US010238145B2

(12) United States Patent
Guenther, Jr. et al.

(10) Patent No.: US 10,238,145 B2
(45) Date of Patent: Mar. 26, 2019

(54) ASSEMBLY SUBSTATION FOR ASSEMBLING A CARTRIDGE FOR A SMOKING ARTICLE

(71) Applicant: R.J. Reynolds Tobacco Company, Winston-Salem, NC (US)

(72) Inventors: Quentin Paul Guenther, Jr., Winston-Salem, NC (US); Johnny Keith Cagigas, Advance, NC (US); William Robert Collett, Lexington, NC (US); Lawrence P. Balash, Antioch, TN (US); Scott Lee Brady, Greer, SC (US); Ronnie Dean Dover, Simpsonville, SC (US); John Scott Gerow, Taylors, SC (US); Don Edward Green, Mauldin, SC (US); John Matthew Odel, Mill Spring, NC (US); Christopher M. Spencer, White House, TN (US); Vernon L. Steiner, Mt. Juliet, TN (US); David James Thierauf, Franklin, TN (US); Louis Wade Wacker, Antioch, TN (US); Byron Joseph Williams, Laurens, SC (US)

(73) Assignee: RAI Strategic Holdings, Inc., Winston-Salem, NC (US)

(*) Notice: Subject to any disclaimer, the term of this patent is extended or adjusted under 35 U.S.C. 154(b) by 755 days.

(21) Appl. No.: 14/716,112

(22) Filed: May 19, 2015

(65) Prior Publication Data
US 2016/0338408 A1    Nov. 24, 2016

(51) Int. Cl.
*B23P 19/00* (2006.01)
*H05K 13/04* (2006.01)
(Continued)

(52) U.S. Cl.
CPC .......... *A24F 47/008* (2013.01); *B23P 19/001* (2013.01); *B23P 19/002* (2013.01);
(Continued)

(58) Field of Classification Search
CPC ...... A24F 47/008; B23P 19/002; B23P 19/10; B23P 21/004; B23P 19/027; Y10T 29/49126; Y10T 29/5313; Y10T 29/53187
(Continued)

(56) References Cited

U.S. PATENT DOCUMENTS

| 1,771,366 A | 7/1930 | Wyss et al. |
| 2,057,353 A | 10/1936 | Whittemore, Jr. |

(Continued)

FOREIGN PATENT DOCUMENTS

| AU | 276250 | 7/1965 |
| CA | 2 641 869 | 5/2010 |

(Continued)

OTHER PUBLICATIONS

Anonymous; "The Latest Trend in Liquid Filling: E-Cigarette Cartridges and Containers Part 2"; Filamatic of Baltimore, MD; May 24, 2013 (3 pgs); http://www.filamatic.com/blog/409.
(Continued)

*Primary Examiner* — Donghai D Nguyen
(74) *Attorney, Agent, or Firm* — Womble Bond Dickinson (US) LLP

(57) ABSTRACT

The present disclosure relates to systems, apparatuses, and methods for assembling cartridges for aerosol delivery devices. The cartridges may be assembled by coupling a base of the cartridge to a carriage that is transported via a track. The track transports the carriages between various substations at which one or more parts are added to the base. The carriage may be lifted from the track by a lifter mechanism at each substation in order to perform assembly
(Continued)

operations on the base. An inspection system may inspect the cartridges at various stages of completion at or between the various substations.

6 Claims, 80 Drawing Sheets

(51) Int. Cl.
    *A24F 47/00*     (2006.01)
    *B23P 19/027*     (2006.01)
    *B23P 21/00*     (2006.01)
    *B23P 19/10*     (2006.01)

(52) U.S. Cl.
    CPC ............. *B23P 19/027* (2013.01); *B23P 19/10* (2013.01); *B23P 21/004* (2013.01)

(58) Field of Classification Search
    USPC ............. 29/611, 830, 831, 729, 742; 493/39
    See application file for complete search history.

(56) References Cited

U.S. PATENT DOCUMENTS

| | | |
|---|---|---|
| 2,104,266 A | 1/1938 | McCormick |
| 2,805,669 A | 9/1957 | Meriro |
| 3,200,819 A | 8/1965 | Gilbert |
| 3,316,919 A | 5/1967 | Green et al. |
| 3,398,754 A | 8/1968 | Tughan |
| 3,419,015 A | 12/1968 | Wochnowski |
| 3,424,171 A | 1/1969 | Rooker |
| 3,476,118 A | 11/1969 | Luttich |
| 4,054,145 A | 10/1977 | Berndt et al. |
| 4,131,117 A | 12/1978 | Kite et al. |
| 4,150,677 A | 4/1979 | Osborne |
| 4,190,046 A | 2/1980 | Virag |
| 4,219,032 A | 8/1980 | Tabatznik et al. |
| 4,259,970 A | 4/1981 | Green, Jr. |
| 4,284,089 A | 8/1981 | Ray |
| 4,303,083 A | 12/1981 | Burruss, Jr. |
| 4,449,541 A | 5/1984 | Mays et al. |
| 4,506,682 A | 3/1985 | Muller |
| 4,635,651 A | 1/1987 | Jacobs |
| 4,674,519 A | 6/1987 | Keritsis et al. |
| 4,708,151 A | 11/1987 | Shelar |
| 4,714,082 A | 12/1987 | Banerjee et al. |
| 4,735,217 A | 4/1988 | Gerth et al. |
| 4,756,318 A | 7/1988 | Clearman et al. |
| 4,771,795 A | 9/1988 | White et al. |
| 4,776,353 A | 10/1988 | Lilja et al. |
| 4,793,365 A | 12/1988 | Sensabaugh, Jr. et al. |
| 4,800,903 A | 1/1989 | Ray et al. |
| 4,819,665 A | 4/1989 | Roberts et al. |
| 4,821,749 A | 4/1989 | Toft et al. |
| 4,830,028 A | 5/1989 | Lawson et al. |
| 4,836,224 A | 6/1989 | Lawson et al. |
| 4,836,225 A | 6/1989 | Sudoh |
| 4,848,374 A | 7/1989 | Chard et al. |
| 4,848,376 A | 7/1989 | Lilja et al. |
| 4,874,000 A | 10/1989 | Tamol et al. |
| 4,880,018 A | 11/1989 | Graves, Jr. et al. |
| 4,887,619 A | 12/1989 | Burcham, Jr. et al. |
| 4,907,606 A | 3/1990 | Lilja et al. |
| 4,913,168 A | 4/1990 | Potter et al. |
| 4,917,119 A | 4/1990 | Potter et al. |
| 4,917,128 A | 4/1990 | Clearman et al. |
| 4,922,901 A | 5/1990 | Brooks et al. |
| 4,924,888 A | 5/1990 | Perfetti et al. |
| 4,928,714 A | 5/1990 | Shannon |
| 4,938,236 A | 7/1990 | Banerjee et al. |
| 4,941,483 A | 7/1990 | Ridings et al. |
| 4,941,484 A | 7/1990 | Clapp et al. |
| 4,945,931 A | 8/1990 | Gori |
| 4,947,874 A | 8/1990 | Brooks et al. |
| 4,947,875 A | 8/1990 | Brooks et al. |
| 4,972,854 A | 11/1990 | Kiernan et al. |
| 4,972,855 A | 11/1990 | Kuriyama et al. |
| 4,986,286 A | 1/1991 | Roberts et al. |
| 4,987,906 A | 1/1991 | Young et al. |
| 5,005,593 A | 4/1991 | Fagg |
| 5,019,122 A | 5/1991 | Clearman et al. |
| 5,022,416 A | 6/1991 | Watson |
| 5,042,510 A | 8/1991 | Curtiss et al. |
| 5,056,537 A | 10/1991 | Brown et al. |
| 5,060,669 A | 10/1991 | White et al. |
| 5,060,671 A | 10/1991 | Counts et al. |
| 5,065,775 A | 11/1991 | Fagg |
| 5,072,744 A | 12/1991 | Luke et al. |
| 5,074,319 A | 12/1991 | White et al. |
| 5,076,296 A | 12/1991 | Nystrom et al. |
| 5,093,894 A | 3/1992 | Deevi et al. |
| 5,095,921 A | 3/1992 | Losee et al. |
| 5,097,850 A | 3/1992 | Braunshteyn et al. |
| 5,099,862 A | 3/1992 | White et al. |
| 5,099,864 A | 3/1992 | Young et al. |
| 5,103,842 A | 4/1992 | Strang et al. |
| 5,121,757 A | 6/1992 | White et al. |
| 5,129,409 A | 7/1992 | White et al. |
| 5,131,415 A | 7/1992 | Munoz et al. |
| 5,144,962 A | 8/1992 | Counts et al. |
| 5,143,097 A | 9/1992 | Sohn et al. |
| 5,146,934 A | 9/1992 | Deevi et al. |
| 5,159,940 A | 11/1992 | Hayward et al. |
| 5,159,942 A | 11/1992 | Brinkley et al. |
| 5,179,966 A | 1/1993 | Losee et al. |
| 5,211,684 A | 5/1993 | Shannon et al. |
| 5,220,930 A | 6/1993 | Gentry |
| 5,224,498 A | 7/1993 | Deevi et al. |
| 5,228,460 A | 7/1993 | Sprinkel, Jr. et al. |
| 5,230,354 A | 7/1993 | Smith et al. |
| 5,235,992 A | 8/1993 | Sensabaugh |
| 5,243,999 A | 9/1993 | Smith |
| 5,246,018 A | 9/1993 | Deevi et al. |
| 5,249,586 A | 10/1993 | Morgan et al. |
| 5,261,424 A | 11/1993 | Sprinkel, Jr. |
| 5,269,327 A | 12/1993 | Counts et al. |
| 5,271,139 A | 12/1993 | Sticht |
| 5,285,798 A | 2/1994 | Banerjee et al. |
| 5,293,883 A | 3/1994 | Edwards |
| 5,301,694 A | 4/1994 | Raymond |
| 5,303,720 A | 4/1994 | Banerjee et al. |
| 5,318,050 A | 6/1994 | Gonzalez-Parra et al. |
| 5,322,075 A | 6/1994 | Deevi et al. |
| 5,322,076 A | 6/1994 | Brinkley et al. |
| 5,339,838 A | 8/1994 | Young et al. |
| 5,345,951 A | 9/1994 | Serrano et al. |
| 5,353,813 A | 10/1994 | Deevi et al. |
| 5,357,984 A | 10/1994 | Farrier et al. |
| 5,360,023 A | 11/1994 | Blakley et al. |
| 5,369,723 A | 11/1994 | Counts et al. |
| 5,372,148 A | 12/1994 | McCafferty et al. |
| 5,377,698 A | 1/1995 | Litzinger et al. |
| 5,388,574 A | 2/1995 | Ingebrethsen et al. |
| 5,388,594 A | 2/1995 | Counts et al. |
| 5,408,574 A | 4/1995 | Deevi et al. |
| 5,435,325 A | 7/1995 | Clapp et al. |
| 5,445,169 A | 8/1995 | Brinkley et al. |
| 5,468,266 A | 11/1995 | Bensalem et al. |
| 5,468,936 A | 11/1995 | Deevi et al. |
| 5,479,948 A | 1/1996 | Counts et al. |
| 5,498,850 A | 3/1996 | Das |
| 5,498,855 A | 3/1996 | Deevi et al. |
| 5,499,636 A | 3/1996 | Baggett, Jr. et al. |
| 5,501,237 A | 3/1996 | Young et al. |
| 5,505,214 A | 4/1996 | Collins et al. |
| 5,515,842 A | 5/1996 | Ramseyer et al. |
| 5,530,225 A | 6/1996 | Hajaligol |
| 5,551,450 A | 9/1996 | Hemsley |
| 5,551,451 A | 9/1996 | Riggs et al. |
| 5,564,442 A | 10/1996 | MacDonald et al. |
| 5,573,692 A | 11/1996 | Das et al. |
| 5,591,368 A | 1/1997 | Fleischhauer et al. |
| 5,593,792 A | 1/1997 | Farrier et al. |
| 5,595,577 A | 1/1997 | Bensalem et al. |

(56) References Cited

U.S. PATENT DOCUMENTS

| | | |
|---|---|---|
| 5,596,706 A | 1/1997 | Sikk et al. |
| 5,611,360 A | 3/1997 | Tang |
| 5,613,504 A | 3/1997 | Collins et al. |
| 5,613,505 A | 3/1997 | Campbell et al. |
| 5,649,552 A | 7/1997 | Cho et al. |
| 5,649,554 A | 7/1997 | Sprinkel et al. |
| 5,659,656 A | 8/1997 | Das |
| 5,665,262 A | 9/1997 | Hajaligol et al. |
| 5,666,976 A | 9/1997 | Adams et al. |
| 5,666,977 A | 9/1997 | Higgins et al. |
| 5,666,978 A | 9/1997 | Counts et al. |
| 5,687,746 A | 11/1997 | Rose et al. |
| 5,692,525 A | 12/1997 | Counts et al. |
| 5,692,526 A | 12/1997 | Adams et al. |
| 5,708,258 A | 1/1998 | Counts et al. |
| 5,711,320 A | 1/1998 | Martin |
| 5,726,421 A | 3/1998 | Fleischhauer et al. |
| 5,727,571 A | 3/1998 | Meiring et al. |
| 5,730,158 A | 3/1998 | Collins et al. |
| 5,750,964 A | 5/1998 | Counts et al. |
| 5,799,663 A | 9/1998 | Gross et al. |
| 5,816,263 A | 10/1998 | Counts et al. |
| 5,819,756 A | 10/1998 | Mielordt |
| 5,829,453 A | 11/1998 | White et al. |
| 5,865,185 A | 2/1999 | Collins et al. |
| 5,865,186 A | 2/1999 | Volsey, II |
| 5,878,752 A | 3/1999 | Adams et al. |
| 5,880,439 A | 3/1999 | Deevi et al. |
| 5,894,841 A | 4/1999 | Voges |
| 5,915,387 A | 7/1999 | Baggett, Jr. et al. |
| 5,934,289 A | 8/1999 | Watkins et al. |
| 5,954,979 A | 9/1999 | Counts et al. |
| 5,967,148 A | 10/1999 | Harris et al. |
| 6,026,820 A | 2/2000 | Baggett, Jr. et al. |
| 6,033,623 A | 3/2000 | Deevi et al. |
| 6,040,560 A | 3/2000 | Fleischhauer et al. |
| 6,053,176 A | 4/2000 | Adams et al. |
| 6,089,857 A | 7/2000 | Matsuura et al. |
| 6,095,153 A | 8/2000 | Kessler et al. |
| 6,116,247 A | 9/2000 | Banyasz et al. |
| 6,119,700 A | 9/2000 | Fleischhauer et al. |
| 6,125,853 A | 10/2000 | Susa et al. |
| 6,125,855 A | 10/2000 | Nevett et al. |
| 6,125,866 A | 10/2000 | Nichols et al. |
| 6,155,268 A | 12/2000 | Takeuchi |
| 6,164,287 A | 12/2000 | White |
| 6,182,670 B1 | 2/2001 | White |
| 6,196,218 B1 | 3/2001 | Voges |
| 6,196,219 B1 | 3/2001 | Hess et al. |
| 6,216,706 B1 | 4/2001 | Kumar et al. |
| 6,289,898 B1 | 9/2001 | Fournier et al. |
| 6,349,729 B1 | 2/2002 | Pham |
| 6,357,671 B1 | 3/2002 | Cewers |
| 6,418,938 B1 | 7/2002 | Fleischhauer et al. |
| 6,446,426 B1 | 8/2002 | Sweeney et al. |
| 6,532,965 B1 | 3/2003 | Abhulimen et al. |
| 6,598,607 B2 | 7/2003 | Adiga et al. |
| 6,601,776 B1 | 8/2003 | Oljaca et al. |
| 6,615,840 B1 | 9/2003 | Fournier et al. |
| 6,688,313 B2 | 2/2004 | Wrenn et al. |
| 6,701,936 B2 | 3/2004 | Shafer et al. |
| 6,715,494 B1 | 4/2004 | McCoy |
| 6,730,832 B1 | 5/2004 | Dominguez et al. |
| 6,772,756 B2 | 8/2004 | Shayan |
| 6,803,545 B2 | 10/2004 | Blake et al. |
| 6,803,550 B2 | 10/2004 | Sharpe et al. |
| 6,810,883 B2 | 11/2004 | Felter et al. |
| 6,854,461 B2 | 2/2005 | Nichols |
| 6,854,470 B1 | 2/2005 | Pu |
| 6,994,096 B2 | 2/2006 | Rostami et al. |
| 7,011,096 B2 | 3/2006 | Li et al. |
| 7,017,585 B2 | 3/2006 | Li et al. |
| 7,025,066 B2 | 4/2006 | Lawson et al. |
| 7,117,867 B2 | 10/2006 | Cox et al. |
| 7,163,015 B2 | 1/2007 | Moffitt |
| 7,173,322 B2 | 2/2007 | Cox et al. |
| 7,185,659 B2 | 3/2007 | Sharpe et al. |
| 7,234,470 B2 | 6/2007 | Yang |
| 7,290,549 B2 | 11/2007 | Banerjee et al. |
| 7,293,565 B2 | 11/2007 | Griffin et al. |
| 7,338,421 B2 * | 3/2008 | Eusepi ............... A24D 3/0225 493/39 |
| 7,392,809 B2 | 7/2008 | Larson et al. |
| 7,513,253 B2 | 4/2009 | Kobayashi et al. |
| 7,594,424 B2 | 9/2009 | Fazekas |
| 7,647,932 B2 | 1/2010 | Cantrell et al. |
| 7,690,385 B2 | 4/2010 | Moffitt |
| 7,692,123 B2 | 4/2010 | Baba et al. |
| 7,726,320 B2 | 6/2010 | Robinson et al. |
| 7,775,459 B2 | 8/2010 | Martens, III et al. |
| 7,810,505 B2 | 10/2010 | Yang |
| 7,832,410 B2 | 11/2010 | Hon |
| 7,845,359 B2 | 12/2010 | Montaser |
| 7,878,209 B2 | 2/2011 | Newbery et al. |
| 7,896,006 B2 | 3/2011 | Hamano et al. |
| 8,066,010 B2 | 11/2011 | Newbery et al. |
| 8,079,371 B2 | 12/2011 | Robinson et al. |
| 8,127,772 B2 | 3/2012 | Montaser |
| 8,156,944 B2 | 4/2012 | Han |
| 8,314,591 B2 | 11/2012 | Terry et al. |
| 8,365,742 B2 | 2/2013 | Hon |
| 8,375,957 B2 | 2/2013 | Hon |
| 8,393,331 B2 | 3/2013 | Hon |
| 8,402,976 B2 | 3/2013 | Fernando et al. |
| 8,499,766 B1 | 8/2013 | Newton |
| 8,528,569 B1 | 9/2013 | Newton |
| 8,550,069 B2 | 10/2013 | Alelov |
| 8,851,081 B2 | 10/2014 | Fernando et al. |
| 2002/0119873 A1 * | 8/2002 | Heitmann ............ A24D 3/0225 493/39 |
| 2002/0146242 A1 | 10/2002 | Vieira |
| 2003/0131859 A1 | 7/2003 | Li et al. |
| 2003/0226837 A1 | 12/2003 | Blake et al. |
| 2004/0020500 A1 | 2/2004 | Wrenn et al. |
| 2004/0118401 A1 | 6/2004 | Smith et al. |
| 2004/0129280 A1 | 7/2004 | Woodson et al. |
| 2004/0149296 A1 | 8/2004 | Rostami et al. |
| 2004/0200488 A1 | 10/2004 | Felter et al. |
| 2004/0226568 A1 | 11/2004 | Takeuchi et al. |
| 2004/0255965 A1 | 12/2004 | Perfetti et al. |
| 2005/0016549 A1 | 1/2005 | Banerjee et al. |
| 2005/0016550 A1 | 1/2005 | Katase |
| 2005/0066986 A1 | 3/2005 | Nestor et al. |
| 2005/0172976 A1 | 8/2005 | Newman et al. |
| 2005/0274390 A1 | 12/2005 | Banerjee et al. |
| 2006/0016453 A1 | 1/2006 | Kim |
| 2006/0070633 A1 | 4/2006 | Rostami et al. |
| 2006/0162733 A1 | 7/2006 | McGrath et al. |
| 2006/0185687 A1 | 8/2006 | Hearn et al. |
| 2006/0196518 A1 | 9/2006 | Hon |
| 2007/0074734 A1 | 4/2007 | Braunshteyn et al. |
| 2007/0102013 A1 | 5/2007 | Adams et al. |
| 2007/0215167 A1 | 9/2007 | Crooks et al. |
| 2007/0283972 A1 | 12/2007 | Monsees et al. |
| 2008/0085103 A1 | 4/2008 | Beland et al. |
| 2008/0092912 A1 | 4/2008 | Robinson et al. |
| 2008/0149118 A1 | 6/2008 | Oglesby et al. |
| 2008/0245377 A1 | 10/2008 | Marshall et al. |
| 2008/0257367 A1 | 10/2008 | Paterno et al. |
| 2008/0276947 A1 | 11/2008 | Martzel |
| 2008/0302374 A1 | 12/2008 | Wengert et al. |
| 2009/0065010 A1 | 3/2009 | Shands |
| 2009/0095311 A1 | 4/2009 | Hon |
| 2009/0095312 A1 | 4/2009 | Herbrich et al. |
| 2009/0126745 A1 | 5/2009 | Hon |
| 2009/0188490 A1 | 7/2009 | Hon |
| 2009/0230117 A1 | 9/2009 | Fernando et al. |
| 2009/0260641 A1 | 10/2009 | Monsees et al. |
| 2009/0260642 A1 | 10/2009 | Monsees et al. |
| 2009/0272379 A1 | 11/2009 | Thorens et al. |
| 2009/0283103 A1 | 11/2009 | Nielsen et al. |
| 2009/0293892 A1 | 12/2009 | Williams et al. |
| 2009/0320863 A1 | 12/2009 | Fernando et al. |
| 2009/0324206 A1 | 12/2009 | Young et al. |

(56) References Cited

U.S. PATENT DOCUMENTS

| | | |
|---|---|---|
| 2010/0006113 A1 | 1/2010 | Urtsev et al. |
| 2010/0024834 A1 | 2/2010 | Oglesby et al. |
| 2010/0043809 A1 | 2/2010 | Magnon |
| 2010/0059070 A1 | 3/2010 | Potter et al. |
| 2010/0059073 A1 | 3/2010 | Hoffmann et al. |
| 2010/0065075 A1 | 3/2010 | Banerjee et al. |
| 2010/0083959 A1 | 4/2010 | Siller |
| 2010/0163063 A1 | 7/2010 | Fernando et al. |
| 2010/0200006 A1 | 8/2010 | Robinson et al. |
| 2010/0229881 A1 | 9/2010 | Hearn |
| 2010/0242974 A1 | 9/2010 | Pan |
| 2010/0242976 A1 | 9/2010 | Katayama et al. |
| 2010/0258139 A1 | 10/2010 | Onishi et al. |
| 2010/0300467 A1 | 12/2010 | Kuistilla et al. |
| 2010/0307518 A1 | 12/2010 | Wang |
| 2010/0313901 A1 | 12/2010 | Fernando et al. |
| 2011/0005535 A1 | 1/2011 | Xiu |
| 2011/0011396 A1 | 1/2011 | Fang |
| 2011/0036363 A1 | 2/2011 | Urtsev et al. |
| 2011/0036365 A1 | 2/2011 | Chong et al. |
| 2011/0073121 A1 | 3/2011 | Levin et al. |
| 2011/0088707 A1 | 4/2011 | Hajaligol |
| 2011/0094523 A1 | 4/2011 | Thorens et al. |
| 2011/0120480 A1 | 5/2011 | Brenneise |
| 2011/0126847 A1 | 6/2011 | Zuber et al. |
| 2011/0126848 A1 | 6/2011 | Zuber et al. |
| 2011/0155153 A1 | 6/2011 | Thorens et al. |
| 2011/0155718 A1 | 6/2011 | Greim et al. |
| 2011/0162663 A1 | 7/2011 | Bryman |
| 2011/0168194 A1 | 7/2011 | Hon |
| 2011/0180082 A1 | 7/2011 | Banerjee et al. |
| 2011/0265806 A1 | 11/2011 | Alarcon et al. |
| 2011/0309157 A1 | 12/2011 | Yang et al. |
| 2012/0042885 A1 | 2/2012 | Stone et al. |
| 2012/0060853 A1 | 3/2012 | Robinson et al. |
| 2012/0111347 A1 | 5/2012 | Hon |
| 2012/0132643 A1 | 5/2012 | Choi et al. |
| 2012/0227752 A1 | 9/2012 | Alelov |
| 2012/0231464 A1 | 9/2012 | Yu et al. |
| 2012/0260927 A1 | 10/2012 | Liu |
| 2012/0279512 A1 | 11/2012 | Hon |
| 2012/0318882 A1 | 12/2012 | Abehasera |
| 2013/0037041 A1 | 2/2013 | Worm et al. |
| 2013/0056013 A1 | 3/2013 | Terry et al. |
| 2013/0081625 A1 | 4/2013 | Rustad et al. |
| 2013/0081642 A1 | 4/2013 | Safari |
| 2013/0192619 A1 | 8/2013 | Tucker et al. |
| 2013/0255702 A1 | 10/2013 | Griffith, Jr. et al. |
| 2013/0306084 A1 | 11/2013 | Flick |
| 2013/0319439 A1 | 12/2013 | Gorelick et al. |
| 2013/0340750 A1 | 12/2013 | Thorens et al. |
| 2013/0340775 A1 | 12/2013 | Juster et al. |
| 2014/0000638 A1 | 1/2014 | Sebastian et al. |
| 2014/0060554 A1 | 3/2014 | Collett et al. |
| 2014/0060555 A1 | 3/2014 | Chang et al. |
| 2014/0096781 A1 | 4/2014 | Sears et al. |
| 2014/0096782 A1 | 4/2014 | Ampolini et al. |
| 2014/0109921 A1 | 4/2014 | Chen |
| 2014/0157583 A1 | 6/2014 | Ward et al. |
| 2014/0209105 A1 | 7/2014 | Sears et al. |
| 2014/0250651 A1 | 9/2014 | MacDougall |
| 2014/0253144 A1 | 9/2014 | Novak et al. |
| 2014/0261408 A1 | 9/2014 | DePiano et al. |
| 2014/0261486 A1 | 9/2014 | Potter et al. |
| 2014/0261487 A1 | 9/2014 | Chapman et al. |
| 2014/0261495 A1 | 9/2014 | Novak et al. |
| 2014/0270727 A1 | 9/2014 | Ampolini et al. |
| 2014/0270729 A1 | 9/2014 | DePiano et al. |
| 2014/0270730 A1 | 9/2014 | DePiano et al. |
| 2014/0345631 A1 | 11/2014 | Bowen et al. |
| 2015/0007838 A1 | 1/2015 | Fernando et al. |
| 2015/0027471 A1 | 1/2015 | Feldman et al. |
| 2015/0053217 A1 | 2/2015 | Steingraber et al. |
| 2015/0223522 A1 | 8/2015 | Ampolini et al. |
| 2015/0289565 A1 | 10/2015 | Cadieux et al. |
| 2015/0291301 A1 | 10/2015 | Cadieux et al. |
| 2015/0327598 A1 | 11/2015 | Xiang |
| 2016/0037826 A1 | 2/2016 | Hearn et al. |
| 2016/0054345 A1 | 2/2016 | Watson et al. |

FOREIGN PATENT DOCUMENTS

| | | |
|---|---|---|
| CA | 2 752 255 | 8/2010 |
| CN | 1541577 | 11/2004 |
| CN | 2719043 | 8/2005 |
| CN | 200997909 | 1/2008 |
| CN | 101116542 | 2/2008 |
| CN | 101176805 | 5/2008 |
| CN | 201379072 | 1/2010 |
| CN | 204 108 632 U | 1/2015 |
| CN | 204 169 065 U | 2/2015 |
| DE | 10 2006 004 484 | 8/2007 |
| DE | 102006041042 | 3/2008 |
| DE | 20 2009 010 400 | 11/2009 |
| EP | 0 295 122 | 12/1988 |
| EP | 0 430 566 | 6/1991 |
| EP | 0 845 220 | 6/1998 |
| EP | 1 618 803 | 1/2006 |
| EP | 2 316 286 | 5/2011 |
| EP | 2 468 116 | 6/2012 |
| EP | 2 779 786 A1 | 9/2014 |
| GB | 1 303 420 A | 1/1973 |
| GB | 1444461 | 7/1976 |
| GB | 2 199 008 A | 6/1988 |
| GB | 2469850 | 11/2010 |
| WO | WO 1986/02528 | 5/1986 |
| WO | WO 1997/48293 | 12/1997 |
| WO | WO 02/37990 | 5/2002 |
| WO | WO 2003/034847 A1 | 5/2003 |
| WO | WO 2004/043175 | 5/2004 |
| WO | WO 2004/080216 | 9/2004 |
| WO | WO 2005/099494 | 10/2005 |
| WO | WO 2007/078273 | 7/2007 |
| WO | WO 2007/131449 | 11/2007 |
| WO | WO 2009/105919 | 9/2009 |
| WO | WO 2009/155734 | 12/2009 |
| WO | WO 2010/003480 | 1/2010 |
| WO | WO 2010/045670 | 4/2010 |
| WO | WO 2010/073122 | 7/2010 |
| WO | WO 2010/091593 | 8/2010 |
| WO | WO 2010/118644 | 10/2010 |
| WO | WO 2010/140937 | 12/2010 |
| WO | WO 2011/010334 | 1/2011 |
| WO | WO 2011/081558 | 7/2011 |
| WO | WO 2012/072762 | 6/2012 |
| WO | WO 2012/100523 | 8/2012 |
| WO | WO 2013/089551 | 6/2013 |
| WO | 2015106604 A1 | 7/2015 |
| WO | 2015139186 A1 | 9/2015 |
| WO | 2015172383 A1 | 11/2015 |
| WO | 2015172384 A1 | 11/2015 |
| WO | 2015172387 A1 | 11/2015 |
| WO | 2015172389 A1 | 11/2015 |
| WO | 2015172390 A1 | 11/2015 |
| WO | 2015180145 A1 | 12/2015 |
| WO | 2015196367 A1 | 12/2015 |
| WO | 2016/079533 | 5/2016 |
| WO | 2016/116755 | 7/2016 |

OTHER PUBLICATIONS

Mikron G05 "High volume automation solutions for the assembling of products"; 2015; http://www.mikron.com/fileadmin/customer/2_Pdfs/2_Mikron_Automation/Solutions/MikronG05_EN.pdf.

Mikron Ecoline™ "Solutions for the assembling of products"; 2015; http://www.mikron.com/fileadmin/customer/2_Pdfs/2_Mikron_Automation/Solutions/Mikron_Ecoline_EN.pdf.

ATC Automation; Automation tool company—custom assembly automation and test systems; 2016; http://automationtool.com/.

International Search Report dated Jan. 25, 2017 in corresponding International Application No. PCT/US2016/033073 filed May 18, 2016.

(56) References Cited

OTHER PUBLICATIONS

Freedom Smokeless Press Release; *Electronic Cigarettes U.S. Automated Filling, Assembly & Packaging*; Feb. 12, 2014 (2 pgs.) http://www.freedomsmokeless.com/20120212_pressrelease.pdf.
Freedom Smokeless; Manufacturing: Component Manufacturing, Manufacturing Audits,and Automations Systems and QC; site visited Mar. 27, 2014 (4 pgs.) http://www.freedomsmokeless.com/manufacturing.php.
Freedom Smokeless Video on Vimeo; site visited May 14, 2014 (screenshots—42 pgs.) http://vimeo.com/85109379.
Timothy S. Donahue; The Need for Speed; Vapor Voice; 2015; pp. 30-31; Issue 1.

* cited by examiner

PROVIDE A PLURALITY OF COMPONENTS VIA A SUPPLY UNIT — 1602

↓

ALTERNATINGLY FEED THE COMPONENTS FROM THE SUPPLY UNIT TO A FIRST ASSEMBLY UNIT AND A SECOND ASSEMBLY UNIT — 1604

↓

RESPECTIVELY ASSEMBLE THE COMPONENTS WITH THE FIRST ASSEMBLY UNIT AND THE SECOND ASSEMBLY UNIT INTO A PLURALITY OF CARTRIDGES FOR AN AEROSOL DELIVERY DEVICE — 1606

FIG. 82

```
┌─────────────────────────────────────────────────────────────┐
│  PROVIDE A BASE AND A PLURALITY OF ADDITIONAL COMPONENTS    │─ 1702
│  CONFIGURED TO FORM A PLURALITY OF CARTRIDGES FOR AN        │
│           AEROSOL DELIVERY DEVICE                           │
└─────────────────────────────────────────────────────────────┘
                              ↓
┌─────────────────────────────────────────────────────────────┐
│  PROVIDE A PLURALITY OF ASSEMBLY SUBSTATIONS, A TRACK, AND  │─ 1704
│  A CARRIAGE COMPRISING AN ENGAGEMENT HEAD DEFINING A        │
│              PLURALITY OF SECTIONS                          │
└─────────────────────────────────────────────────────────────┘
                              ↓
┌─────────────────────────────────────────────────────────────┐
│  ENGAGE AN INTERNAL SURFACE OF THE ATTACHMENT END OF THE    │─ 1706
│  BASE WITH THE SECTIONS OF THE ENGAGEMENT HEAD VIA          │
│                  INTERFERENCE FIT                           │
└─────────────────────────────────────────────────────────────┘
                              ↓
┌─────────────────────────────────────────────────────────────┐
│  TRANSPORT THE CARRIAGE ON THE TRACK BETWEEN THE ASSEMBLY   │─ 1708
│                     SUBSTATIONS                             │
└─────────────────────────────────────────────────────────────┘
                              ↓
┌─────────────────────────────────────────────────────────────┐
│  ASSEMBLE THE ADDITIONAL COMPONENTS WITH THE BASE AT THE    │─ 1710
│              ASSEMBLY SUBSTATIONS                           │
└─────────────────────────────────────────────────────────────┘
```

FIG. 83

ASSEMBLY SUBSTATION FOR ASSEMBLING A CARTRIDGE FOR A SMOKING ARTICLE

BACKGROUND

Field of the Disclosure

The present disclosure relates to a cartridge for aerosol delivery devices such as electronic cigarettes, and more particularly to methods for assembling a cartridge for aerosol delivery devices including an atomizer, and associated systems and apparatuses. The atomizer may be configured to heat an aerosol precursor, which may be made or derived from tobacco or otherwise incorporate tobacco, to form an inhalable substance for human consumption.

Description of Related Art

Many smoking devices have been proposed through the years as improvements upon, or alternatives to, smoking products that require combusting tobacco for use. Many of those devices purportedly have been designed to provide the sensations associated with cigarette, cigar, or pipe smoking, but without delivering considerable quantities of incomplete combustion and pyrolysis products that result from the burning of tobacco. To this end, there have been proposed numerous smoking products, flavor generators, and medicinal inhalers that utilize electrical energy to vaporize or heat a volatile material, or attempt to provide the sensations of cigarette, cigar, or pipe smoking without burning tobacco to a significant degree. See, for example, the various alternative smoking articles, aerosol delivery devices and heat generating sources set forth in the background art described in U.S. Pat. No. 8,881,737 to Collett et al., U.S. Pat. App. Pub. No. 2013/0255702 to Griffith Jr. et al., U.S. Pat. App. Pub. No. 2014/0000638 to Sebastian et al., U.S. Pat. App. Pub. No. 2014/0096781 to Sears et al., U.S. Pat. App. Pub. No. 2014/0096782 to Ampolini et al., and U.S. patent application Ser. No. 14/011,992 to Davis et al., filed Aug. 28, 2013, which are incorporated herein by reference in their entireties. See also, for example, the various embodiments of products and heating configurations described in the background sections of U.S. Pat. No. 5,388,594 to Counts et al. and U.S. Pat. No. 8,079,371 to Robinson et. al, which are incorporated by reference in their entireties.

However, some electronic smoking articles or portions thereof may be difficult to manufacture. In this regard, for example, the various components of electronic smoking articles may be relatively small and/or fragile. Thus, advances with respect to systems, apparatuses, and methods for manufacturing electronic smoking articles would be desirable.

BRIEF SUMMARY OF THE DISCLOSURE

The present disclosure relates to assembly of cartridges for aerosol delivery devices configured to produce aerosol and which aerosol delivery devices, in some embodiments, may be referred to as electronic cigarettes. In one aspect, an assembly substation is provided. The assembly substation may include a supply unit configured to provide a plurality of components, a first assembly unit configured to receive a first portion of the components, and a second assembly unit configured to receive a second portion of the components. The first assembly unit and the second assembly unit may be respectively configured to assemble the first portion of the components and the second portion of components into a plurality of cartridges for an aerosol delivery device. The assembly substation may additionally include a feeder unit configured to receive the components from the supply unit and alternatingly feed the first portion of the components to the first assembly unit and feed the second portion of the components to the second assembly unit.

In some embodiments the feeder unit may include a rotary member configured to swivel between a first delivery position in which the rotary member is configured to deliver the first portion of the components to the first assembly unit and a second delivery position in which the rotary member is configured to deliver the second portion of the components to the second assembly unit. The rotary member may include a first engagement head and a second engagement head respectively configured to receive one of the components from the supply unit. The first engagement head may be configured to receive one of the components from the supply unit while the second engagement head feeds one of the components to the second assembly unit. The second engagement head may be configured to receive one of the components from the supply unit while the first engagement head feeds one of the components to the first assembly unit.

In some embodiments the supply unit may include a vibratory arrangement defining a pathway configured to arrange the components in a serially-aligned stream and a singulator configured to singulate the components from the serially-aligned stream. The supply unit may further include an actuator configured to individually remove the components from the serially-aligned stream or realign the components when misaligned in a first direction. The pathway may define a gap configured to remove the components from the serially-aligned stream when the components are misaligned in a second direction.

In an additional aspect, an assembly method is provided. The assembly method may include providing a plurality of components via a supply unit, alternatingly feeding a first portion of the components from the supply unit to a first assembly unit and a second portion of the components to a second assembly unit, and assembling the first portion of the components with the first assembly unit and the second portion of the components with the second assembly unit into a plurality of cartridges for an aerosol delivery device.

In some embodiments, alternatingly feeding the first portion of the components from the supply unit to the first assembly unit and the second portion of the components to the second assembly unit may include swiveling a rotary member between a first delivery position in which the rotary member is configured to deliver the first portion of the components to the first assembly unit and a second delivery position in which the rotary member is configured to deliver the second portion of the components to the second assembly unit. Swiveling the rotary member may include receiving one of the components from the supply unit in a first engagement head while a second engagement head feeds one of the components to the second assembly unit and receiving one of the components from the supply unit in the second engagement head while the first engagement head feeds one of the components to the first assembly unit.

In some embodiments providing the components via the supply unit may include directing the components along a pathway in a serially-aligned stream and singulating the components from the serially-aligned stream. The method may additionally include individually removing the components from the serially-aligned stream or realigning the components when misaligned in a first direction. The method may further include removing the components from the serially-aligned stream through a gap in the pathway when the components are misaligned in a second direction.

In an additional aspect, a system configured to assemble a plurality of cartridges for an aerosol delivery device is provided. The system may include a plurality of assembly substations collectively configured to assemble a base and a plurality of additional components together. The base may extend between an inner end configured to receive the additional components during assembly of the cartridges and an attachment end defining an internal surface configured to engage a control body during usage of the aerosol delivery device. The system may further include a track extending between the assembly substations. Additionally, the system may include a carriage configured to engage the track and to cooperate therewith to move between the assembly substations. The carriage may include an engagement head defining a plurality of sections configured to engage the internal surface of the attachment end of the base via an interference fit to provide the assembly substations with access to the inner end of the base to attach the additional components thereto.

In some embodiments the assembly substations may include a base load substation. The base load substation may be configured to rotationally align the base with the engagement head of the carriage and engage the base with the engagement head. The base load substation may include an imaging device configured to detect a rotational orientation of the base based on image of the attachment end of the base. The carriage may include a storage module configured to store cartridge identification and status information.

In some embodiments the carriage may define one or more alignment apertures and the track may include one or more locking pins configured to engage the alignment apertures to releasably lock the carriage at one or more of the assembly substations.

The track further may further include a conveyor and a lifter mechanism. The lifter mechanism may include the locking pins and may be configured to lift the carriage from the conveyor. The carriage may include an electrostatic dissipative material. The carriage may further include a locator module including a ferromagnetic material.

In an additional aspect, an assembly method is provided. The assembly method may include providing a base and a plurality of additional components collectively configured to form a plurality of cartridges for an aerosol delivery device. The base may extend between an inner end configured to receive the additional components during assembly of the cartridges and an attachment end defining an internal surface configured to engage a control body during usage of the aerosol delivery device. The method may further include providing a plurality of assembly substations, a track, and a carriage comprising an engagement head defining a plurality of sections. The track may extend between the assembly substations, and the carriage may be configured to engage the track and to cooperate therewith to move between the assembly substations. The method may additionally include engaging the internal surface of the attachment end of the base with the sections of the engagement head via an interference fit to provide the assembly substations with access to the inner end of the base. Further, the method may include transporting the carriage by way of the track between the assembly substations and assembling the additional components with the inner end of the base at the assembly substations.

In some embodiments, engaging the base with the engagement head may include rotationally aligning the base with the engagement head. Rotationally aligning the base with the engagement head may include detecting a rotational orientation of the base based on image of the attachment end of the base. Further, the method may include storing cartridge identification and status information in a storage module coupled to the carriage. The method may also include locking the carriage at one or more of the substations by directing one or more locking pins from the track into one or more alignment apertures defined in the carriage. Transporting the carriage by way of the track may include transporting the carriage by way of a conveyor, and wherein locking the carriage comprises lifting the carriage from the conveyor.

In a further, aspect, an assembly substation is provided. The assembly substation may include a robotic arm configured to insert a partially-assembled cartridge into an outer body. The partially-assembled cartridge may include a base, a negative heating terminal, a positive heating terminal, a heating element, and a liquid transport element. The negative heating terminal and the positive heating terminal may be coupled to the base. The heating element may be coupled to the negative heating terminal and the positive heating terminal. The robotic arm may include an outer body gripper configured to receive an outer body therein. The robotic arm may be configured to direct the outer body gripper with the outer body positioned therein over the partially-assembled cartridge such that at least a portion of the negative heating terminal, the positive heating terminal, the heating element, and the liquid transport element are received in the outer body. The assembly substation may additionally include a suction system operably engaged with the outer body gripper of the robotic arm. The outer body gripper may be configured to apply a negative pressure supplied by the suction system longitudinally through the outer body to facilitate insertion of the partially-assembled cartridge into the outer body.

In some embodiments the assembly substation may additionally include a bending mechanism configured to receive the partially-assembled cartridge therein so as to bend the liquid transport element against the negative heating terminal and the positive heating terminal. The assembly substation may also include a substrate gripper configured to wrap a reservoir substrate at least partially around the bending mechanism, The bending mechanism may be configured to retract relative to the partially-assembled cartridge following wrapping of the reservoir substrate such that the reservoir substrate is wrapped at least partially about the negative heating terminal and the positive heating terminal and in contact with the liquid transport element.

In some embodiments the outer body gripper may include a piston. The piston may be in fluid communication with the suction system and configured to engage an end of the outer body to apply the negative pressure through the outer body. The piston may be configured to press the outer body into engagement with the base. The outer body gripper may be configured to receive the outer body therein while the bending mechanism receives the partially-assembled cartridge therein.

In an additional aspect, an assembly method is provided. The assembly method may include providing a partially-assembled cartridge including a base, a negative heating terminal, a positive heating terminal, a heating element, and a liquid transport element. The negative heating terminal and the positive heating terminal may be coupled to the base. The heating element may be coupled to the negative heating terminal and the positive heating terminal. The assembly method may additionally include inserting the partially-assembled cartridge within an outer body by engaging the outer body with an outer body gripper of a robotic arm and directing the outer body over the partially-assembled cartridge. Further, the method may include applying a negative pressure to the outer body supplied by a suction system operably engaged with the outer body gripper of the robotic arm to facilitate insertion of the partially-assembled cartridge into the outer body.

In some embodiments, the assembly method may further include inserting the partially-assembled cartridge in a bending mechanism to bend the liquid transport element against the negative heating terminal and the positive heating terminal. The assembly method may also include wrapping a reservoir substrate at least partially around the bending mechanism. Further, the assembly method may include retracting the bending mechanism relative to the partially-assembled cartridge following wrapping of the reservoir substrate such that the reservoir substrate is wrapped at least partially about the negative heating terminal and the positive heating terminal and in contact with the liquid transport element.

In some embodiments, applying the negative pressure to the outer body may include engaging an end of the outer body with a piston of the outer body gripper. The piston may be in fluid communication with the suction system and configured to apply the negative pressure through the outer body. The assembly method may additionally include pressing the outer body into engagement with the base with the piston.

These and other features, aspects, and advantages of the disclosure will be apparent from a reading of the following detailed description together with the accompanying drawings, which are briefly described below. The invention includes any combination of two, three, four, or more of the above-noted embodiments as well as combinations of any two, three, four, or more features or elements set forth in this disclosure, regardless of whether such features or elements are expressly combined in a specific embodiment description herein. This disclosure is intended to be read holistically such that any separable features or elements of the disclosed invention, in any of its various aspects and embodiments, should be viewed as intended to be combinable unless the context clearly dictates otherwise.

BRIEF DESCRIPTION OF THE FIGURES

Figure 1:
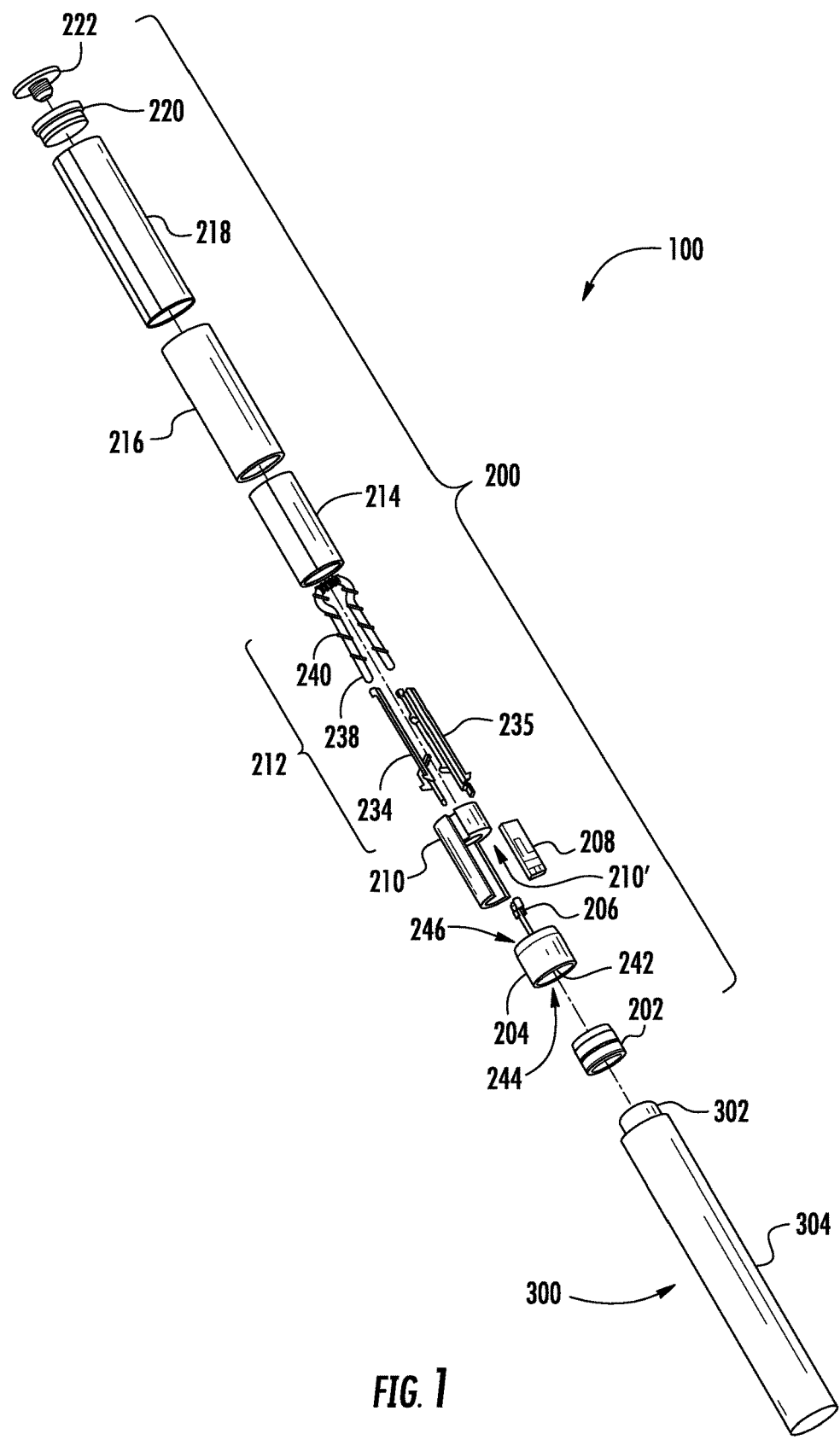
Figure 2:
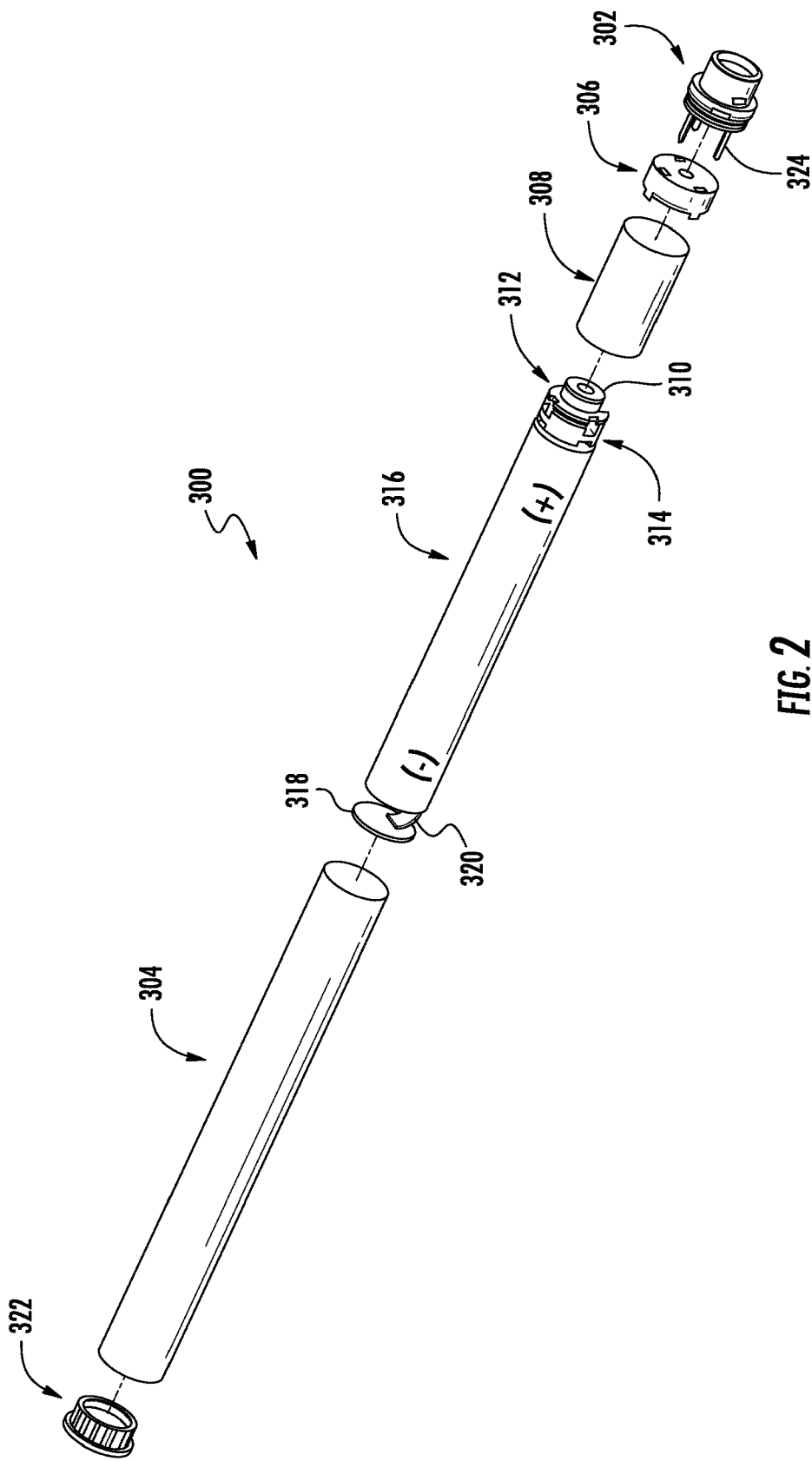
Figure 3:
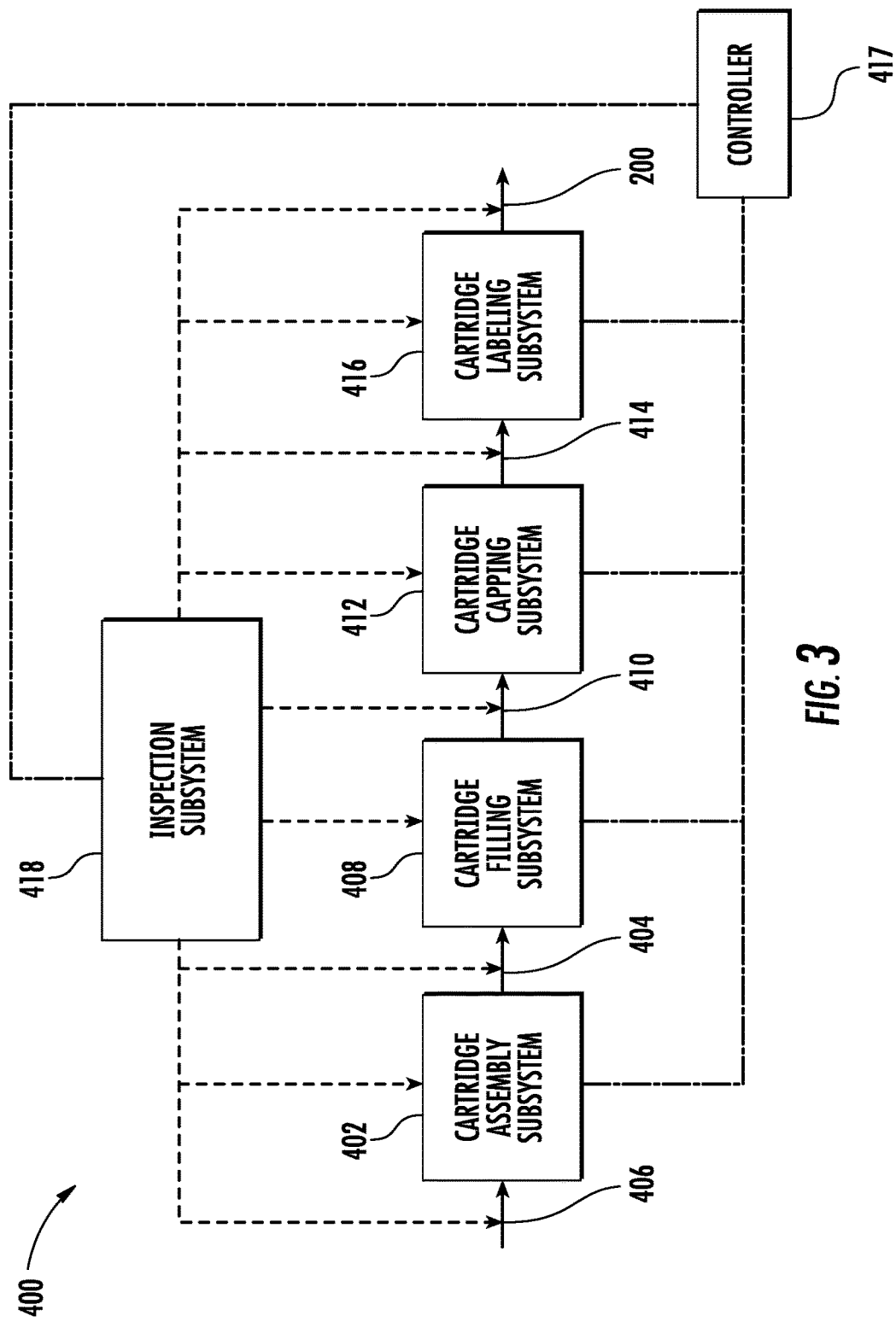
Figure 4:
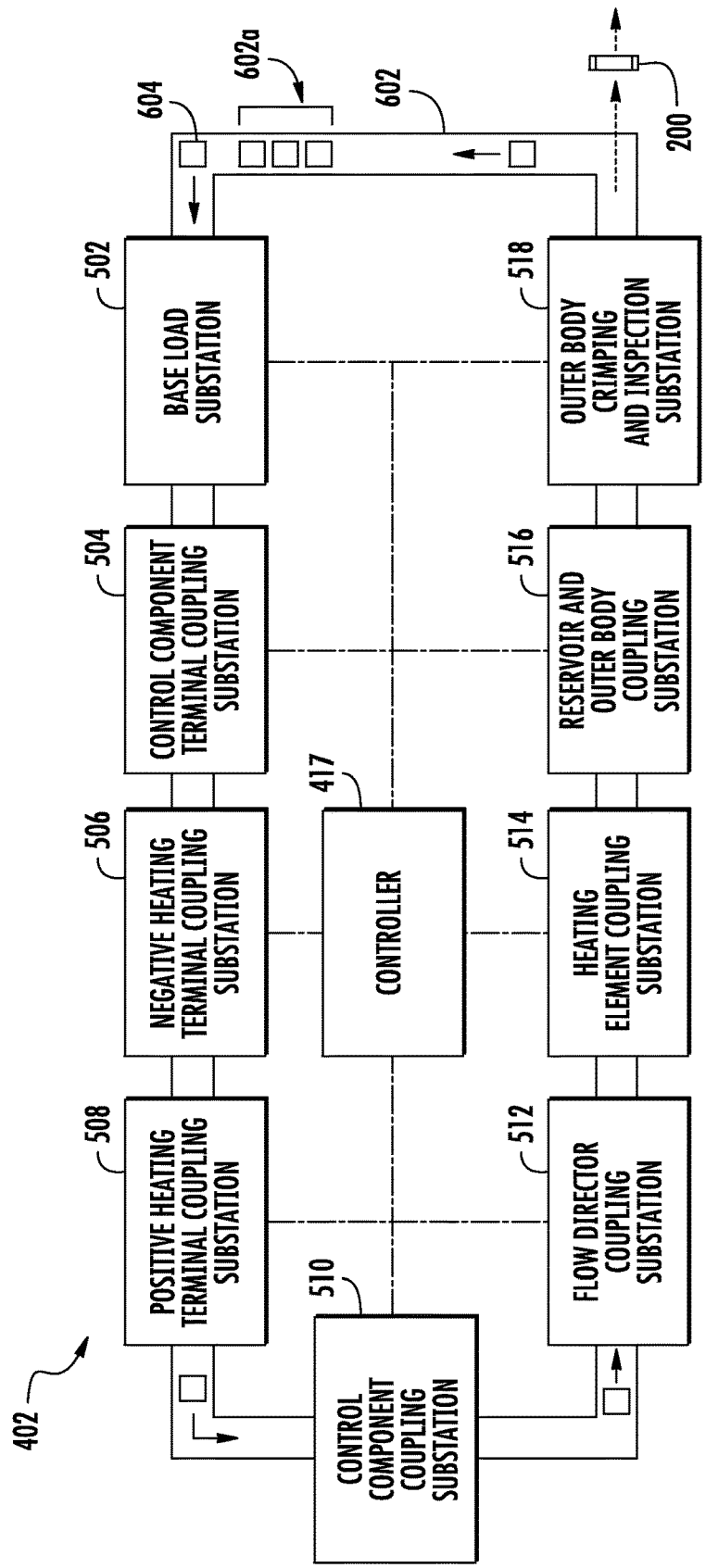
Figure 5:
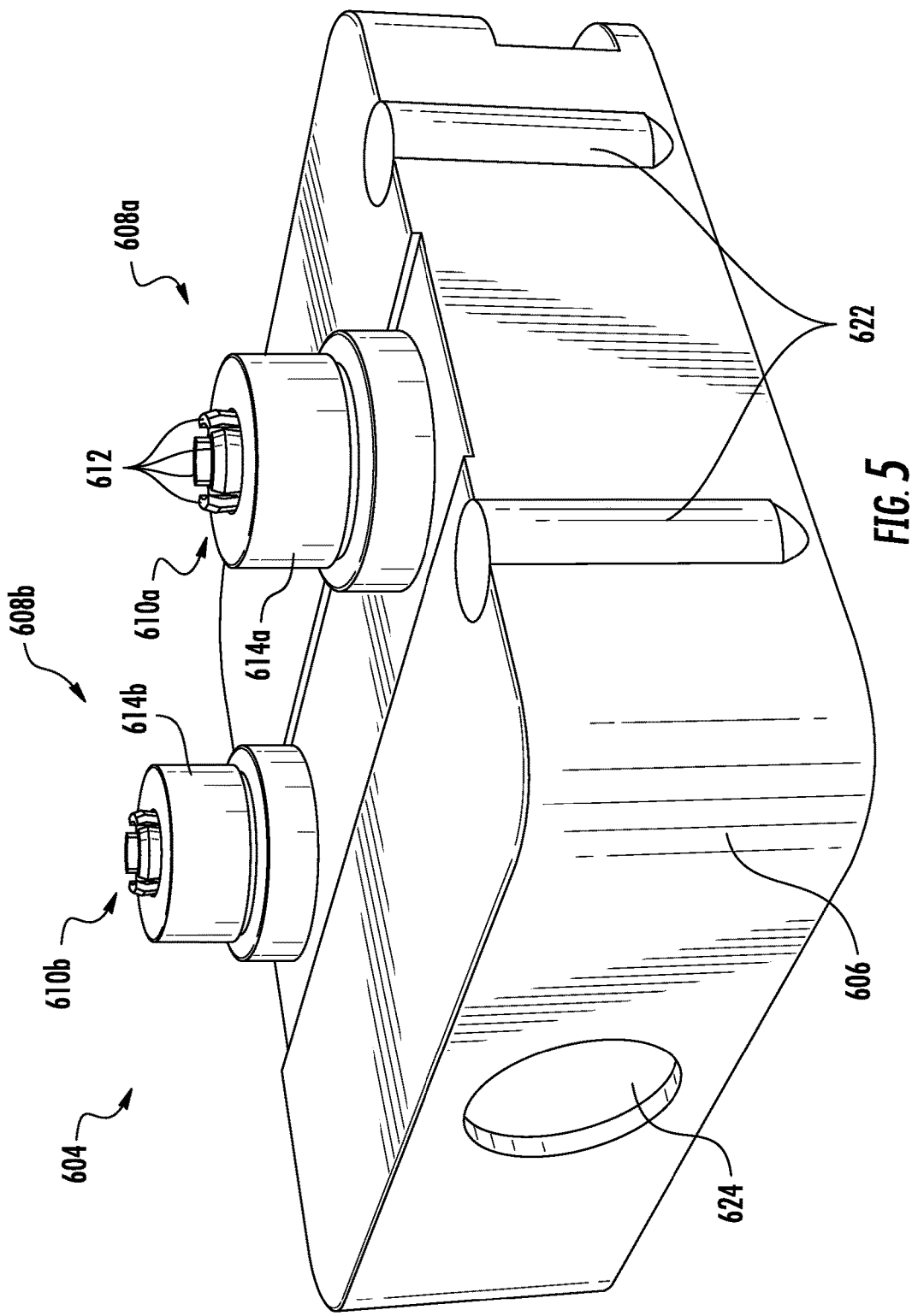
Figure 6:
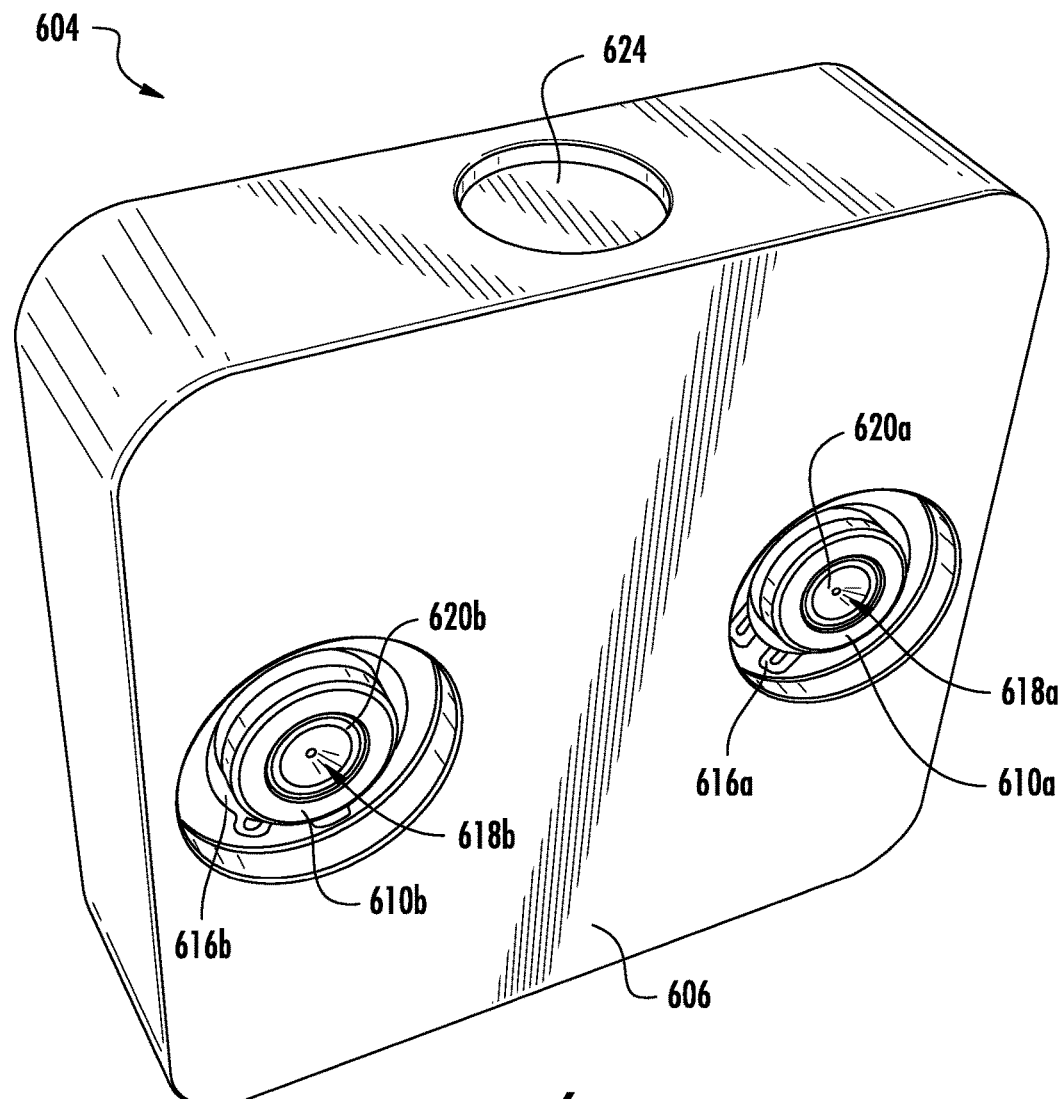
Figure 7:
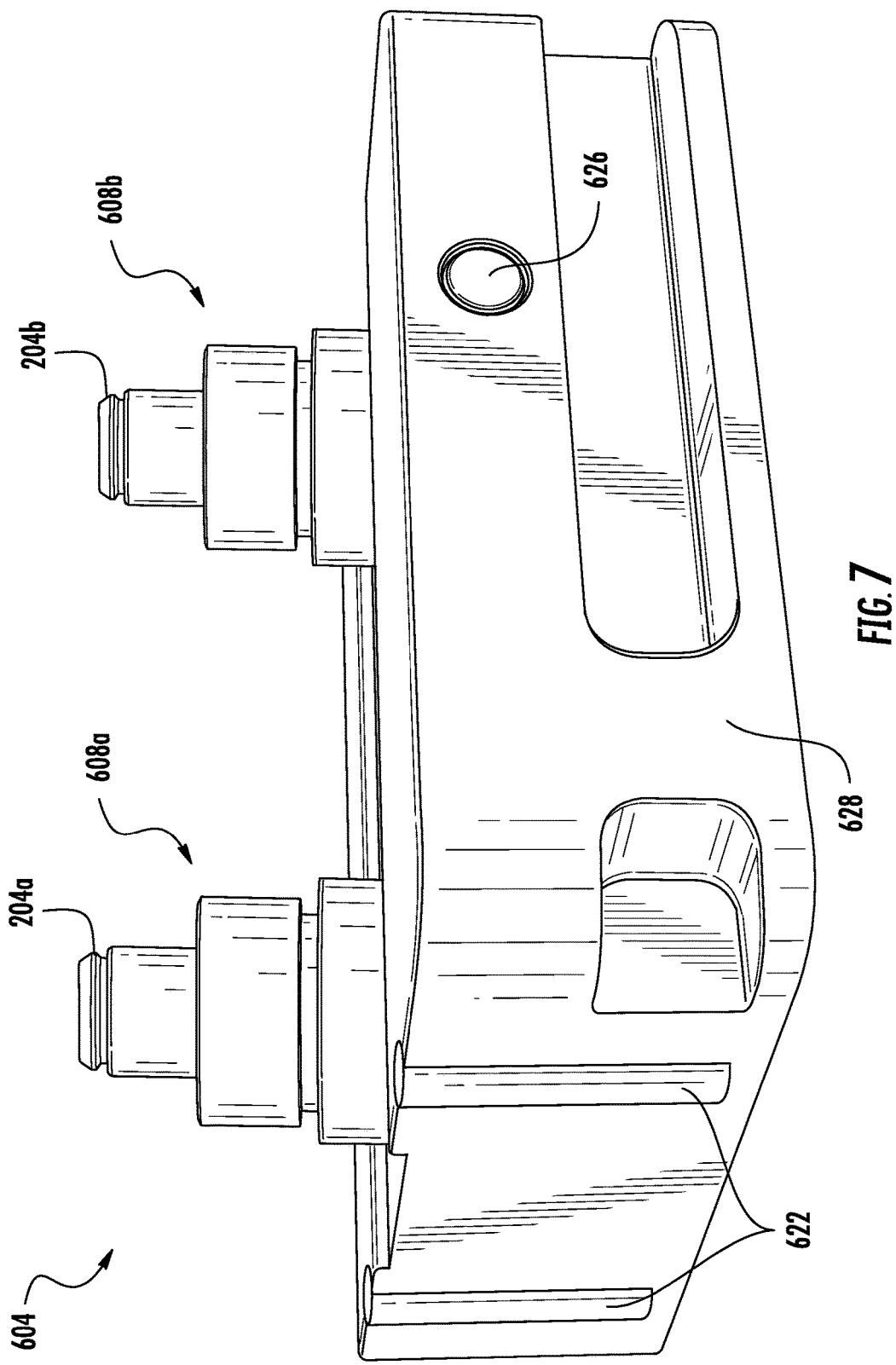
Figure 8:
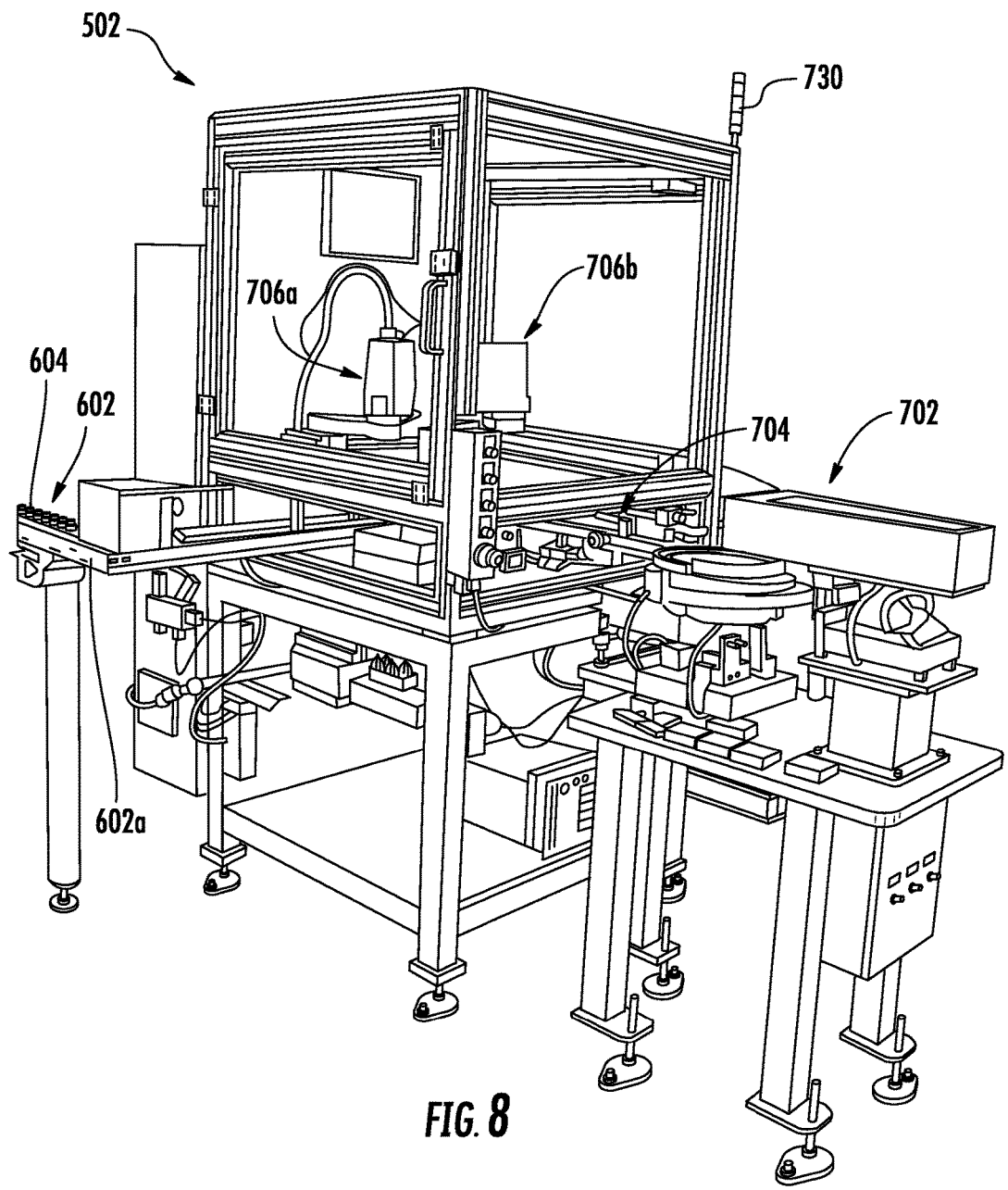
Figure 9:
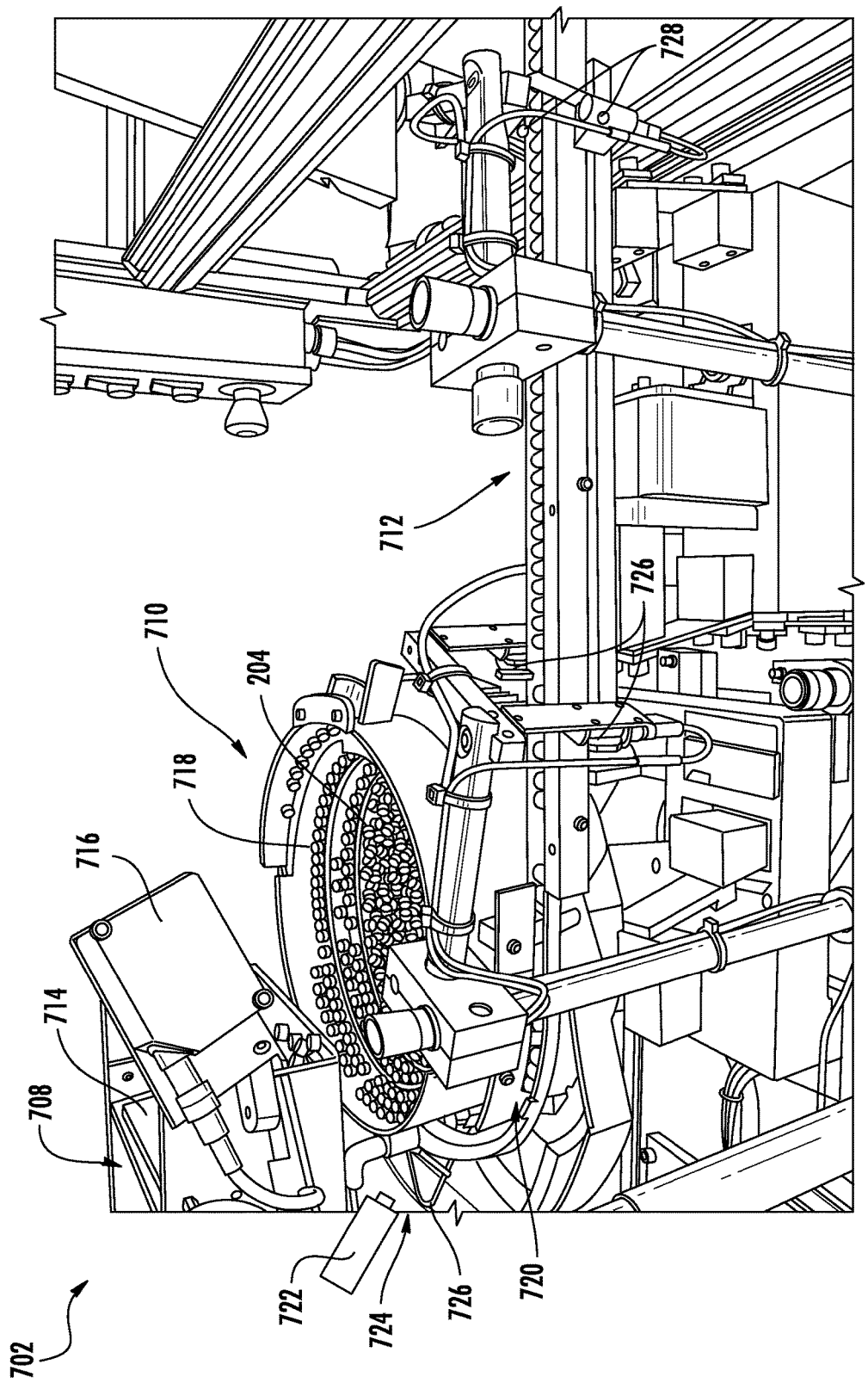
Figure 10:
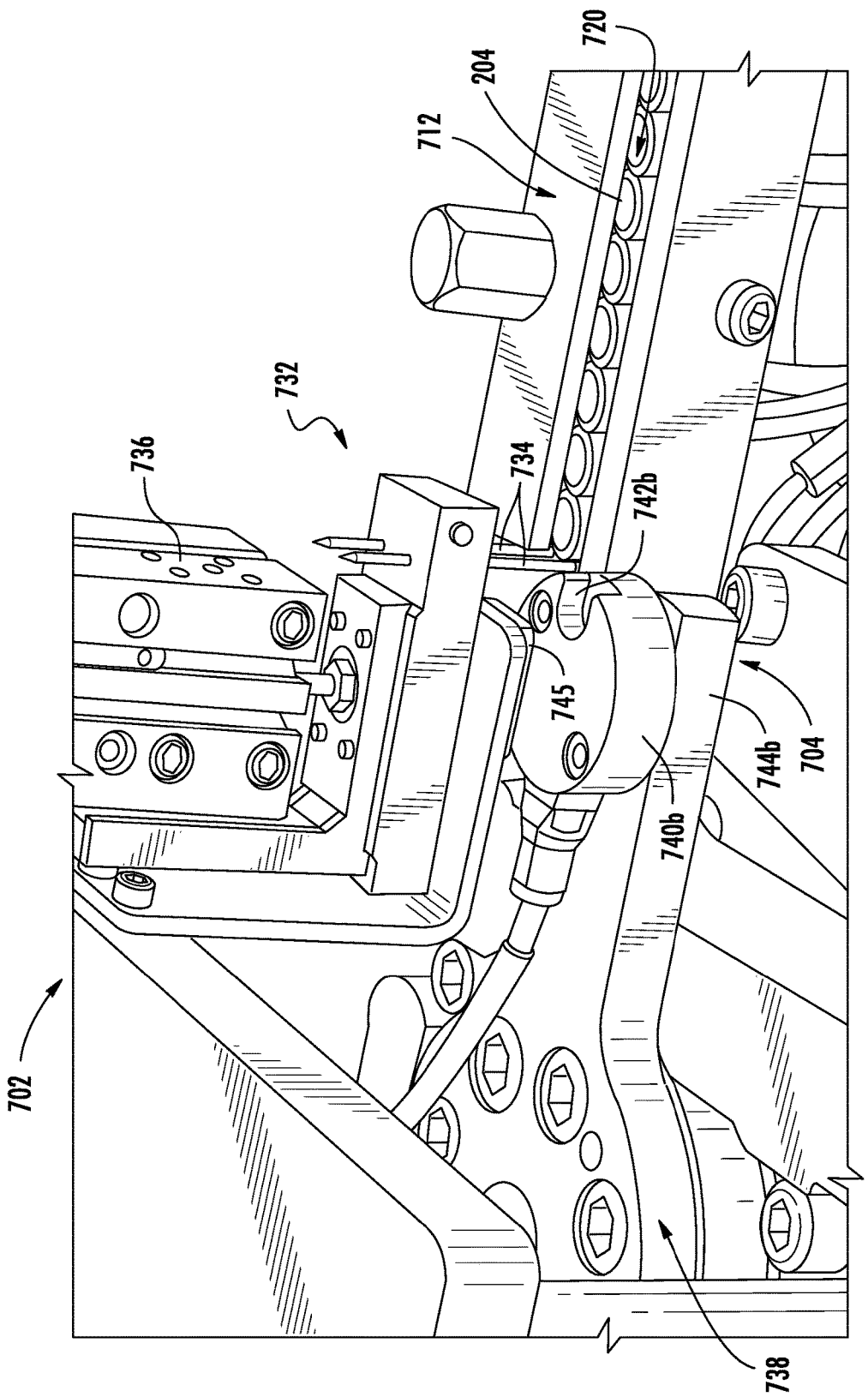
Figure 11:
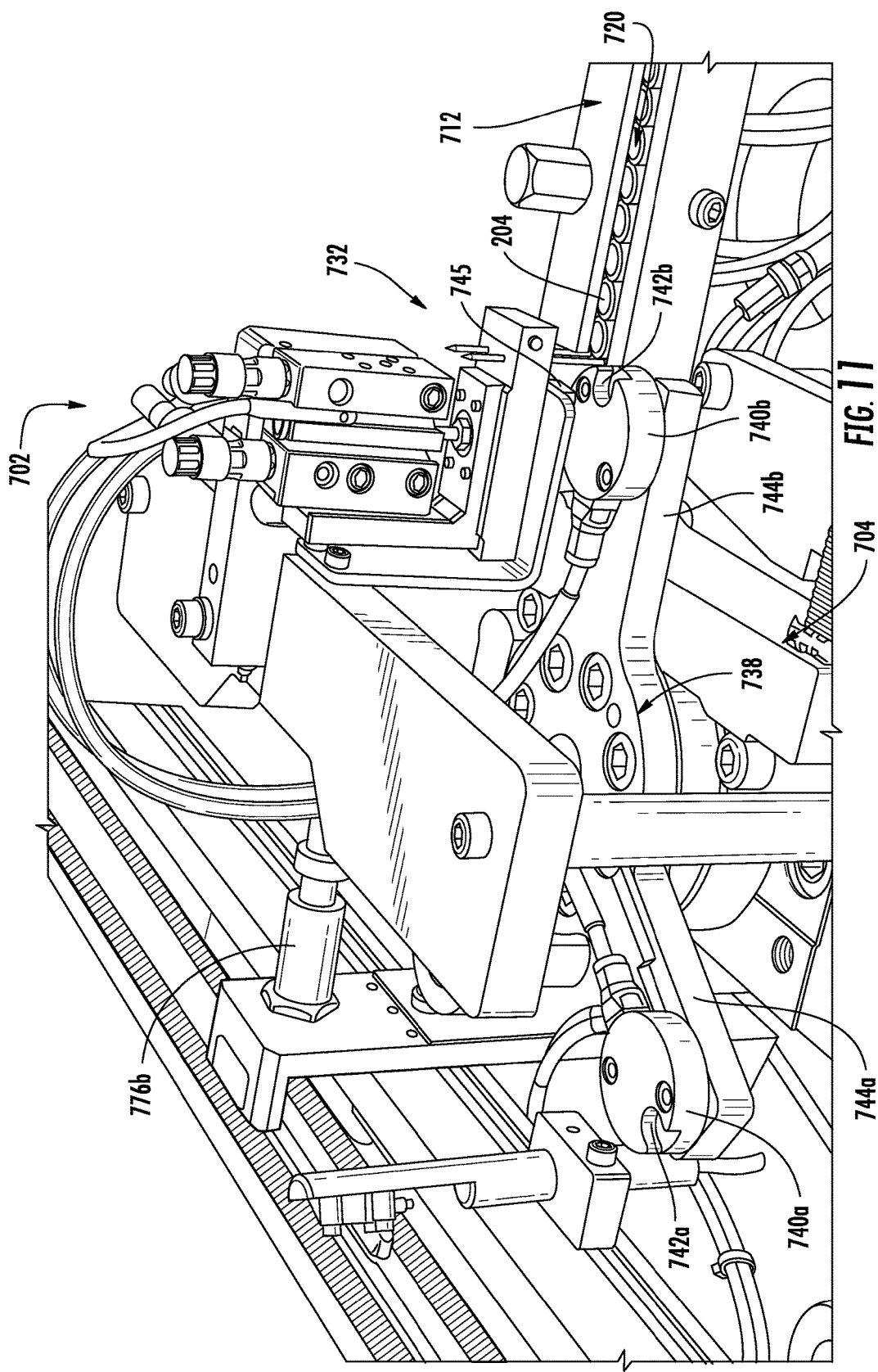
Figure 12:
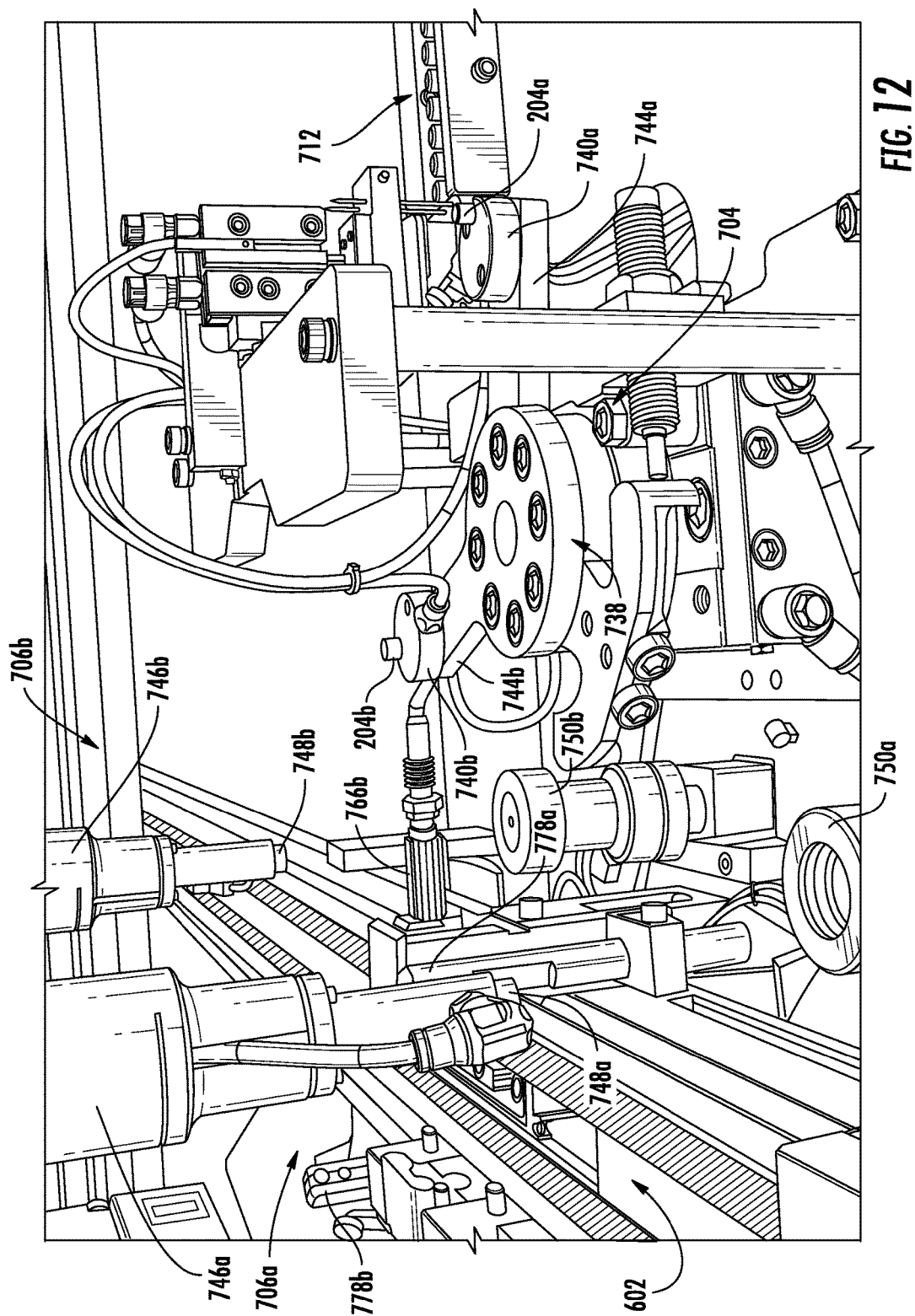
Figure 13:
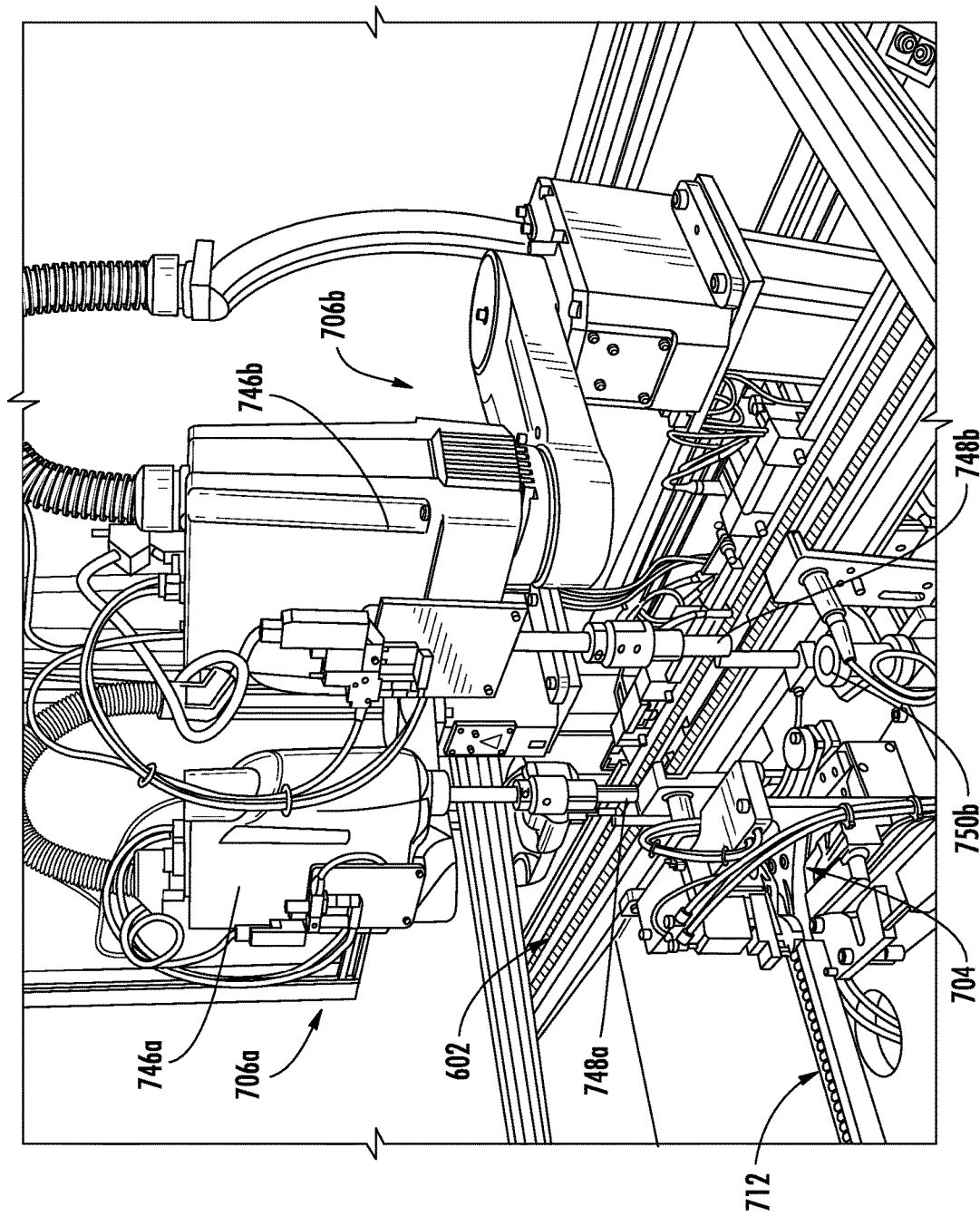
Figure 14:
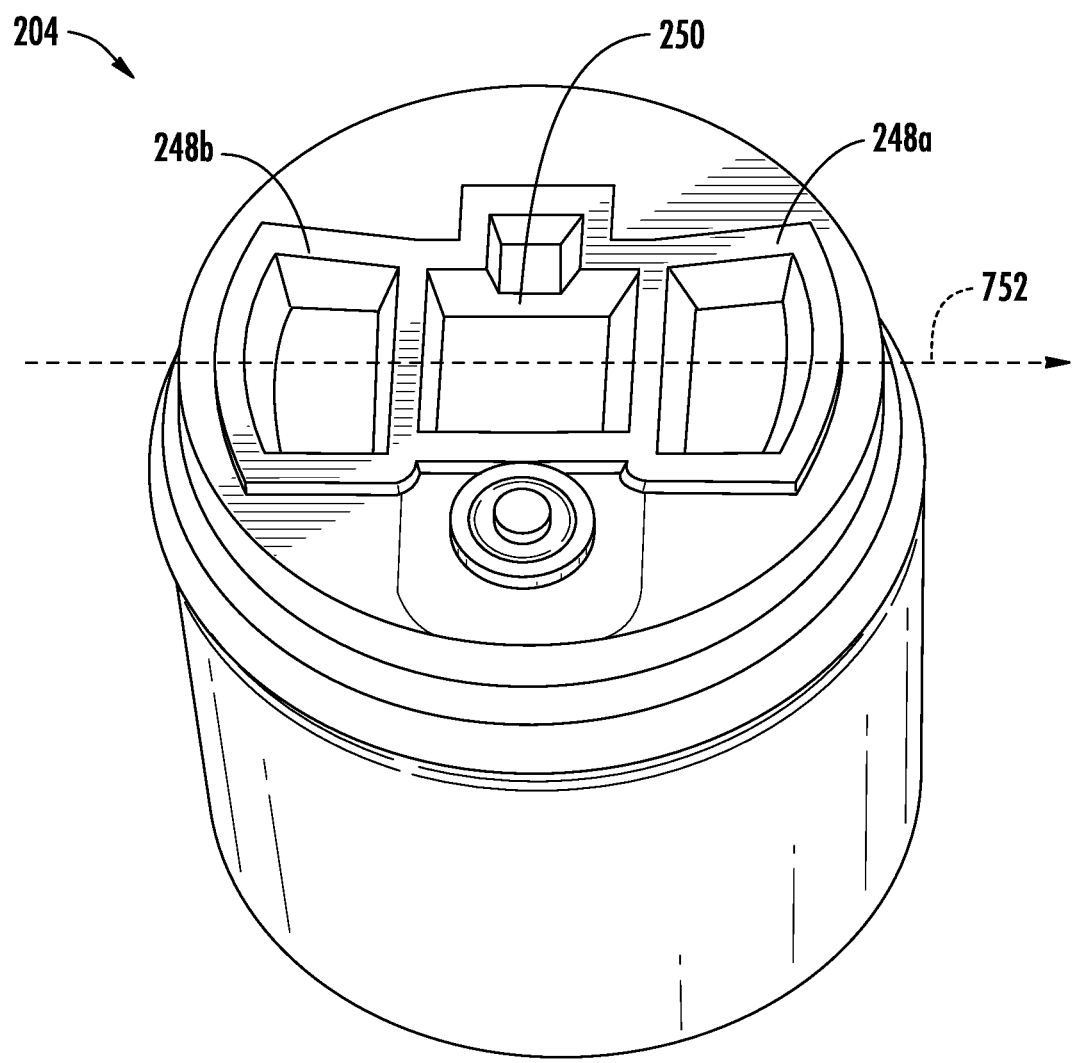
Figure 15:
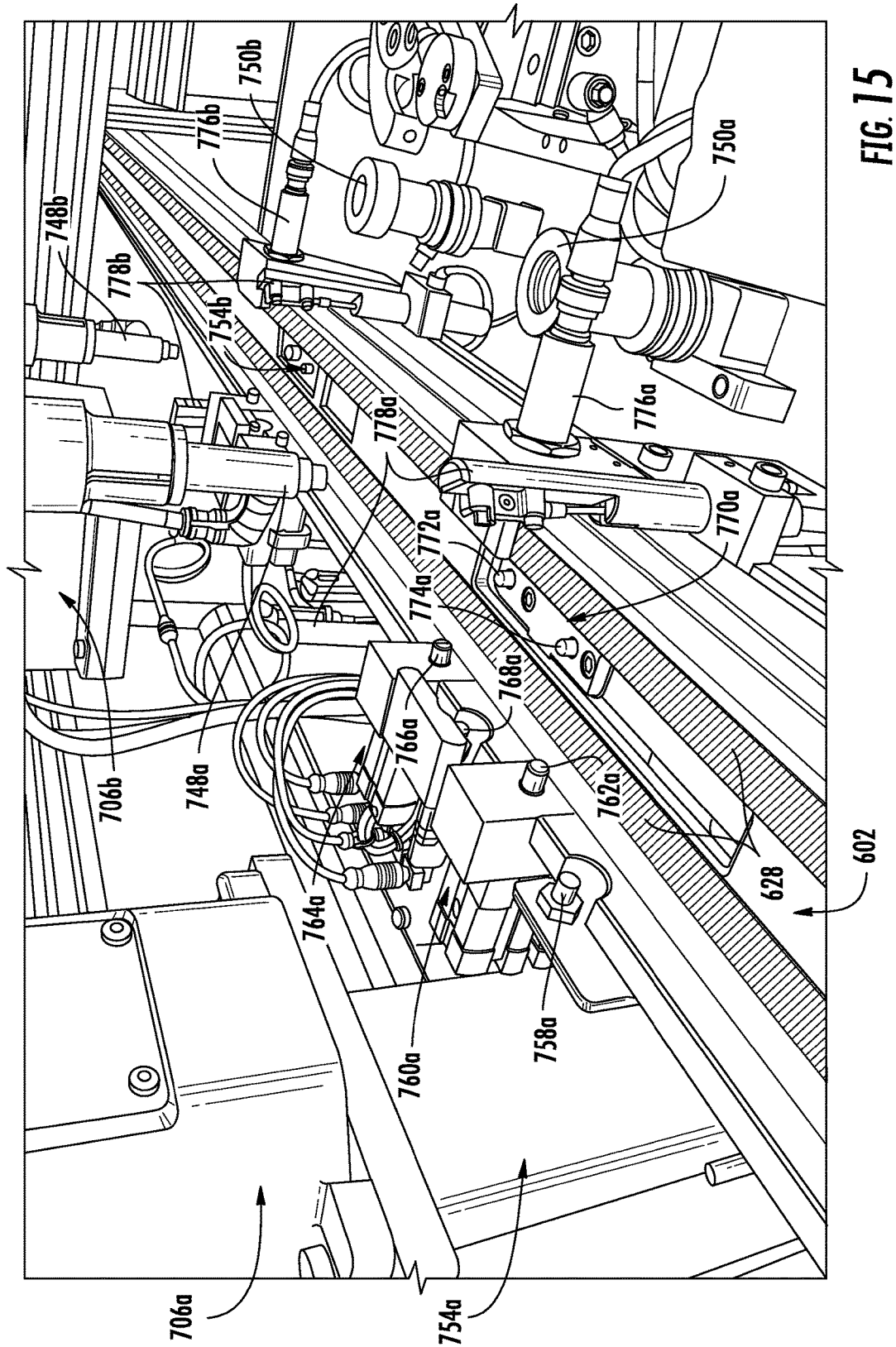
Figure 16:
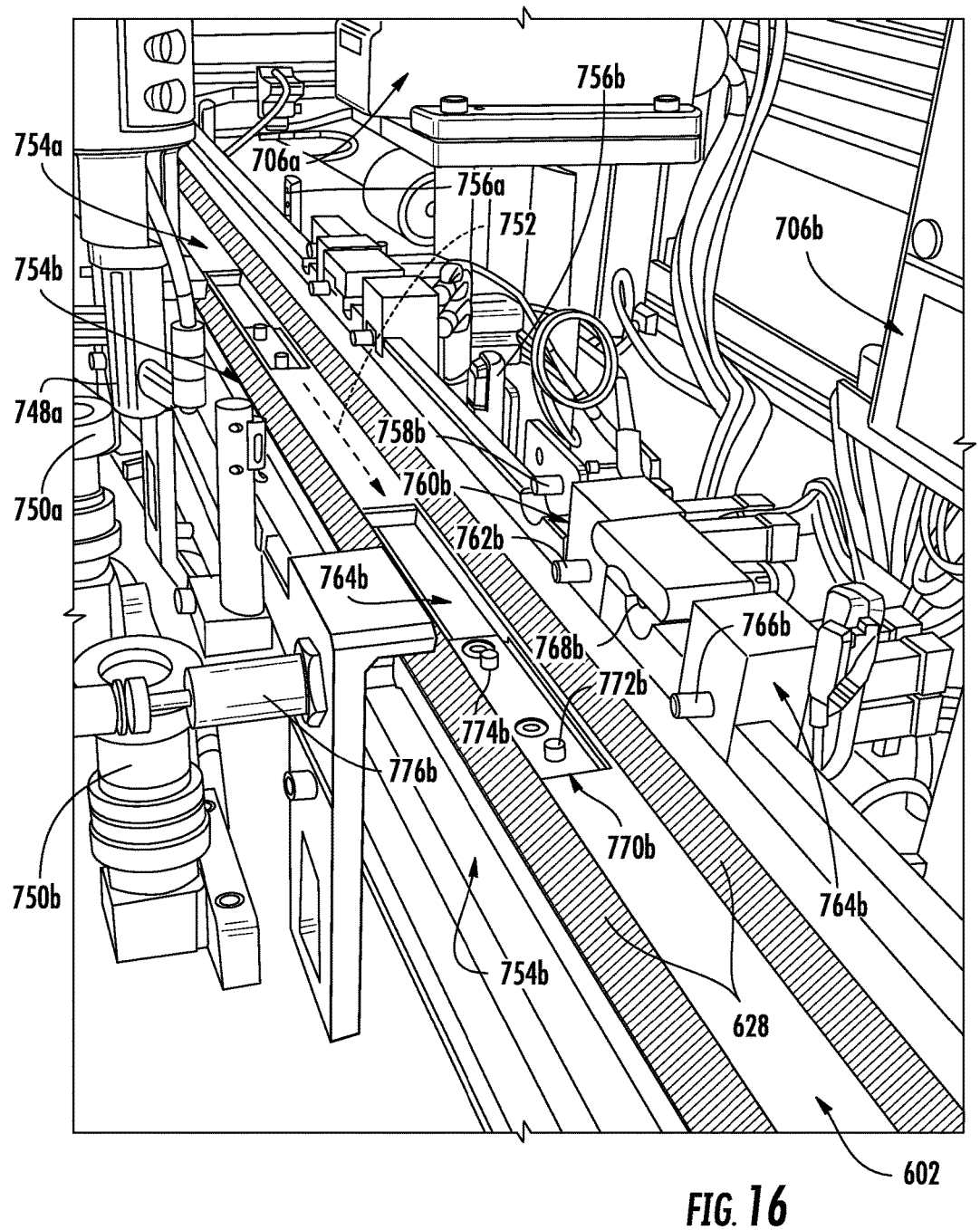
Figure 17:
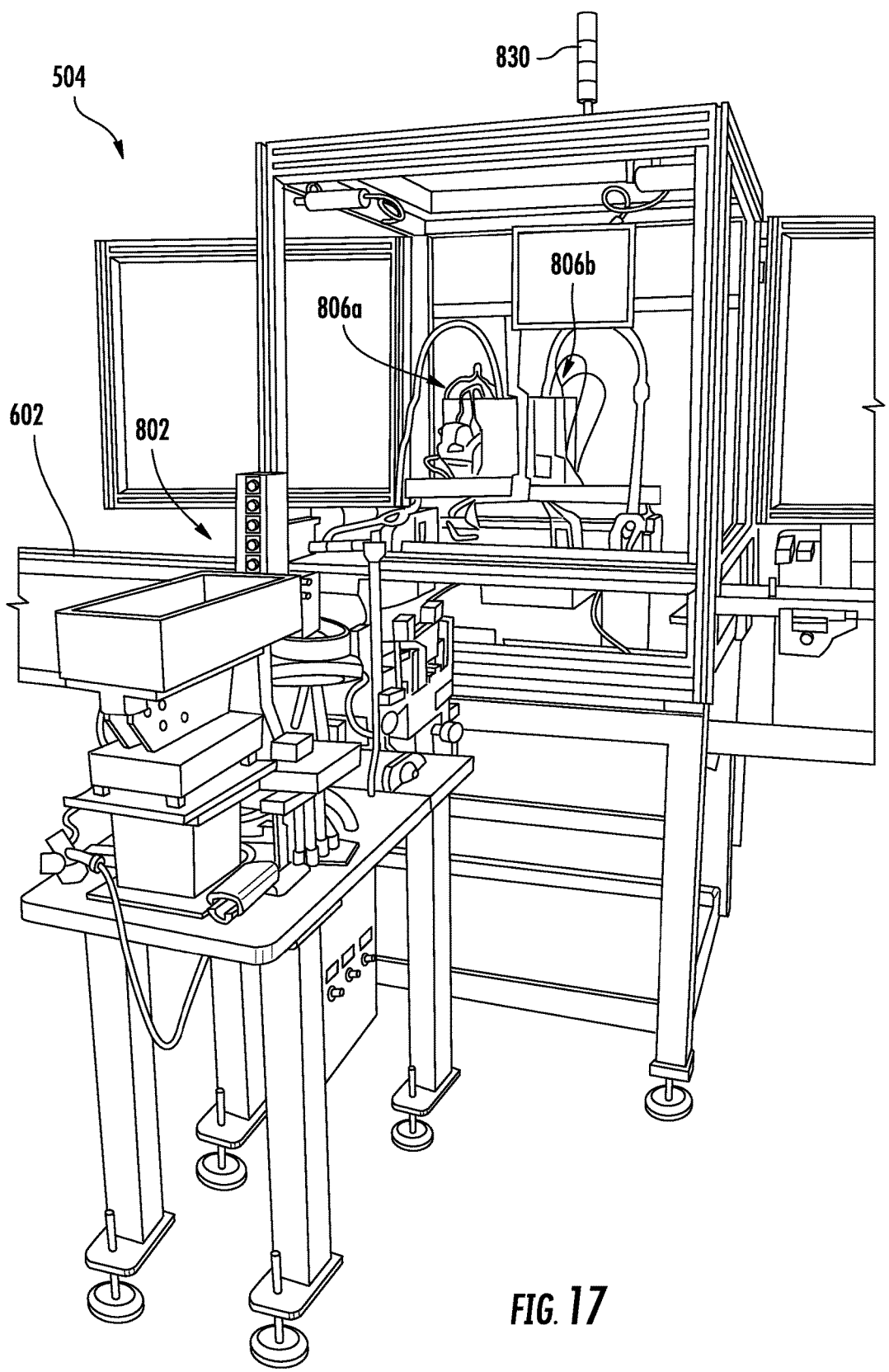
Figure 18:
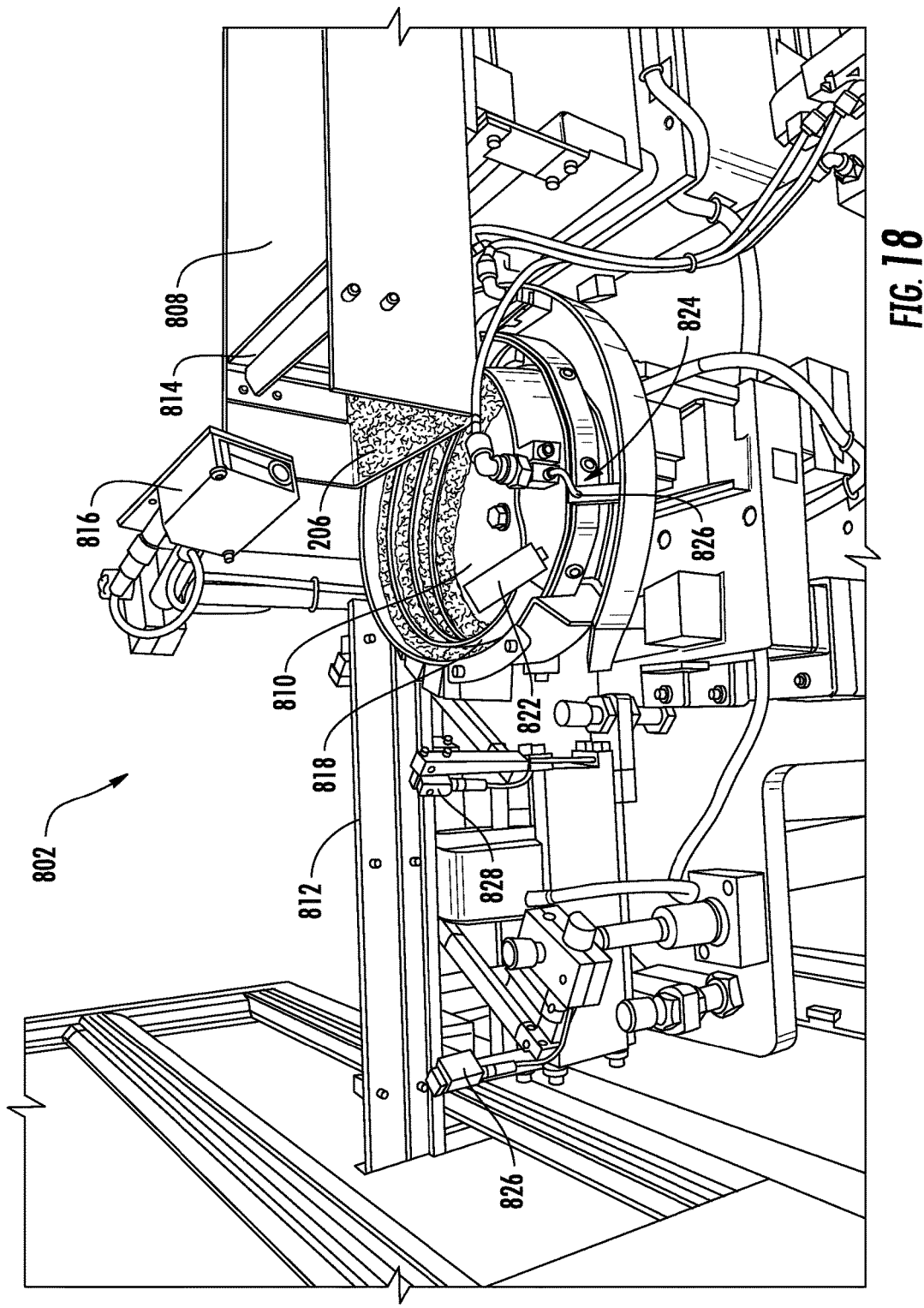
Figure 19:
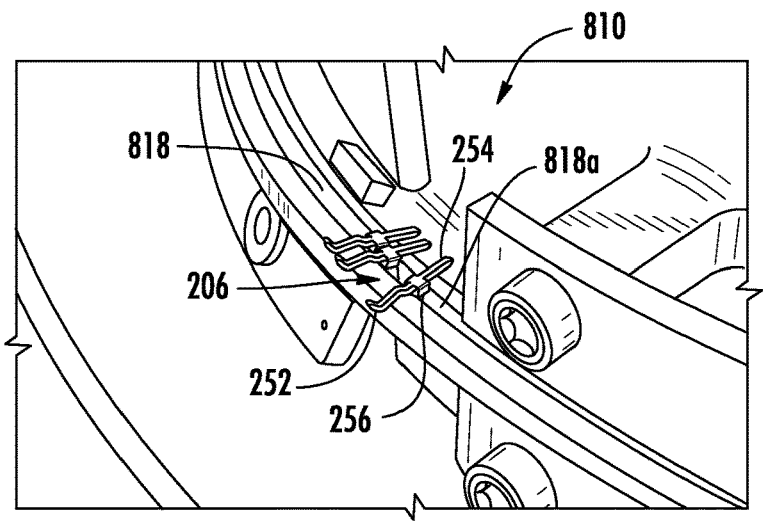
Figure 20:
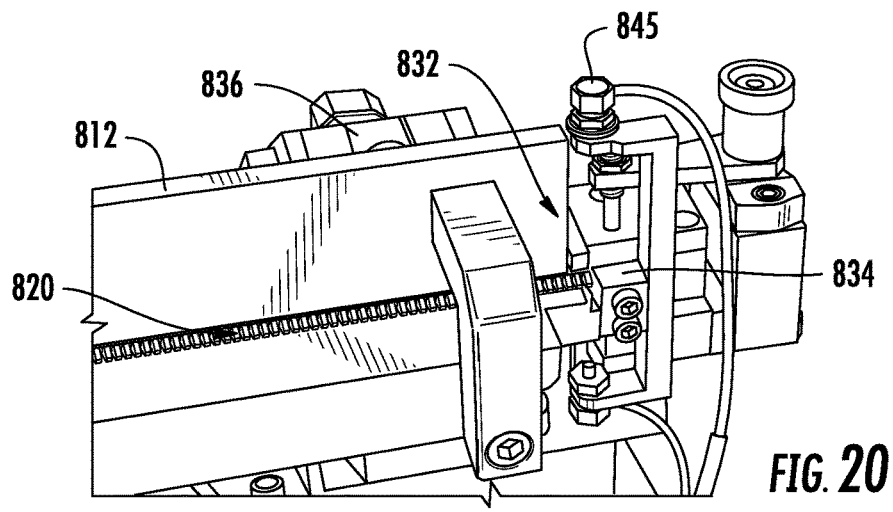
Figure 21:
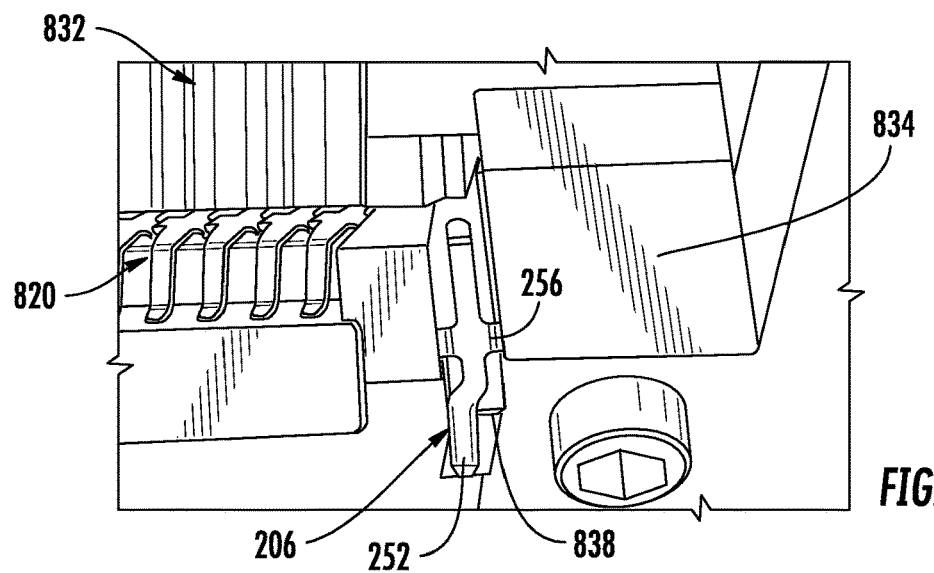
Figure 22:
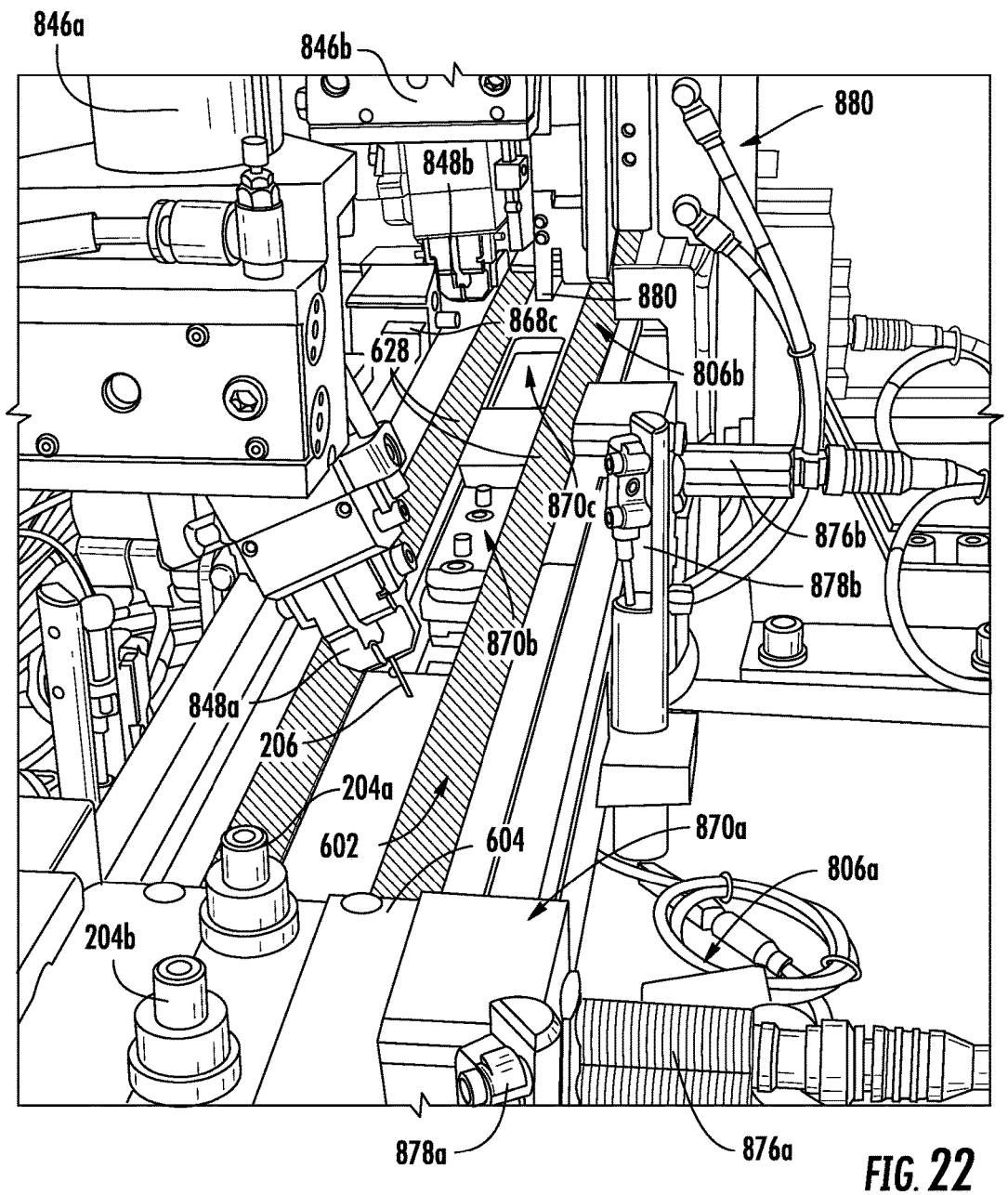
Figure 23:
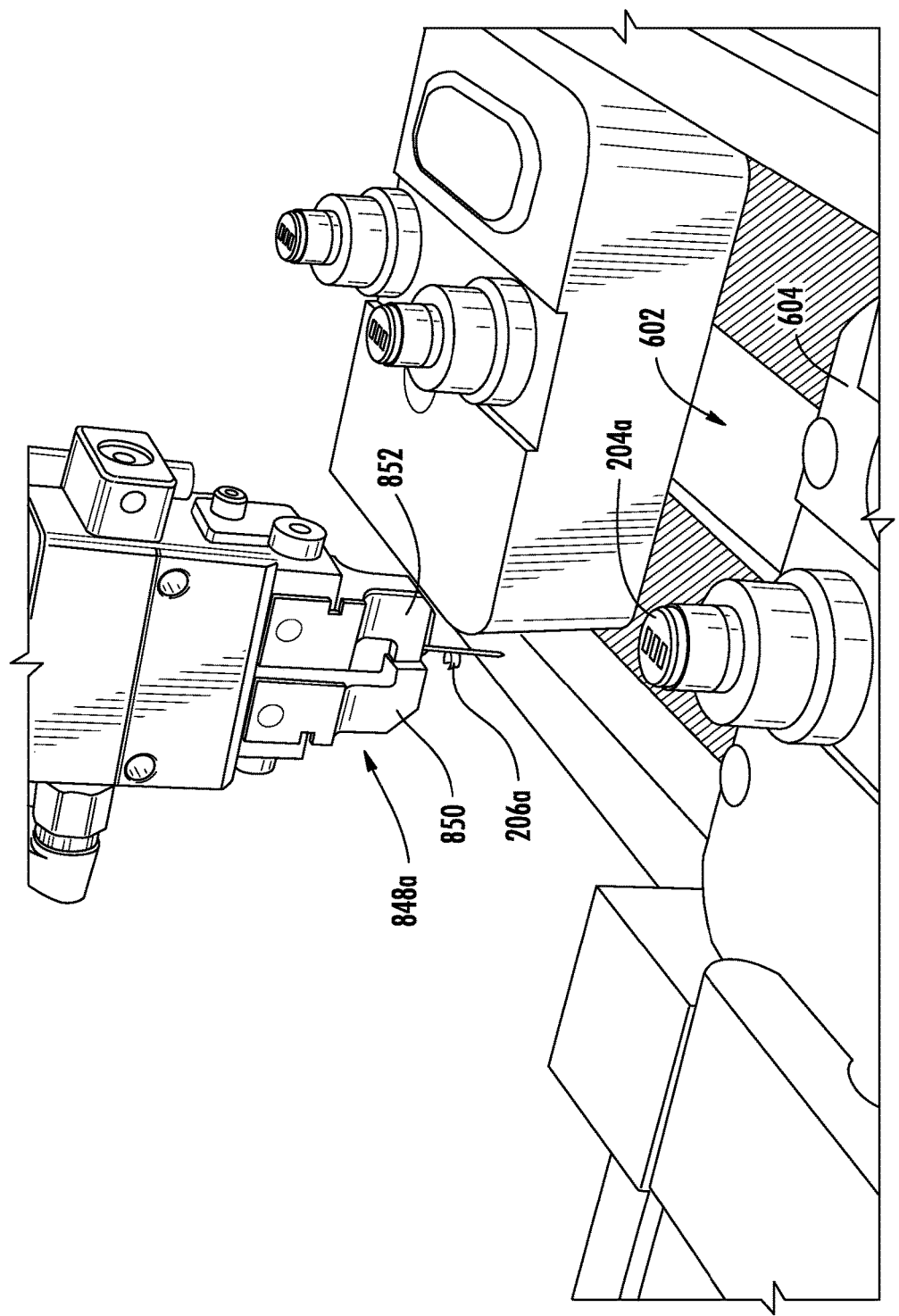
Figure 24:
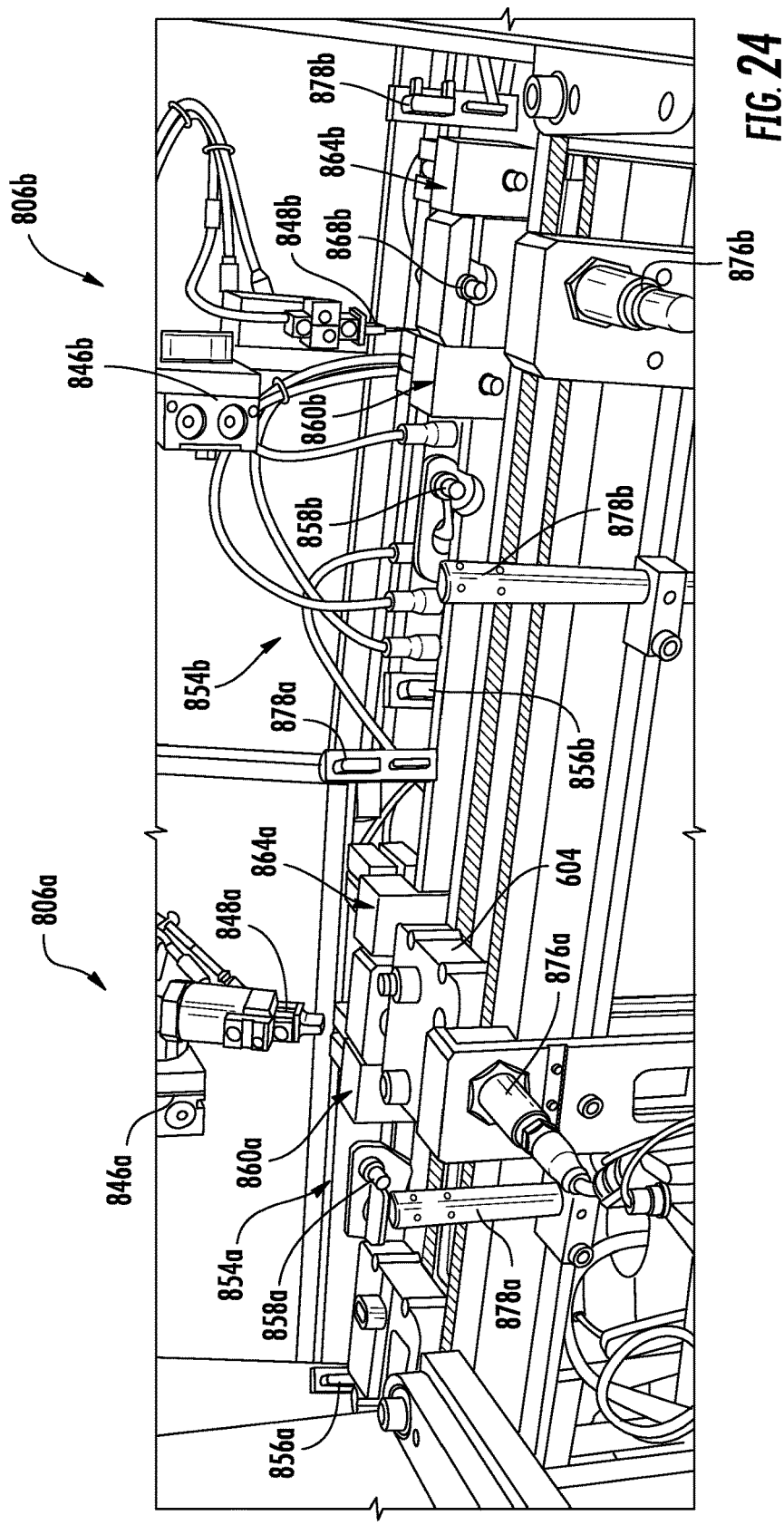
Figure 25:
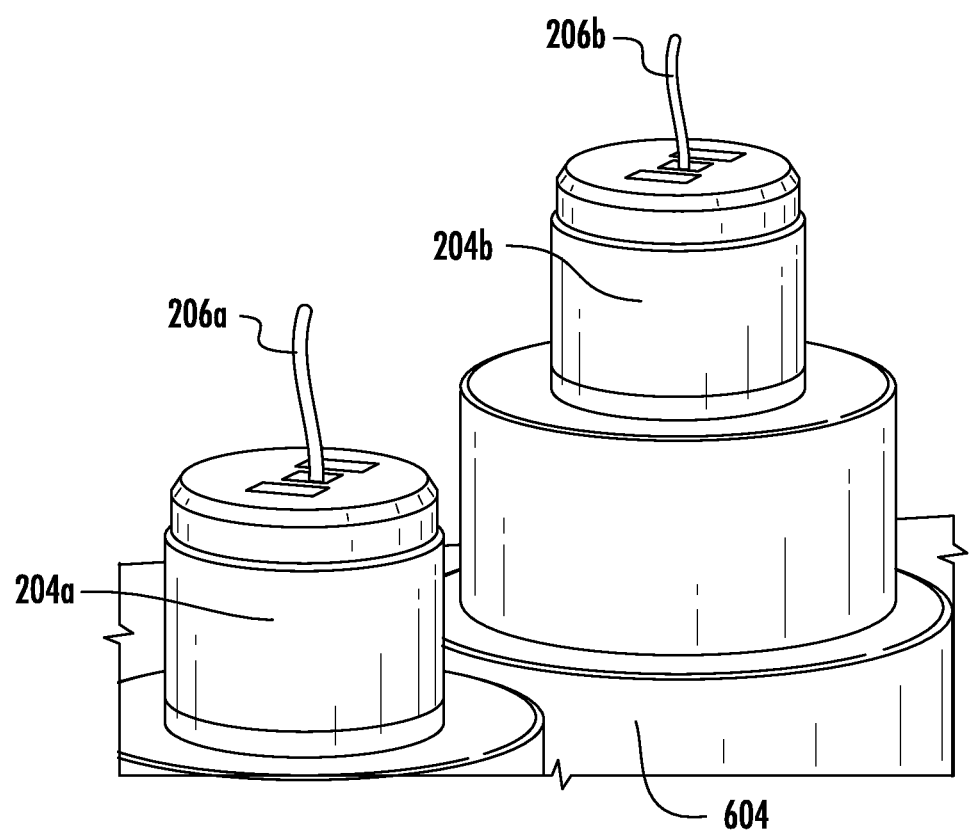
Figure 26:
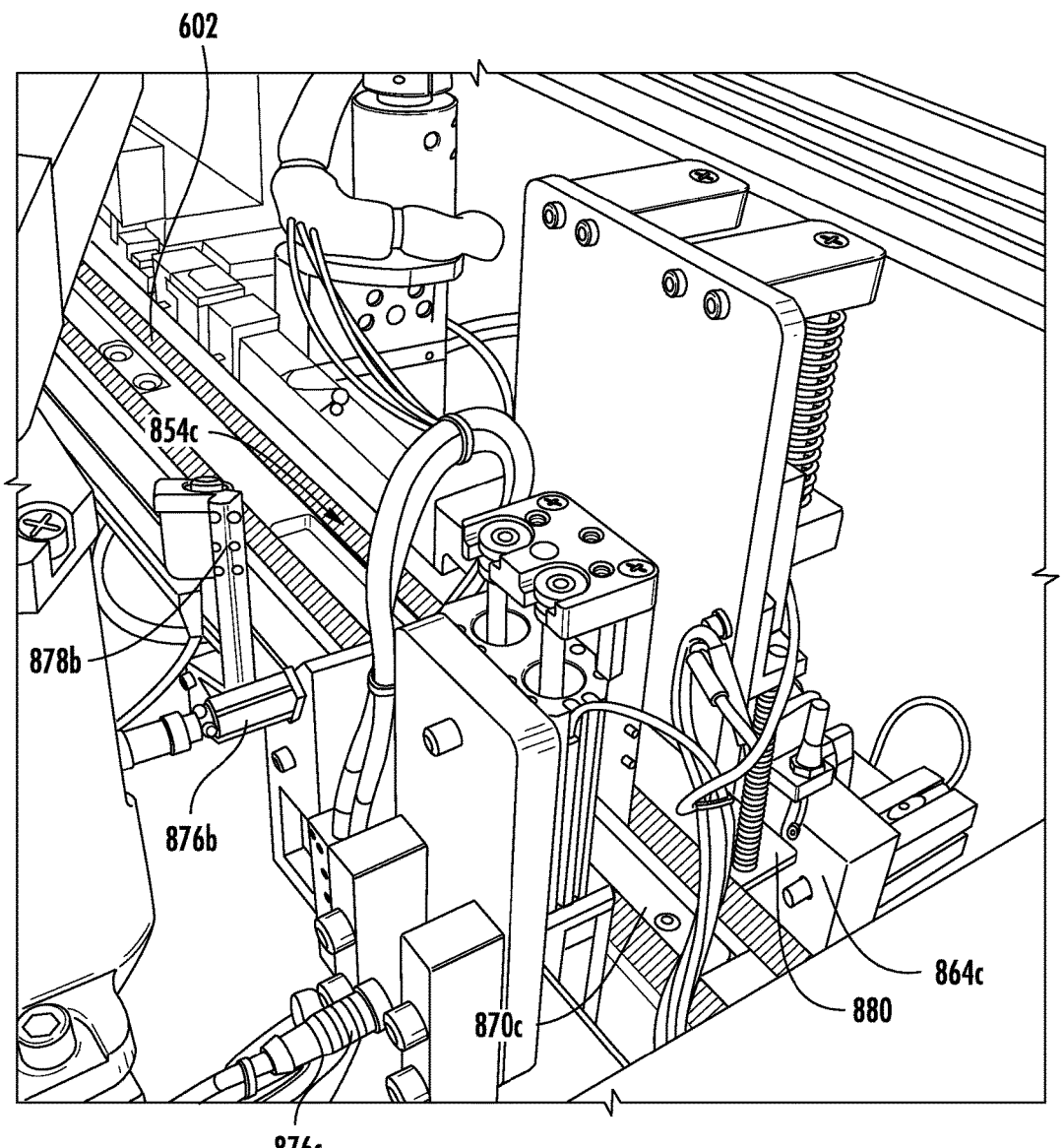
Figure 27:
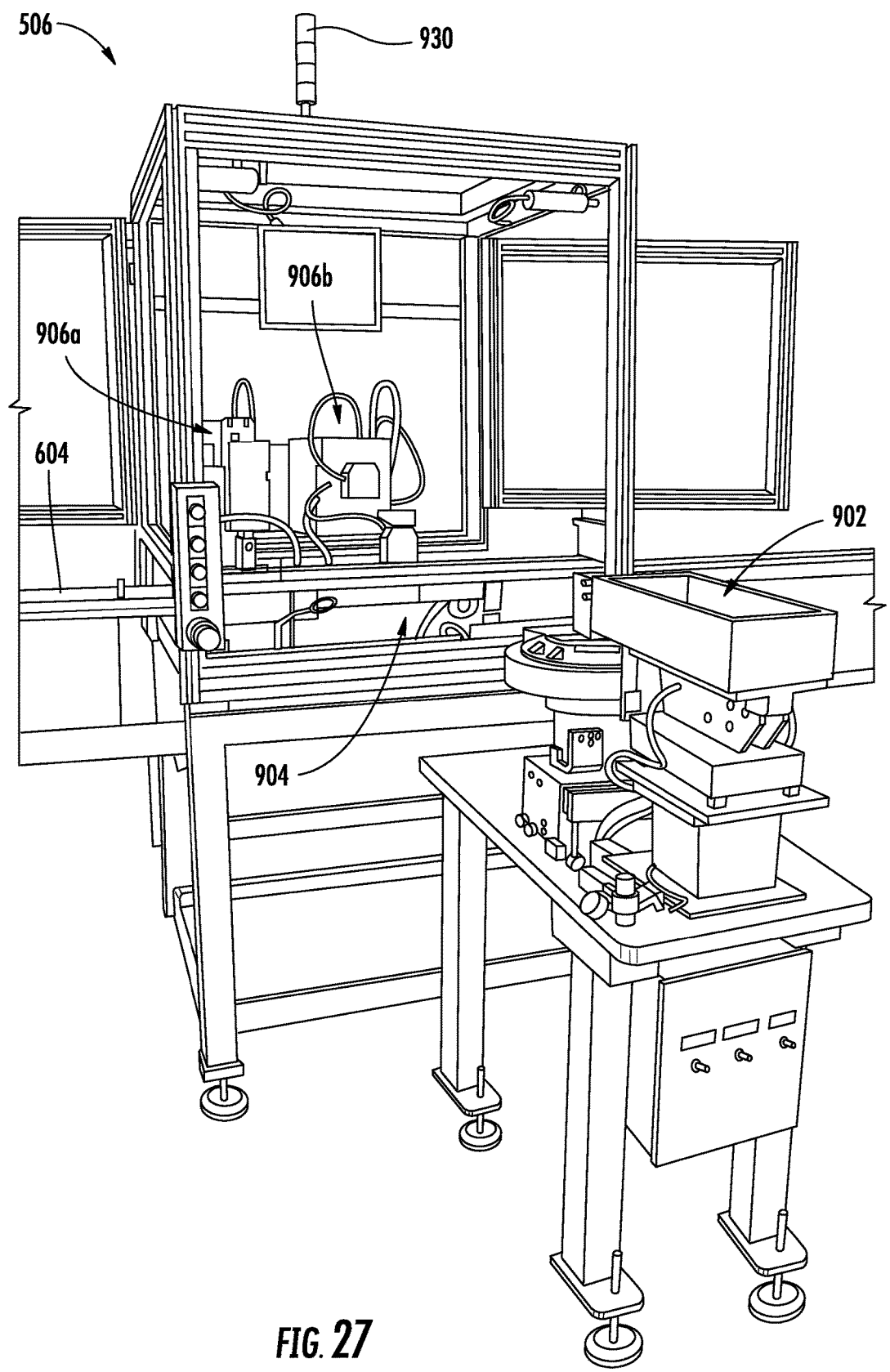
Figure 28:
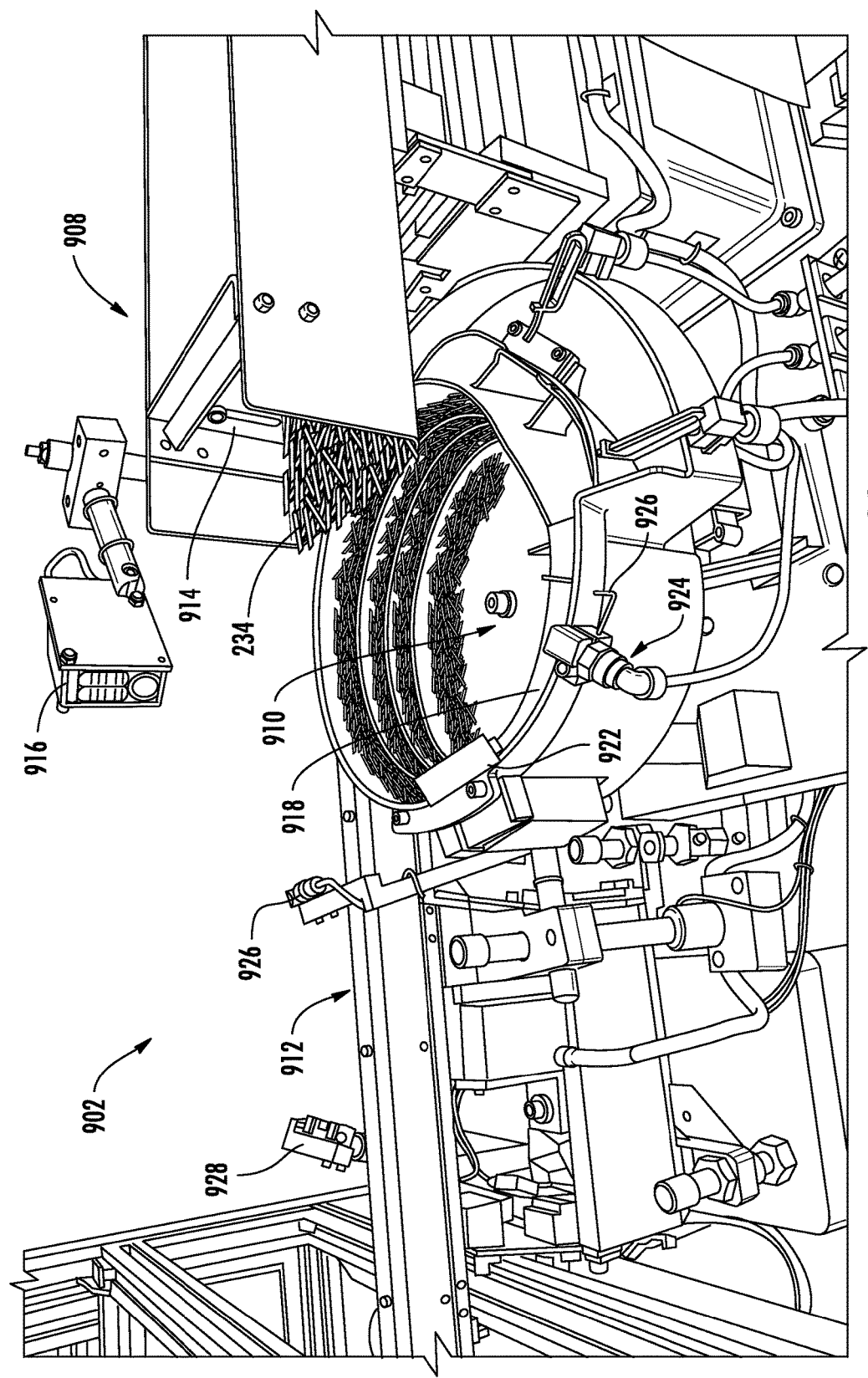
Figure 29:
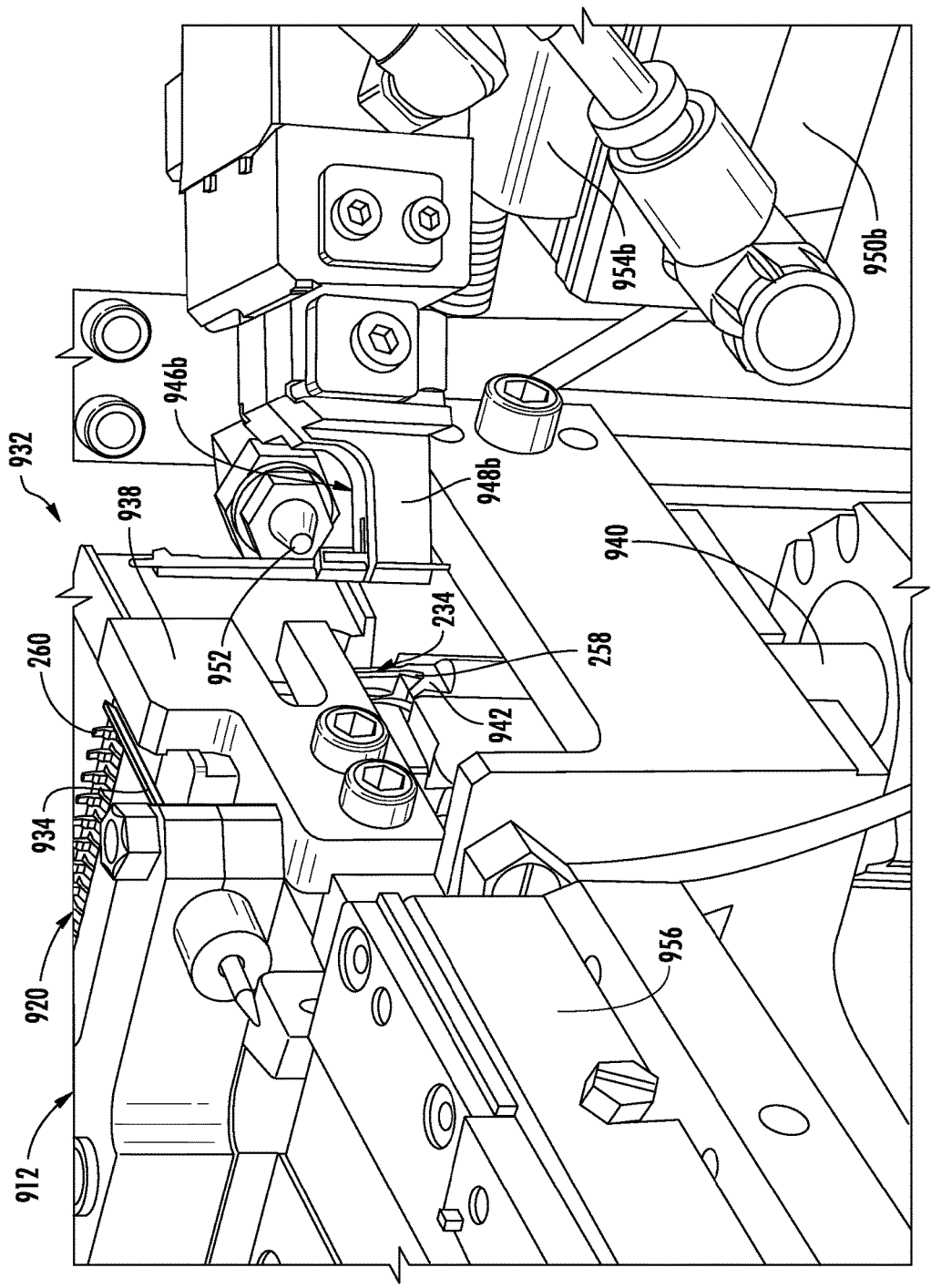
Figure 30:
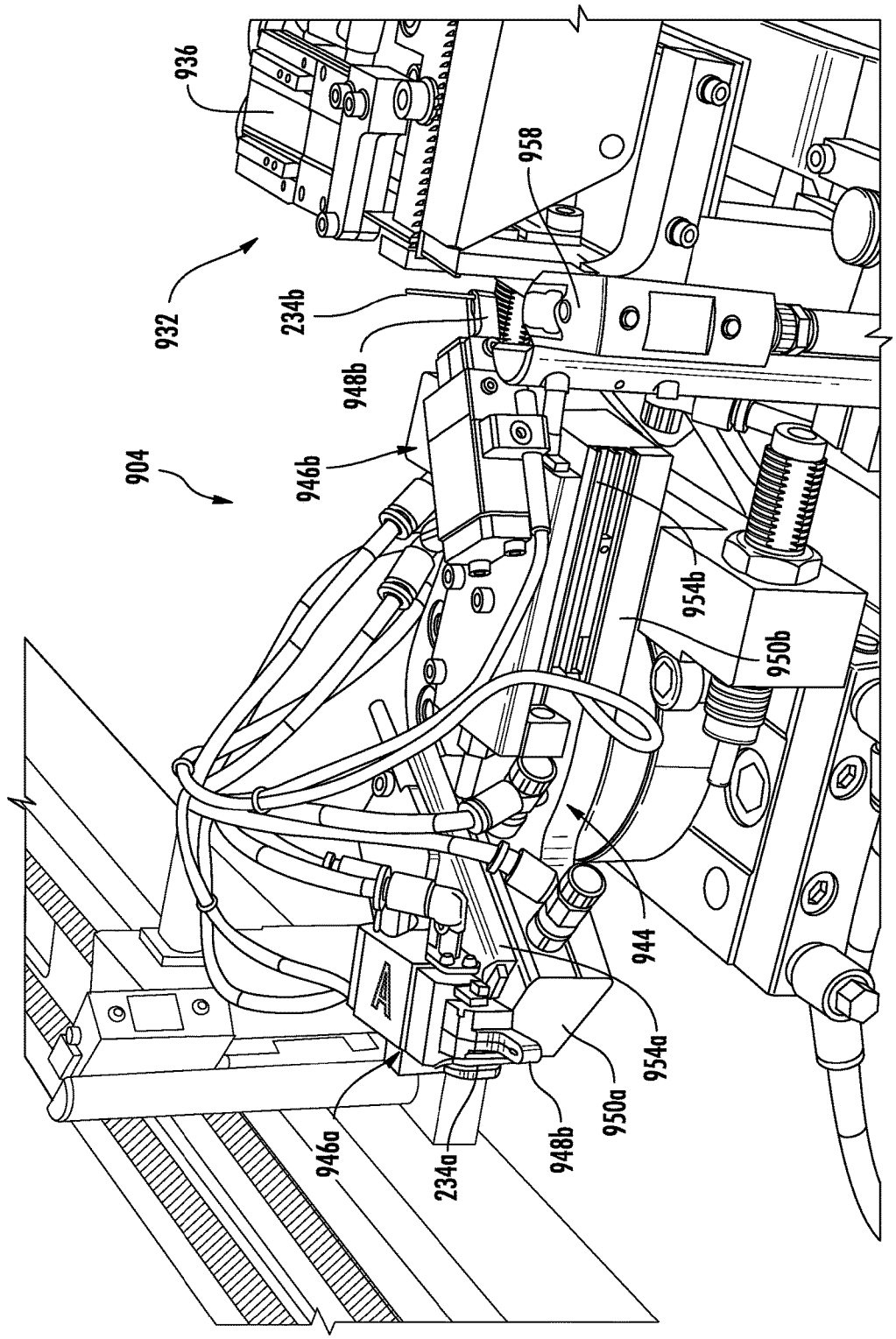
Figure 31:
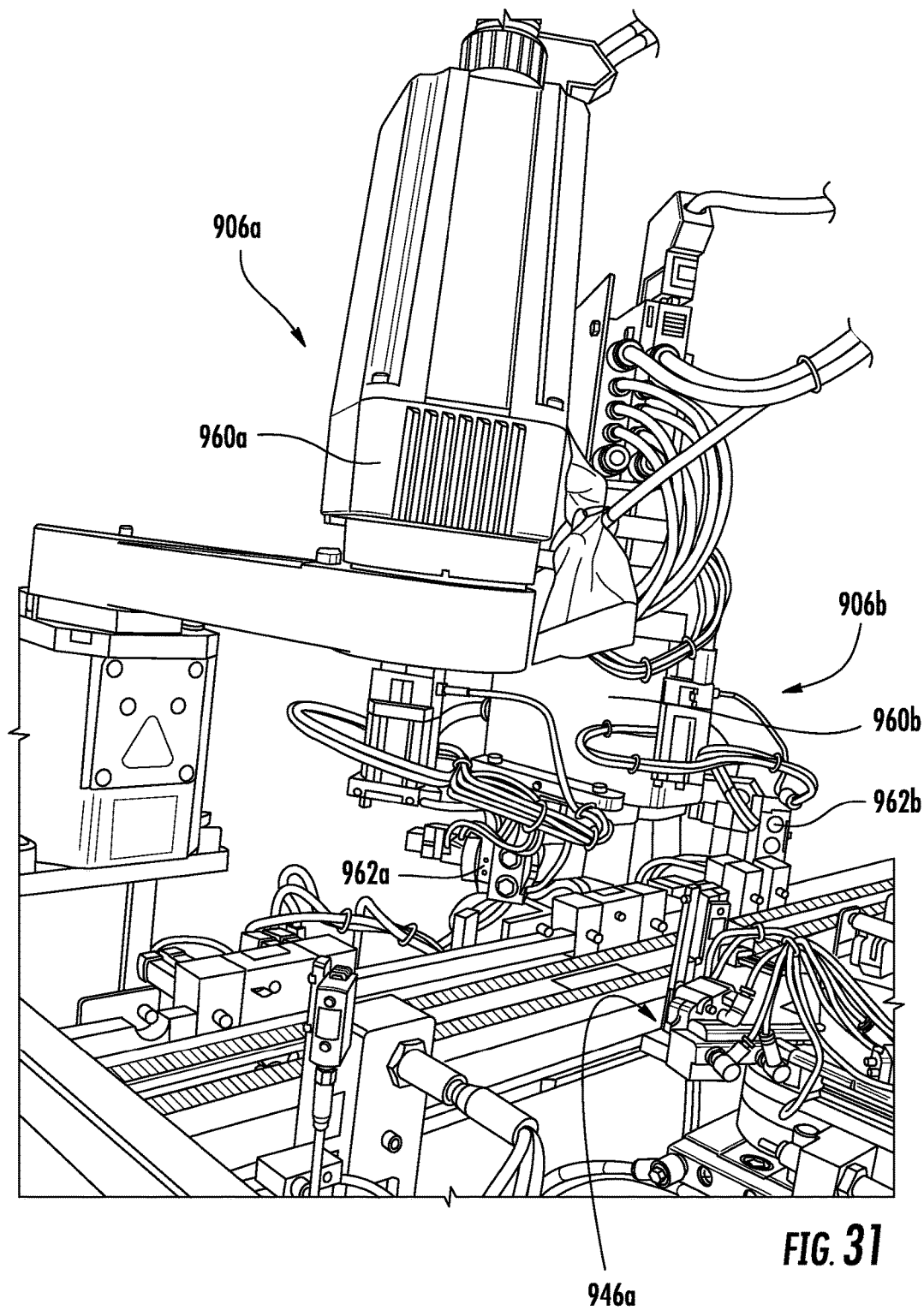
Figure 32:
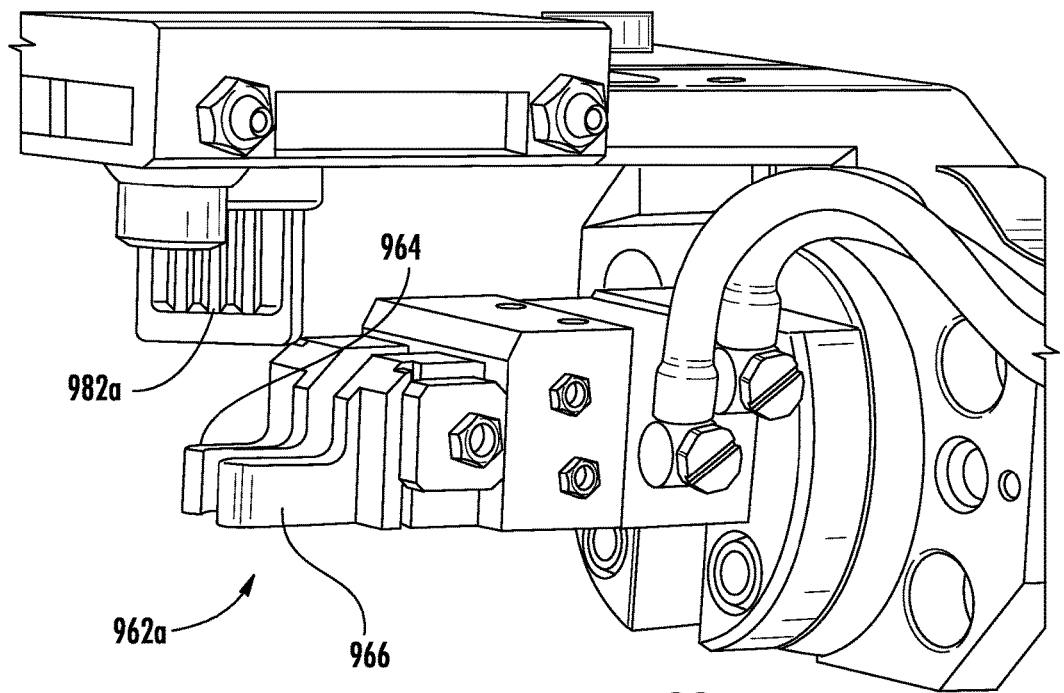
Figure 33:
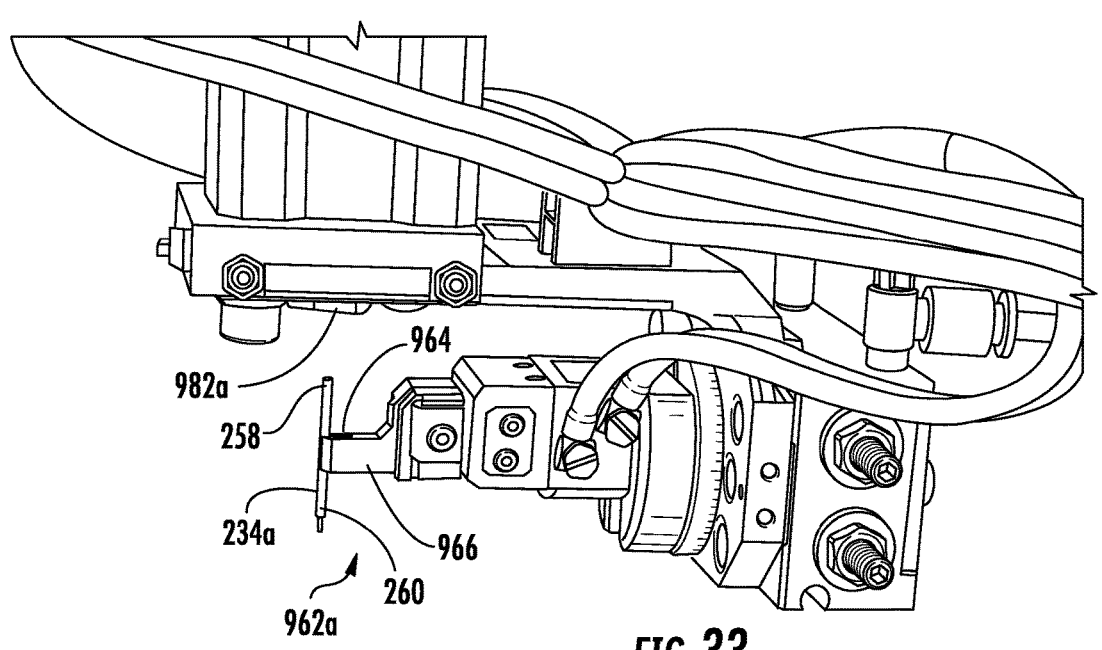
Figure 34:
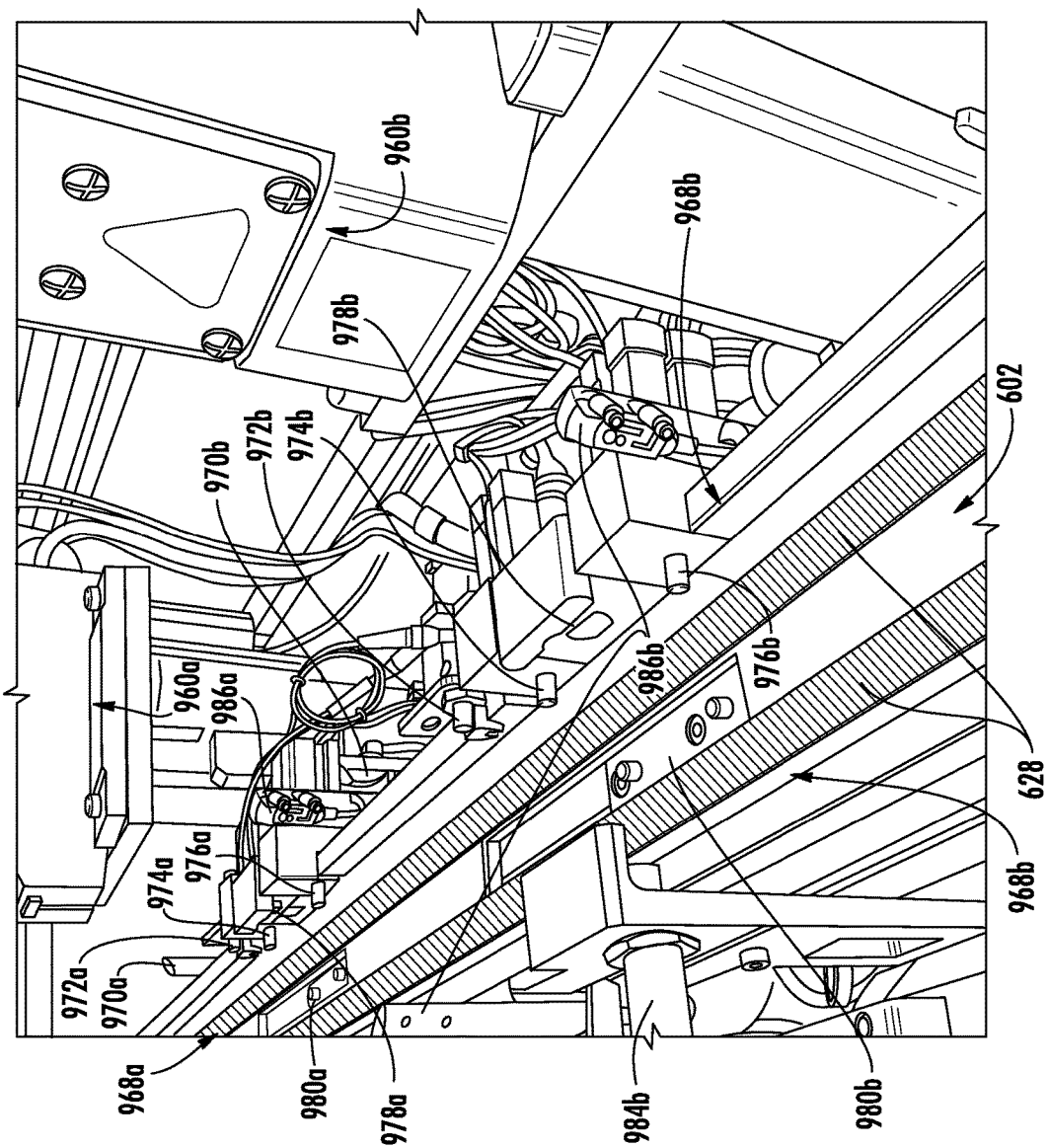
Figure 35:
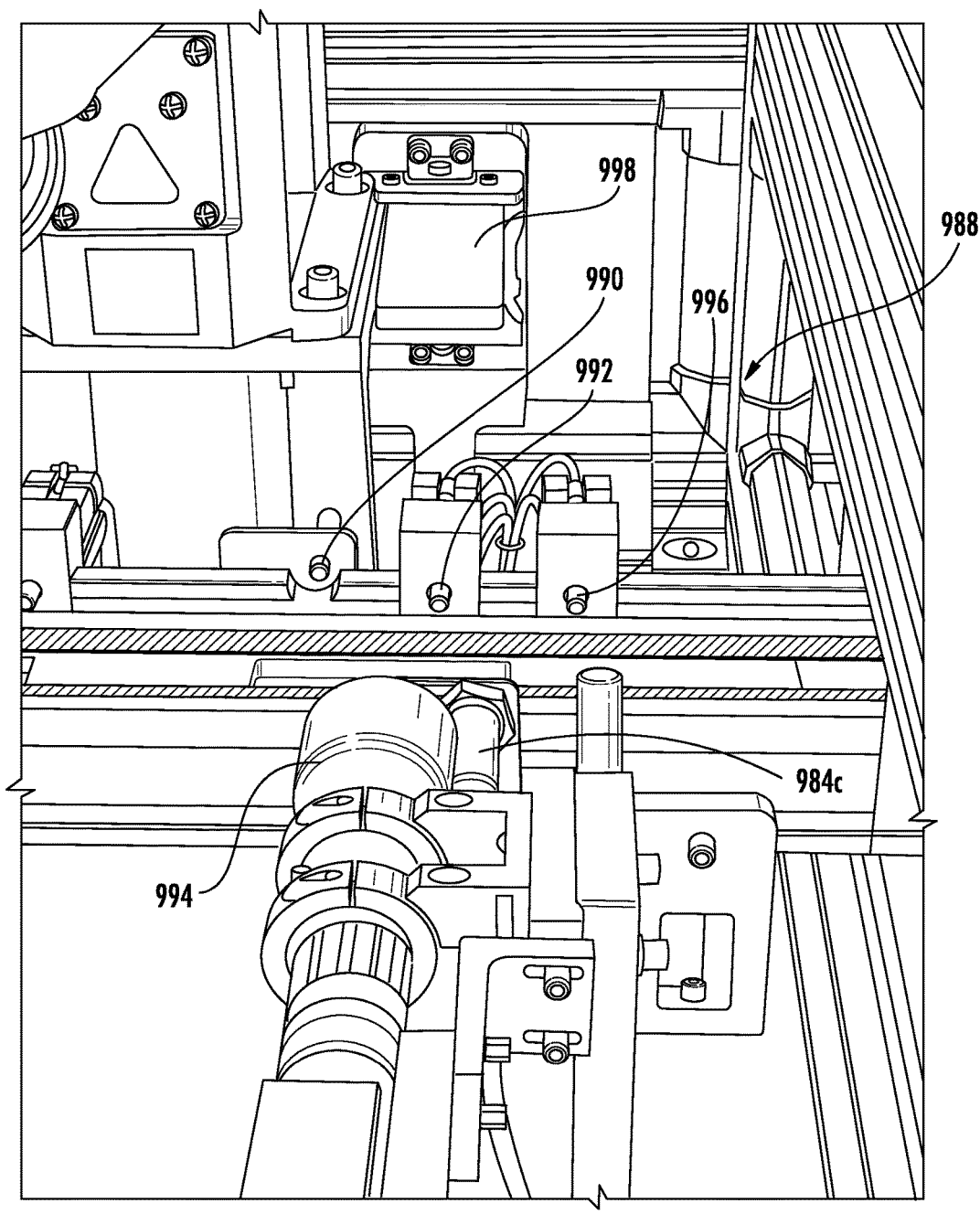
Figure 36:
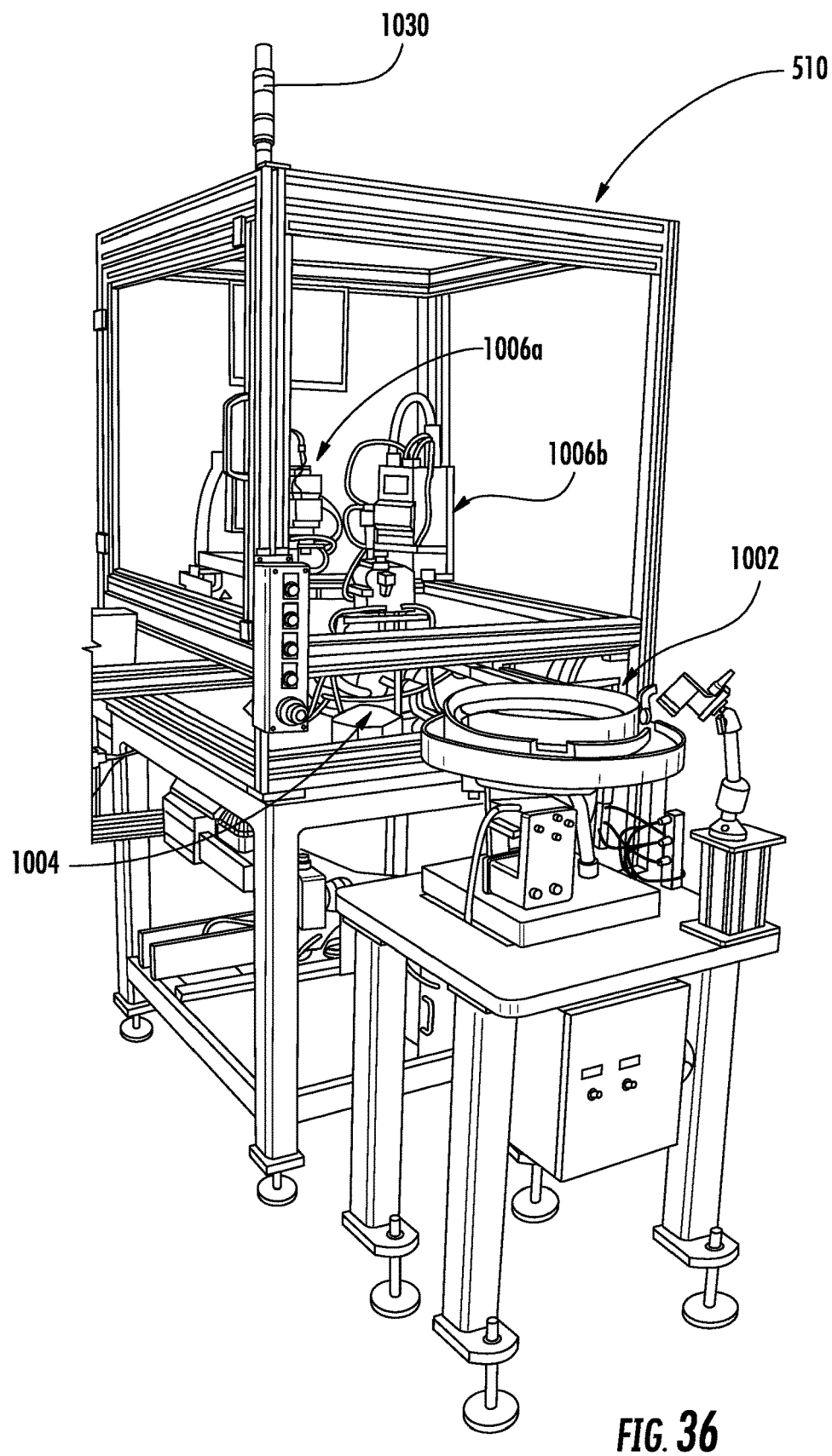
Figure 37:
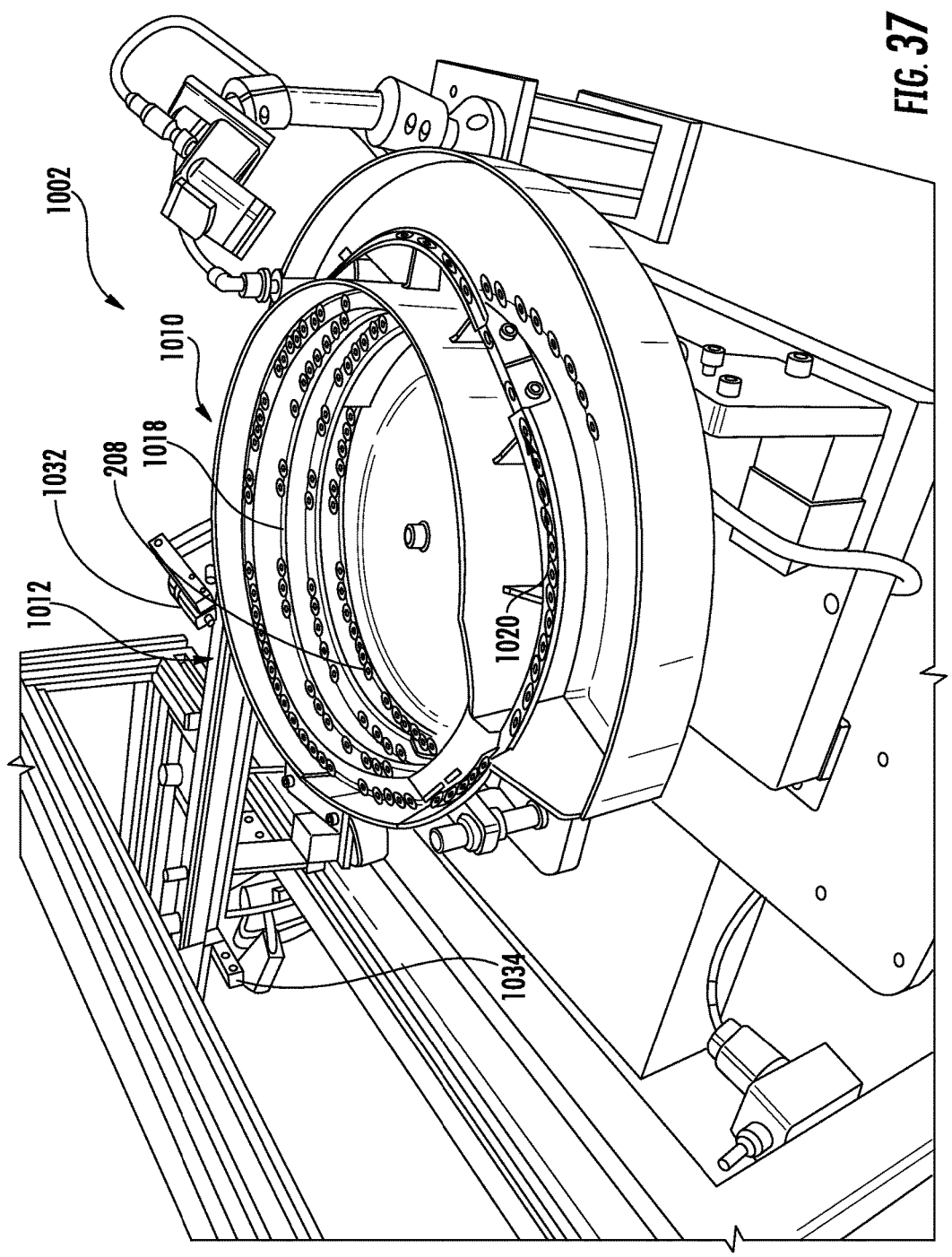
Figure 38:
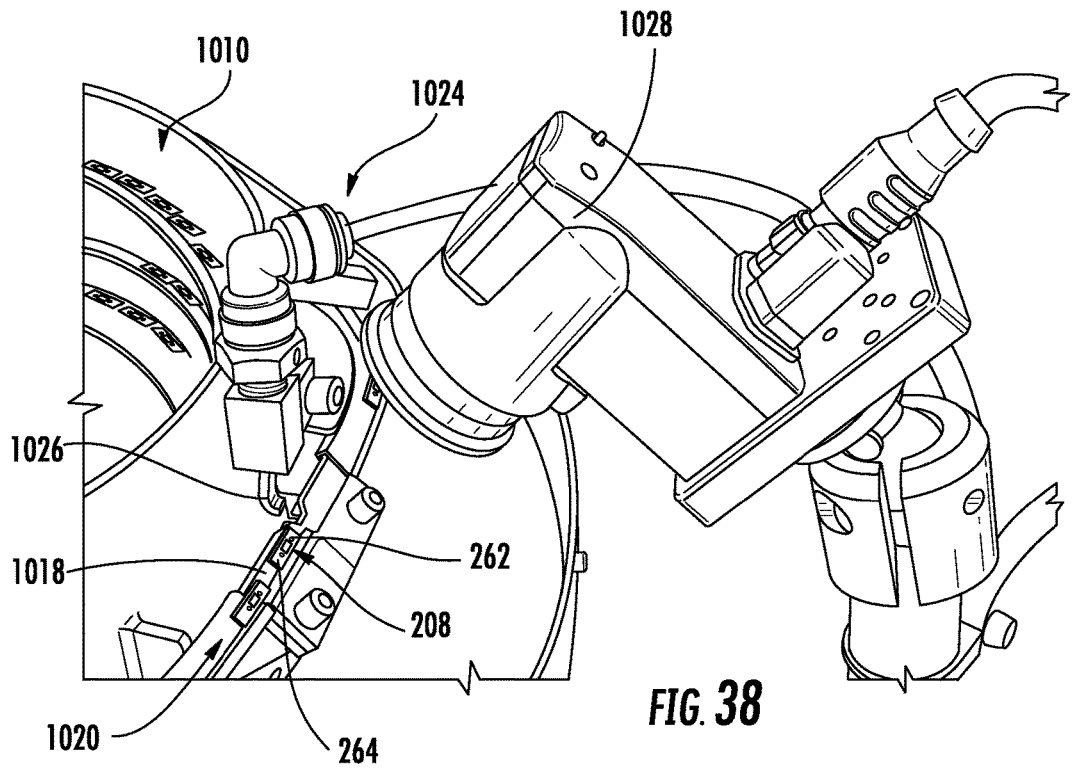
Figure 39:
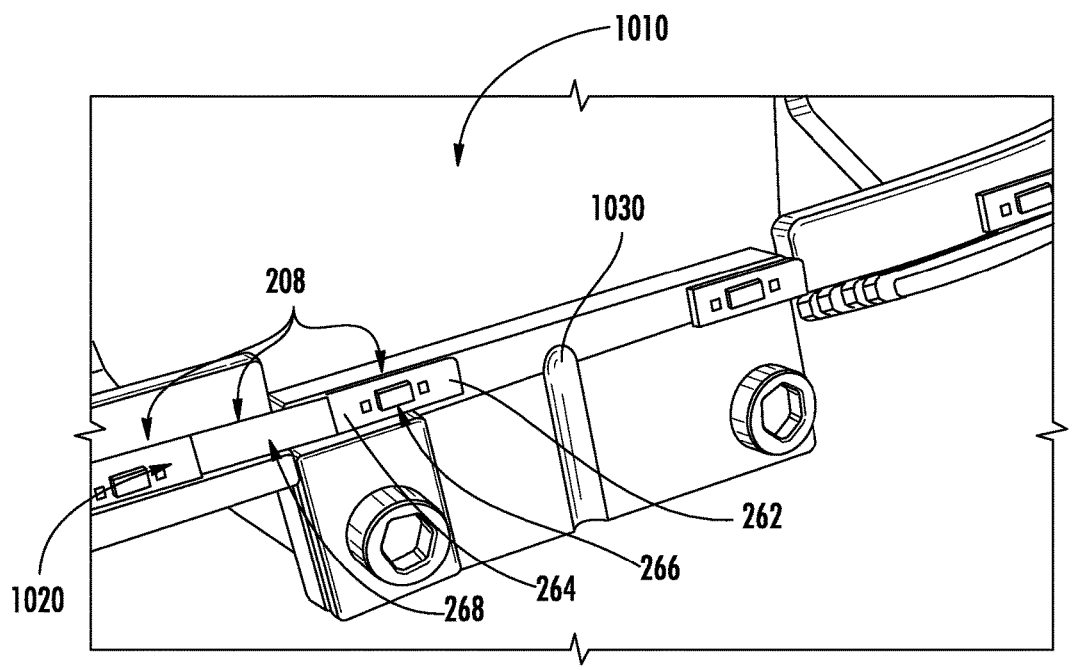
Figure 40:
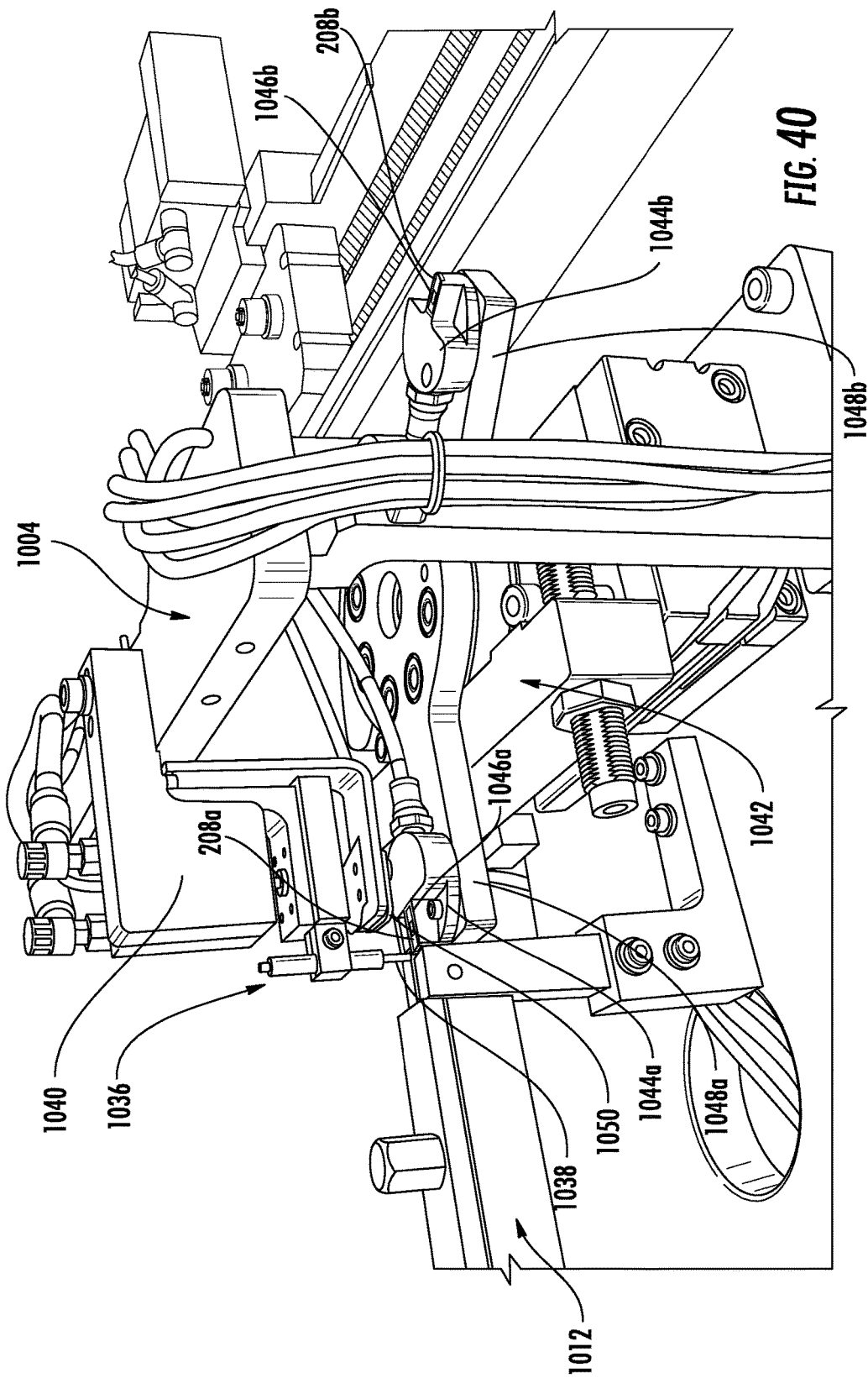
Figure 41:
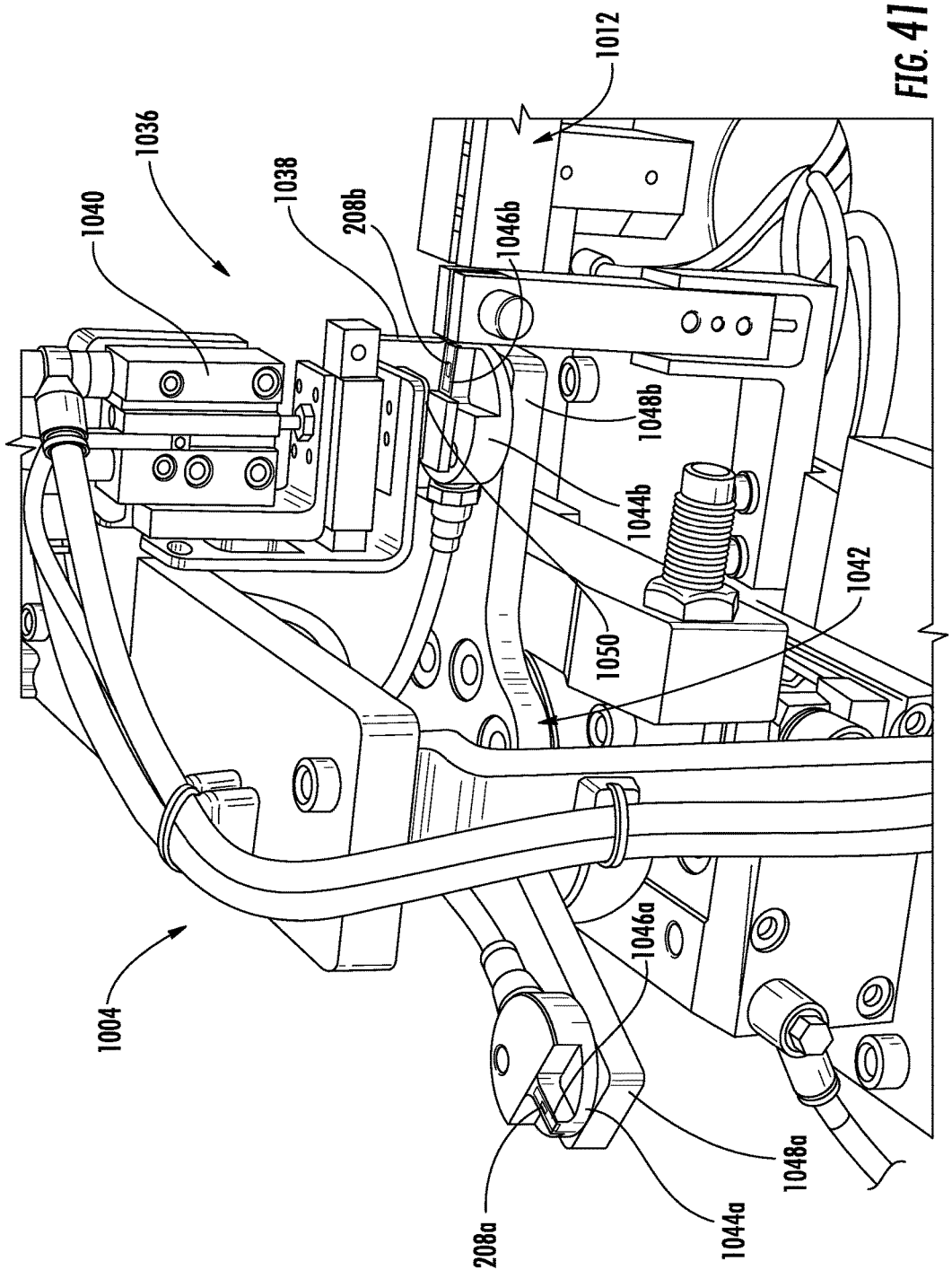
Figure 42:
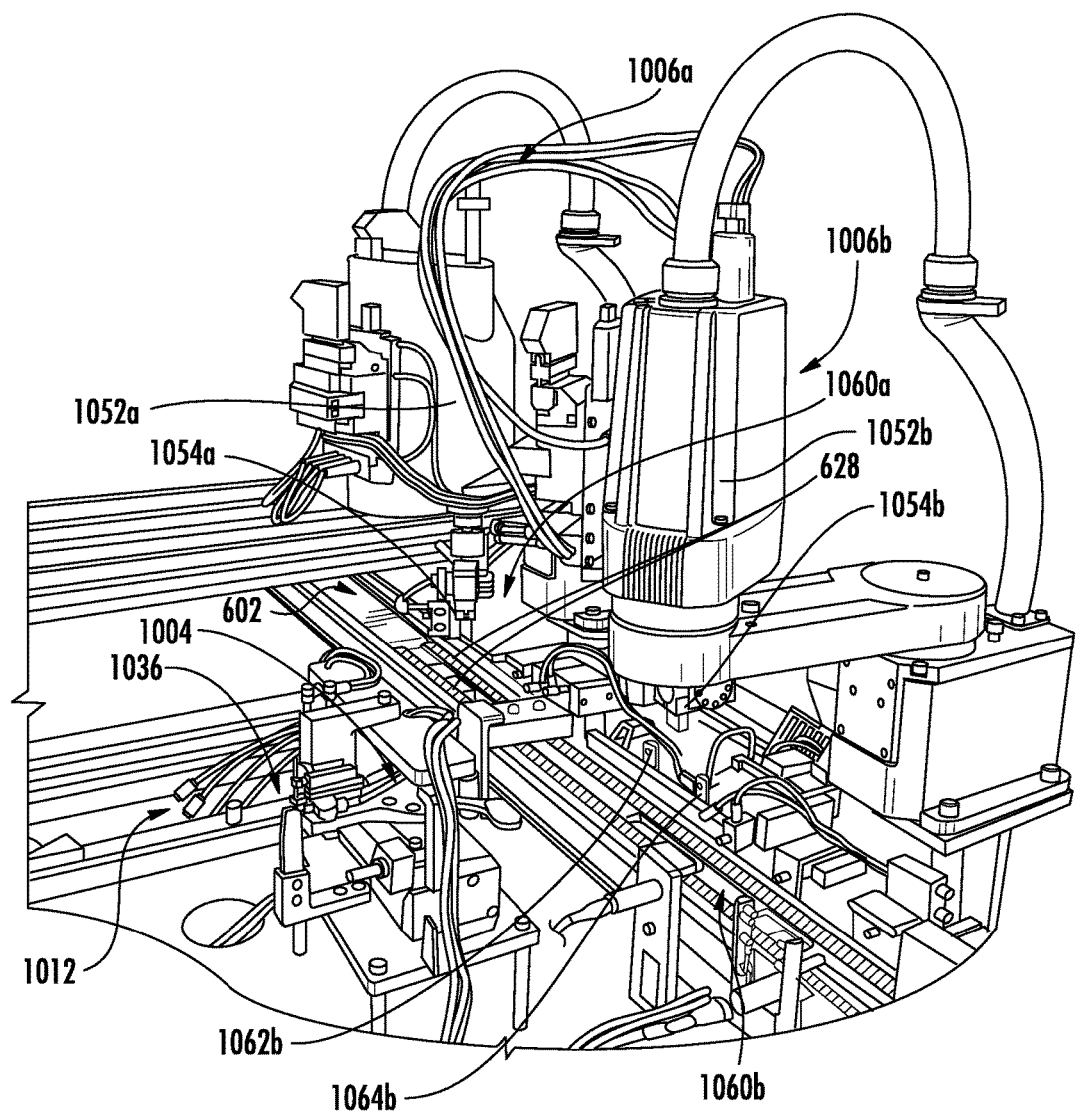
Figure 43:
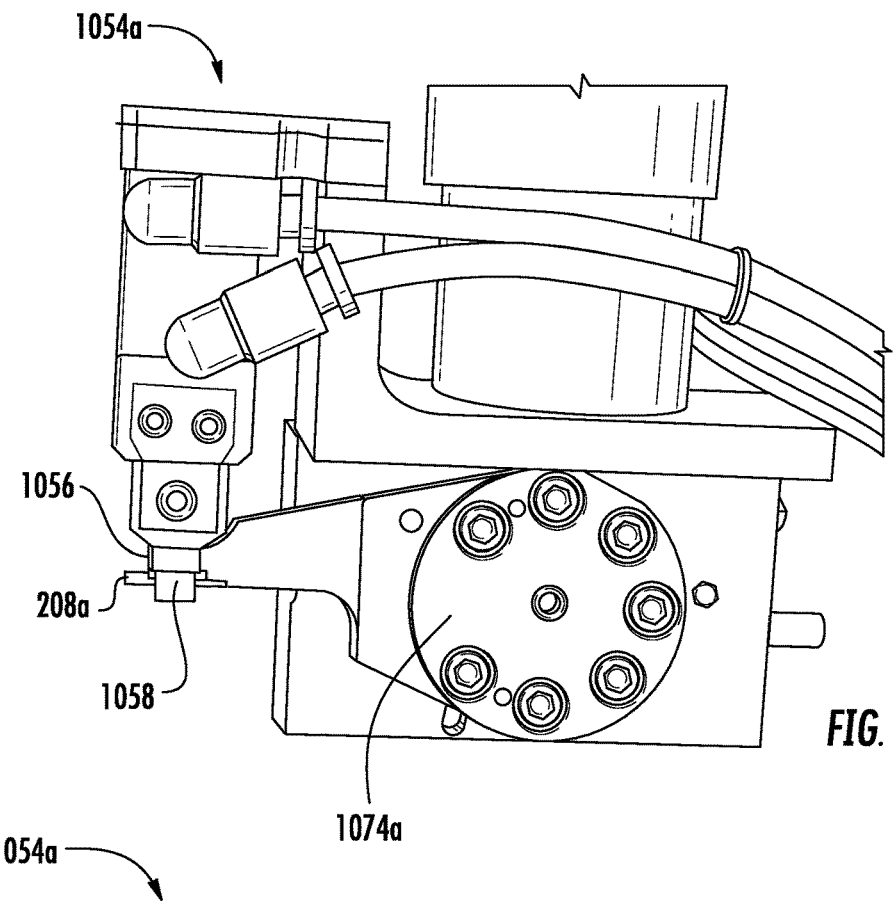
Figure 44:
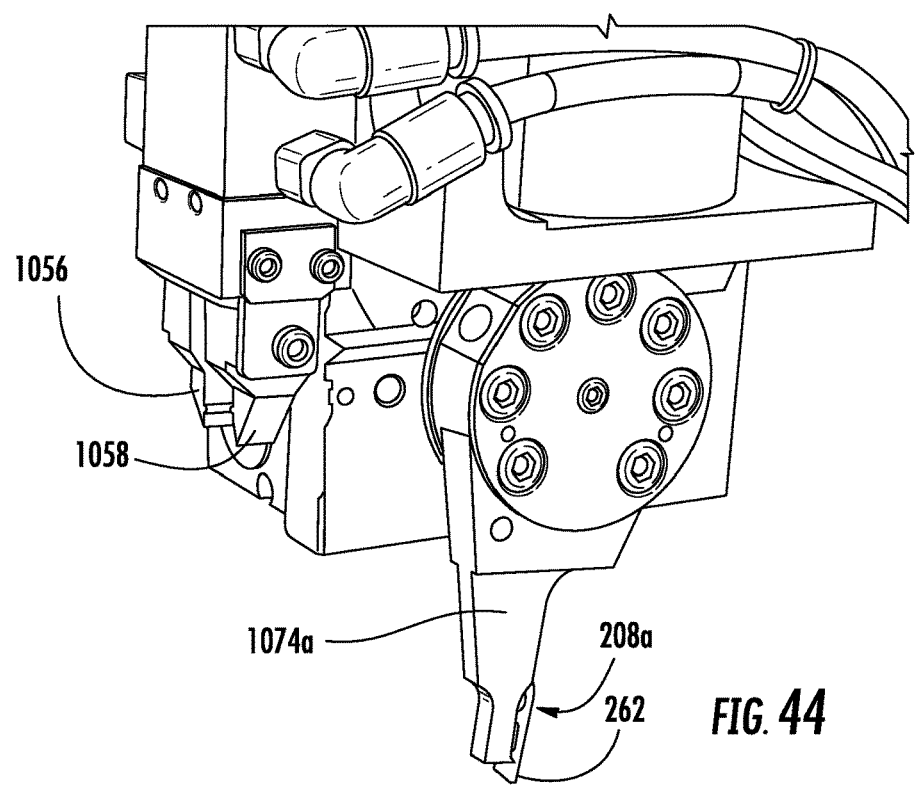
Figure 45:
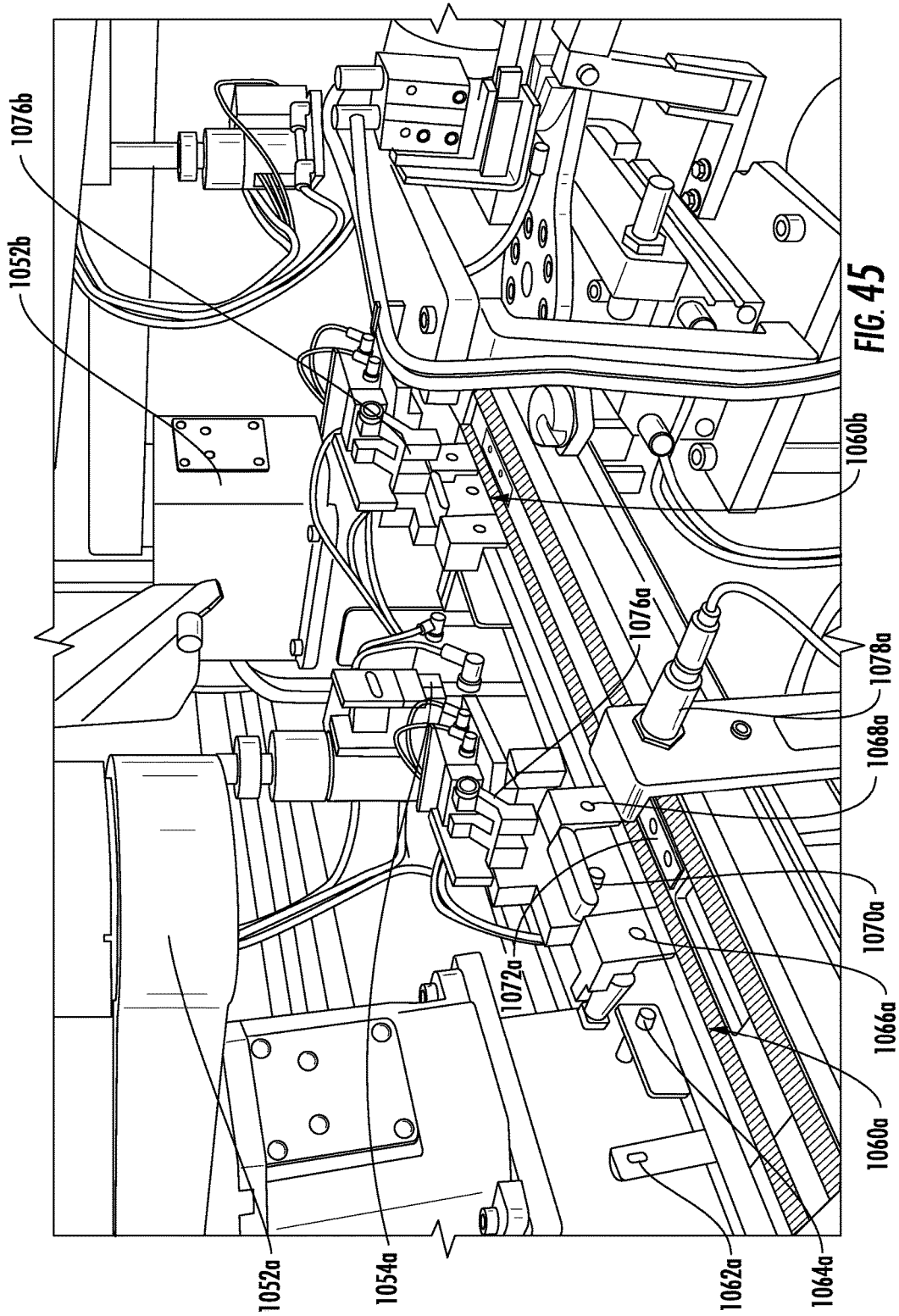
Figure 46:
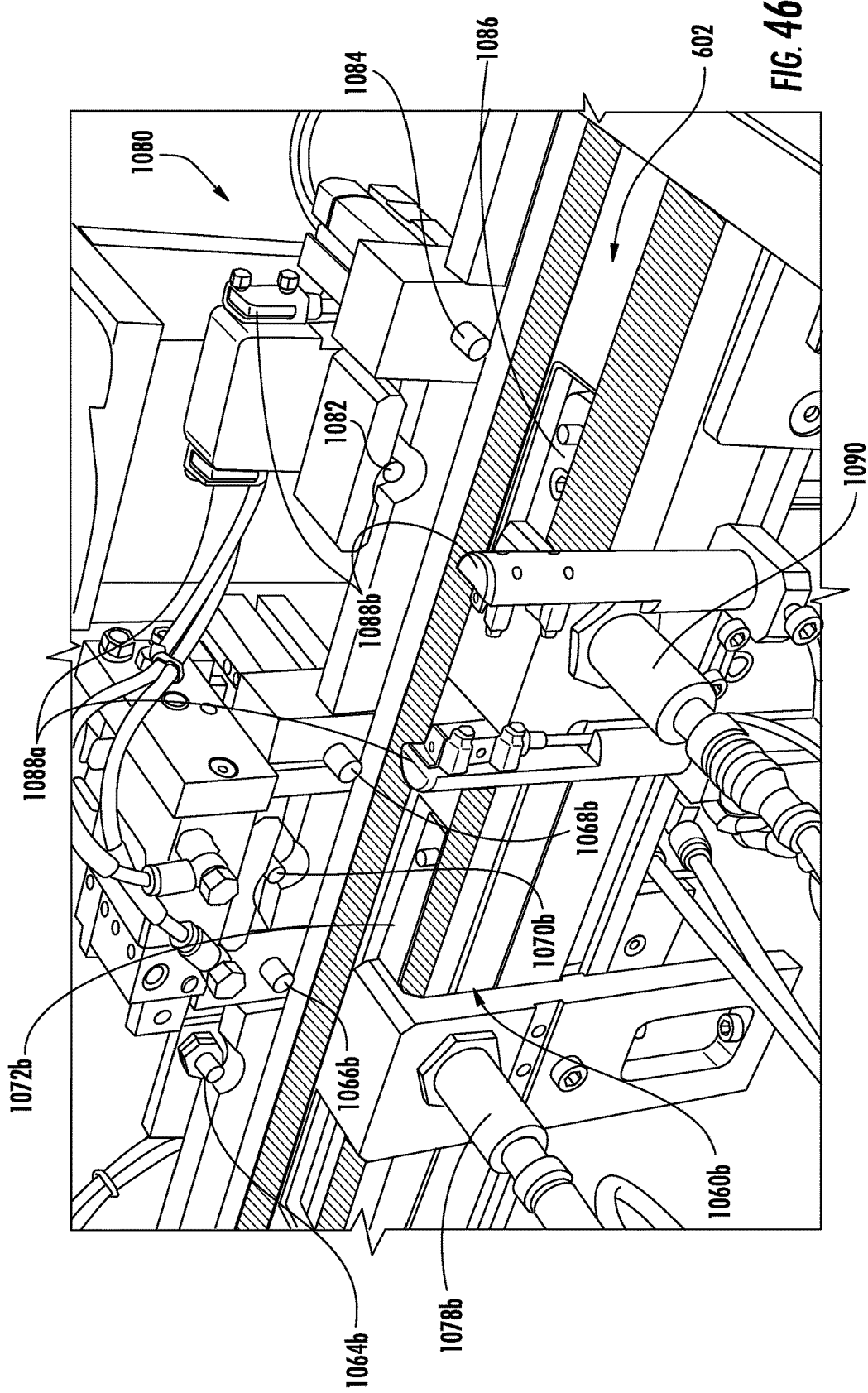
Figure 47:
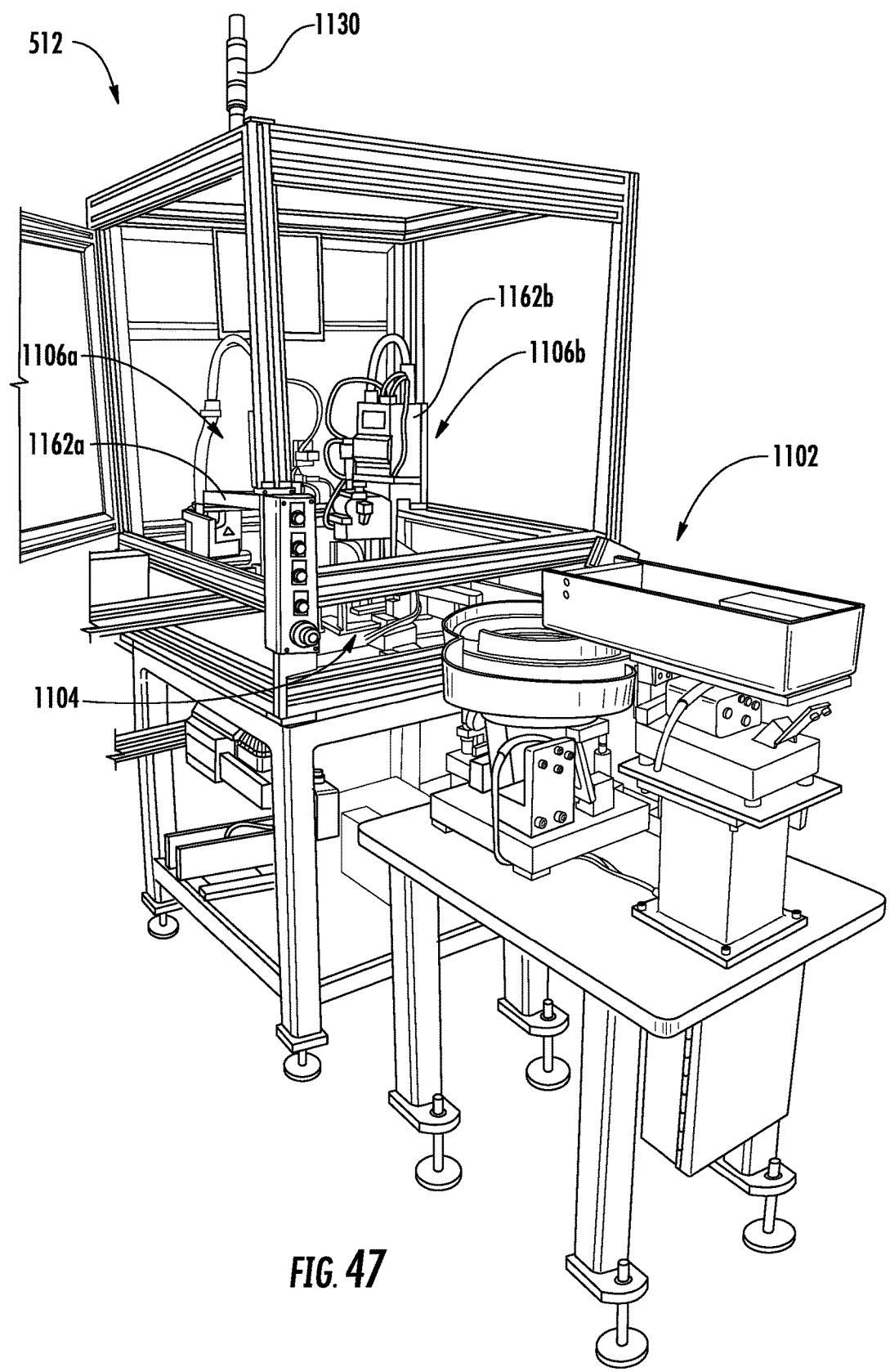
Figure 48:
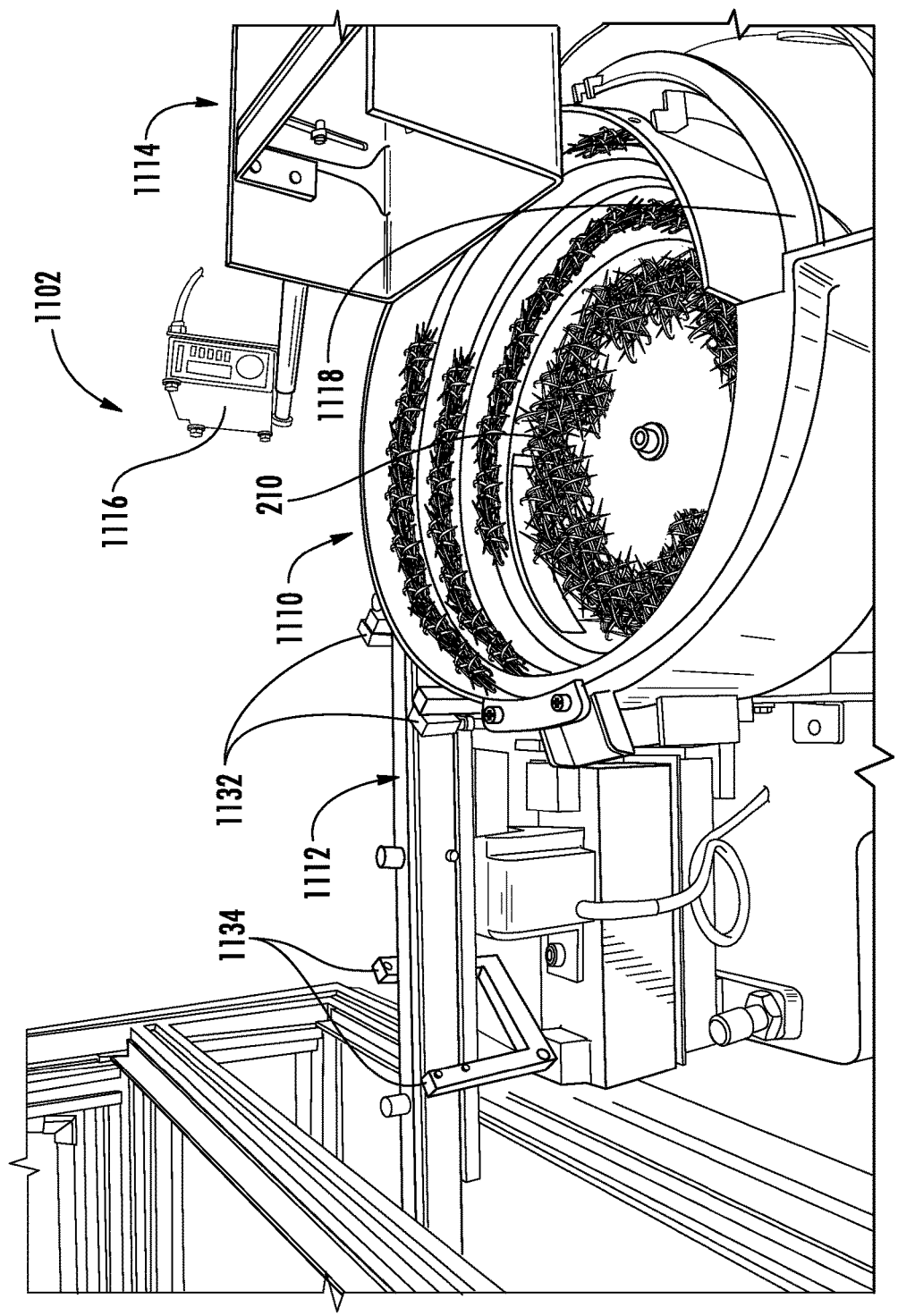
Figure 49:
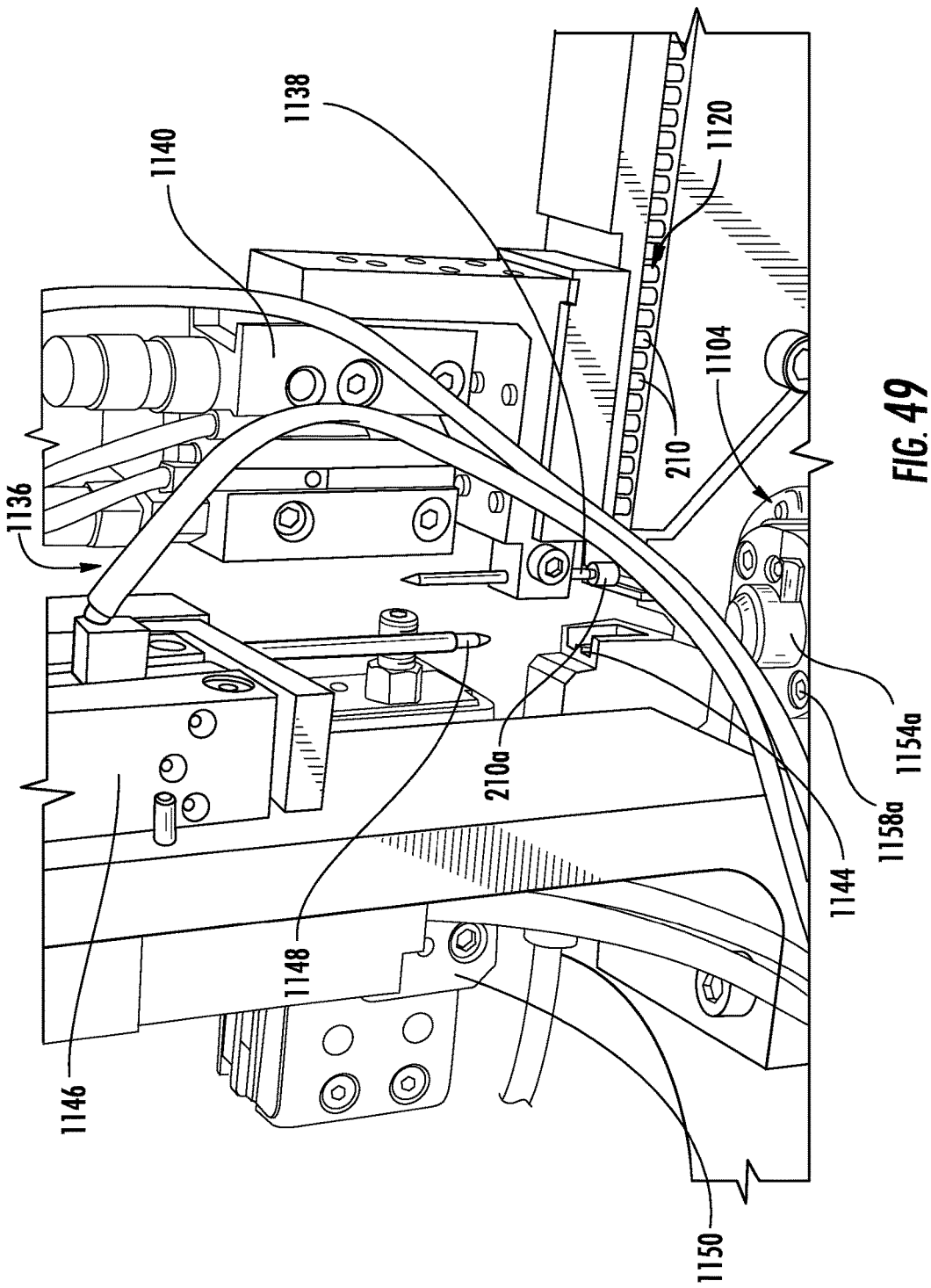
Figure 50:
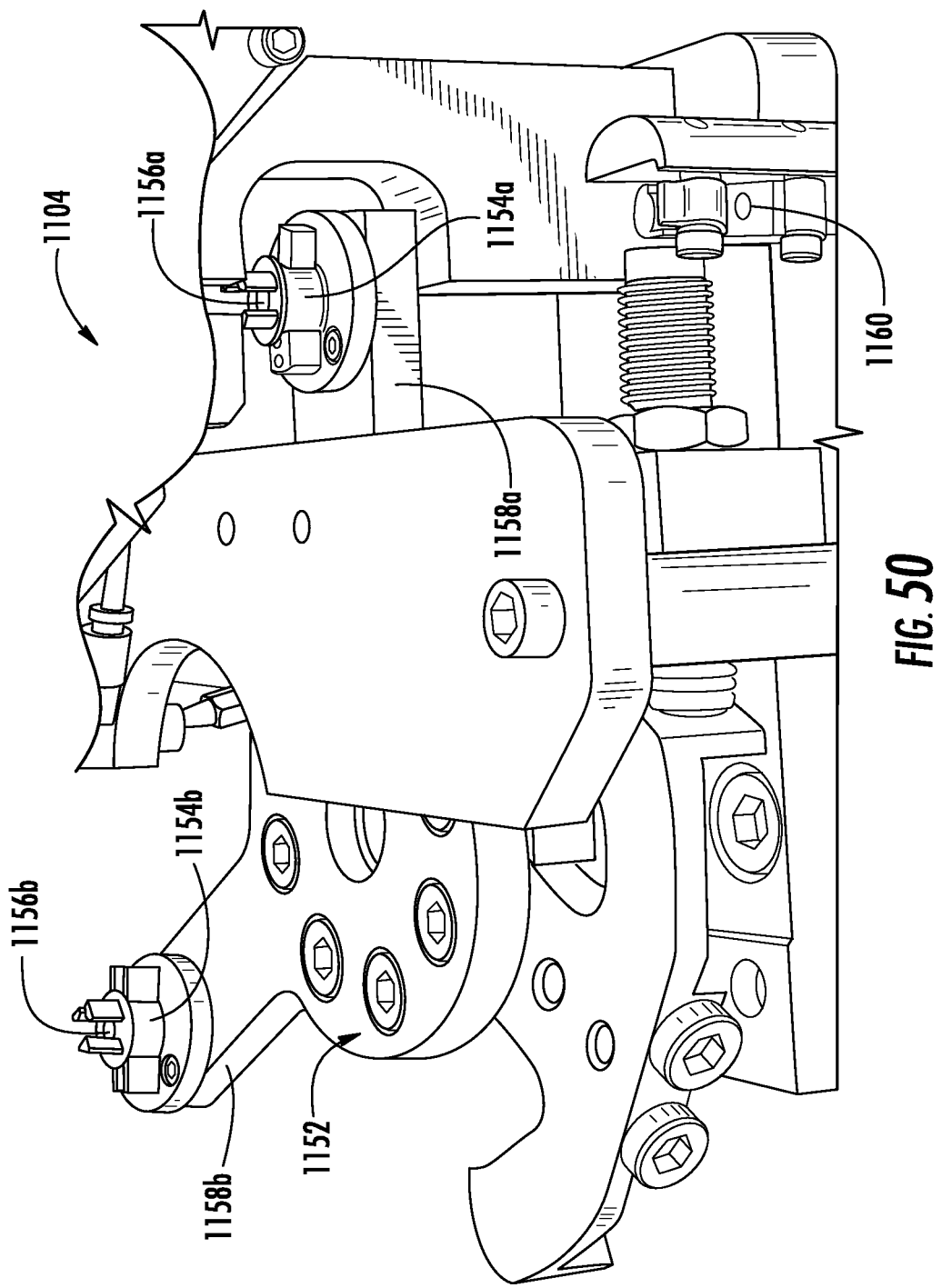
Figure 51:
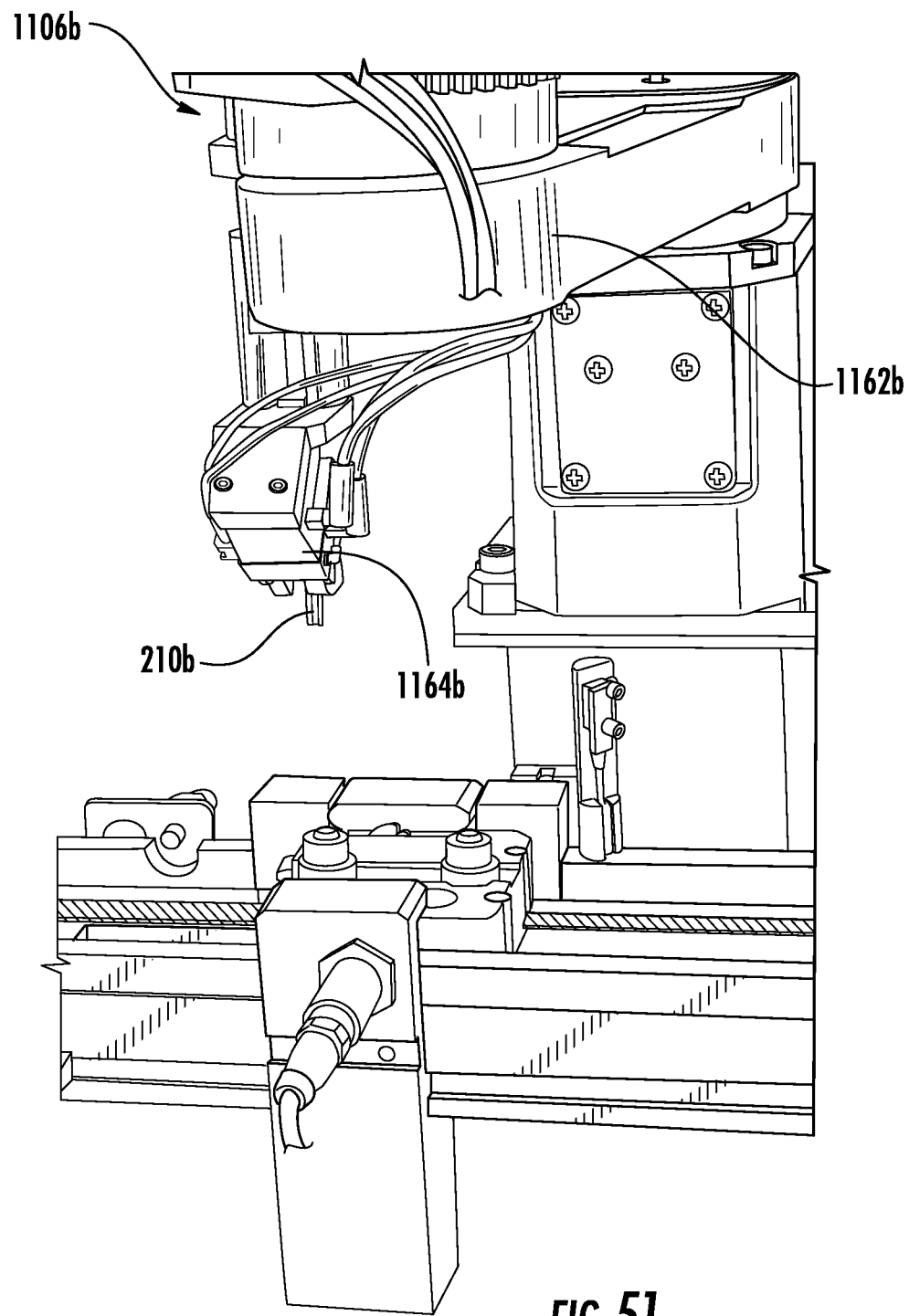
Figure 52:
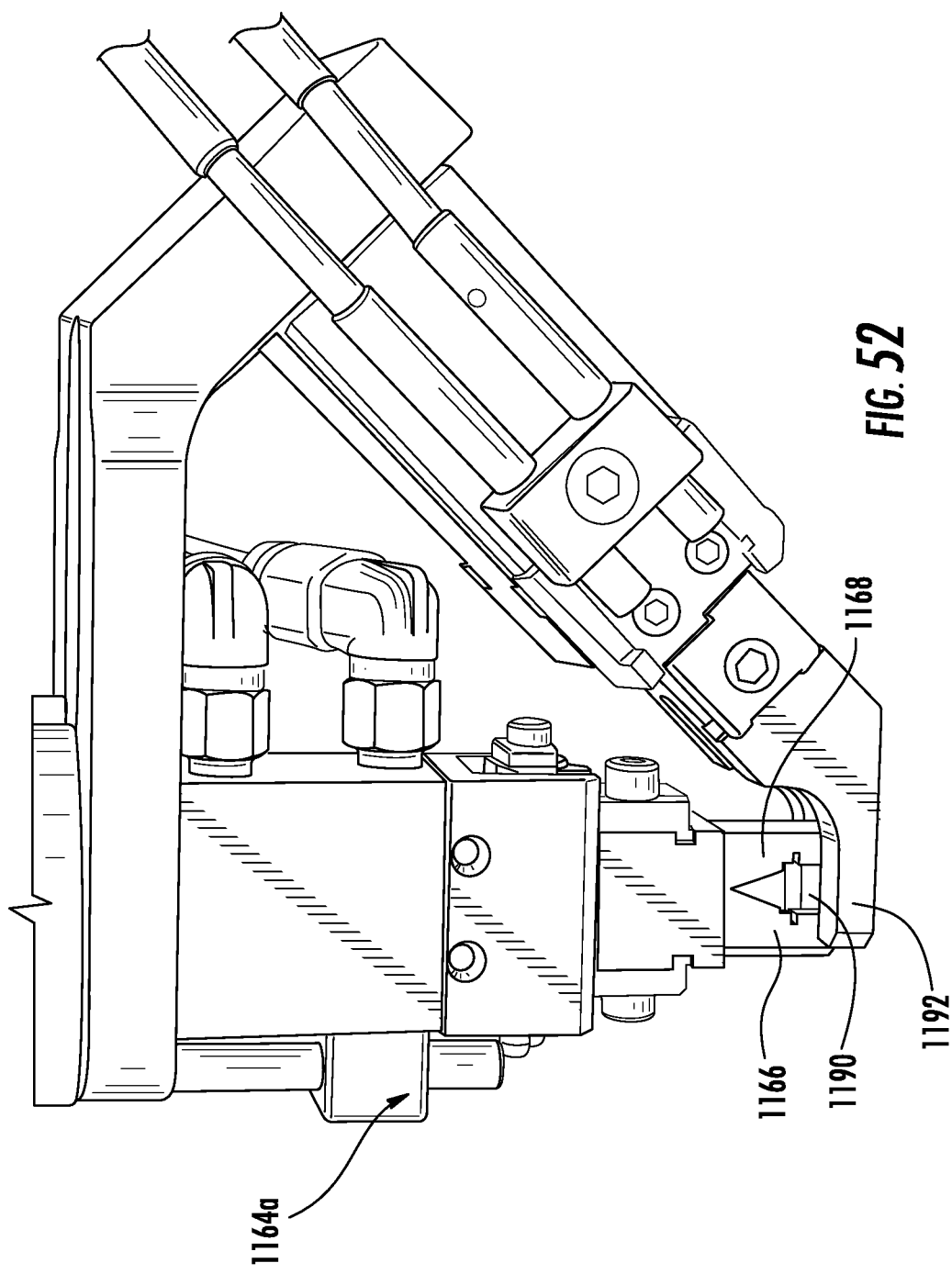
Figure 53:
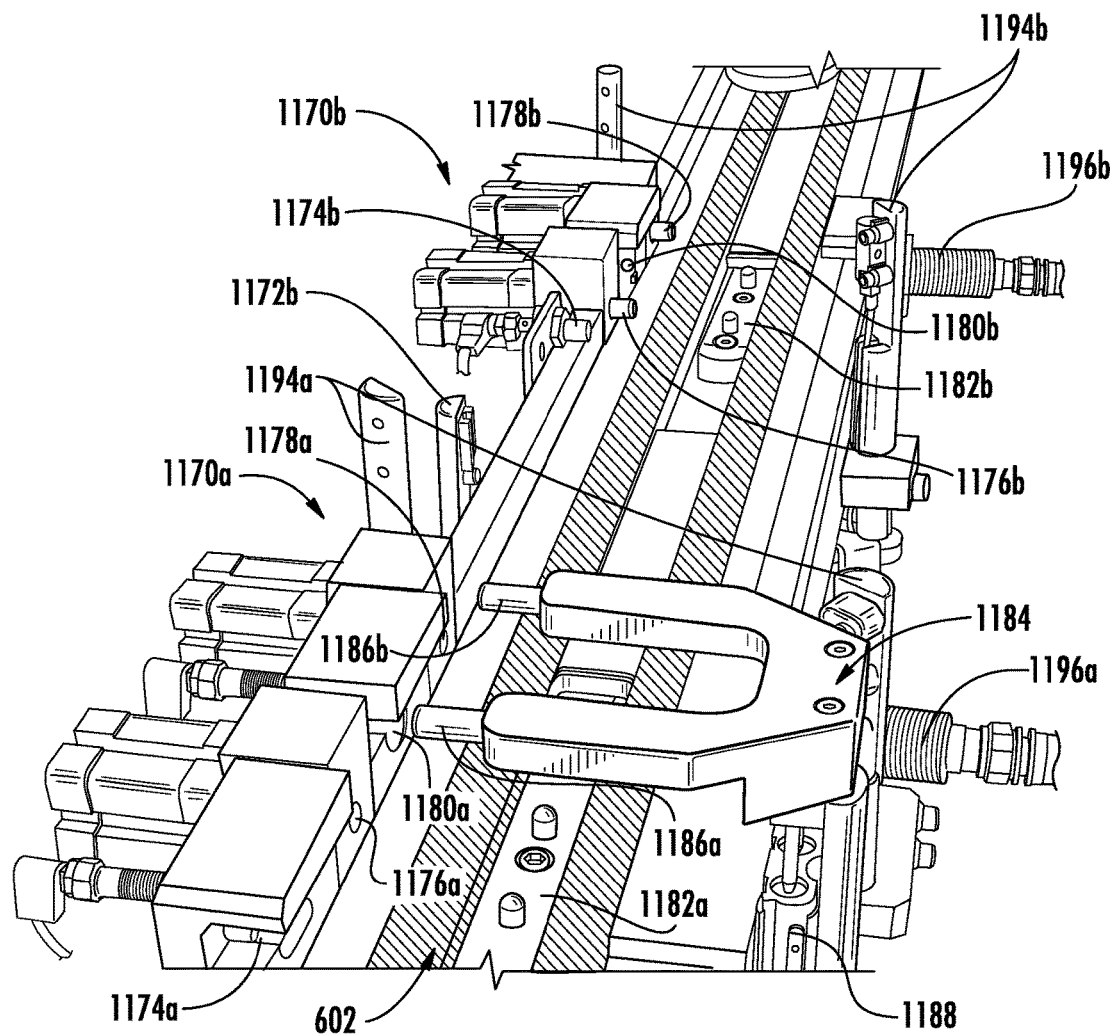
Figure 54:
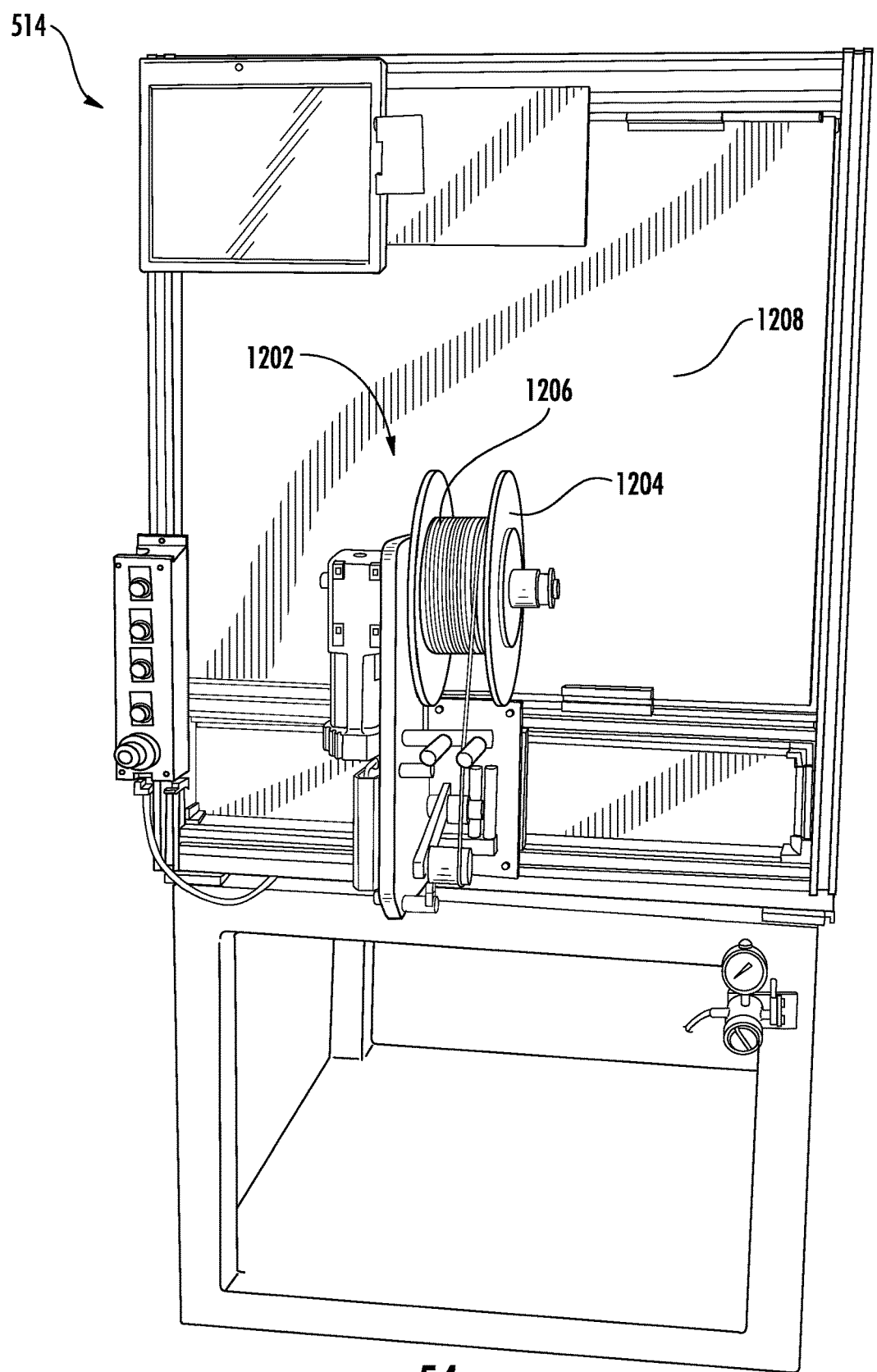
Figure 55:
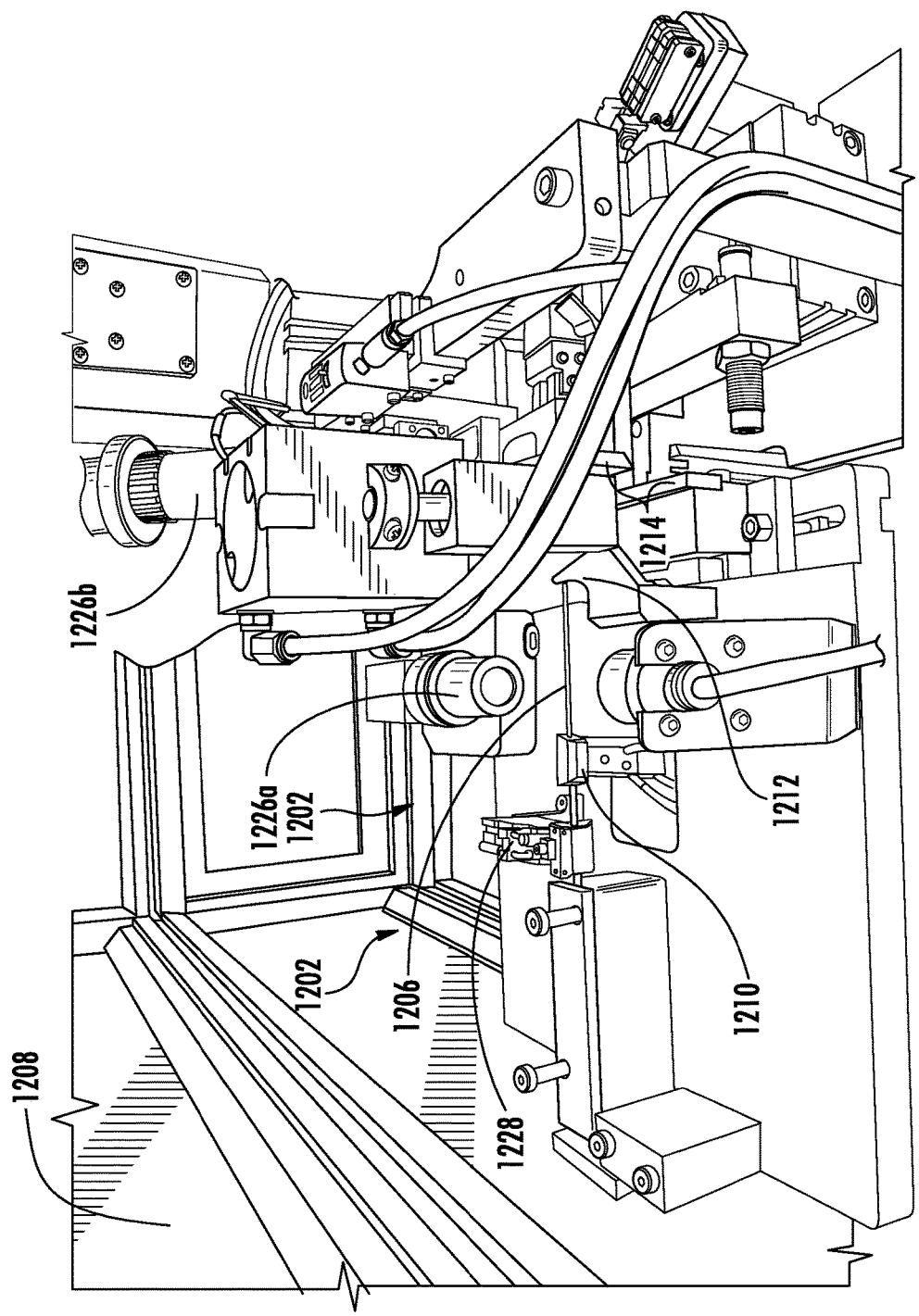
Figure 56:
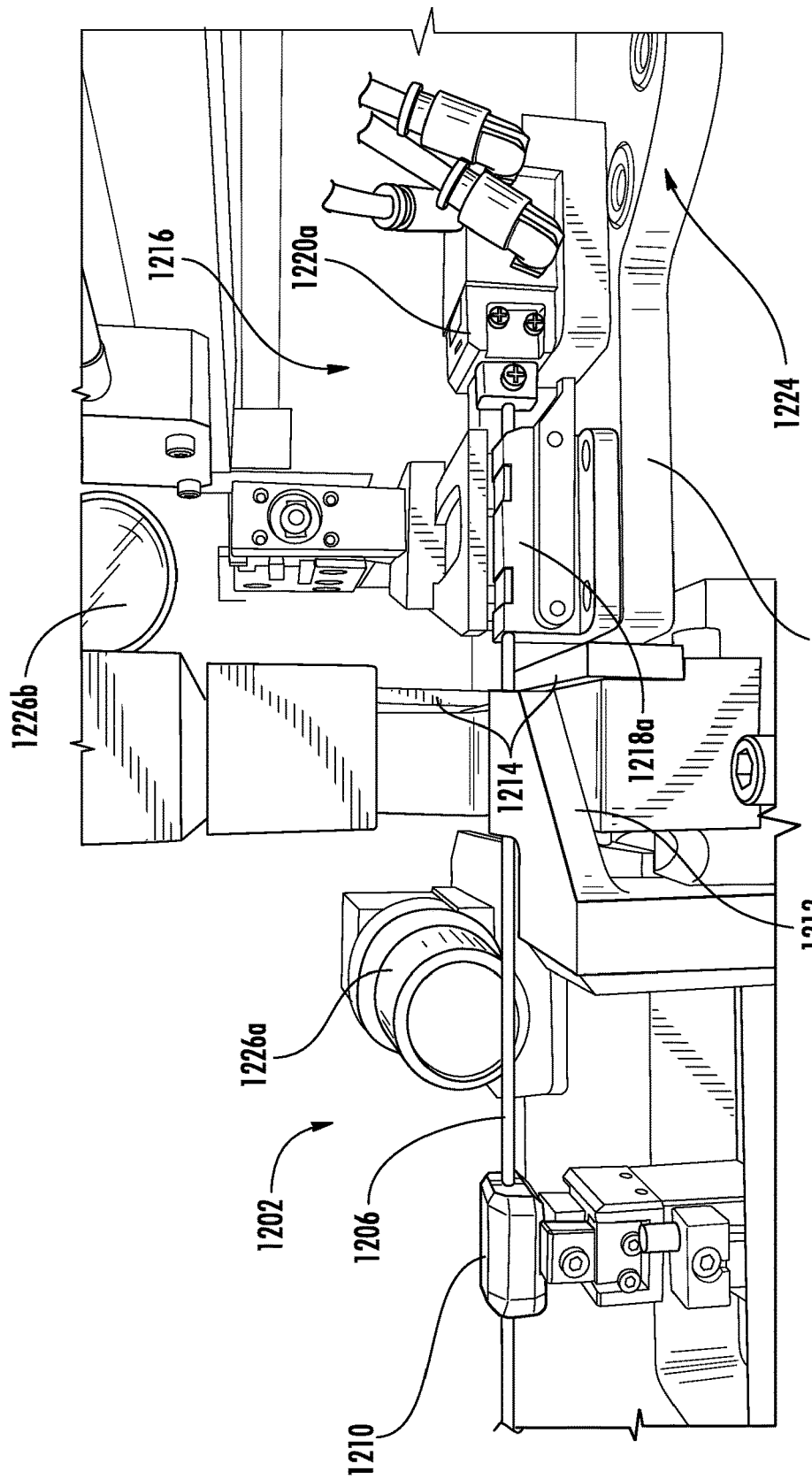
Figure 57:
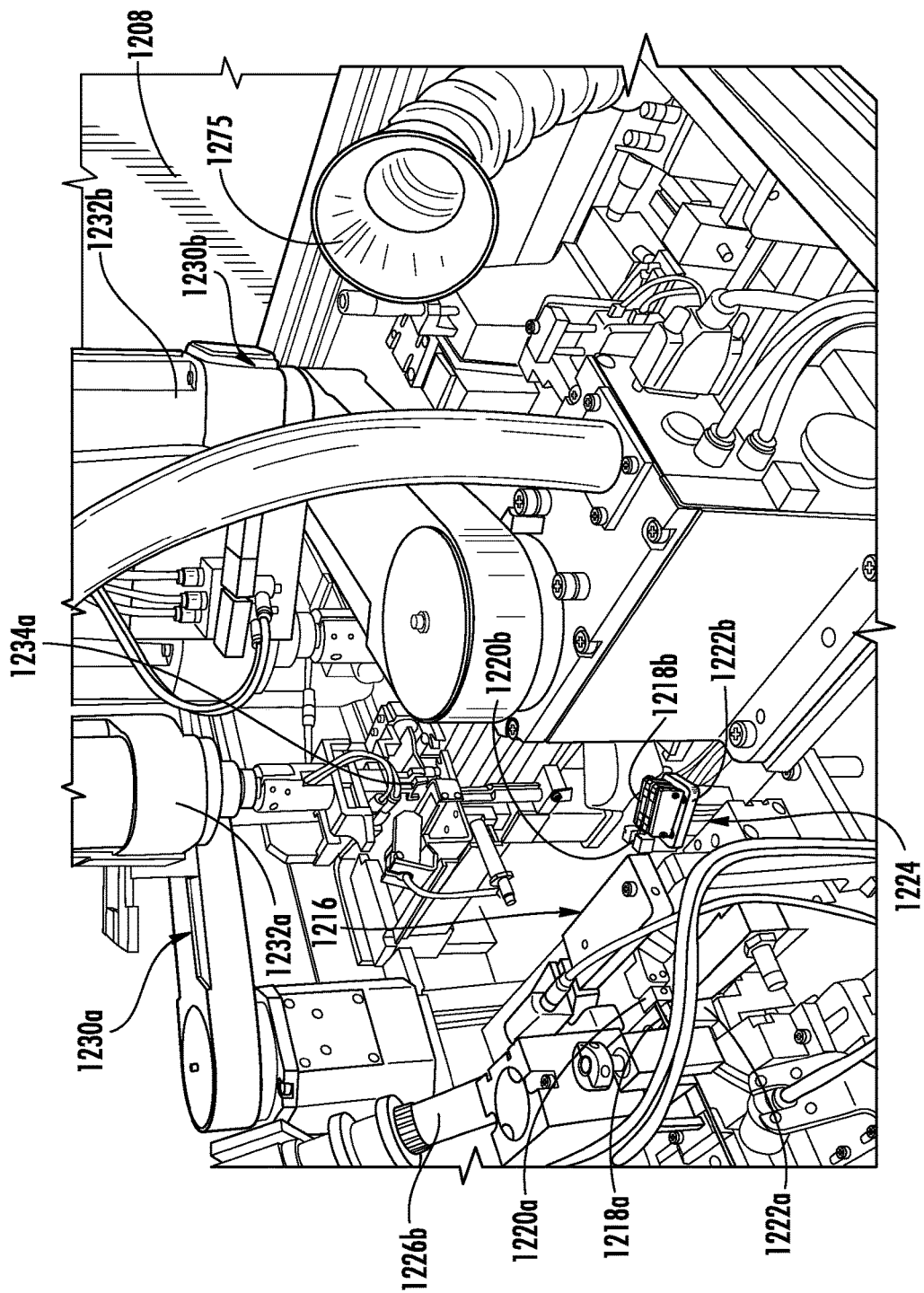
Figure 58:
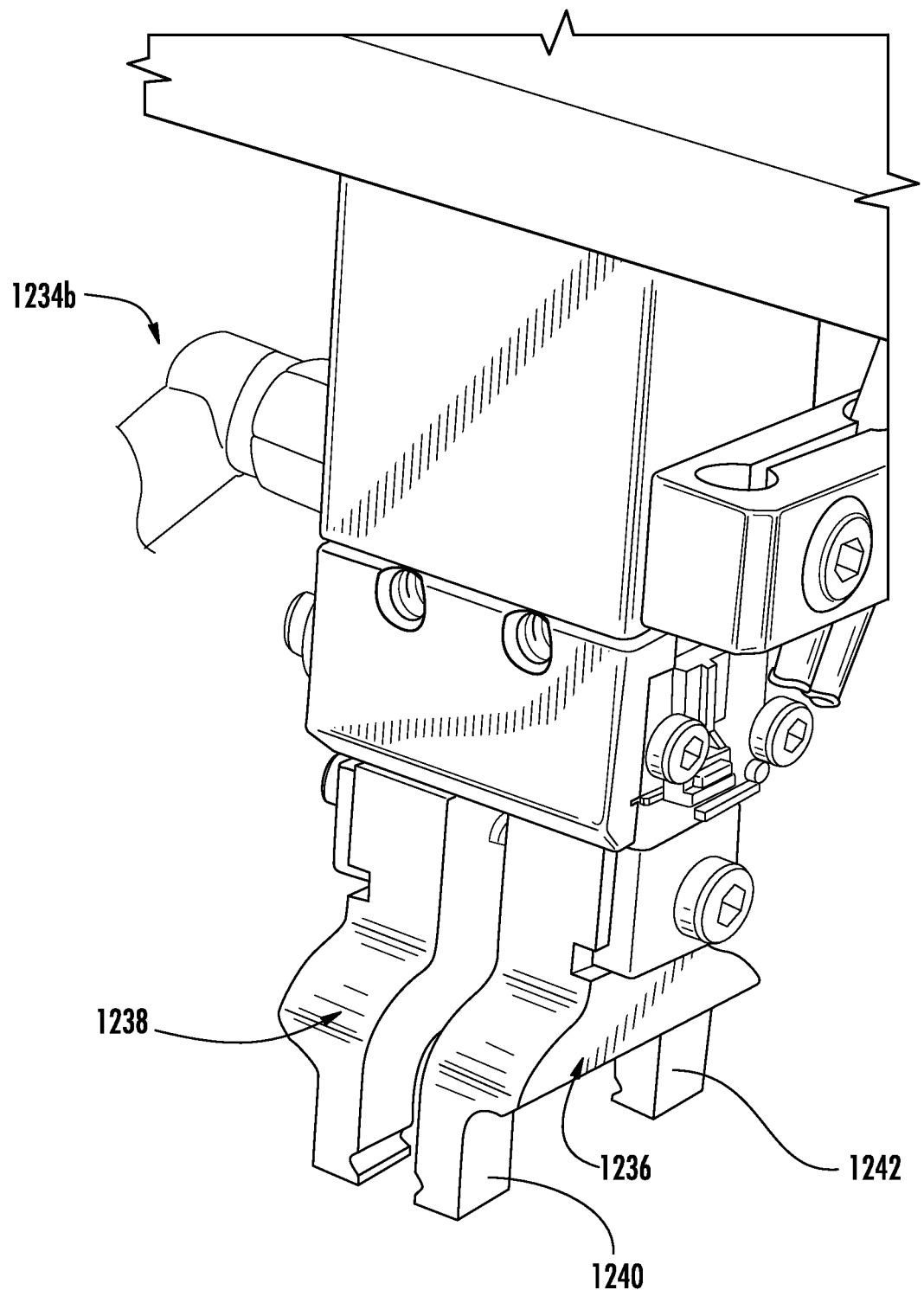
Figure 59:
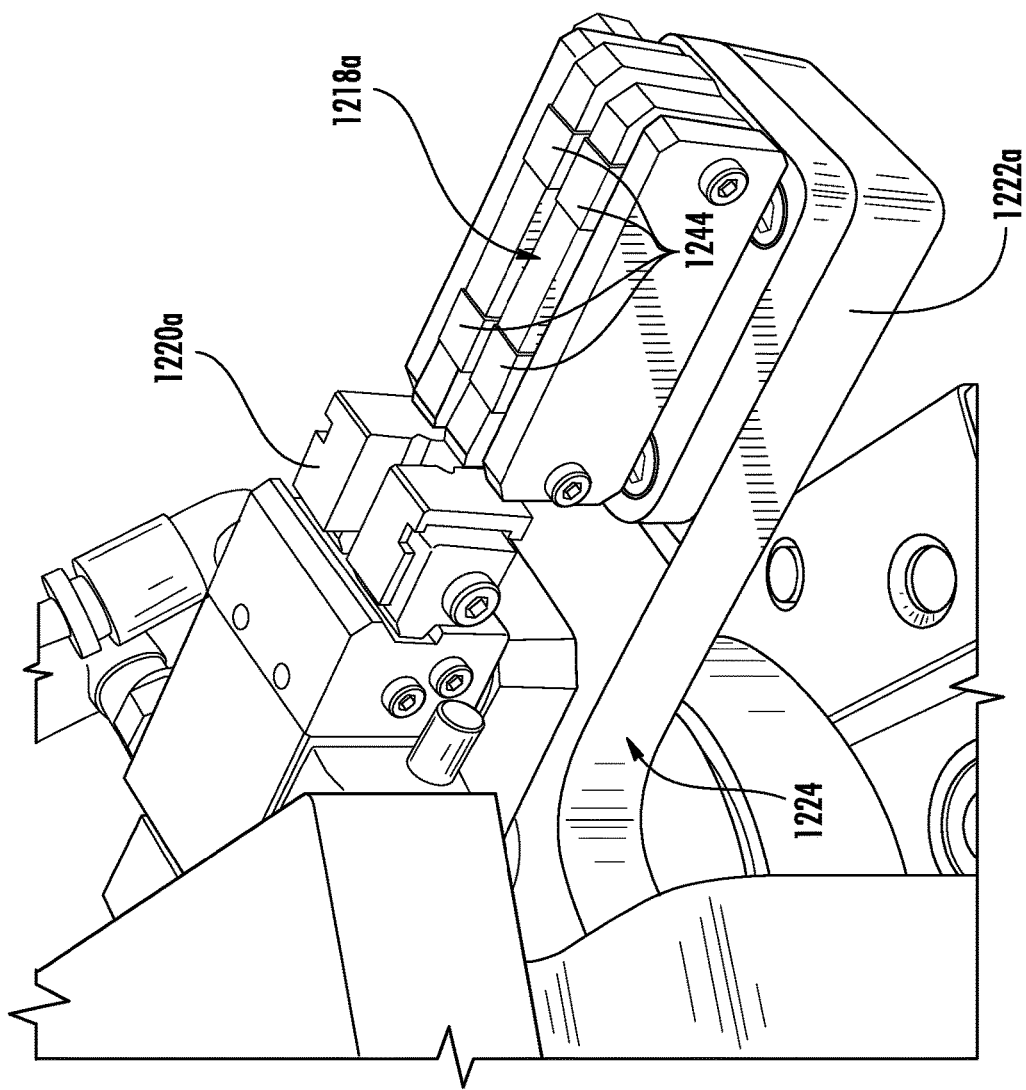
Figure 60:
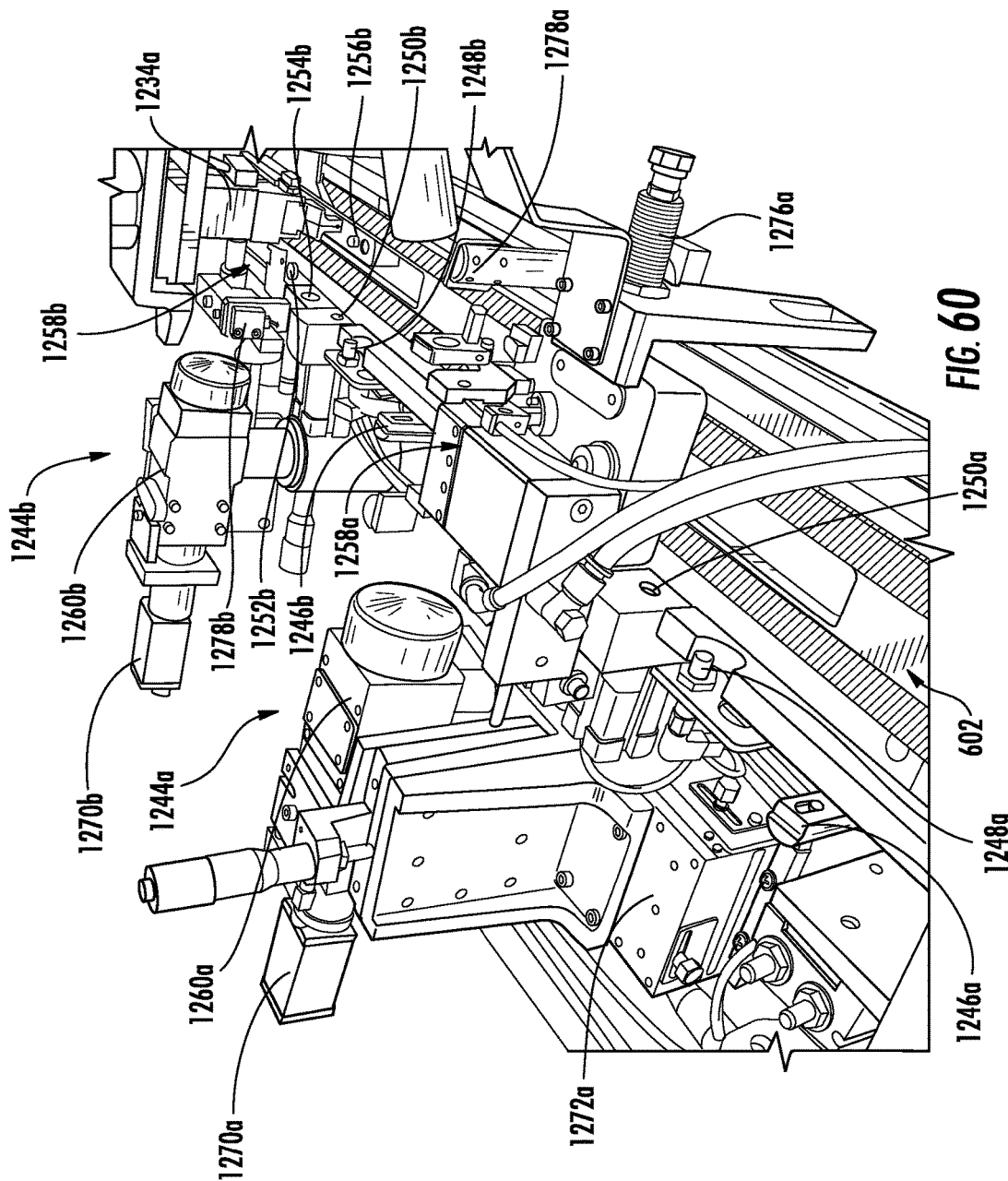
Figure 61:
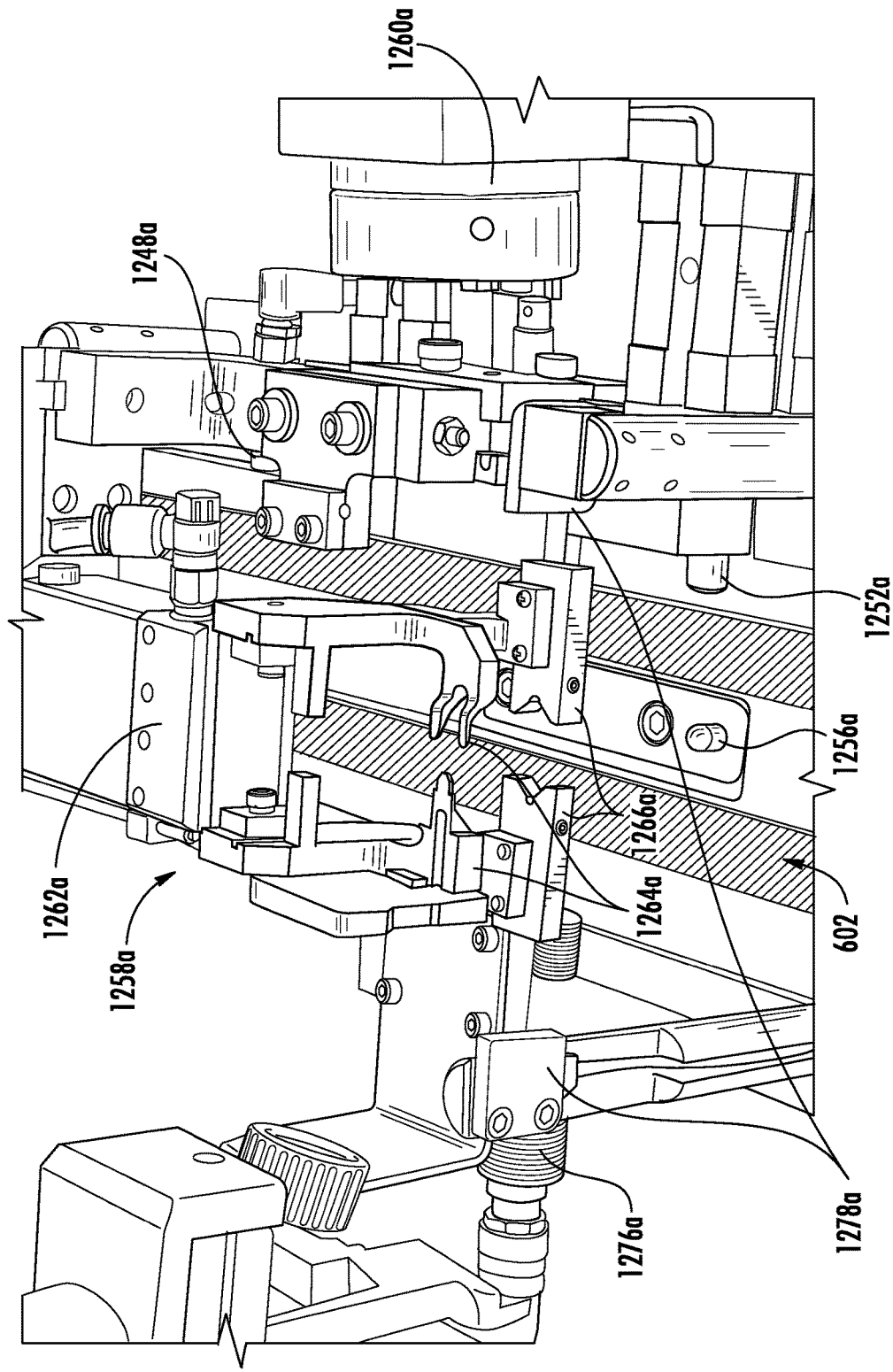
Figure 62:
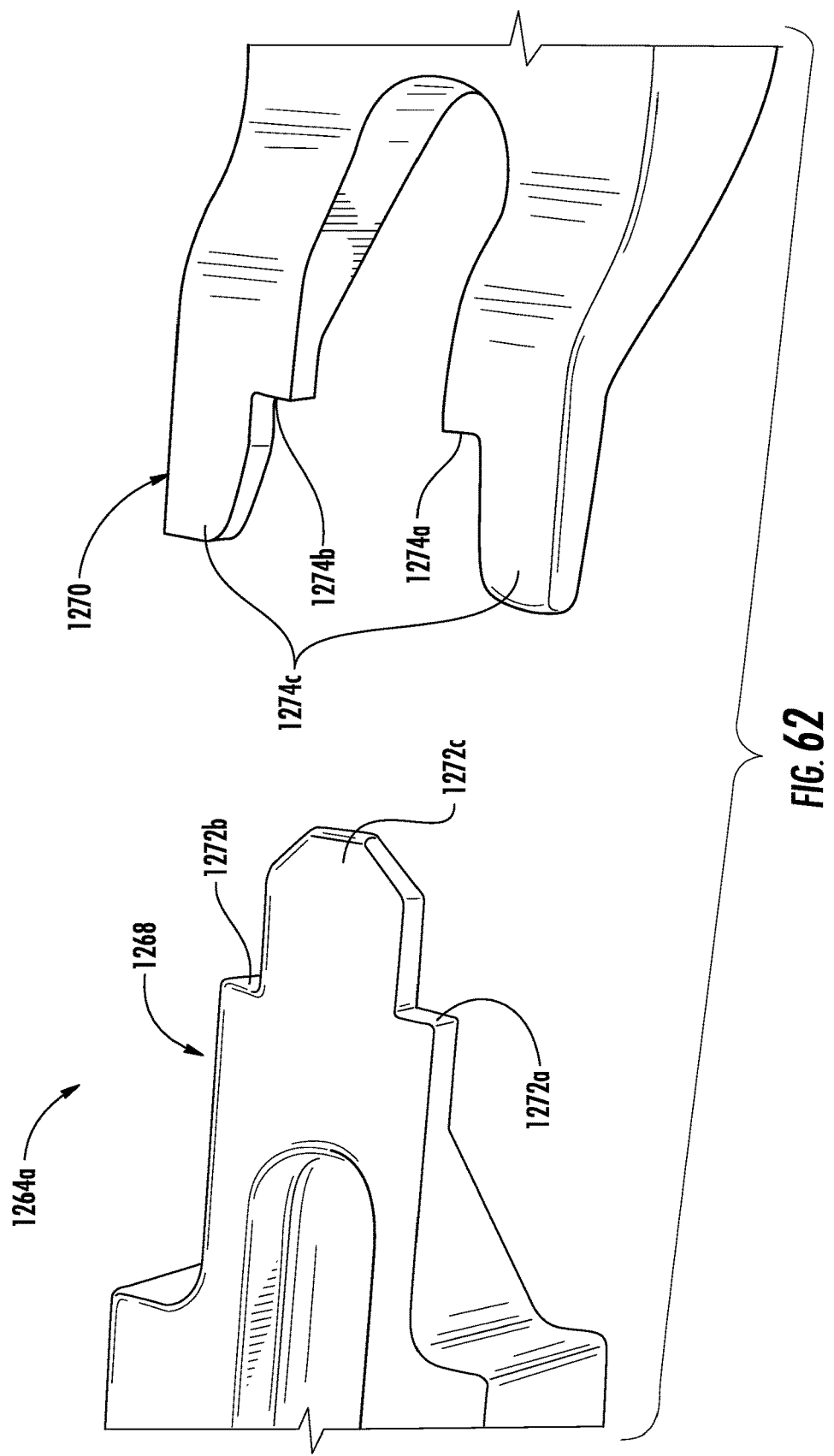
Figure 63:
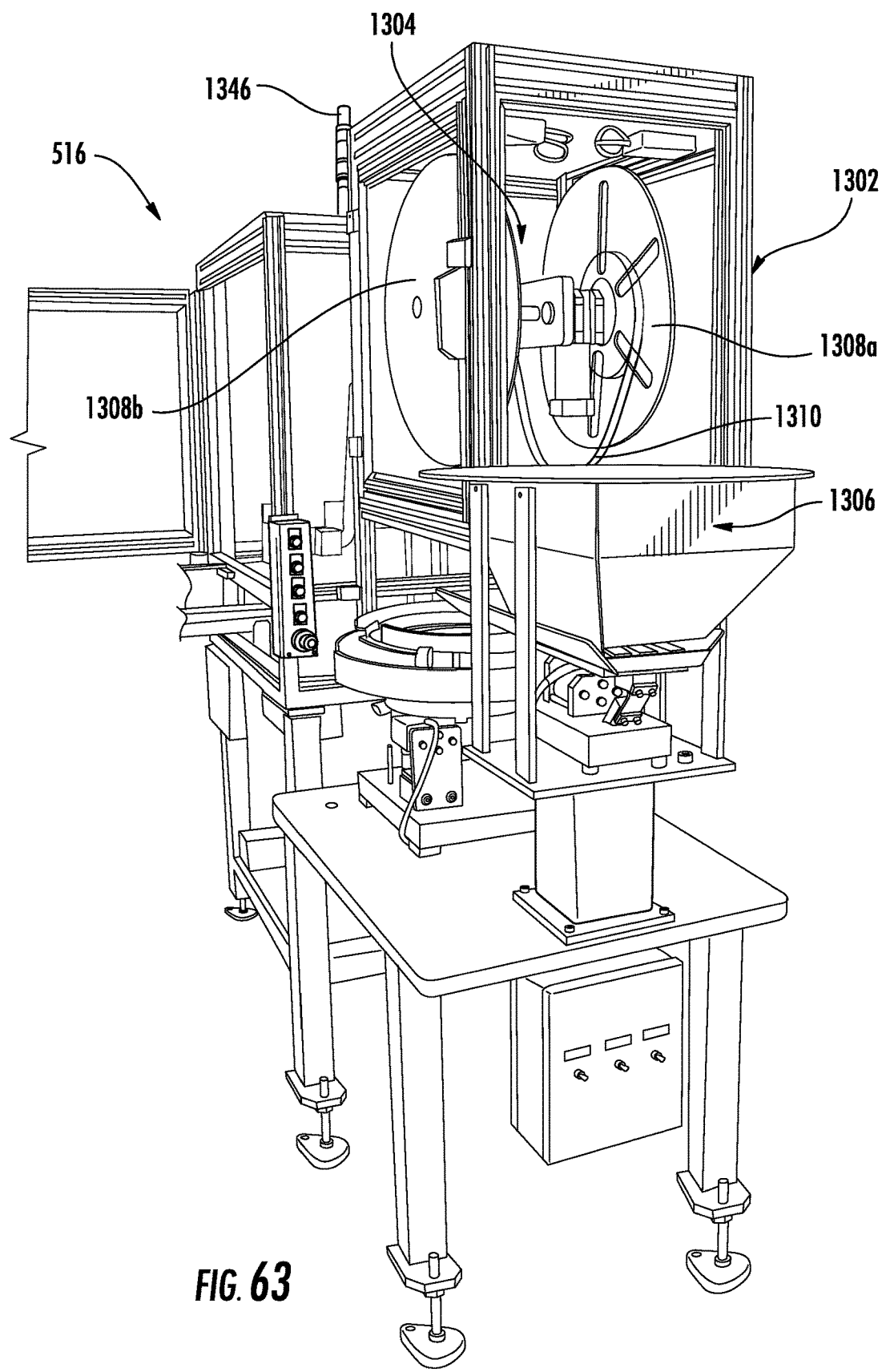
Figure 64:
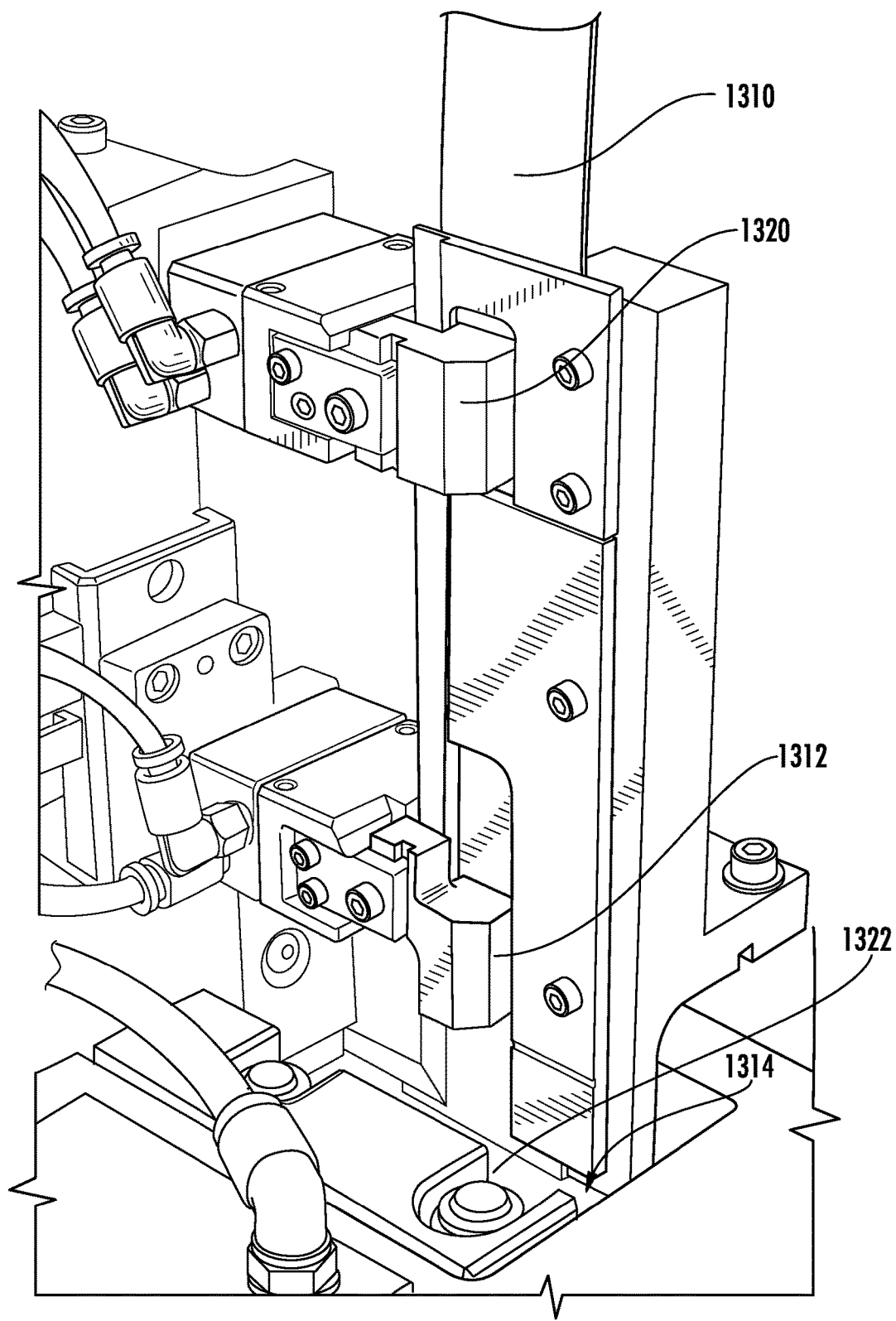
Figure 65:
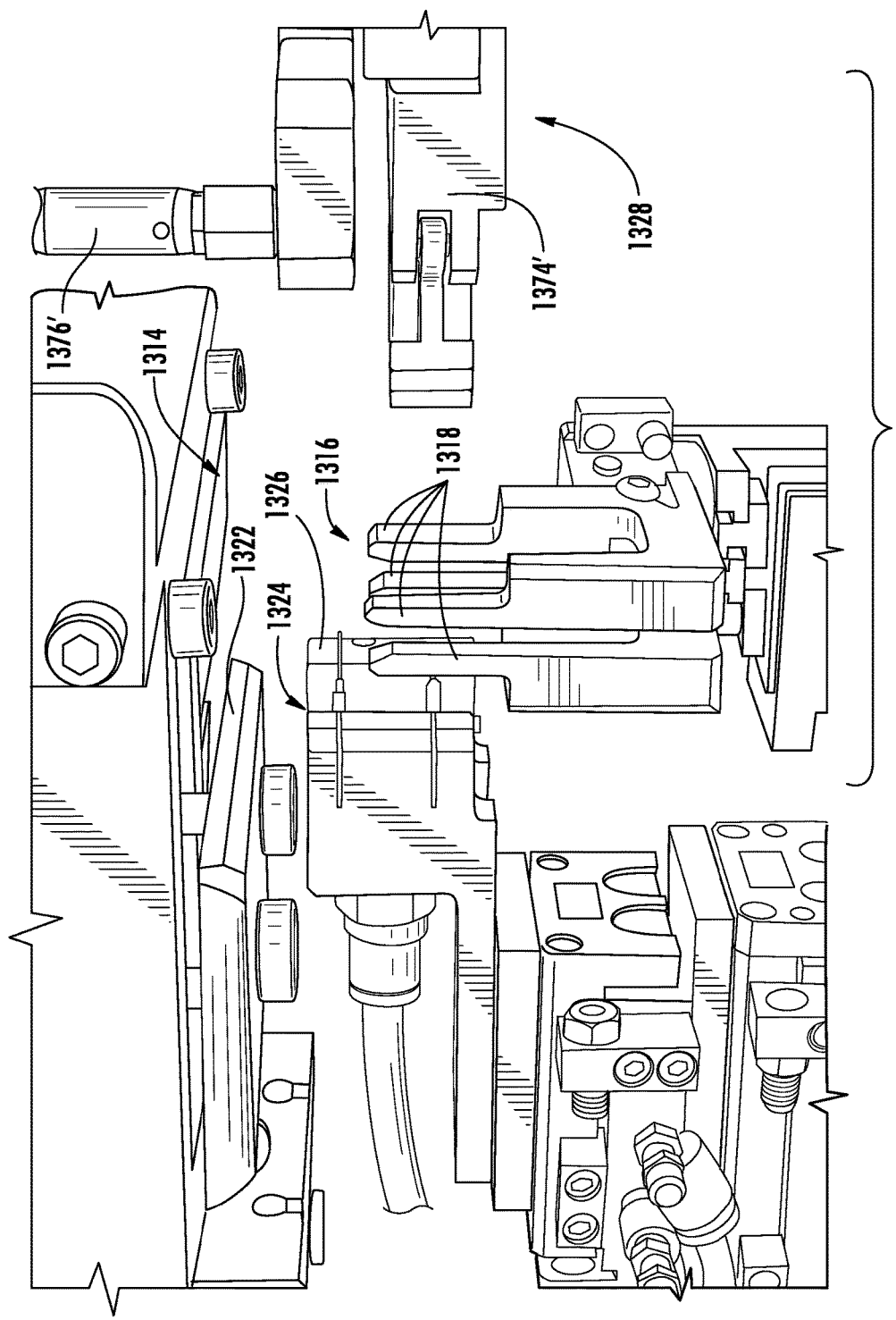
Figure 66:
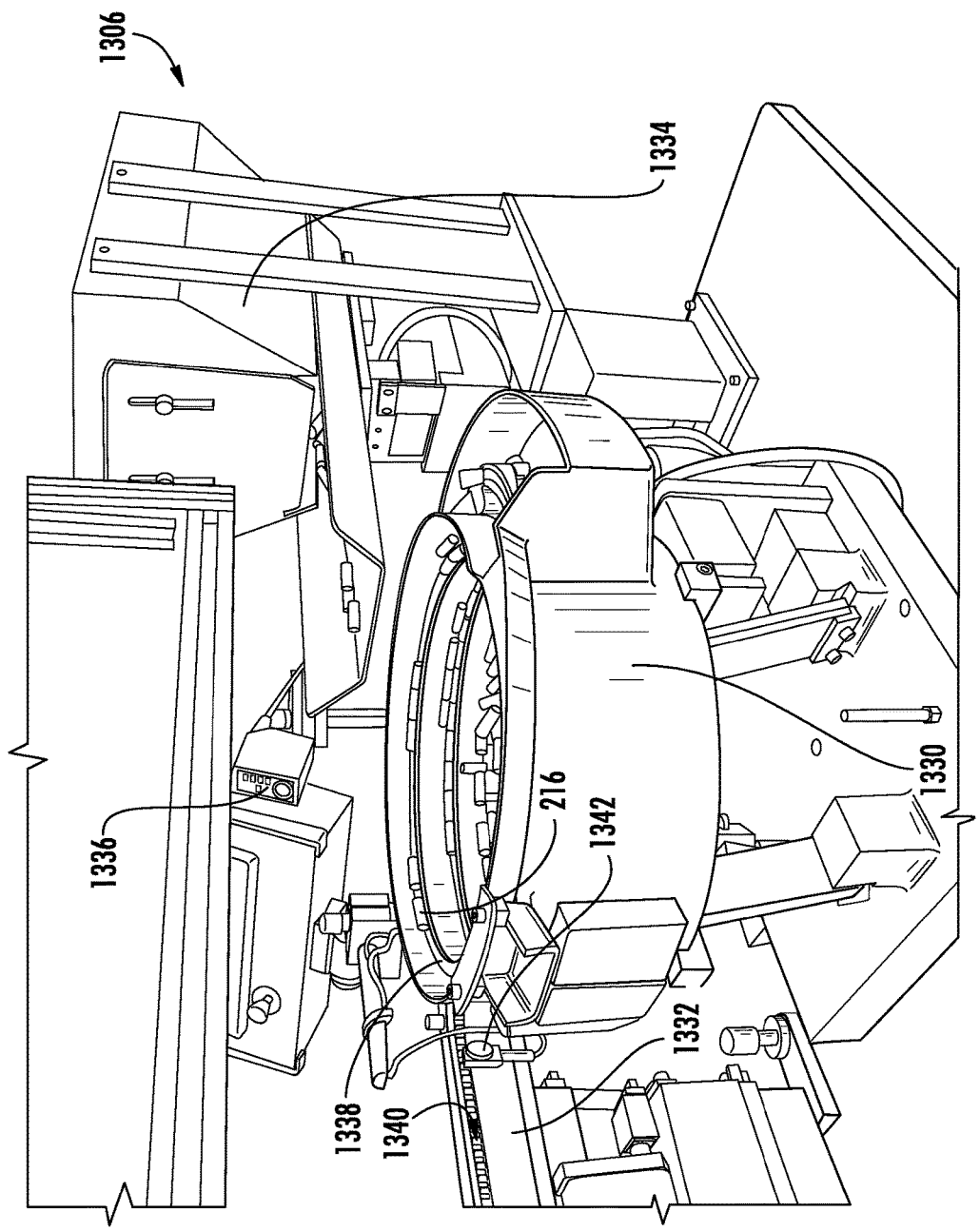
Figure 67:
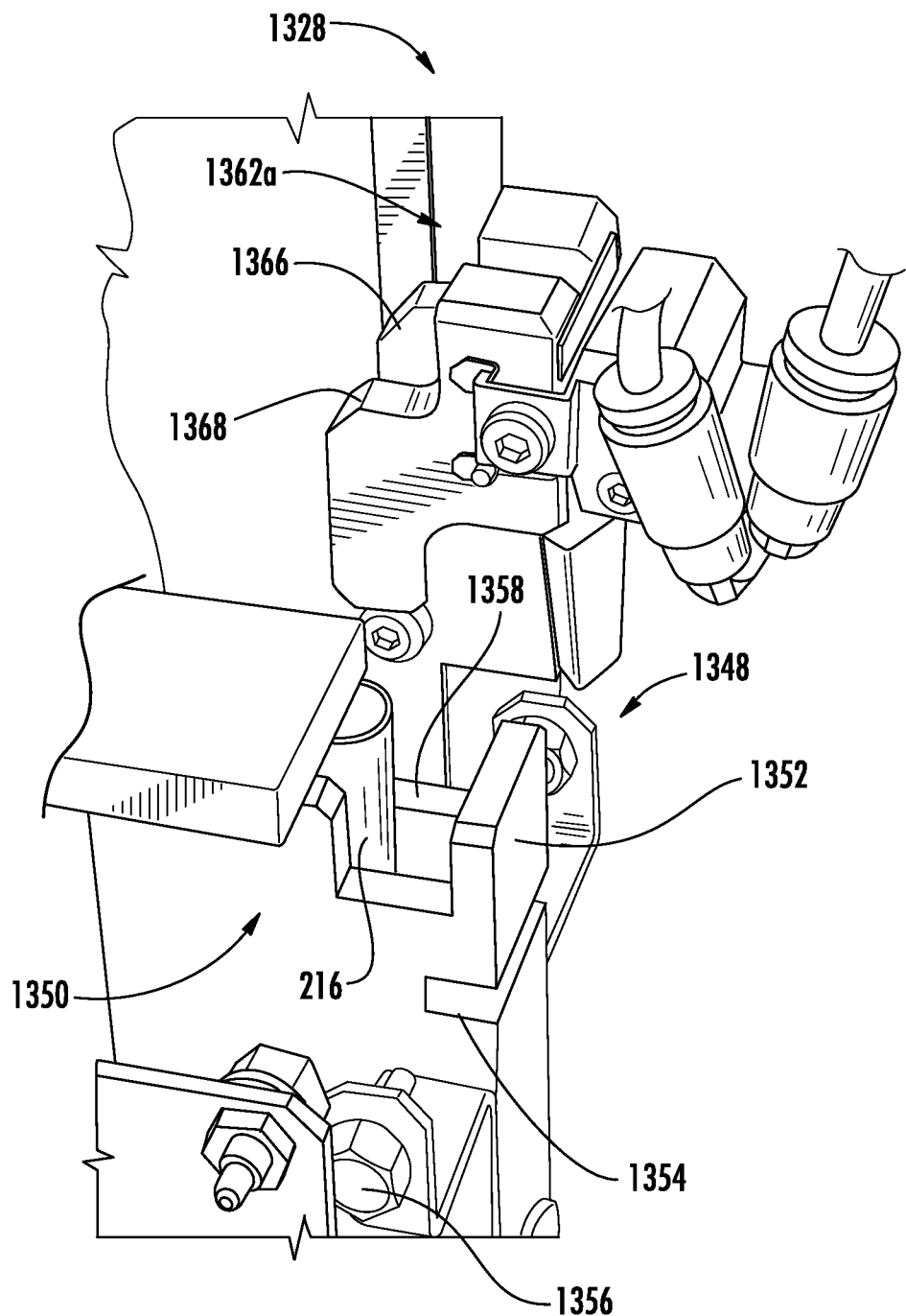
Figure 68:
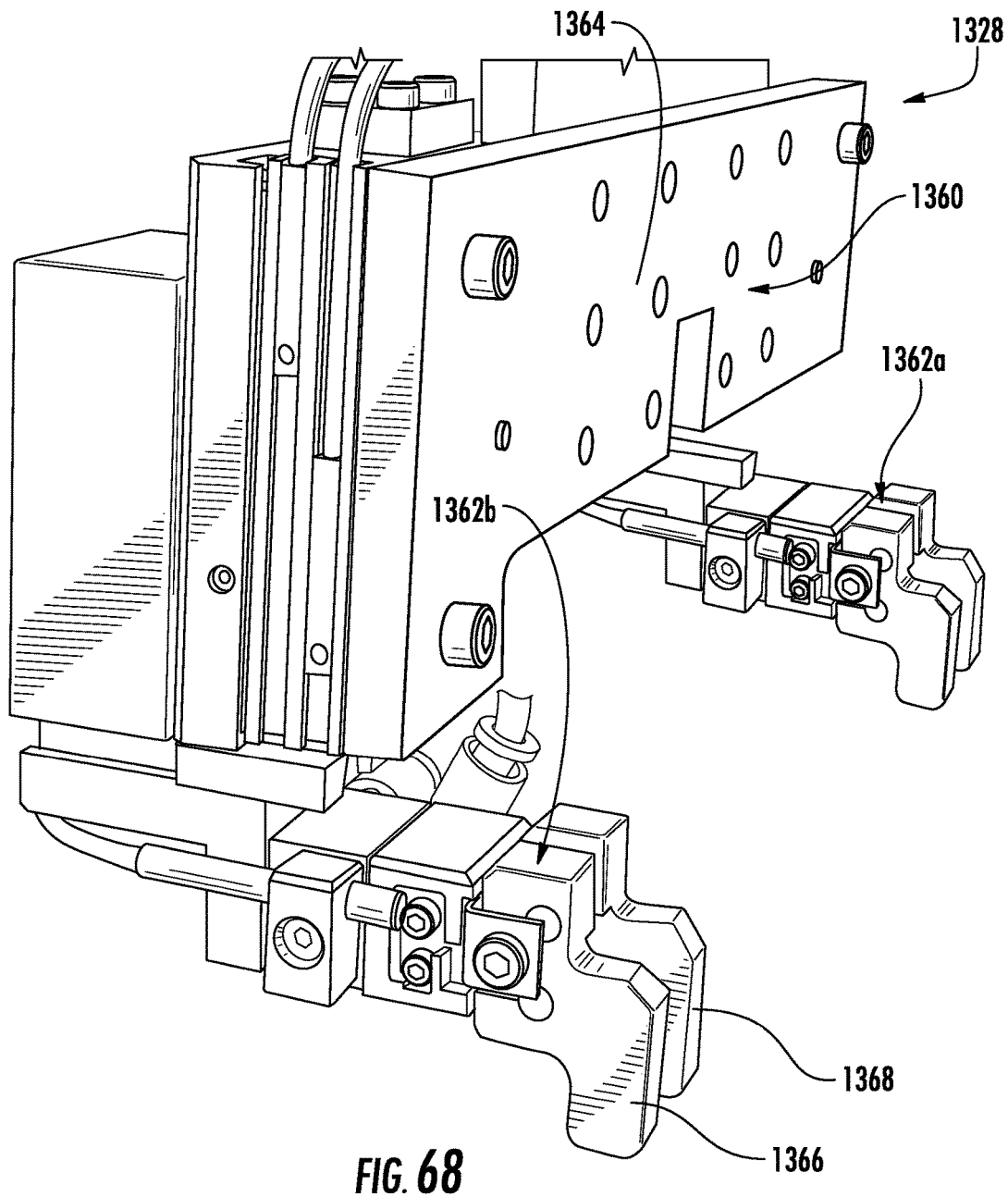
Figure 69:
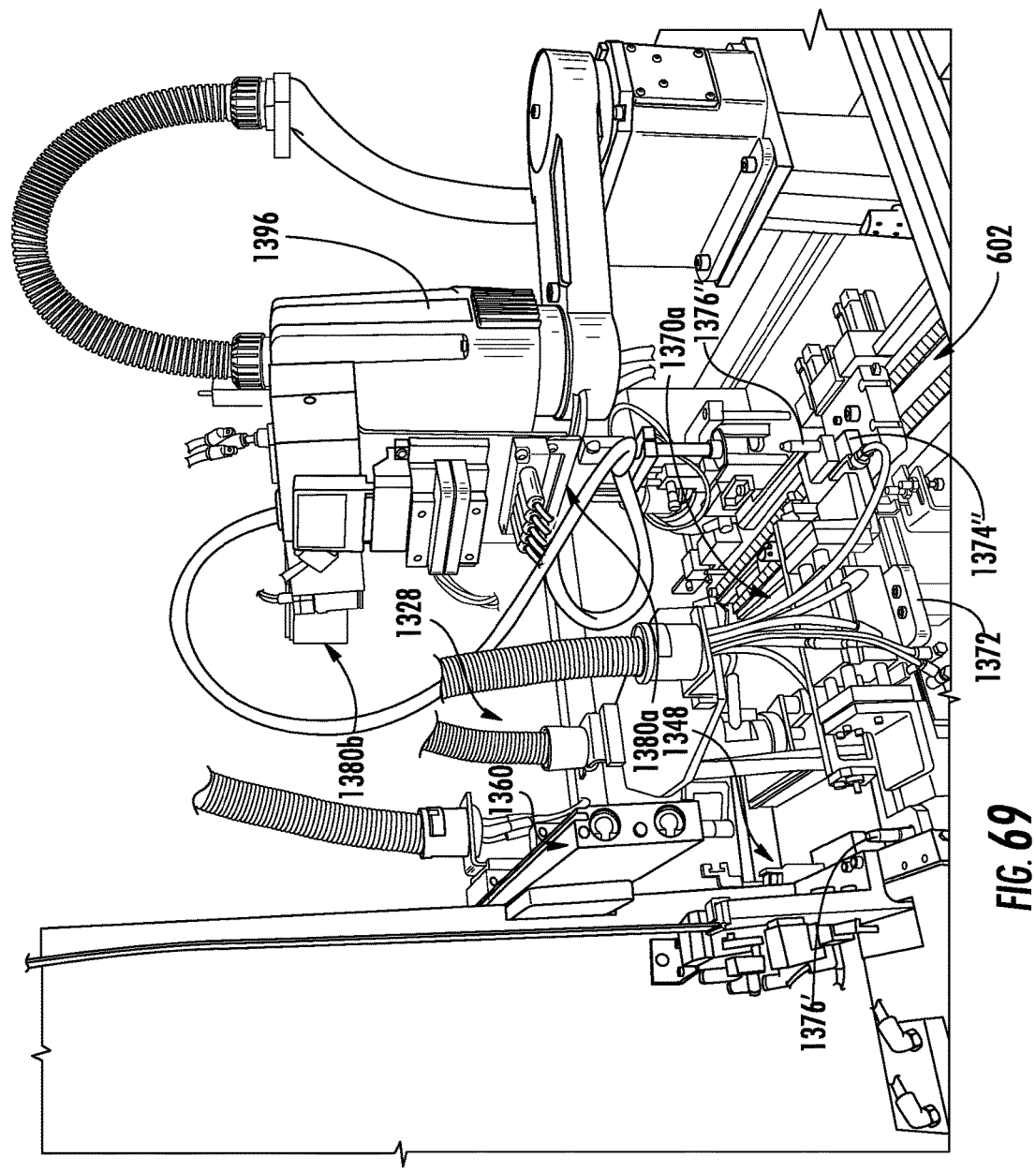
Figure 70:
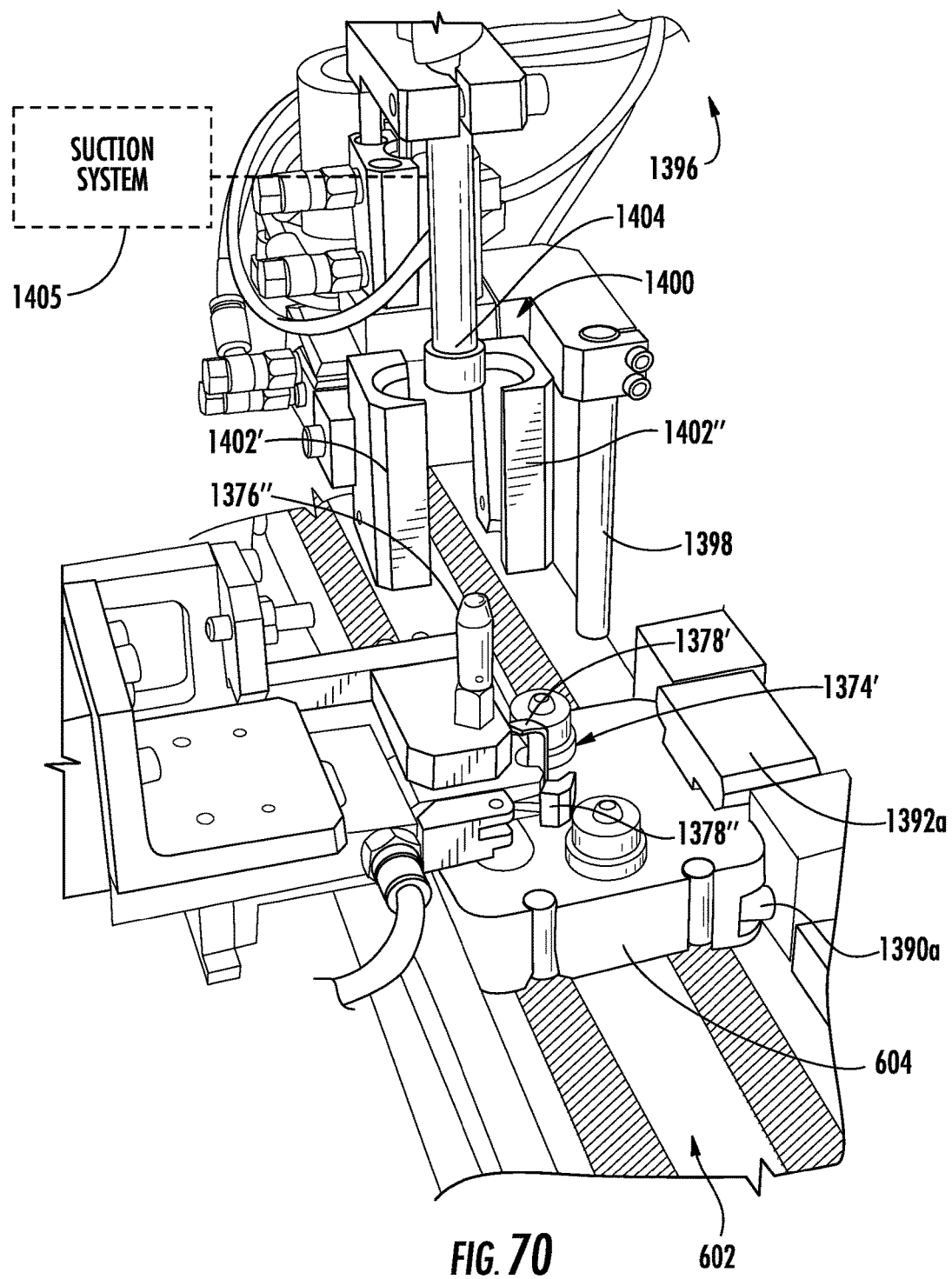
Figure 71:
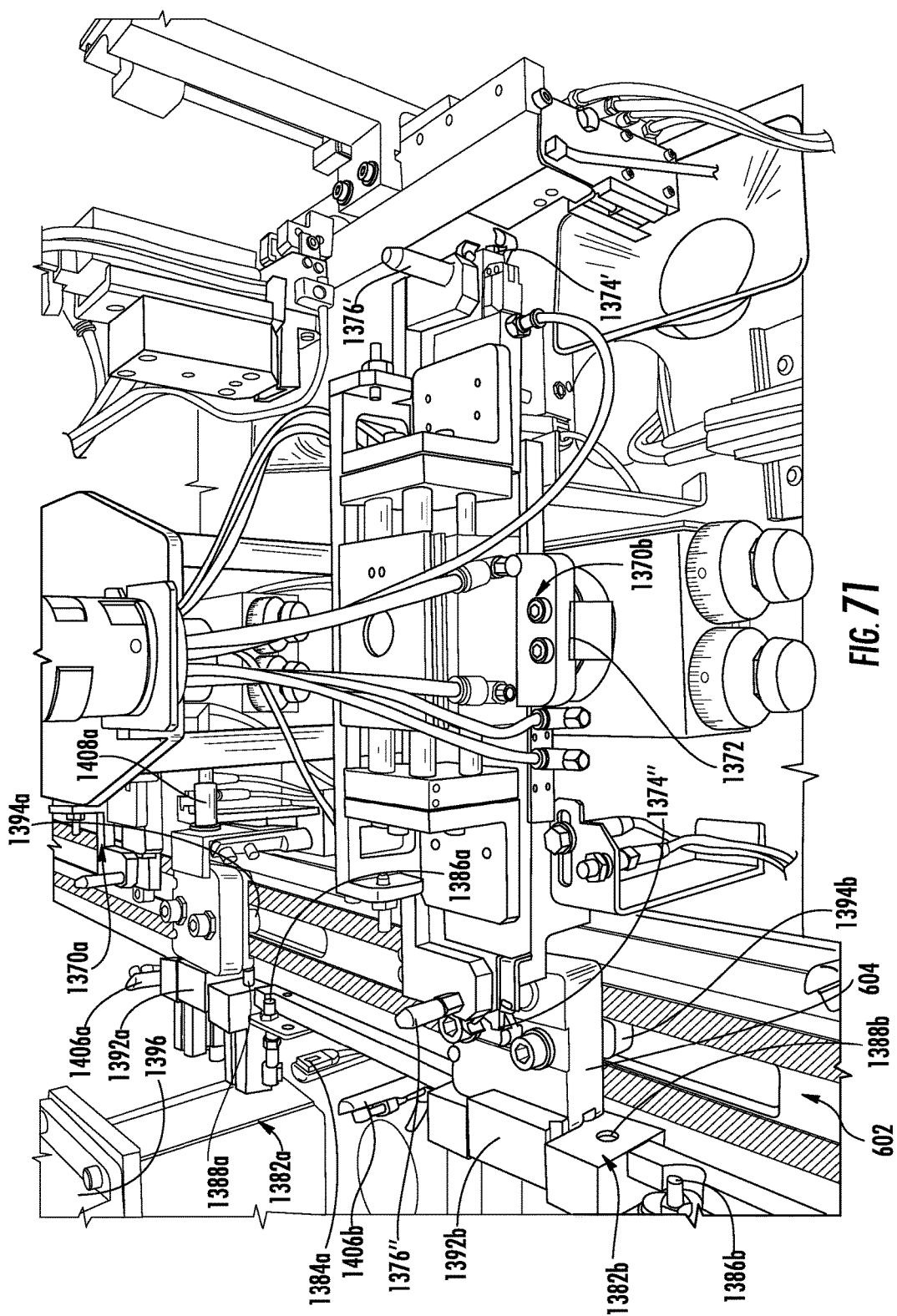
Figure 72:
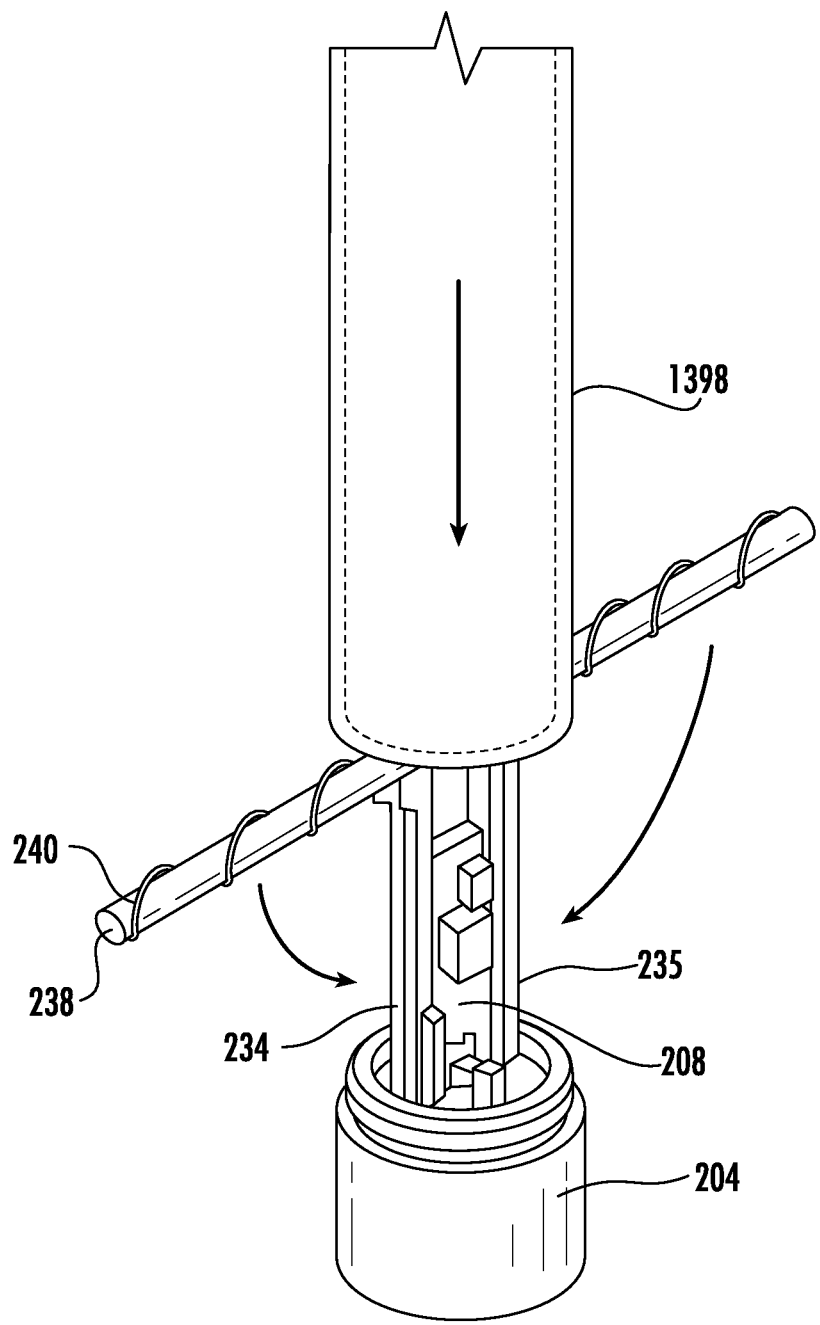
Figure 73:
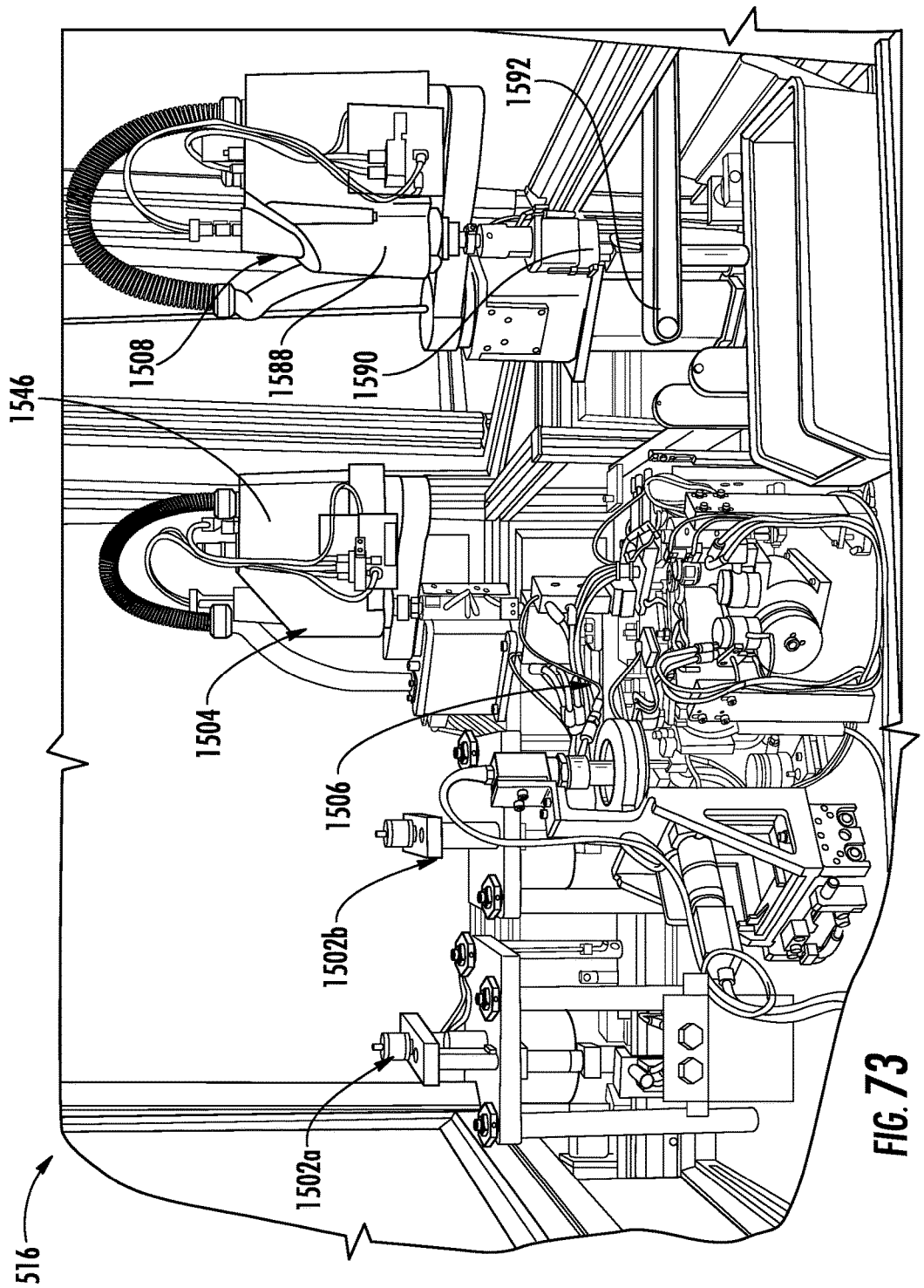
Figure 74:
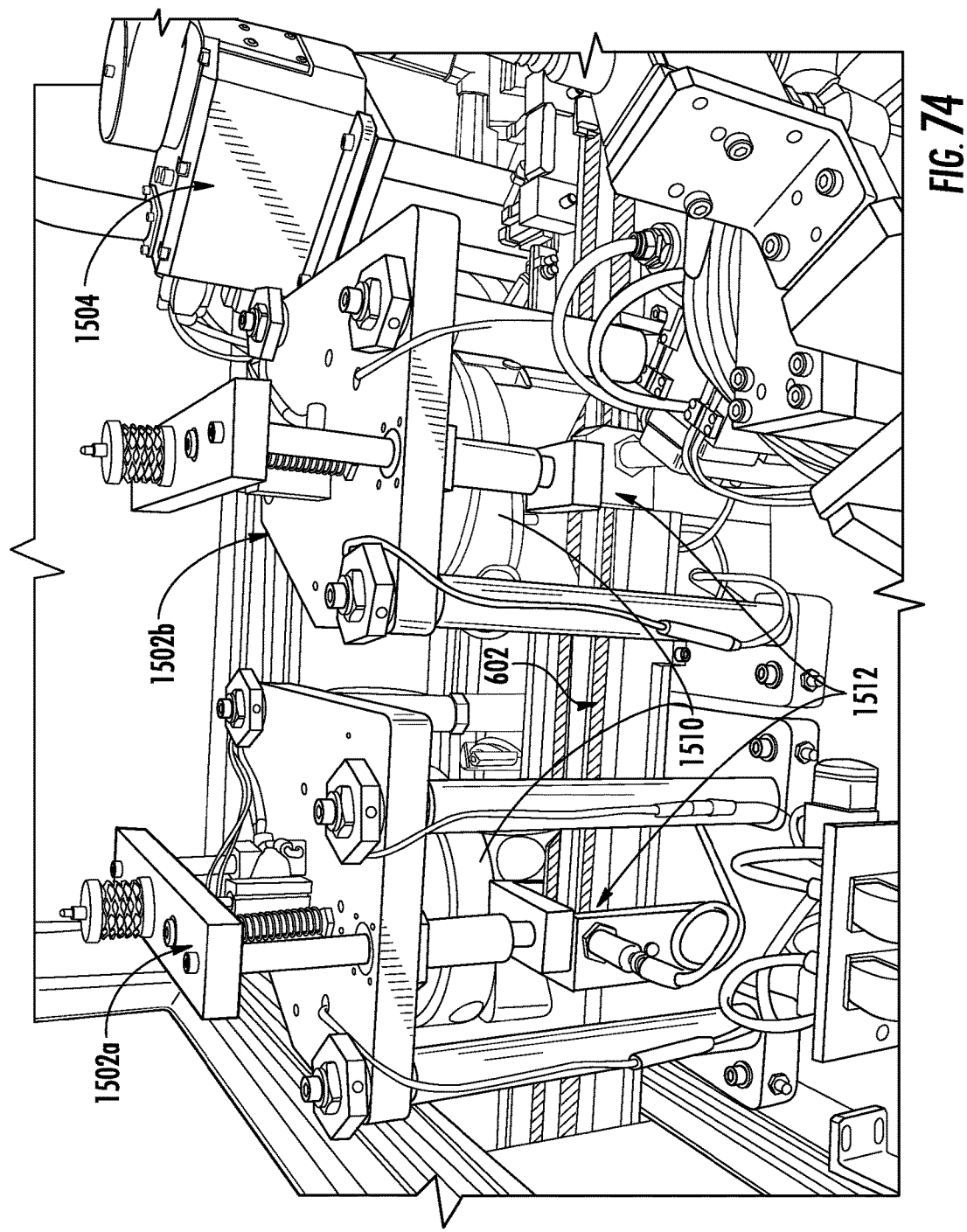
Figure 75:
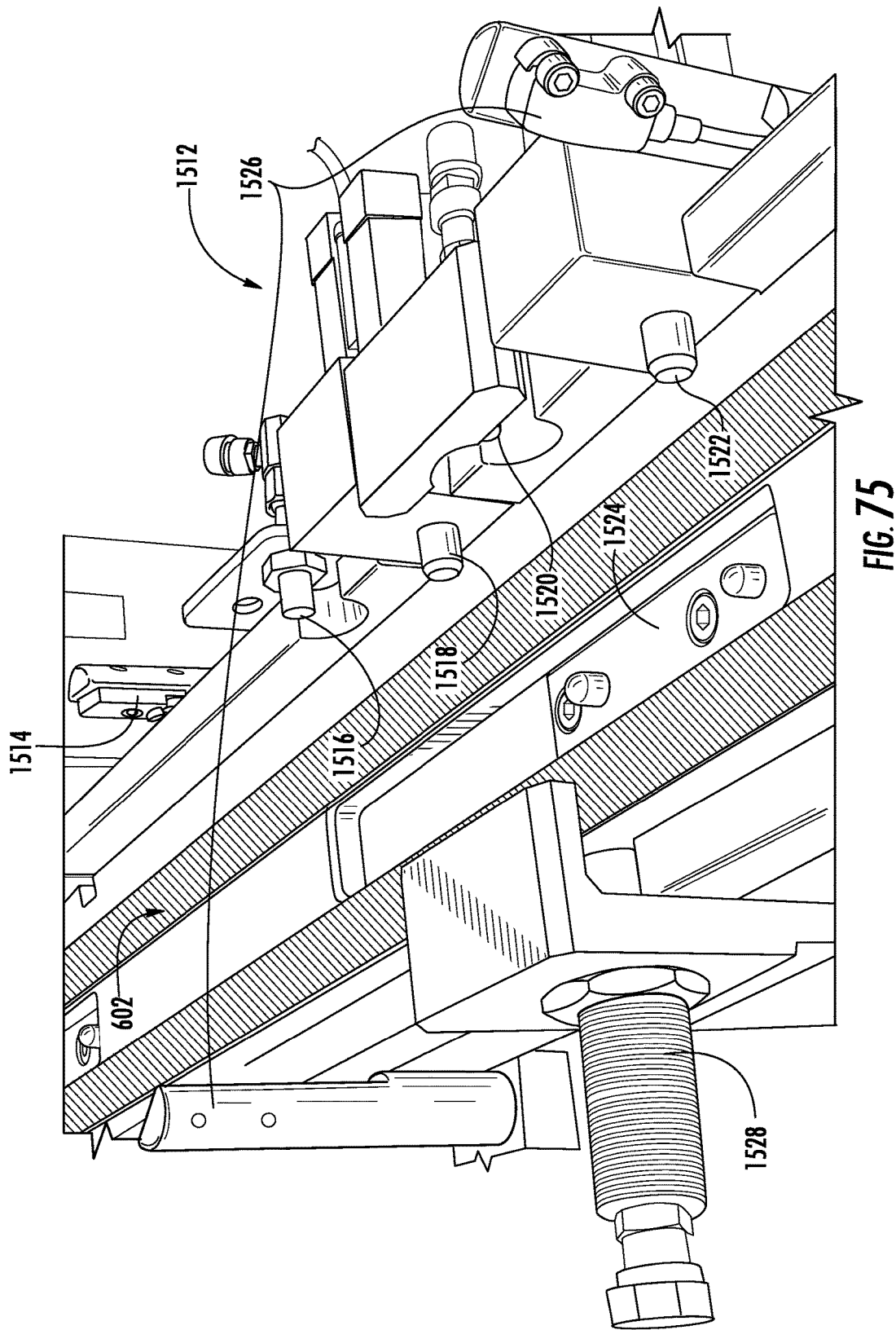
Figure 76:
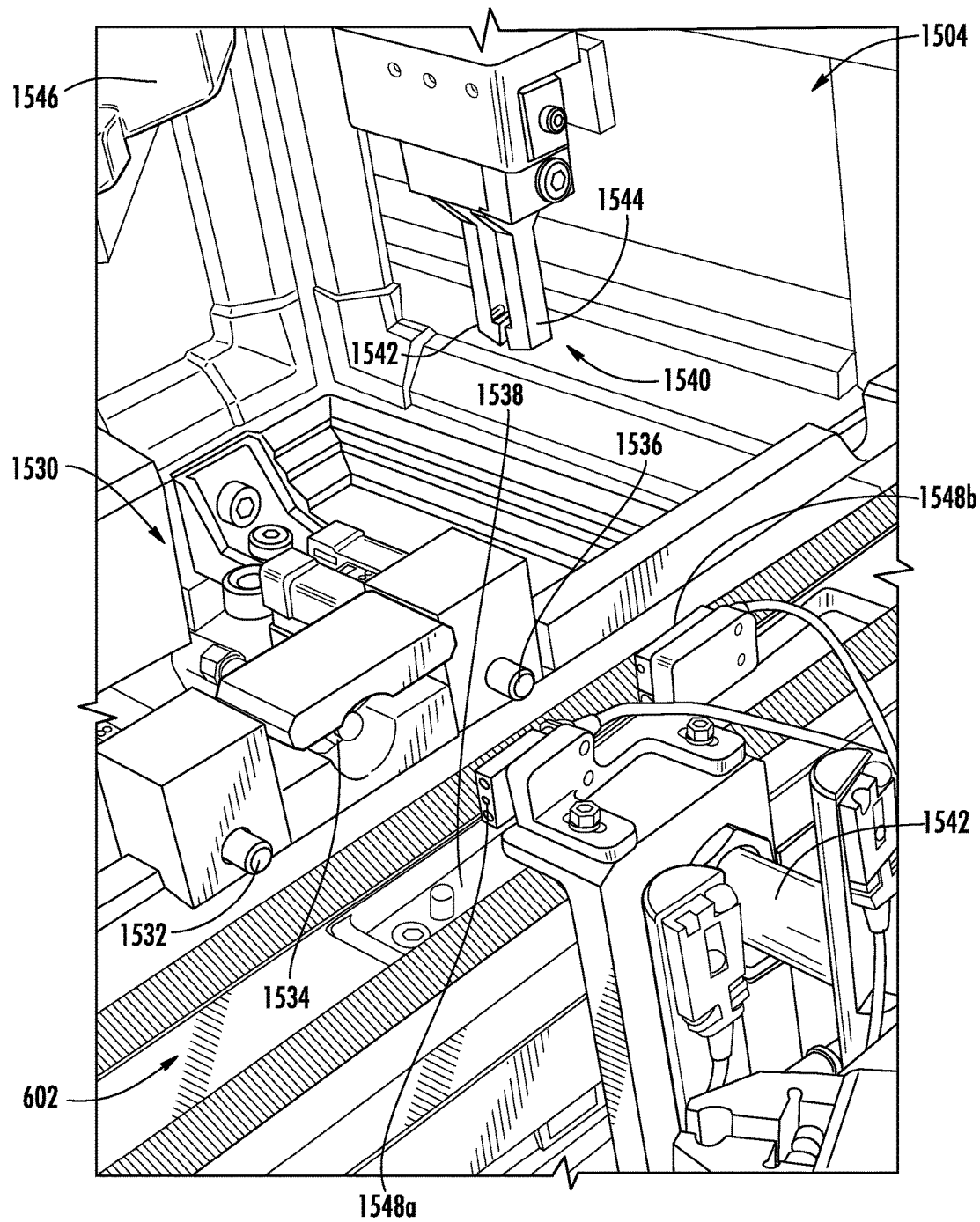
Figure 77:
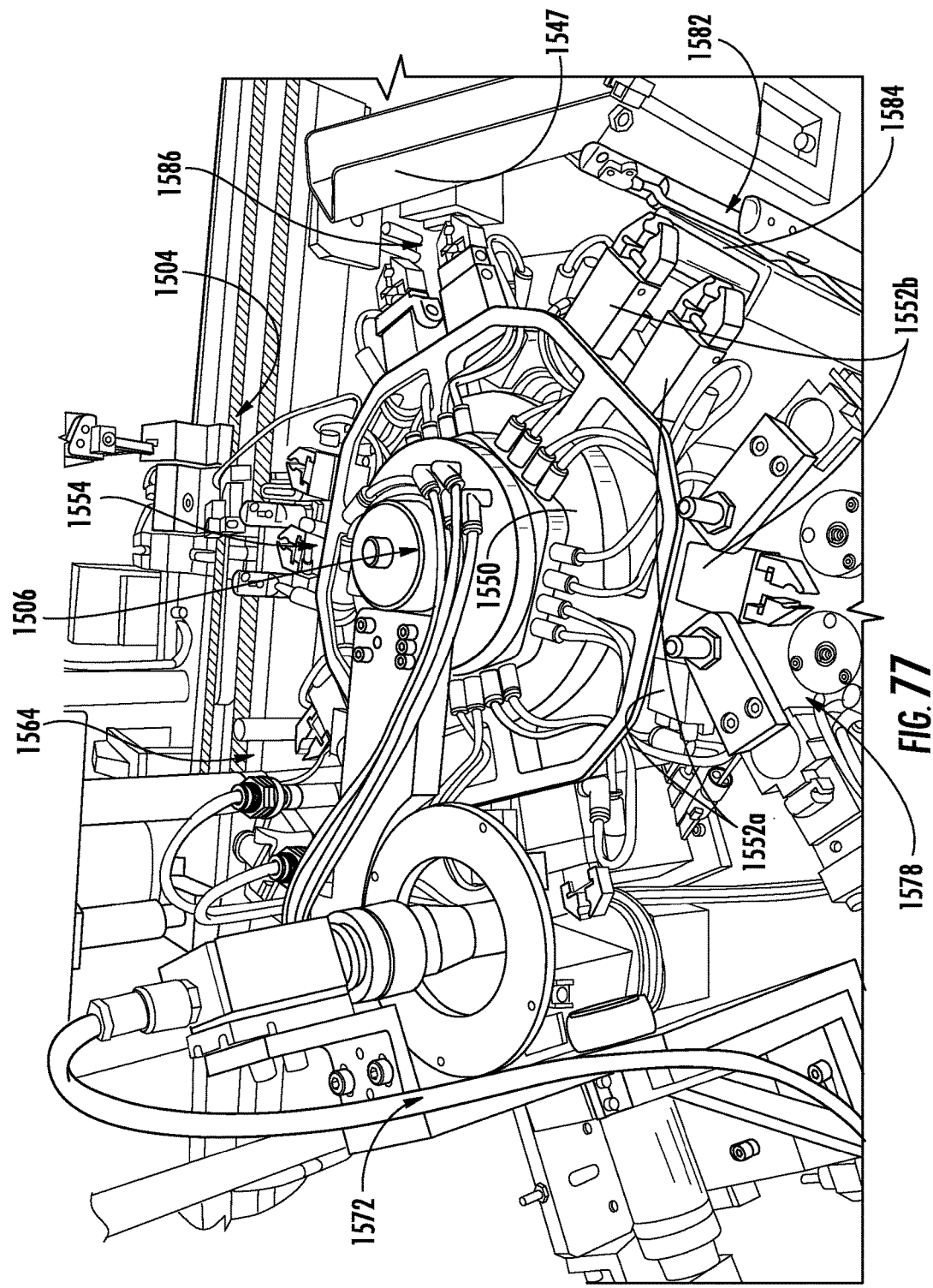
Figure 78:
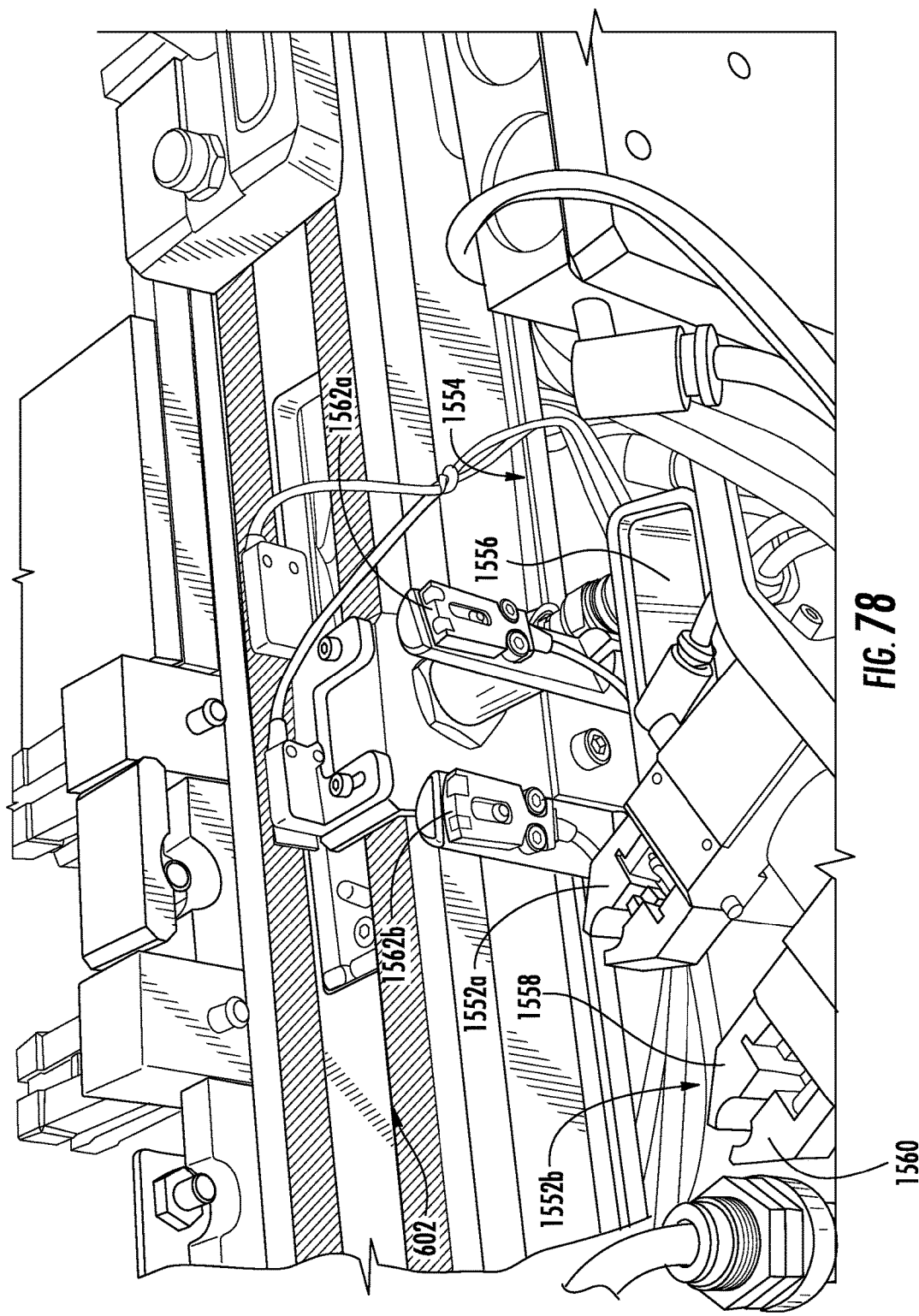
Figure 79:
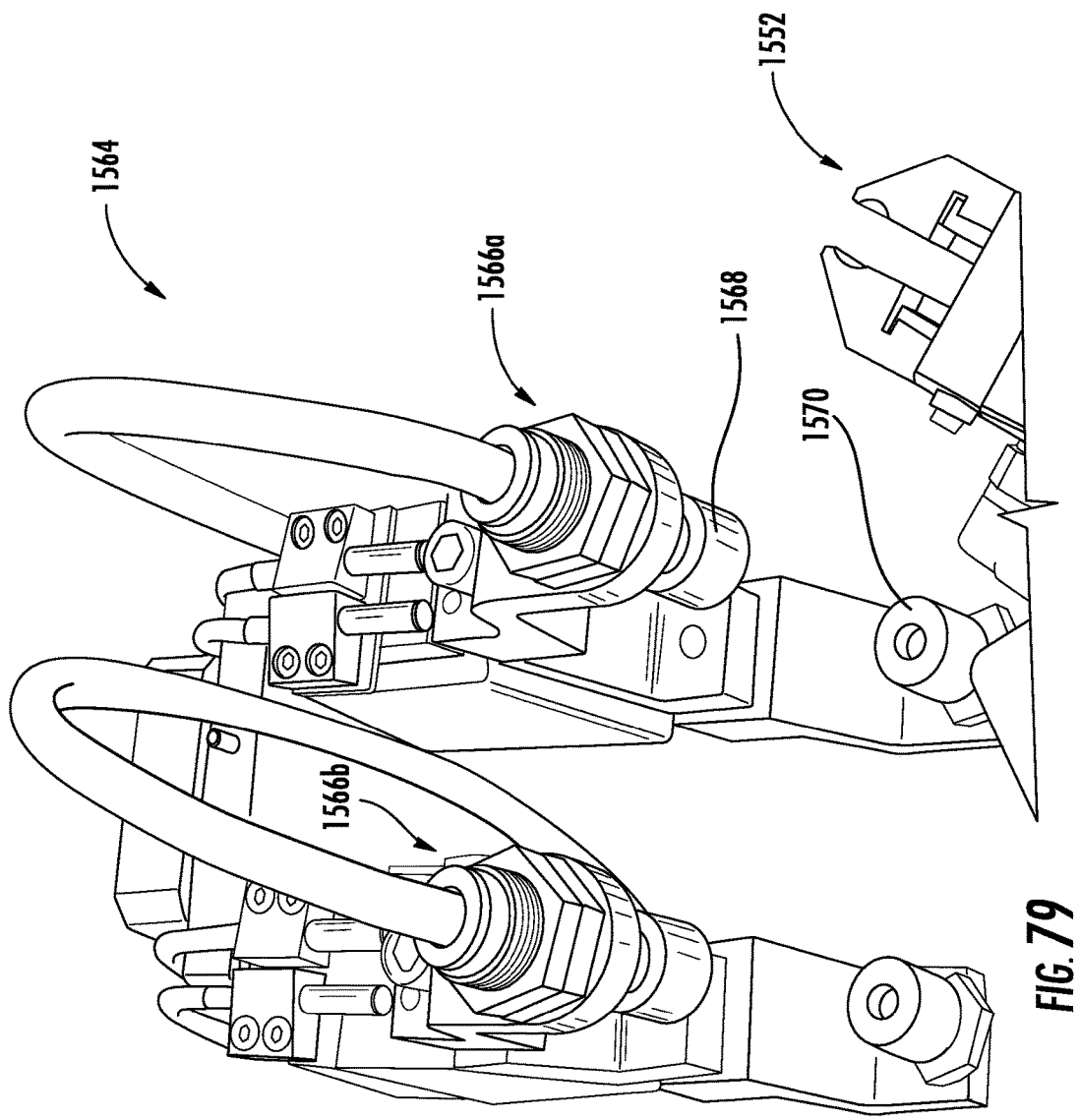
Figure 80:
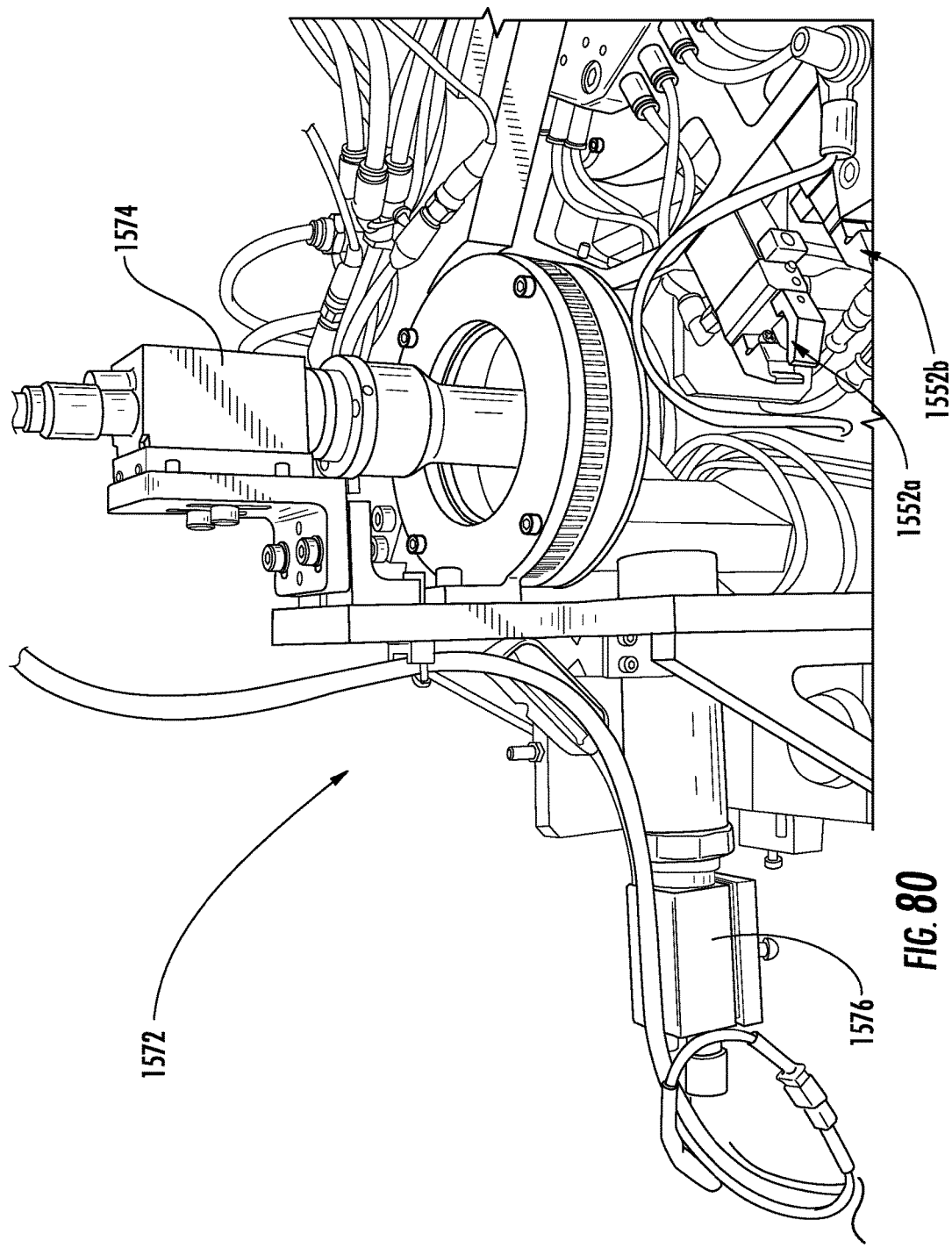
Figure 81:
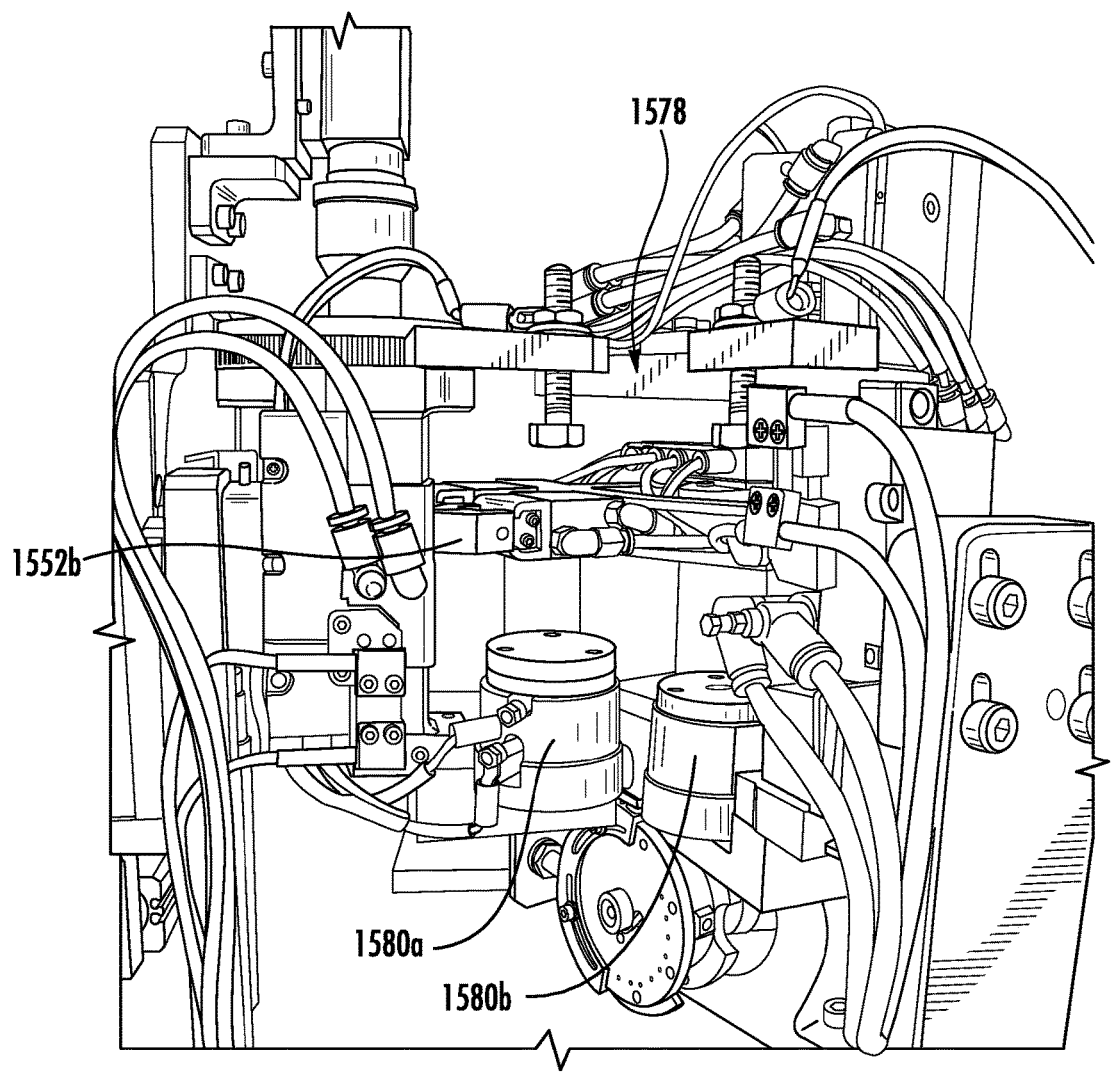
Figure 84:
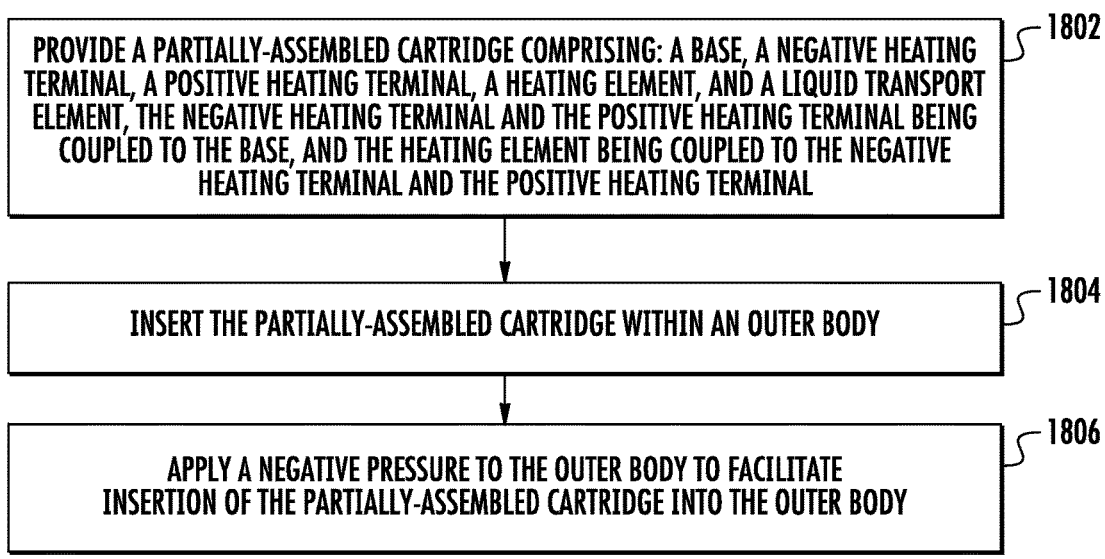
Figure 85:
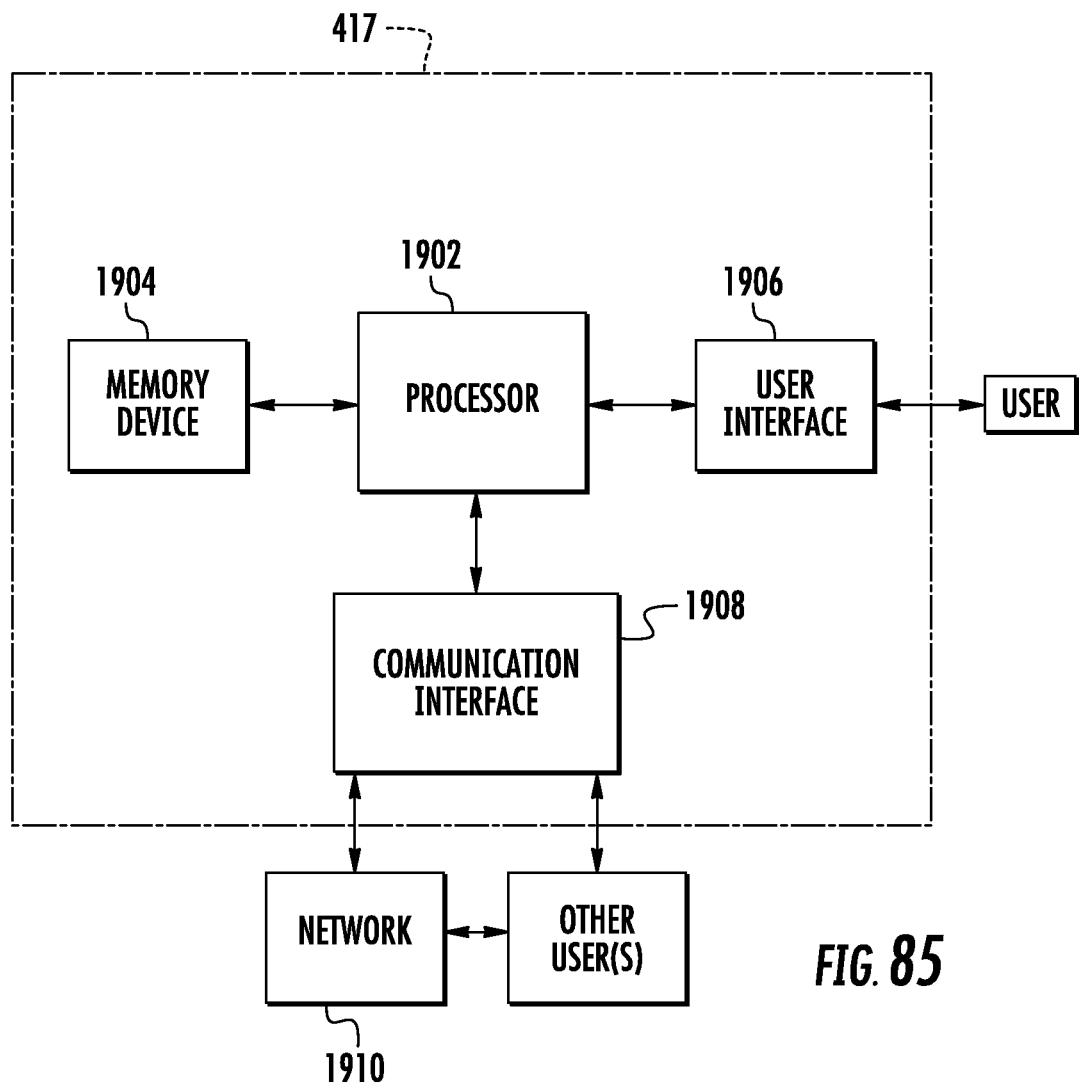

Having thus described the disclosure in the foregoing general terms, reference will now be made to the accompanying drawings, which are not necessarily drawn to scale, and wherein:

FIG. 1 illustrates an aerosol delivery device comprising a cartridge and a control body, the cartridge being illustrated in an exploded configuration and the control body being illustrated in an assembled configuration according to an example embodiment of the present disclosure;

FIG. 2 illustrates the control body of FIG. 1 in an exploded configuration according to an example embodiment of the present disclosure;

FIG. 3 schematically illustrates a system for producing cartridges for an aerosol delivery device including a cartridge assembly subsystem, a cartridge filling subsystem, a cartridge capping subsystem, a cartridge labeling subsystem, and an inspection subsystem according to an example embodiment of the present disclosure;

FIG. 4 schematically illustrates the cartridge assembly subsystem of FIG. 3 according to an example embodiment of the present disclosure;

FIG. 5 illustrates a top perspective view of a carriage of the cartridge assembly subsystem of FIG. 4 according to an example embodiment of the present disclosure;

FIG. 6 illustrates a bottom perspective view of the carriage of FIG. 5 according to an example embodiment of the present disclosure;

FIG. 7 illustrates a side view of the carriage of FIG. 5 with bases engaged with first and second engagement heads thereof according to an example embodiment of the present disclosure;

FIG. 8 illustrates a perspective view of a base load substation of the cartridge assembly subsystem of FIG. 4 according to an example embodiment of the present disclosure;

FIG. 9 illustrates an enlarged view of a supply unit of the base load substation of FIG. 8 according to an example embodiment of the present disclosure;

FIG. 10 illustrates an enlarged view of a singulator of the supply unit of FIG. 9 according to an example embodiment of the present disclosure;

FIG. 11 illustrates an enlarged perspective view of a feeder unit of the base load substation of FIG. 8 according to an example embodiment of the present disclosure;

FIG. 12 illustrates an alternate enlarged perspective view of the feeder unit of the base load substation of FIG. 8 according to an example embodiment of the present disclosure;

FIG. 13 illustrates a first assembly unit and a second assembly unit of the base load substation of FIG. 8 according to an example embodiment of the present disclosure;

FIG. 14 illustrates an enlarged view of a base of the cartridge of FIG. 1 in a desired rotational orientation relative to a machine direction according to an example embodiment of the present disclosure;

FIG. 15 illustrates a view of a track of the cartridge assembly subsystem of FIG. 4 proximate the base load substation of FIG. 8 according to an example embodiment of the present disclosure;

FIG. 16 illustrates an opposing view of the track of the cartridge assembly subsystem of FIG. 4 proximate the base load substation of FIG. 8 according to an example embodiment of the present disclosure;

FIG. 17 illustrates a perspective view of a control component terminal coupling substation of the cartridge assembly substation of FIG. 4 according to an example embodiment of the present disclosure;

FIG. 18 illustrates an enlarged view of a supply unit of the control component terminal coupling substation of FIG. 17 according to an example embodiment of the present disclosure;

FIG. 19 illustrates an enlarged view of a pathway defined by a vibratory bowl of the supply unit of FIG. 18 according to an example embodiment of the present disclosure;

FIG. 20 illustrates a view of a singulator of the supply unit of FIG. 18 according to an example embodiment of the present disclosure:

FIG. 21 illustrates an enlarged view of the singulator of FIG. 20 with a singulated control component terminal according to an example embodiment of the present disclosure;

FIG. 22 illustrates a first assembly unit and a second assembly unit of the control component terminal coupling substation of FIG. 17 according to an example embodiment of the present disclosure;

FIG. 23 illustrates an enlarged view of a first engagement head of the first assembly unit of FIG. 22 according to an example embodiment of the present disclosure;

FIG. 24 illustrates a perspective view of the track of the cartridge assembly subsystem of FIG. 4 proximate the control component coupling substation according to an example embodiment of the present disclosure;

FIG. 25 illustrates a perspective view of bases of the cartridge of FIG. 1 with a control component terminal partially engaged therewith according to an example embodiment of the present disclosure:

FIG. 26 illustrates a press of the control component coupling substation of FIG. 17 according to an example embodiment of the present disclosure;

FIG. 27 illustrates a perspective view of a negative heating terminal coupling substation of the cartridge assembly substation of FIG. 4 according to an example embodiment of the present disclosure;

FIG. 28 illustrates an enlarged view of a supply unit of the negative heating terminal coupling substation of FIG. 17 according to an example embodiment of the present disclosure;

FIG. 29 illustrates an enlarged view of a singulator of the supply unit of FIG. 28 according to an example embodiment of the present disclosure;

FIG. 30 illustrates an enlarged view of a feeder unit of the negative heating terminal coupling substation of FIG. 17 according to an example embodiment of the present disclosure;

FIG. 31 illustrates a first assembly unit and a second assembly unit of the negative heating terminal coupling substation of FIG. 27 according to an example embodiment of the present disclosure;

FIG. 32 illustrates an enlarged view of an end effector of the first assembly unit of FIG. 31 according to an example embodiment of the present disclosure;

FIG. 33 illustrates an enlarged view of the end effector of FIG. 32 engaging a first negative heating terminal according to an example embodiment of the present disclosure;

FIG. 34 illustrates the track of the cartridge assembly subsystem of FIG. 4 proximate the negative heating terminal coupling substation according to an example embodiment of the present disclosure;

FIG. 35 illustrates an inspection unit at the positive heating terminal assembly subsystem of the cartridge assembly substation of FIG. 4 according to an example embodiment of the present disclosure;

FIG. 36 illustrates a perspective view of the control component coupling substation of the cartridge assembly substation of FIG. 4 according to an example embodiment of the present disclosure;

FIG. 37 illustrates a feeder unit of the control component coupling substation of FIG. 36 according to an example embodiment of the present invention;

FIG. 38 illustrates an enlarged view of a vibratory bowl of the supply unit of FIG. 37 proximate an actuator according to an example embodiment of the present disclosure;

FIG. 39 illustrates an enlarged view of the vibratory bowl of FIG. 38 proximate a gap defined in a pathway according to an example embodiment of the present disclosure;

FIG. 40 illustrates an enlarged view of a singulator of the supply unit of FIG. 37 and a feeder unit of the control component coupling substation of FIG. 36 in a first receiving position according to an example embodiment of the present disclosure;

FIG. 41 illustrates an opposing enlarged view of the singulator and the feeder unit of FIG. 40 wherein the feeder unit is in a second receiving position according to an example embodiment of the present disclosure;

FIG. 42 illustrates a first assembly unit and a second assembly unit of the control component coupling substation of FIG. 36 according to an example embodiment of the present disclosure;

FIG. 43 illustrates a first end effector of the first assembly unit of FIG. 42 wherein a pivoting gripper is in a substantially horizontal configuration according to an example embodiment of the present disclosure;

FIG. 44 illustrates the first end effector of FIG. 43 wherein the pivoting gripper is in a substantially vertical configuration according to an example embodiment of the present disclosure;

FIG. 45 illustrates the track of the cartridge assembly subsystem of FIG. 4 proximate the control component coupling substation of FIG. 36 according to an example embodiment of the present disclosure;

FIG. 46 illustrates the track of FIG. 45 proximate a second processing portion according to an example embodiment of the present disclosure;

FIG. 47 illustrates a perspective view of the flow director coupling substation of the cartridge assembly substation of FIG. 4 according to an example embodiment of the present disclosure;

FIG. 48 illustrates an enlarged view of a supply unit of the flow director coupling substation of FIG. 47 according to an example embodiment of the present disclosure;

FIG. 49 illustrates a singulator of the supply unit of FIG. 48 according to an example embodiment of the present disclosure;

FIG. 50 illustrates a perspective view of a feeder unit of the flow director coupling substation of FIG. 47 according to an example embodiment of the present disclosure;

FIG. 51 illustrates a perspective view of a first assembly unit of the of the flow director coupling substation of FIG. 47 according to an example embodiment of the present disclosure;

FIG. 52 illustrates a first end effector of the first assembly unit of FIG. 51 according to an example embodiment of the present disclosure;

FIG. 53 illustrates a perspective view of the track of the cartridge assembly subsystem of FIG. 4 proximate the flow director coupling substation of FIG. 47 according to an example embodiment of the present disclosure;

FIG. 54 illustrates a perspective view of the heating element coupling substation of the cartridge assembly substation of FIG. 4 according to an example embodiment of the present disclosure;

FIG. 55 illustrates a perspective view of a supply unit of the heating element coupling substation of FIG. 54 according to an example embodiment of the present disclosure;

FIG. 56 illustrates a side view of the supply unit of FIG. 55 according to an example embodiment of the present disclosure;

FIG. 57 illustrates a perspective view of a feeder unit, a first assembly unit, and a second assembly unit of the heating element coupling substation of FIG. 54 according to an example embodiment of the present disclosure;

FIG. 58 illustrates an enlarged view of an end effector of the second assembly unit of FIG. 57 according to an example embodiment of the present disclosure;

FIG. 59 illustrates an enlarged view of an engagement head and a gripper of the feeder unit of FIG. 57 according to an example embodiment of the present disclosure;

FIG. 60 illustrates a perspective view of the track of the cartridge assembly subsystem of FIG. 4 proximate the heating element coupling substation of FIG. 55 according to an example embodiment of the present disclosure;

FIG. 61 illustrates a terminal fixation mechanism and a laser of a first processing portion of the first assembly unit of FIG. 57 according to an example embodiment of the present disclosure;

FIG. 62 illustrates an enlarged partial view of terminal effectors of the terminal fixation mechanism of FIG. 61 according to an example embodiment of the present disclosure;

FIG. 63 illustrates a perspective view of a reservoir and outer body coupling substation of the cartridge assembly substation of FIG. 4 according to an example embodiment of the present disclosure;

FIG. 64 illustrates a perspective view of a reservoir supply unit of the reservoir and outer body coupling substation of FIG. 63 according to an example embodiment of the present disclosure;

FIG. 65 illustrates a side view of a singulator of the reservoir supply unit of FIG. 65 according to an example embodiment of the present disclosure;

FIG. 66 illustrates a perspective view of an outer body supply unit of the reservoir and outer body coupling substation of FIG. 63 according to an example embodiment of the present disclosure;

FIG. 67 illustrates a side view of a singulator of the outer body supply unit of FIG. 66 according to an example embodiment of the present disclosure;

FIG. 68 illustrates an initial outer body feeder of a feeder unit of the reservoir and outer body coupling substation of FIG. 63 according to an example embodiment of the present disclosure;

FIG. 69 illustrates a first outer body and reservoir substrate feeder and first and second assembly units of the reservoir and outer body coupling substation of FIG. 63 according to an example embodiment of the present disclosure;

FIG. 70 illustrates a perspective view of a bending mechanism and an outer body gripper of the first assembly unit of FIG. 69 according to an example embodiment of the present disclosure;

FIG. 71 illustrates a perspective view of a second outer body and reservoir substrate feeder of the reservoir and outer body coupling substation of FIG. 63 according to an example embodiment of the present disclosure;

FIG. 72 illustrates an enlarged view of the bending mechanism of FIG. 70 according to an example embodiment of the present disclosure;

FIG. 73 illustrates a partial side view of the outer body crimping and inspection substation according to an example embodiment of the present disclosure;

FIG. 74 illustrates a perspective view of first and second crimper units of the outer body crimping and inspection substation according to an example embodiment of the present disclosure;

FIG. 75 illustrates an enlarged perspective view of the processing portion included at each of the first and second crimper units of FIG. 74 according to an example embodiment of the present disclosure;

FIG. 76 illustrates an enlarged view of a processing portion of a first transfer unit of the outer body crimping and inspection substation of FIG. 73 according to an example embodiment of the present disclosure;

FIG. 77 illustrates a perspective view of an inspection and processing unit including an indexing table of the outer body crimping and inspection substation of FIG. 73 according to an example embodiment of the present disclosure;

FIG. 78 illustrates an enlarged view of a first angular stop of the indexing table of FIG. 77 according to an example embodiment of the present disclosure;

FIG. 79 illustrates an enlarged perspective view of a second angular stop of the indexing table of FIG. 77 according to an example embodiment of the present disclosure;

FIG. 80 illustrates a side view of a third angular stop of the indexing table of FIG. 77 according to an example embodiment of the present disclosure;

FIG. 81 illustrates a side view a fourth angular stop of the indexing table of FIG. 77 according to an example embodiment of the present disclosure;

FIG. 82 schematically illustrates a cartridge assembly method including alternatingly feeding components from a first supply unit to first and second assembly units according to an example embodiment of the present disclosure;

FIG. 83 schematically illustrates a cartridge assembly method including engaging an internal surface of a base of the cartridge with a carriage and transporting the cartridge on a track to a plurality of assembly substations via the carriage according to an example embodiment of the present disclosure;

FIG. 84 schematically illustrates a cartridge assembly method including applying a negative pressure to an outer body of the cartridge to facilitation insertion of other components of the cartridge therein according to an example embodiment of the present disclosure;

FIG. 85 schematically illustrates a controller according to an example embodiment of the present disclosure.

DETAILED DESCRIPTION OF PREFERRED EMBODIMENTS

The present disclosure will now be described more fully hereinafter with reference to exemplary embodiments thereof. These exemplary embodiments are described so that this disclosure will be thorough and complete, and will fully convey the scope of the disclosure to those skilled in the art. Indeed, the disclosure may be embodied in many different forms and should not be construed as limited to the embodiments set forth herein; rather, these embodiments are provided so that this disclosure will satisfy applicable legal requirements. As used in the specification, and in the appended claims, the singular forms "a", "an", "the", include plural variations unless the context clearly dictates otherwise.

The present disclosure provides descriptions of systems for assembling aerosol delivery devices. The aerosol delivery devices may use electrical energy to heat a material (preferably without combusting the material to any significant degree) to form an inhalable substance; such articles most preferably being sufficiently compact to be considered "hand-held" devices. An aerosol delivery device may provide some or all of the sensations (e.g., inhalation and exhalation rituals, types of tastes or flavors, organoleptic effects, physical feel, use rituals, visual cues such as those provided by visible aerosol, and the like) of smoking a cigarette, cigar, or pipe, without any substantial degree of combustion of any component of that article or device. The aerosol delivery device may not produce smoke in the sense of the aerosol resulting from by-products of combustion or pyrolysis of tobacco, but rather, that the article or device most preferably yields vapors (including vapors within aerosols that can be considered to be visible aerosols that might be considered to be described as smoke-like) resulting from volatilization or vaporization of certain components of the article or device, although in other embodiments the aerosol may not be visible. In highly preferred embodiments, aerosol delivery devices may incorporate tobacco and/or components derived from tobacco. As such, the aerosol delivery device can be characterized as an electronic smoking article such as an electronic cigarette or "e-cigarette."

While the systems are generally described herein in terms of embodiments associated with aerosol delivery devices such as so-called "e-cigarettes," it should be understood that the mechanisms, components, features, and methods may be embodied in many different forms and associated with a variety of articles. For example, the description provided herein may be employed in conjunction with embodiments of traditional smoking articles (e.g., cigarettes, cigars, pipes, etc.), heat-not-burn cigarettes, and related packaging for any of the products disclosed herein. Accordingly, it should be understood that the description of the mechanisms, components, features, and methods disclosed herein are discussed in terms of embodiments relating to aerosol delivery mechanisms by way of example only, and may be embodied and used in various other products and methods.

Aerosol delivery devices of the present disclosure also can be characterized as being vapor-producing articles or medicament delivery articles. Thus, such articles or devices can be adapted so as to provide one or more substances (e.g., flavors and/or pharmaceutical active ingredients) in an inhalable form or state. For example, inhalable substances can be substantially in the form of a vapor (i.e., a substance that is in the gas phase at a temperature lower than its critical point). Alternatively, inhalable substances can be in the form of an aerosol (i.e., a suspension of fine solid particles or liquid droplets in a gas). For purposes of simplicity, the term "aerosol" as used herein is meant to include vapors, gases and aerosols of a form or type suitable for human inhalation, whether or not visible, and whether or not of a form that might be considered to be smoke-like.

In use, aerosol delivery devices of the present disclosure may be subjected to many of the physical actions employed by an individual in using a traditional type of smoking article (e.g., a cigarette, cigar or pipe that is employed by lighting and inhaling tobacco). For example, the user of an aerosol delivery device of the present disclosure can hold that article much like a traditional type of smoking article, draw on one end of that article for inhalation of aerosol produced by that article, take puffs at selected intervals of time, etc.

Smoking articles of the present disclosure generally include a number of components provided within an outer shell or body. The overall design of the outer shell or body can vary, and the format or configuration of the outer body that can define the overall size and shape of the smoking article can vary. Typically, an elongated body resembling the shape of a cigarette or cigar can be a formed from a single, unitary shell; or the elongated body can be formed of two or more separable pieces. For example, a smoking article can comprise an elongated shell or body that can be substantially tubular in shape and, as such, resemble the shape of a conventional cigarette or cigar. In one embodiment, all of the components of the smoking article are contained within one outer body or shell. Alternatively, a smoking article can comprise two or more shells that are joined and are separable. For example, a smoking article can possess at one end a control body comprising a shell containing one or more reusable components (e.g., a rechargeable battery and various electronics for controlling the operation of that article), and at the other end and removably attached thereto a shell containing a disposable portion (e.g., a disposable flavor-containing cartridge). More specific formats, configurations and arrangements of components within the single shell type of unit or within a multi-piece separable shell type of unit will be evident in light of the further disclosure provided herein. Additionally, various smoking article designs and component arrangements can be appreciated upon consideration of the commercially available electronic smoking articles.

Aerosol delivery devices of the present disclosure most preferably comprise some combination of a power source (i.e., an electrical power source), at least one control component (e.g., means for actuating, controlling, regulating and/or ceasing power for heat generation, such as by controlling electrical current flow from the power source to other components of the aerosol delivery device), a heater or heat generation component (e.g., an electrical resistance heating element or component commonly referred to as part of an "atomizer"), and an aerosol precursor composition (e.g., commonly a liquid capable of yielding an aerosol upon application of sufficient heat, such as ingredients commonly referred to as "smoke juice," "e-liquid" and "e-juice"), and a mouthend region or tip for allowing draw upon the aerosol delivery device for aerosol inhalation (e.g., a defined air flow path through the article such that aerosol generated can be withdrawn therefrom upon draw).

Alignment of the components within the aerosol delivery device of the present disclosure can vary. In specific embodiments, the aerosol precursor composition can be located near an end of the aerosol delivery device which may be configured to be positioned proximal to the mouth of a user so as to maximize aerosol delivery to the user. Other configurations, however, are not excluded. Generally, the heating element can be positioned sufficiently near the aerosol precursor composition so that heat from the heating element can volatilize the aerosol precursor (as well as one or more flavorants, medicaments, or the like that may likewise be provided for delivery to a user) and form an aerosol for delivery to the user. When the heating element heats the aerosol precursor composition, an aerosol is formed, released, or generated in a physical form suitable for inhalation by a consumer. It should be noted that the foregoing terms are meant to be interchangeable such that reference to release, releasing, releases, or released includes form or generate, forming or generating, forms or generates, and formed or generated. Specifically, an inhalable substance is released in the form of a vapor or aerosol or mixture thereof, wherein such terms are also interchangeably used herein except where otherwise specified.

As noted above, the aerosol delivery device may incorporate a battery or other electrical power source (e.g., a capacitor) to provide current flow sufficient to provide various functionalities to the aerosol delivery device, such as powering of a heater, powering of control systems, powering of indicators, and the like. The power source can take on various embodiments. Preferably, the power source is able to deliver sufficient power to rapidly heat the heating element to provide for aerosol formation and power the aerosol delivery device through use for a desired duration of time. The power source preferably is sized to fit conveniently within the aerosol delivery device so that the aerosol delivery device can be easily handled. Additionally, a preferred power source is of a sufficiently light weight to not detract from a desirable smoking experience.

More specific formats, configurations and arrangements of components within the aerosol delivery device of the present disclosure will be evident in light of the further disclosure provided hereinafter. Additionally, the selection of various aerosol delivery device components can be appreciated upon consideration of the commercially available electronic aerosol delivery devices. Further, the arrangement of the components within the aerosol delivery device can also be appreciated upon consideration of the commercially available electronic aerosol delivery devices.

One example embodiment of an aerosol delivery device 100 is illustrated in FIG. 1. In particular, FIG. 1 illustrates a partially exploded view of an aerosol delivery device 100 including a cartridge 200 and a control body 300. The cartridge 200 and the control body 300 can be permanently or detachably aligned in a functioning relationship. Various mechanisms may connect the cartridge 200 to the control body 300 to result in a threaded engagement, a press-fit engagement, an interference fit, a magnetic engagement, or the like. The aerosol delivery device 100 may be substantially rod-like, substantially tubular shaped, or substantially cylindrically shaped in some embodiments when the cartridge 200 and the control body 300 are in an assembled configuration.

In specific embodiments, one or both of the cartridge 200 and the control body 300 may be referred to as being disposable or as being reusable. For example, the control body 300 may have a replaceable battery or a rechargeable battery and thus may be combined with any type of recharging technology, including connection to a typical alternating current electrical outlet, connection to a car charger (i.e., cigarette lighter receptacle), and connection to a computer, such as through a universal serial bus (USB) cable. Further, in some embodiments the cartridge 200 may comprise a single-use cartridge, as disclosed in U.S. Pat. App. Pub. No. 2014/0060555 to Change et al., which is incorporated herein by reference in its entirety.

FIG. 2 illustrates an exploded view of the control body 300 of the aerosol delivery device 100 according to an example embodiment of the present disclosure. As illustrated, the control body 300 may comprise a coupler 302, an outer body 304, a sealing member 306, an adhesive member 308 (e.g., KAPTON® tape), a flow sensor 310 (e.g., a puff sensor or pressure switch), a control component 312, a spacer 314, an electrical power source 316 (e.g., a battery, which may be rechargeable), a circuit board with an indicator 318 (e.g., a light emitting diode (LED)), a connector circuit 320, and an end cap 322. Examples of electrical power sources are described in U.S. Pat. App. Pub. No. 2010/0028766 by Peckerar et al., the disclosure of which is incorporated herein by reference in its entirety.

With respect to the flow sensor 310, representative current regulating components and other current controlling components including various microcontrollers, sensors, and switches for aerosol delivery devices are described in U.S. Pat. No. 4,735,217 to Gerth et al., U.S. Pat. Nos. 4,922,901, 4,947,874, and 4,947,875, all to Brooks et al., U.S. Pat. No. 5,372,148 to McCafferty et al., U.S. Pat. No. 6,040,560 to Fleischhauer et al., U.S. Pat. No. 7,040,314 to Nguyen et al., and U.S. Pat. No. 8,205,622 to Pan, all of which are incorporated herein by reference in their entireties. Reference also is made to the control schemes described in U.S. App. Pub. No. 2014/0270727 to Ampolini et al., which is incorporated herein by reference in its entirety.

In one embodiment the indicator 318 may comprise one or more light emitting diodes. The indicator 318 can be in communication with the control component 312 through the connector circuit 320 and be illuminated, for example, during a user drawing on a cartridge coupled to the coupler 302, as detected by the flow sensor 310. The end cap 322 may be adapted to make visible the illumination provided thereunder by the indicator 318. Accordingly, the indicator 318 may be illuminated during use of the aerosol delivery device 100 to simulate the lit end of a smoking article. However, in other embodiments the indicator 318 can be provided in varying numbers and can take on different shapes and can even be an opening in the outer body (such as for release of sound when such indicators are present).

Still further components can be utilized in the aerosol delivery device of the present disclosure. For example, U.S. Pat. No. 5,154,192 to Sprinkel et al. discloses indicators for smoking articles; U.S. Pat. No. 5,261,424 to Sprinkel, Jr. discloses piezoelectric sensors that can be associated with the mouth-end of a device to detect user lip activity associated with taking a draw and then trigger heating of a heating device; U.S. Pat. No. 5,372,148 to McCafferty et al. discloses a puff sensor for controlling energy flow into a heating load array in response to pressure drop through a mouthpiece; U.S. Pat. No. 5,967,148 to Harris et al. discloses receptacles in a smoking device that include an identifier that detects a non-uniformity in infrared transmissivity of an inserted component and a controller that executes a detection routine as the component is inserted into the receptacle; U.S. Pat. No. 6,040,560 to Fleischhauer et al. describes a defined executable power cycle with multiple differential phases; U.S. Pat. No. 5,934,289 to Watkins et al. discloses photonic-optronic components; U.S. Pat. No. 5,954,979 to Counts et al. discloses means for altering draw resistance through a smoking device; U.S. Pat. No. 6,803,545 to Blake et al. discloses specific battery configurations for use in smoking devices; U.S. Pat. No. 7,293,565 to Griffen et al. discloses various charging systems for use with smoking devices; U.S. Pat. No. 8,402,976 to Fernando et al. discloses computer interfacing means for smoking devices to facilitate charging and allow computer control of the device; U.S. Pat. No. 8,689,804 to Fernando et al. discloses identification systems for smoking devices; and WO 2010/003480 by Flick discloses a fluid flow sensing system indicative of a puff in an aerosol generating system; all of the foregoing disclosures being incorporated herein by reference in their entireties. Further examples of components related to electronic aerosol delivery articles and disclosing materials or components that may be used in the present article include U.S. Pat. No. 4,735,217 to Gerth et al.; U.S. Pat. No. 5,249,586 to Morgan et al.; U.S. Pat. No. 5,666,977 to Higgins et al.; U.S. Pat. No. 6,053,176 to Adams et al.; U.S. Pat. No. 6,164,287 to White; U.S. Pat. No. 6,196,218 to Voges; U.S. Pat. No. 6,810,883 to Felter et al.; U.S. Pat. No. 6,854,461 to Nichols; U.S. Pat. No. 7,832,410 to Hon; U.S. Pat. No. 7,513,253 to Kobayashi; U.S. Pat. No. 7,896,006 to Hamano; U.S. Pat. No. 6,772,756 to Shayan; U.S. Pat. Nos. 8,156,944 and 8,375,957 to Hon; U.S. Pat. No. 8,794,231 to Thorens et al.; U.S. Pat. No. 8,851,083 to Oglesby et al.; U.S. Pat. Nos. 8,915,254 and 8,925,555 to Monsees et al.; U.S. Pat. App. Pub. Nos. 2006/0196518 and 2009/0188490 to Hon; U.S. Pat. App. Pub. No. 2010/0024834 to Oglesby et al.; U.S. Pat. App. Pub. No. 2010/0307518 to Wang; U.S. Pat. App. Pub. No. 2014/0261408 to DePiano et al.; WO 2010/091593 to Hon; and WO 2013/089551 to Foo, each of which is incorporated herein by reference in its entirety. A variety of the materials disclosed by the foregoing documents may be incorporated into the present devices in various embodiments, and all of the foregoing disclosures are incorporated herein by reference in their entireties.

Returning to FIG. 1, the cartridge 200 is illustrated in an exploded configuration. As illustrated, the cartridge 200 may comprise a base shipping plug 202, a base 204, a control component terminal 206, an electronic control component 208, a flow director 210, an atomizer 212, a reservoir substrate 214, an outer body 216, a label 218, a mouthpiece 220, and a mouthpiece shipping plug 222 according to an example embodiment of the present disclosure. The base 204 may be coupled to a first end of the outer body 216 and the mouthpiece 220 may be coupled to an opposing second end of the outer body to substantially or fully enclose the remaining components of the cartridge 200 therein. The base 204 may be configured to engage the coupler 302 of the control body 300. In some embodiments the base 204 may comprise anti-rotation features that substantially prevent relative rotation between the cartridge and the control body as disclosed in U.S. Pat. App. Pub. No. 2014/0261495 to Novak et al., which is incorporated herein by reference in its entirety.

The base shipping plug 202 may be configured to engage and protect the base 204 prior to use of the cartridge 200. Similarly, the mouthpiece shipping plug 222 may be configured to engage and protect the mouthpiece 220 prior to use of the cartridge 200. The control component terminal 206, the electronic control component 208, the flow director 210, the atomizer 212, and the reservoir substrate 214 may be substantially entirely retained within the outer body 216. The label 218 may at least partially surround the outer body 216 and include information such as a product identifier thereon.

The atomizer 212 may comprise a negative heating terminal 234 and a positive heating terminal 235, a liquid transport element 238 and a heating element 240. In this regard, the reservoir substrate 214 may be configured to hold an aerosol precursor composition. Representative types of aerosol precursor components and formulations are also set forth and characterized in U.S. Pat. No. 7,726,320 to Robinson et al. and U.S. Pat. Pub. Nos. 2013/0008457 to Zheng et al.; 2013/0213417 to Chong et al. and 2014/0060554 to Collett et al., 2015/0020823 to Lipowicz et al.; and 2015/0020830 to Koller, as well as WO 2014/182736 to Bowen et al, the disclosures of which are incorporated herein by reference. Other aerosol precursors that may be employed include the aerosol precursors that have been incorporated in the VUSE® product by R. J. Reynolds Vapor Company, the BLU product by Lorillard Technologies, the MISTIC MENTHOL product by Mistic Ecigs, and the VYPE product by CN Creative Ltd. Also desirable are the so-called "smoke juices" for electronic cigarettes that have been available from Johnson Creek Enterprises LLC. Embodiments of effervescent materials can be used with the aerosol precursor, and are described, by way of example, in U.S. Pat. App. Pub. No. 2012/0055494 to Hunt et al., which is incorporated herein by reference. Further, the use of effervescent materials is described, for example, in U.S. Pat. No. 4,639,368 to Niazi et al.; U.S. Pat. No. 5,178,878 to Wehling et al.; U.S. Pat. No. 5,223,264 to Wehling et al.; U.S. Pat. No. 6,974,590 to Pather et al.; and U.S. Pat. No. 7,381,667 to Bergquist et al., as well as US Pat. Pub. Nos. 2006/0191548 to Strickland et al.; 2009/0025741 to Crawford et al; 2010/0018539 to Brinkley et al.; and 2010/0170522 to Sun et al.; and PCT WO 97/06786 to Johnson et al., all of which are incorporated by reference herein.

The reservoir substrate 214 may comprise a plurality of layers of nonwoven fibers formed into the shape of a tube encircling the interior of the outer body 216 of the cartridge 200. Thus, liquid components, for example, can be sorptively retained by the reservoir substrate 214. The reservoir substrate 214 is in fluid connection with the liquid transport element 238. Thus, the liquid transport element 238 may be configured to transport liquid from the reservoir substrate 214 to the heating element 240 via capillary action or other liquid transport mechanisms.

As illustrated, the liquid transport element 238 may be in direct contact with the heating element 240. As further illustrated in FIG. 1, the heating element 240 may comprise a wire defining a plurality of coils wound about the liquid transport element 238. In some embodiments the heating element 240 may be formed by winding the wire about the liquid transport element 238 as described in U.S. Pat. App. Pub. No. 2014/0157583 to Ward et al., which is incorporated herein by reference in its entirety. Further, in some embodiments the wire may define a variable coil spacing, as described in U.S. Pat. App. Pub. No. 2014/0270730 to DePiano et al., which is incorporated herein by reference in its entirety. Various embodiments of materials configured to produce heat when electrical current is applied therethrough may be employed to form the heating element 240. Example materials from which the wire coil may be formed include Kanthal (FeCrAl), Nichrome, Molybdenum disilicide ($MoSi_2$), molybdenum silicide (MoSi), Molybdenum disilicide doped with Aluminum ($Mo(Si,Al)_2$), graphite and graphite-based materials; and ceramic (e.g., a positive or negative temperature coefficient ceramic).

However, various other embodiments of methods may be employed to form the heating element 240, and various other embodiments of heating elements may be employed in the atomizer 212. For example, a stamped heating element may be employed in the atomizer, as described in U.S. Pat. App. Pub. No. 2014/0270729 to DePiano et al., which is incorporated herein by reference in its entirety. Further to the above, additional representative heating elements and materials for use therein are described in U.S. Pat. No. 5,060,671 to Counts et al.; U.S. Pat. No. 5,093,894 to Deevi et al.; U.S. Pat. No. 5,224,498 to Deevi et al.; U.S. Pat. No. 5,228,460 to Sprinkel Jr., et al.; U.S. Pat. No. 5,322,075 to Deevi et al.; U.S. Pat. No. 5,353,813 to Deevi et al.; U.S. Pat. No. 5,468,936 to Deevi et al.; U.S. Pat. No. 5,498,850 to Das; U.S. Pat. No. 5,659,656 to Das; U.S. Pat. No. 5,498,855 to Deevi et al.; U.S. Pat. No. 5,530,225 to Hajaligol; U.S. Pat. No. 5,665,262 to Hajaligol; U.S. Pat. No. 5,573,692 to Das et al.; and U.S. Pat. No. 5,591,368 to Fleischhauer et al., the disclosures of which are incorporated herein by reference in their entireties. Further, chemical heating may be employed in other embodiments. Various additional examples of heaters and materials employed to form heaters are described in U.S. Pat. No. 8,881,737 to Collett et al., which is incorporated herein by reference, as noted above.

A variety of heater components may be used in the present aerosol delivery device. In various embodiments, one or more microheaters or like solid state heaters may be used. Embodiments of microheaters that may be utilized are further described herein. Further, microheaters and atomizers incorporating microheaters suitable for use in the presently disclosed devices are described in U.S. Pat. No. 8,881,737 to Collett et al., which is incorporated herein by reference in its entirety.

The negative heating terminal 234 and the positive heating terminal 235 (e.g., positive and negative terminals) at the opposing ends of the heating element 240 are configured to form an electrical connection with the control body 300 when the cartridge 200 is connected thereto. Further, when the control body 300 is coupled to the cartridge 200, the electronic control component 208 may form an electrical connection with the control body through the control component terminal 206. The control body 300 may thus employ the electronic control component 208 to determine whether the cartridge 200 is genuine and/or perform other functions. Further, various examples of electronic control components and functions performed thereby are described in U.S. Pat. App. Pub. No. 2014/009678 to Sears et al., which is incorporated herein by reference in its entirety.

During use, a user may draw on the mouthpiece 220 of the cartridge 200 of the aerosol delivery device 100. This may pull air through an opening in the control body 300 or in the cartridge. For example, in one embodiment an opening may be defined between the coupler 302 and the outer body 304 of the control body 300, as described in U.S. Pat. App. Pub. No. 2014/0261408 to DePiano et al.; which is incorporated herein by reference in its entirety. However, the flow of air may be received through other parts of the aerosol delivery device 100 in other embodiments. As noted above, in some embodiments the cartridge 200 may include the flow director 210. The flow director 210 may be configured to direct the flow of air received from the control body 300 to the heating element 240 of the atomizer 212.

A sensor in the aerosol delivery device 100 (e.g., a puff or flow sensor in the control body 300) may sense the puff. When the puff is sensed, the control body 300 may direct current to the heating element 240 through a circuit including the negative heating terminal 234 and the positive heating terminal 235. Accordingly, the heating element 240 may vaporize the aerosol precursor composition directed to an aerosolization zone from the reservoir substrate 214 by the liquid transport element 238. Thus, the mouthpiece 220 may allow passage of air and entrained vapor (i.e., the components of the aerosol precursor composition in an inhalable form) from the cartridge 200 to a consumer drawing thereon.

Various other details with respect to the components that may be included in the cartridge 200, are provided, for example, in U.S. Pat. App. Pub. No. 2014/0261495 to DePiano et al., which is incorporated herein by reference in its entirety. In this regard, FIG. 7 thereof illustrates an enlarged exploded view of a base and a control component terminal; FIG. 8 thereof illustrates an enlarged perspective view of the base and the control component terminal in an assembled configuration; FIG. 9 thereof illustrates an enlarged perspective view of the base, the control component terminal, an electronic control component, and heating terminals of an atomizer in an assembled configuration; FIG. 10 thereof illustrates an enlarged perspective view of the base, the atomizer, and the control component in an assembled configuration; FIG. 11 thereof illustrates an opposing perspective view of the assembly of FIG. 10 thereof; FIG. 12 thereof illustrates an enlarged perspective view of the base, the atomizer, the flow director, and the reservoir substrate in an assembled configuration; FIG. 13 thereof illustrates a perspective view of the base and an outer body in an assembled configuration; FIG. 14 thereof illustrates a perspective view of a cartridge in an assembled configuration; FIG. 15 thereof illustrates a first partial perspective view of the cartridge of FIG. 14 thereof and a coupler for a control body; FIG. 16 thereof illustrates an opposing second partial perspective view of the cartridge of FIG. 14 thereof and the coupler of FIG. 11 thereof; FIG. 17 thereof illustrates a perspective view of a cartridge including a base with an anti-rotation mechanism; FIG. 18 thereof illustrates a perspective view of a control body including a coupler with an anti-rotation mechanism; FIG. 19 thereof illustrates alignment of the cartridge of FIG. 17 with the control body of FIG. 18; FIG. 20 thereof illustrates an aerosol delivery device comprising the cartridge of FIG. 17 thereof and the control body of FIG. 18 thereof with a modified view through the aerosol delivery device illustrating the engagement of the anti-rotation mechanism of the cartridge with the anti-rotation mechanism of the connector body; FIG. 21 thereof illustrates a perspective view of a base with an anti-rotation mechanism; FIG. 22 thereof illustrates a perspective view of a coupler with an anti-rotation mechanism; and FIG. 23 thereof illustrates a sectional view through the base of FIG. 21 thereof and the coupler of FIG. 22 thereof in an engaged configuration. Various other details with respect to the components that may be included in the cartridge 200, are provided, for example, in U.S. patent application Ser. No. 14/286,552 to Brinkley et al., filed May 23, 2014, which is incorporated herein by reference in its entirety.

Various components of an aerosol delivery device according to the present disclosure can be chosen from components described in the art and commercially available. Reference is made for example to the reservoir and heater system for controllable delivery of multiple aerosolizable materials in an electronic smoking article disclosed in U.S. Pat. App. Pub. No. 2014/0000638 to Sebastian et al., which is incorporated herein by reference in its entirety.

Note further that portions of the cartridge 200 illustrated in FIG. 1 are optional. In this regard, by way of example, the cartridge 200 may not include the flow director 210, the control component terminal 206, and/or the electronic control component 208 in some embodiments.

In another embodiment substantially the entirety of the cartridge may be formed from one or more carbon materials, which may provide advantages in terms of biodegradability and absence of wires. In this regard, the heating element may comprise carbon foam, the reservoir may comprise carbonized fabric, and graphite may be employed to form an electrical connection with the battery and controller. An example embodiment of a carbon-based cartridge is provided in U.S. Pat. App. Pub. No. 2013/0255702 to Griffith et al., which is incorporated herein by reference in its entirety.

As described above, cartridges of aerosol delivery devices may include a number of components. Some of the components may be relatively small and/or relatively delicate. Accordingly, precise manufacturing techniques may be required to form the aerosol delivery devices. In this regard, aerosol delivery devices have traditionally been formed via manual assembly. However, use of manual labor to assemble aerosol delivery devices suffers from certain detriments. In this regard, the quality of aerosol delivery devices produced via manual labor is only as good as the workers performing the labor. Further, even skilled workers may make errors from time-to-time. Additionally, manual labor may be relatively costly. Accordingly, as result of these issues and other issues associated with the production of aerosol delivery devices via manual labor, it may be desirable to produce aerosol delivery devices in an automated manner. Accordingly, automated production of cartridges for aerosol delivery devices is discussed hereinafter, which may provide enhanced repeatability, lower costs, and/or avoid other issues noted above.

In this regard, FIG. 3 schematically illustrates an embodiment of a system 400 for producing cartridges (e.g., the above-described cartridges 200) for an aerosol delivery device (e.g., the above-described aerosol delivery device 100). Note that the above described aerosol delivery device 100 is provided by way of example. In this regard, the methods, systems, and apparatuses described herein may be employed to form various embodiments of cartridges that differ from the above described cartridges in one or more respects.

As illustrated, the system 400 may include various subsystems that perform particular functions in the formation of the completed cartridges 200. Note that although the subsystems are illustrated as being separate from one another, the subsystems may overlap. For example, in some embodiments common equipment may perform two or more functions (e.g., assembly and filling or capping and labeling, etc.), rather than the particular functions being performed by separate equipment.

Further, the various subsystems and portions thereof may be separately usable. In this regard, although the subsystems and portions thereof are generally described herein as being usable together, this is by way of example. Accordingly, any of the subsystems or portions thereof described herein may be usable by themselves or in any combination with some or all of the other subsystems and portions thereof described herein. Further, although particular embodiments of portions of the subsystems are disclosed hereinafter, these embodiments are provided for example purposes only. Accordingly, in some embodiments the subsystems may include fewer or additional portions. Thus, each portion of each subsystem, and each portion of the overall system is not required in all embodiments.

As illustrated, the subsystems may include a cartridge assembly subsystem 402 configured to form unfilled cartridges 404 from components 406 (e.g., the base 204, the heating terminals 234, 235, etc.). A cartridge filling subsystem 408 may fill the unfilled cartridges 404 to produce filled cartridges 410. A cartridge capping subsystem 412 may cap the filled cartridges 410 to produce capped cartridges 414. A cartridge labeling subsystem 416 may apply labels to the capped cartridges 414 to complete the completed cartridges 200.

The system 400 may additionally include an inspection subsystem 418. The inspection subsystem 418 may inspect the components 406, the unfilled cartridges 404, the filled cartridges 410, the capped cartridges 414, and/or the completed cartridges 200. Further, in some embodiments the cartridges may be inspected at intermediate states of completion at one or more of the cartridge assembly subsystem 402, the cartridge filling subsystem 408, the cartridge capping subsystem 412, and the cartridge labeling subsystem 416. Accordingly, the cartridges 200 and components thereof may be inspected before, during, and after completion thereof.

The system may further at least one controller 417. The controller 417 may be configured to control the cartridge assembly subsystem 402, the cartridge filling subsystem 408, the cartridge capping subsystem 412, and/or the cartridge labeling subsystem 416. In this regard, the controller may be configured to receive data from one or more of the sensors described herein and output instructions based thereon, in addition to otherwise directing the operations described herein.

Note that some or all of the system 400 may be automated. In this regard, as described hereinafter, robotic apparatuses may be employed in some embodiments of the system 400. The robotic apparatuses may be provided from various robotic manufacturers including, by way of example, DENSO Robotics of Long Beach, Calif., FANUC of Rochester Hills, Mich., Mitsubishi Electric Automation of Vernon Hills, Ill., EPSON Robots of Carson, Calif., and Siemens Automation Technology of Munich, Germany.

An example embodiment of the cartridge assembly subsystem 402 is schematically illustrated in FIG. 4. Note that the particular embodiments of substations and positions thereof may vary from those described below and illustrated in FIG. 4. Further, the particular operations employed as well as the order thereof may also vary. The equipment employed to assemble a cartridge may depend on the particular configuration of the end-product cartridge. In this regard, the cartridge 200 described above and referenced hereinafter is discussed for example purposes only. Additionally, although the description generally refers to the portions of the cartridge assembly subsystem 402 as substations, it should be understood that the various assembly operations discussed herein may be performed by a single device, apparatus, or substation, or distributed across multiple devices, apparatuses, and substations. Accordingly, the description provided below is for example purposes only, and the equipment and operations and order thereof employed may vary without departing from the scope of the disclosure. Further, it should be understood that various substations and operations performed at each of the substations should be viewed as individual inventive aspects. In this regard, although the individual substations and operations are generally described herein as being part of a system, each of the substations may operate independently of the other substations discussed herein and/or be combined with other substations.

As illustrated in FIG. 4, the cartridge assembly subsystem 402 may include a base load substation 502, a control component terminal coupling substation 504, a negative heating terminal coupling substation 506, a positive heating terminal coupling substation 508, a control component coupling substation 510, a flow director coupling substation 512, a heating element coupling substation 514, a reservoir and an outer body coupling substation 516, and an outer body crimping and inspection substation 518. As illustrated further illustrated in FIG. 4, the controller 417 may be configured to control one or more of the substations 502-518 of the cartridge assembly subsystem 402.

Briefly, the base load substation 502 may be configured to receive a base (e.g., the base 204) and orient the base for assembly with the various other components of the cartridge. The control component terminal coupling substation 504, the negative heating terminal coupling substation 506, and the positive heating terminal coupling substation 508 may be respectively configured to couple a control component terminal (e.g., the control component terminal 206) a negative heating terminal (e.g., the negative heating terminal 234) and a positive heating terminal (e.g., the positive heating terminal 235) to the base 204. The control component coupling substation 510 may be configured to couple a control component (e.g., the electronic control component 208) to the control component terminal 206. The flow director coupling substation 512 may be configured to couple a flow director (e.g., the flow director 210) to the control component 208, the negative and positive heating terminals 234, 235, and/or other components. The heating element coupling substation 514 may be configured to couple a heating element (e.g., the heating element 240) to the negative and positive heating terminals 234, 235. The reservoir and outer body coupling substation 516 may be configured to bend the liquid transport element (e.g., the liquid transport element 238), to wrap a reservoir (e.g., the reservoir 214) around the atomizer (e.g., the atomizer 212) and to engage an outer body (e.g., the outer body 216) to the base 204. The outer body crimping and inspection substation 518 may be configured to crimp the outer body 216 to the base 204 and inspect the cartridges 200.

The cartridge assembly subsystem 402 may assemble the cartridge (e.g., the cartridge 200) in a variety of manners. For example, in one embodiment the cartridge 200 may be assembled generally upwardly from the base 204. In other words, components may be inserted into or otherwise coupled to the base 204, or coupled to components previously coupled to the base, to build up the cartridge 200 therefrom.

In this regard, as further illustrated in FIG. 4, in one embodiment the cartridge assembly subsystem 402 may include a transport system comprising a track 602 and at least one carriage 604 configured to engage the track (e.g., by riding on the track) and to cooperate therewith to move between the assembly substations 502. Preferably, multiple carriages 604 may be employed such that each of the substations 502-518 of the cartridge assembly subsystem 402 may simultaneously operate to simultaneously assemble a plurality of cartridges 200. Further, the carriages 604 may return to an initial starting point upstream of the base load substation following completion of a cartridge 200, such that the carriages may be repeatedly employed to assemble multiple cartridges.

The carriages 604 may be configured to engage the base 204 such that a remainder of the components of the cartridge 200 may be coupled thereto. In this regard, as discussed below, the base 204 may be engaged with the carriage 604 at the base load substation 502. Thereafter additional components may be generally directed downwardly into contact with the base 204, or components previously coupled to the base, such that the cartridge 200 is built generally upwardly from the base as various components are coupled thereto at the remaining substations 504-518.

Accordingly, the carriages 604 may be configured to grasp the base 204. In this regard, each carriage 604 may include at least one engagement head configured to engage the base 204. In some embodiments each carriage 604 may include a plurality of engagement heads, such that multiple cartridges may be assembled thereon in order to improve assembly speed and efficiency. For example, as illustrated in FIG. 5, in some embodiments the carriages 604 may each include a body portion 606 and two engagement heads 608a, 608b extending therefrom. Thereby, each carriage 604 may be configured for assembly of two cartridges thereon.

The engagement heads 608a, 608b may be configured to engage a respective base 204 in a firm manner that does not interfere with attachment of the other components to the base. In this regard, in some embodiments the engagement heads 608a, 608b may be configured to engage an internal surface 242 of an attachment end 244 of each base 204 (see, FIG. 1). Thereby, an external periphery of each base 204 may be exposed to facilitate attachment of components thereto. In this regard, the components may couple to an inner end 246 (see, FIG. 1) of the base 204 during assembly of the cartridges, and hence engagement of the internal surface 242 of each base 204 with the carriage 604 may facilitate attachment of components thereto, by providing for substantially unimpeded access to the inner end.

In particular, as illustrated in FIG. 5, each engagement head 608a, 608b may comprise a collet 610a, 610b, with each collet comprising a plurality of sections 612 separated by slots at a top portion thereof. A collar 614a, 614b may extend around the sections 612 to prevent the collets 610a, 610b from falling downwardly through the body portion 606. The sections 612 of each collet 610a, 610b may be configured to engage the internal surface 242 of the attachment end 244 of the base 204 (see, e.g., FIG. 1), for example, via an interference fit. In the illustrated embodiment, each collet 610a, 610b includes four sections 612. However, as may be understood, the collets 610a, 610b may include various other numbers of sections 612 in other embodiments. The sections 612 of each collet 610a, 610b may be configured to flex inwardly during engagement with the base 204 and then apply outward pressure against the internal surface 242 of the base such that the base is retained in engagement therewith. For example, the internal surface 242 of each base 204 may define one or more ribs which the sections 612 of the collets 610a, 610b may engage such that the cooperation therebetween securely holds the base to the respective collet. A cartridge including a base with such ribs is disclosed in U.S. Pat. App. Pub. No. 2014/0261495 to Novak et al., which is incorporated herein by reference in its entirety.

FIG. 6 illustrates a bottom view of the carriage 604. As illustrated, the collets 610a, 610b may extend to a bottom portion of the carriage 604. A clip 616a, 616b may secure each collet 610a, 610b at an opposing end. Thereby, the collar 614a, 614b and the clip 616a, 616b cooperatively retain each collet 610a, 610b at a fixed position with respect to the body portion 606. As further illustrated in FIG. 6, the carriage 604 may define one or more alignment apertures 618a, 618b. As discussed below, locking pins may be configured to engage the alignment apertures 618a, 618b to releasably lock the carriage 604 at each of the assembly substations 502-518. As illustrated, in one embodiment the alignment apertures 618a, 618b may be defined by the collets 610a, 610b. In this regard, when the alignment apertures 618a, 618b engage locking pins, the collets 610a, 610b may be directly aligned with the locking pins such that the partially-assembled cartridges are precisely positioned and thereby the cartridges may be precisely assembled. In some embodiments the collets 610a, 610b may be formed from life-science grade polyether ether ketone (PEEK), which provides the sections 612 thereof with resiliency that enables coupling with bases as described above and which may be substantially hard so as to avoid wear from repeated coupling and decoupling with the bases 204, which may also comprise a plastic or other polymeric material. However, the alignment apertures 618a, 618b may receive locking pins comprising metal or other relatively harder substances. Thus, in order to prevent wear to the collets 610a, 610b at the alignment apertures 618a, 618b, in some embodiments a hardened ring 620a, 620b may be received within each collet at the alignment aperture 618a, 618b so as to avoid wear thereto.

As illustrated in FIG. 5, each carriage 604 may further comprise one or more bumpers 622. In this regard, in some embodiments the carriages 604 may be positioned adjacent to or in contact with one another at one or more locations along the track 602 such that the carriages are ready for usage in the next substation. For example, as illustrated in FIG. 4, in some embodiments the track 602 may include a staging area 602a at which the carriages 604 are temporarily collected. In some embodiments the staging area 602a may be positioned upstream of the base load substation 502, such that one or more of the carriages 604 may be temporarily collected prior to moving through the substations 502-518. Thereby, the bumpers 622 may protect the body portions 606 of the carriages 604 and/or the cartridge assemblies/subassemblies carried thereby, from damage due to contact between the carriages.

As further illustrated in FIG. 5, the carriage 604 may additionally include a storage module 624. The storage module 624 may be configured to store cartridge identification and status information for each of the cartridges 200 (or partially-assembled cartridges) coupled to the carriage 604. In some embodiments the storage module 624 may comprise a radio-frequency identification (RFID) chip or other wireless transponder. In this regard, the storage module 624 may be utilized to track information for each of the partially-assembled cartridges on that carriage 604 during their assembly. The storage module 624 may include a unique identifier for the carriage 604 and/or each of the cartridges 200 undergoing assembly, and various other information may be stored and associated therewith. Thereby, the storage module 624 may store information with respect to each cartridge 200 during assembly thereof. Thus, as each substation 502-518 completes operations on the partially-assembled cartridges, data may be updated and written to the storage module 624. If an assembly step or a post-assembly step inspection indicates that an assembly operation was not properly performed on one of the partially-assembled cartridges or the partially-assembled cartridge is determined to differ from the desired specifications, the operations or tasks at all substations downstream from that substation may not be performed on that partially-assembled cartridge in order to avoid potentially damaging the downstream substations and to avoid wasting usage of additional components on the defective partially-assembled cartridge. The information stored in the storage module 624 may also be employed to determine where to place the completed cartridges 200 following removal from the carriages 604 (e.g., for filling and/or labeling purposes). The storage module 624 may have data stored therein cleared following removal of the completed cartridges 200 such that the cycle may be repeated during the assembly of new cartridges on each carriage 604.

FIG. 7 illustrates an opposing perspective view of the carriage 604 after engagement of a first base 204a with the first engagement head 608a and after engagement of a second base 204b with the second engagement head 608b at the base load substation 502, as discussed below. As illustrated, the carriage 604 may further comprise a locator module 626. The locator module 626 may be employed to detect a presence of the carriage 604 along the track 602 at each of the substations 502-518 as the carriage moves therealong such that the substations know when the carriage is available and positioned to perform cartridge assembly operations. In some embodiments the locator module 626 may comprise a ferromagnetic material such as steel. Further, to avoid interference with detection of the locator module 626, the body portion 606 of the carriage 604 may comprise a non-ferromagnetic material. In some embodiments the body portion 606 of the carriage 604 may comprise an electrostatic dissipative material such as polyoxymethylene sold under the name DELRIN by E.I. du Pont de Nemours of Wilmington, Del. In this regard, usage of an electrostatic dissipative material may avoid buildup of a static charge on the carriage 604 as a result of movement along the track 602. Such an electrostatic charge could potentially discharge and damage one of the substations 502-518.

As further illustrated in FIG. 7, in some embodiments the carriage 604 may include a stop bar 628. The stop bar 628 may be configured to engage a stop pin at one or more locations along the track 602 so as to temporarily hold the carriage 604 at a desired position. For example, the stop pin may engage the stop bar 628 to temporarily stop movement of the carriage 604 and allow for lifting of the carriage.

Accordingly, the track 602 may be configured to transport the carriages 604 therealong to the various assembly substations 502-518. In this regard, the empty cartridges 604 may first be directed to the base load substation 502. The base load substation 502 may be configured to rotationally align a base 204 with each engagement head 608a, 608b of the carriage 604 and engage the bases with the engagement heads.

In this regard, FIG. 8 illustrates a perspective view of the base load substation 502. As illustrated, the base load substation 502 may include a supply unit 702, a feeder unit 704, a first assembly unit 706a, and a second assembly unit 706b. Briefly, the supply unit 702 may be configured to provide a plurality of components (e.g., the bases 204). The feeder unit 704 may be configured to receive the bases 204 from the supply unit 702 and alternatingly feed the bases 204 to the first assembly unit 706a and the second assembly unit 706b. The first assembly unit 706a and the second assembly unit 706b may each be configured to assemble the components (e.g., the bases 204) into cartridges 200 for an aerosol delivery device 100, for example, by coupling the bases 204 to the carriage 604 to allow for coupling of other components thereto thereafter.

In this regard, FIG. 9 illustrates an enlarged view of the supply unit 702. As illustrated, the supply unit 702 may be configured to supply a plurality of the bases 204. In some embodiments the supply unit 702 may include a vibratory arrangement. For example, the vibratory arrangement may include a vibratory hopper 708, a vibratory bowl 710, and a supply track 712. In some embodiments the vibratory hopper 708, the vibratory bowl 710, and/or the supply track 712 may be manufactured by Performance Feeders, Inc. of Oldsmar, Fla.

The bases 204 may be loaded into the vibratory hopper 708. As the vibratory hopper 708 vibrates, the bases 204 gradually travel under a gate 714 and fall into the vibratory bowl 710 so as to provide the vibratory bowl with a substantially constant supply of the bases. In this regard, a component level sensor 716 may detect a level of the bases 204 within the vibratory bowl 710. Thereby, the vibratory hopper 708 may start and stop based on the level of the bases 204 within the vibratory bowl 710 as detected by the component level sensor 716. The vibratory hopper 708 may thus maintain a substantially constant level of the bases 204 within the vibratory bowl 710 as the bases are transported therefrom.

The vibratory bowl 710 may define a pathway 718 configured to arrange the bases 204 in a serially-aligned stream 720. In this regard, the vibratory motion of the vibratory bowl 710 may direct the bases 204 upwardly along the pathway 718, which may narrow such that some bases fall therefrom and the bases that remain on the pathway become serially-aligned. The vibratory bowl 710 may be configured to arrange the bases 204 such that the attachment end 244 is oriented downwardly and the inner end 246 is oriented upwardly (see, FIG. 1).

However, some bases 204 in the serially-aligned stream 720 may be oriented upside down or otherwise oriented in a manner that differs from the desired orientation. In this regard, the supply unit 702 may further comprise an actuator 724 configured to individually remove or realign the bases 204 in the serially-aligned stream 720 when the bases are misaligned in a direction. In one embodiment the actuator 724 may comprise a nozzle 726 configured to direct a flow of air at each base 204 that is misaligned to remove the base from the pathway 718 or push the base into proper alignment. In some embodiments the nozzle 726 may be oriented so as to only impact those bases 204 that are misaligned with the flow of air (i.e., if a base is misaligned, it will be impacted by the flow of air from the nozzle and removed or re-aligned). In another embodiment the supply unit 702 may further comprise an orientation sensor 722 (e.g., a camera)

configured to determine an alignment of the bases 204 on the pathway 718, and the actuator 724 may be actuated in response thereto when a misaligned base is detected.

Accordingly, each of the bases 204 in the serially-aligned stream 720 may be properly oriented downstream of the actuator 724. The bases 204 removed by the actuator 724 may be directed back into the vibratory bowl 710 such that the bases 204 may be returned to the pathway 718. In some embodiments the pathway may define a gap or other feature configured to remove the components from the serially-aligned stream when the components are misaligned in a second direction. For example, such a gap or other feature may be configured to allow the bases resting on their outer circumference to roll off of the pathway.

Accordingly, the serially-aligned stream 720 of the bases 204 may be directed to the supply track 712, which may maintain the bases in the upwardly-extending orientation and in the single-file arrangement. In some embodiments the supply track 712 may comprise a vibratory supply track to facilitate movement of the bases 204 therealong. As illustrated, the supply track 712 may include a full sensor 726 configured to detect whether the supply track is full of the bases 204. In this regard, when the full sensor 726 senses that the supply track 712 is full, the vibratory bowl 710 may be shut off. Further, the supply track 712 may include a low level sensor 728 configured to detect when the supply track is running low on the bases 204. In this regard, when the low level sensor 728 detects a low level of the bases 204 in the supply track 712, an indicator 730 (see, FIG. 8) may be illuminated to inform an operator that the base load substation 502 is running low on the bases 204, such that the operator may be informed that it is time to refill the vibratory hopper 708. In some embodiments the full sensor 726 and the low level sensor 728 may comprise optical sensors that include an emitter and a receiver configured to detect a presence or absence of a base 204 therebetween.

Further, as illustrated in FIG. 10, the supply unit 702 may include a singulator 732 configured to singulate the bases 204 from the serially-aligned stream 720. In this regard, the singulator 732 includes a stop 734 (e.g., comprising first and second pins in the illustrated embodiment) and a vertical actuator 736. The vertical actuator 736 may be configured to raise stop 734 to an upper position and lower the stop to a lower position. The vertical actuator 736 may default to the lower position such that the stop 734 blocks the base 204 at the end of the serially-aligned stream 720 from moving. However, the vertical actuator 736 may momentarily raise the stop 734 to the upper position to allow the base 204 at the end of the serially-aligned stream to pass thereunder. Thereby, the base 204 passing under the stop 734 may be delivered to the feeder unit 704. The vertical actuator 736 may return the stop 734 to the lower position after the base 204 passes thereunder, such that a remainder of the serially-aligned stream 720 is blocked. This cycle may be repeated to singulate each of the bases 204 from the serially-aligned stream 720 and deliver individual bases to the feeder unit 704.

FIGS. 11 and 12 illustrate the feeder unit 704. In some embodiments the feeder unit 704 may comprise a rotary member 738, such as a rotary table. A first engagement head 740a and a second engagement head 740b may be coupled to the rotary member 738 and each configured to alternatingly receive one of the bases 204 from the supply unit 702. In this regard, the first engagement head 740a may define a first pocket 742a (see, FIG. 11) and the second engagement head 740b may define a second pocket 742b (see, FIG. 11). As illustrated, in some embodiments the rotary member 738 may comprise a first arm 744a and a second arm 744b. The first engagement head 740a may be coupled to the first arm 744a and the second engagement head 740b may be coupled to the second arm 742b.

FIG. 12 illustrates the rotary member 738 in a first receiving position and FIG. 11 illustrates the rotary member in a second receiving position, between which the rotary member may be configured to swivel or rotate about a particular point. In the first receiving position, the first engagement head 740a is positioned proximate the singulator 732. Thereby, a first base 204a may be singulated from the serially-aligned stream 720 and delivered into the first pocket 742a in the first engagement head 740a. A base load sensor 745 (e.g., an optical sensor) may detect that the first base 204a has been delivered to the first engagement head 740a.

After the first base 204a is received in the first engagement head 740a, the rotary member 738 may swivel (e.g., by rotating counterclockwise when viewed from above) to a first delivery position, which corresponds to the second receiving position, and which is illustrated in FIG. 11. As the rotary member 738 swivels, negative pressure may be applied to the first pocket 742a. Thereby, the negative pressure may assist in retaining the first base 204a on the rotary member 738 during swiveling movement thereof. Accordingly, the first base 204a may be moved to the first delivery position.

FIG. 13 illustrates the first assembly unit 706a and the second assembly unit 706b. As illustrated, the first assembly unit 706a may include a first robotic arm 746a and a first end effector 748a coupled thereto. Similarly, the second assembly unit 706b may include a second robotic arm 746b and a second end effector 748b coupled thereto.

The first end effector 748a may be configured to engage the first base 204a and deliver the first base to a carriage 604 engaged with the track 602 via movement of the first robotic arm 748a. Thus, the first assembly unit 706a may be positioned such that the first robotic arm 746a is configured to move the first end effector 748a between the feeder unit 704 and the track 602. In this regard, when the rotary member 738 is in the first delivery position (see, FIG. 11), the first robotic arm 746a may direct the first end effector 748a into engagement with the first base 204a in the first engagement head 740a. In this regard, in some embodiments the first end effector 748a may be configured to apply a negative pressure to the inner end 246 (see, FIG. 1) of the first base 204a such that the first base becomes engaged therewith. Further, the first engagement head 740a may stop applying negative pressure to the first pocket 742a when the rotary member 738 is in the first delivery position to facilitate transfer of the first base 204a to the first end effector 748a. Thereby, the first robotic arm 746a may lift the first base 204a via the first end effector 748a.

As illustrated in FIG. 12, the first assembly unit 706a may include a first rotational alignment imaging device 750a and the second assembly unit 706b may include a second rotational alignment imaging device 750b. In this regard, after the first robotic arm 746a and the first end effector 748a lift the first base 204a, the first robotic arm may move the first end effector such that the first base is positioned above the first rotational alignment imaging device 750a. Thereby, the first rotational alignment imaging device 750a may detect a rotational orientation of the first base 204a based on image of the attachment end 244 of the base. Thereby, the first robotic arm 746a may rotate the end effector 748a such that the first base 204a defines a desired rotational orientation.

For example, FIG. 14 illustrates an enlarged view of a base 204 in a proper orientation relative to a machine direction 752, which corresponds to a direction of movement of the carriage 604 and the base along the track 602 at any given point thereon. As illustrated, the base 204 may define a negative heating terminal aperture 248a configured to receive the negative heating terminal 234, a positive heating terminal aperture 248b configured to receive the positive heating terminal 235, and a control component terminal aperture 250 configured to receive the control component terminal 206. The negative heating terminal aperture 248a may be positioned downstream of the positive heating terminal aperture 248b, with the control component terminal aperture 250 positioned therebetween when the base 204 is properly oriented with respect to the carriage 604.

Accordingly, the carriage 604 may be positioned for receipt of the first base 204a following rotational alignment thereof. In this regard, FIG. 15 illustrates an enlarged view of the track 602 proximate the base load substation 502. As illustrated, the first assembly unit 706a may include a first processing portion 754a and the second assembly unit 706b may include a second processing portion 754b positioned proximate the track 602. In particular, each carriage 604 may first be directed through the first processing portion 754a followed by the second processing portion 754b. Operations relating to the first base 204a and the first engagement head 608a (see, FIG. 7) are conducted at the first processing portion 754a, whereas operations relating to the second base 204b and the second engagement head 608b (see, FIG. 7) are conducted at the second processing portion 754b.

Accordingly, the carriage 604 may be directed into the base load substation 502 along the track 602. The carriage 604 may thereby enter the first processing portion 754a. As illustrated in FIG. 16, the carriage 604 may be directed past a carriage sensor 756a, which may comprise a light emitter and detector, and which detects presence of the carriage 604. Thereby, for example, an additional carriage may be released from the staging area 602a (see, FIG. 4) following detection of the carriage 604, such that a continuing flow of the carriages may be directed along the track 602.

As illustrated in FIG. 15, after passing the carriage sensor 756a, the carriage 604 may be directed past an initial locator sensor 758a configured to detect the locator module 626 and verify the presence and location of the carriage. An initial stop 760a may then stop the carriage 604 by engaging an initial stop pin 762a with the stop bar 628 on the carriage 604 (see, FIG. 7). Thereby, when a downstream carriage is clear, the carriage 604 may be released from the initial stop 760a by retracting the initial stop pin 762a.

Accordingly, the track 602 may move the carriage 604 until the carriage engages a lift stop 764a. In particular the stop bar 628 on the carriage (see, FIG. 7) may engage a lift stop pin 766a. While the carriage 604 is stopped, a stop locator sensor 768a may detect the locator module 626 and verify the presence and location of the carriage. The track 602 may include a lifter mechanism 770a configured to lift the carriage 604 after the presence and location thereof is verified by the stop locator sensor 768a. In this regard, the track 602 may comprise a conveyor including two parallel conveyor belts 628 which may extend on opposing sides of the lifter mechanism 770a and which move the carriages 604 along the track. Accordingly, the lifter mechanism 770a may lift the carriage 604 from the conveyor belts 628. Example embodiments of conveyors and conveyor belts are available from MONTECH of Derendingen, Switzerland.

The lifter mechanism 770a may comprise a first locking pin 772a and a second locking pin 774a configured to engage the carriage 604. In particular, the first locking pin 772a may be configured to engage the first alignment aperture 618a defined by the first collet 610a (see, FIG. 6), and the second locking pin 774a may be configured to engage the second alignment aperture 618b defined by the second collet 610b (see, FIG. 6) to releasably lock the carriage 604 at the base load substation 502. Accordingly, the first engagement head 608a may be aligned with the first locking pin 772a and the second engagement head 608b may be aligned with the second locking pin 774a. Thereby, the position of the engagement heads 608a, 608b is precisely controlled, without regard to the overall tolerance of the carriage 604, due to the collets 610a, 610b being configured to engage both the locking pins 772a, 774a and the bases 204a, 204b. In this regard, while the carriage 604 is lifted and engaged by the lifter mechanism 770a, the first robotic arm 746a may direct the first base 204a into engagement with the first engagement head 608a with the first base properly rotationally oriented as described above. At such time, the first end effector 748a may stop applying negative pressure, such that the first base 204a may release therefrom and remain in engagement with the first engagement head 608a. The robotic arm 748a may then return to an initial position proximate the rotary member 738.

After the robotic arm 748a completes the base engagement operation, a storage transceiver 776a may write code to the storage module 624 indicating whether or not the first base 204a was properly coupled to the first engagement head 608a. In this regard, a component presence sensor 778a (e.g., comprising a light emitter and receiver; see FIG. 15) may detect whether the first base 204a is engaged with the first engagement head 608a following movement of the first robotic arm 746a as described above. For example, the component presence sensor 778a may detect whether or not the base 204a is present while the carriage 604 is lifted by the lifter mechanism 770a. In instances in which the first base 204a is not properly engaged with the engagement head 608a, the substations downstream of the base load substation 502 may not perform additional operations that would be otherwise conducted on the first base 204a. In other words, in light of the first base 204a being improperly attached or missing, the substations downstream of the base load substation 502 may not attempt to couple additional components to the base that should be on the carriage, so as to avoid damage to the remaining substations and waste of components.

Thereafter, the lifter mechanism 770a may release the carriage 604 by lowering the carriage back onto the conveyor belts 628. At such time the carriage 604 may be directed to the second processing portion 754b. The second processing portion 754b may comprise the same components included in the first processing portion 754a. For example, as illustrated in FIG. 16, the second processing portion 754b may include a carriage sensor 756b, an initial locator sensor 758b, an initial stop 760b including an initial stop pin 762b, a lift stop 764b including a lift stop pin 766b, a stop locator sensor 768b, a lifter mechanism 770b including a first locking pin 772b and a second locking pin 774b. Accordingly, the second processing portion 754b may operate in substantially the same manner as the first processing portion 754a, and hence the description thereof will not be repeated. However, as may be understood, the carriage 604 may be lifted by the lifter mechanism 770b such that the second base 204b may be engaged with the second engagement head 608b.

In this regard, as illustrated in FIG. 11, while the first engagement head 740*a* is in the first delivery position, the second engagement head 740*b* is in the second receiving position at which the second engagement head is positioned proximate the singulator 732. Thereby, one of the bases 204 may be singulated from the serially-aligned stream 720 and delivered into the second pocket 742*b* in the second engagement head 740*b*. The base load sensor 745 may detect that a base 204 (e.g., the second base 204*b*) has been delivered to the second engagement head 740*b*. While the second engagement head 740*b* receives the second base 204*b*, the first engagement head 740*a* may feed the first base 204*a* received therein to the first assembly unit 706*a* in the manner described above. The rotary member 738 may then swivel (e.g., by rotating counterclockwise when viewed from above) back to the first receiving position such that the first engagement head 740*a* may receive another base 204.

While the first engagement head 740*a* receives one of the bases 204, the second engagement head 740*b* may feed the second base 204*b* received therein to the second assembly unit 706*b*. Accordingly, the rotary member 738 may swivel back and forth such that the bases are individually delivered by the feeder unit 704 to the first assembly unit 706*a* and the second assembly unit 706*b*. Thus, the first receiving position may correspond to the second delivery position and the second receiving position may correspond to the first delivery position.

Thereby, the second assembly unit 706*b* may engage the second base 204*b* with the second engagement head 608*b* in the manner described above with respect to the first assembly unit 706*a*. In this regard, briefly, the second robotic arm 746*b* may engage the second base 204*b* via the second end effector 748*b*, lift and rotate the second base to the proper orientation based on an image provided by the second rotational alignment imaging device 750*b*, and engage the second base with the second engagement head 608*b* in the proper orientation while the lifter mechanism 770*b* engages the carriage 604. At such time, the second end effector 746*b* may stop applying negative pressure, such that the second base 204*b* may release therefrom and remain in engagement with the second engagement head 608*b*. The second robotic arm 746*b* may return to an initial position proximate the rotary member 738.

After the second robotic arm 746*b* completes the base engagement operation, a second storage transceiver 776*b* may write code to the storage module 624 indicating whether or not the second base 204*b* was properly coupled to the second engagement head 608*b*. In this regard, a component presence sensor 778*b* (e.g., comprising a light emitter and receiver; see FIG. 15) may detect whether the second base 204*b* is engaged with the second engagement head 608*b* following movement of the second robotic arm 746*b* as described above. For example, the component presence sensor 778*b* may detect whether or not the base 204*b* is present while the carriage 604 is lifted by the lifter mechanism 770*b*. In instances in which the second base 204*b* is not properly engaged with the engagement head 608*b*, the substations downstream of the base load substation 502 may not perform additional operations that would be otherwise conducted on the second base so as to avoid damage to the remaining substations and waste of components.

The lifter mechanism 770*b* may lower such that the track 602 transports the carriage 604 including the first and second bases 204*a*, 204*b* coupled thereto downstream. The carriage 604 may be directed out of the base load substation 502 by the track 602. As illustrated in FIG. 4, in some embodiments the carriage 604 may be directed to the control component terminal coupling substation 504 after the base load substation 502. Note that some of the above-described operations may be conducted simultaneously. In this regard, the bases may be singulated, etc. while the carriages are directed along the track and lifted. Further, while a first base is being engaged with a carriage, a second base may be engaged with a carriage positioned downstream. Accordingly, rapid and efficient loading of the bases onto the carriages may be achieved.

FIG. 17 illustrates a perspective view of the control component terminal coupling substation 504. As illustrated, the control component terminal coupling substation 504 may include a supply unit 802, a first assembly unit 806*a*, and a second assembly unit 806*b*. Briefly, the supply unit 802 may be configured to provide a plurality of components (e.g., the control component terminals 206). The first assembly unit 806*a* and the second assembly unit 806*b* may each be configured to assemble the control component terminals 206 into cartridges 200 for an aerosol delivery device 100 by engaging the control component terminals with the bases 204.

In this regard, FIG. 18 illustrates an enlarged view of the supply unit 802. As illustrated, the supply unit 802 may be configured to supply a plurality of the control component terminals 206. In some embodiments the supply unit 802 may include a vibratory arrangement. For example, the vibratory arrangement may include a vibratory hopper 808, a vibratory bowl 810, and a supply track 812. In some embodiments the vibratory hopper 808, the vibratory bowl 810, and/or the supply track 812 may be manufactured by Performance Feeders, Inc. of Oldsmar, Fla.

The control component terminals 206 may be loaded into the vibratory hopper 808. As the vibratory hopper 808 vibrates, the control component terminals 206 gradually travel under a gate 814 and fall into the vibratory bowl 810 so as to provide the vibratory bowl with a substantially constant supply of the control component terminals. In this regard, a component level sensor 816 may detect a level of the control component terminals 206 within the vibratory bowl 810. Thereby, the vibratory hopper 808 may start and stop based on the level of the control component terminals 206 within the vibratory bowl 810 as detected by the component level sensor 816. Accordingly, the vibratory hopper 808 may maintain a substantially constant level of the control component terminals 206 within the vibratory bowl 810 as the control component terminals are transported therefrom.

The vibratory bowl 810 may define a pathway 818 configured to arrange the control component terminals 206 in a serially-aligned stream 820 (see, FIG. 20). In this regard, the vibratory motion of the vibratory bowl 810 may direct the control component terminals 206 upwardly along the pathway 818, which may narrow such that some control component terminals fall therefrom and the control component terminals that remain on the pathway become serially-aligned.

As illustrated in FIG. 19, the vibratory bowl 810 may be configured to arrange the control component terminals 206 horizontally, with an upper end 252 of the control component terminal extending outwardly away from the vibratory bowl, a lower end 254 of the control component terminal extending inwardly toward the vibratory bowl, and flanges 256 extending downwardly into a gap 818*a* defined by the pathway 818. However, some control component terminals 206 in the serially-aligned stream 820 may be oriented upside down or otherwise oriented in a manner that differs from the desired orientation. In this regard, as illustrated in FIG. 18, the supply unit 802 may further comprise an actuator 824 configured to individually remove or realign the control component terminals 206 in the serially-aligned stream 820 when the control component terminals are misaligned in a direction. In one embodiment the actuator 824 may comprise a nozzle 826 configured to direct a flow of air at each control component terminal 206 that is misaligned to remove the control component terminal from the pathway 820 or push the control component terminal into proper alignment. In some embodiments the nozzle 826 may be oriented so as to only impact those control component terminals 206 that are misaligned. In another embodiment the supply unit 802 may further comprise an orientation sensor 822 (e.g., a camera) configured to determine an alignment of the control component terminals 206 on the pathway 818, and the actuator 824 may be actuated in response thereto when a misaligned control component terminal is detected.

Accordingly, each of the control component terminals 206 in the serially-aligned stream 820 may be properly oriented downstream of the actuator 824. The control component terminals 206 removed by the actuator 824 may be directed back into the vibratory bowl 810 such that the control component terminals may be returned to the pathway 818. In some embodiments the pathway may define a gap or other feature configured to remove the components from the serially-aligned stream when the components are misaligned in a second direction. For example, longitudinally oriented control component terminals 206 may fall through the gap 818*a* in the pathway 818 (see, FIG. 19).

Accordingly, the serially-aligned stream 820 of the control component terminals 206 may be directed to the supply track 812, which may maintain the control component terminals in the horizontal orientation and in the single-file arrangement. In some embodiments the supply track 812 may comprise a vibratory supply track 812 to facilitate movement of the control component terminals 206 therealong. As illustrated in FIG. 18, the supply track 812 may include a full sensor 826 configured to detect whether the supply track is full of the control component terminals 206. In this regard, when the full sensor 826 sense that the supply track 812 is full, the vibratory bowl 810 may be shut off. Further, the supply track 812 may include a low level sensor 828 configured to detect when the supply track is running low on the control component terminals 206. In this regard, when the low level sensor 828 detects a low level of the control component terminals 206 in the supply track 812, an indicator 830 (see, FIG. 17) may be illuminated to inform an operator that the control component coupling substation 504 is running low on the control component terminals, such that the operator may be informed that it is time to refill the vibratory hopper 808. In some embodiments the full sensor 826 and the low level sensor 828 may comprise optical sensors that include an emitter and a receiver configured to detect each control component terminal 206 passing thereby.

Further, as illustrated in FIG. 20, the supply unit 802 may include a singulator 832 configured to singulate the control component terminals 206 from the serially-aligned stream 820. In this regard, the singulator 832 may include a stop 834 that stops the serially-aligned stream 820 of control component terminals 806 from further advancement. Additionally, the singulator 832 may include a horizontal actuator 836. As illustrated in FIG. 21, the horizontal actuator 836 may be configured to horizontally displace a terminal plunger 838 to singulate one of the control component terminals 206 from the serially-aligned stream 820. In one embodiment the terminal plunger 838 may extend under the control component terminal 206 between the flanges 256 such that the upper end 252 of the control component terminal is exposed. Further, a terminal presence sensor 845 (which may comprise a light emitter and a detector; see, FIG. 20) may detect the presence of the singulated control component terminal 206. Accordingly, the first assembly unit 806*a* may be prompted to grasp the upper end 252 of the control component terminal 206.

In this regard, FIG. 22 illustrates a perspective view of the first assembly unit 806*a* and the second assembly unit 806*b*. As illustrated, the first assembly unit 806*a* may include a first robotic arm 846*a* and a first end effector 848*a* coupled thereto. Similarly, the second assembly unit 806*b* may include a second robotic arm 846*b* and a second end effector 848*b* coupled thereto.

The first end effector 848*a* may be configured to engage the control component terminal 206. As illustrated in FIG. 23, in some embodiments the first end effector 848*a* may comprise first and second opposing portions 850, 852 configured to clamp the upper end 252 of the control component terminal 206 therebetween. Accordingly, the first end effector 848*a* may be configured to securely grasp each control component terminal 206.

Further, the first end effector 848*a* may be configured to rotate between a horizontal configuration employed to grasp and remove the control component terminal 206 from the singulator 832 and a vertical configuration (see, FIG. 23) configured to insert the control component terminal into the first base 204*a*. Note that FIG. 22 illustrates the first end effector 848*a* at an angle between the horizontal configuration and the vertical orientation during transition therebetween. Accordingly, the first robotic arm 846*a* and the first end effector 848*a* may prepare the control component terminal 206 for insertion into the base 204.

In this regard, a carriage 604 with the first and second bases 204*a*, 204*b* engaged therewith may be directed through the control component terminal coupling substation 504. As illustrated in FIG. 24, the track 602 may direct each carriage 604 through a first processing portion 854*a* of the first assembly unit 806*a* and a second processing portion 854*b* of the second assembly unit 806*b* at the base load substation 502. In particular, each carriage 604 may first be directed through the first processing portion 854*a* followed by the second processing portion 854*b*. Operations relating to the first base 204*a* and a first control component terminal 206*a* are conducted at the first processing portion 854*a*, whereas operations relating to the second base 204*b* and a second control component terminal 206*b* (see, FIG. 25) are conducted at the second processing portion 854*b*.

Accordingly, a carriage 604 may be transported to the first processing portion 854*a* along the track 602. The carriage 604 may be directed past a carriage sensor 856*a*, which may comprise a light emitter and detector, and which detects the presence of the carriage 604. After passing the carriage sensor 856*a*, the carriage 604 may be directed past an initial locator sensor 858*a* configured to detect the locator module 626 and verify the presence and location of the carriage. An initial stop 860*a* may then stop the carriage 604 in the manner described above with respect to the initial stop 760*a* of the base load substation 502 (see, FIG. 15). Thereafter, when any downstream carriage is clear, the carriage 604 may be released from the initial stop 860*a*. Accordingly, the track 602 may move the carriage 604 until the carriage engages a lift stop 864*a* in the manner described above with respect to the lift stop 764*a* of the base load substation 502 (see, FIG. 15). While the carriage 604 is stopped, a stop locator sensor (not shown; see, e.g., stop locator sensor 868*b*) may detect the locator module 626 and verify the presence and location of the carriage.

The track 602 may include a lifter mechanism 870*a* (see, FIG. 22) configured to lift the carriage 604 after the presence and location thereof is verified by the stop locator sensor 864*a* in the manner described above with respect to the lifter mechanism 770*a* of the base load substation 502 (see, FIG. 15). While the carriage 604 is lifted and engaged by the lifter mechanism 870*a*, the first robotic arm 846*a* may direct the first control component terminal 206*a* into engagement with the first base 204*a*. In particular, the lower end 254 of the first control component terminal 206*a* may be engaged with the control component terminal aperture 250 (see, FIG. 14). At such time, the first end effector 848*a* may release the first control component terminal 206*a*, such that the first control component terminal may remain in engagement with the first base 204*a*. The first robotic arm 846*a* may then return to the singulator 832 to engage an additional control component terminal for attachment with the first base on a subsequent carriage.

After the robotic arm 846*a* completes the base engagement operation, a storage transceiver 876*a* may write code to the storage module 624 indicating whether or not the first control component terminal 206*a* was properly coupled to the first base 204*a*. In this regard, a component presence sensor 878*a* (e.g., comprising a light emitter and receiver) may detect whether the first control component terminal 206*a* is engaged with the first base 204*a* following movement of the first robotic arm 846*a* as described above. For example, the component presence sensor 878*a* may detect whether or not the first control component terminal 206*a* is present while the carriage 604 is lifted by the lifter mechanism 870*a*. In instances in which the first control component terminal 206*a* is not properly engaged with the first base 204*a*, the substations downstream of the base load substation 502 may not perform additional operations that would be otherwise conducted on the first base 204*a*. In other words, in light of the first control component terminal 206*a* being improperly attached to the base 204*a* or missing, the substations downstream of the control component terminal coupling substation 504 may not attempt to couple additional components thereto, so as to avoid damage to the remaining substations and waste of components. In this same regard, the storage transceiver 876*a* may read the code on the storage module 624 to determine that the partially-assembled cartridge is fit for further assembly prior to coupling the control component terminal 206*a* to the base 204*a*. Thus, the various storage transceivers disclosed herein may read the storage module before a particular operation is performed to determine whether to perform the operation, and write to the storage module after the operation to reflect whether or not the operation was properly completed.

Thereafter, the lifter mechanism 870*a* may release the carriage 604 by lowering the carriage back onto the conveyor belts 628 of the track 602. At such time the carriage 604 may be directed to the second processing portion 854*b* by the track 602. The second processing portion 854*b* may comprise the same components included in the first processing portion 854*a*.

For example, as illustrated in FIG. 24, the second processing portion 854*b* may include a carriage sensor 856*b*, an initial locator sensor 858*b*, an initial stop 860*b*, a lift stop 864*b*, a stop locator sensor 868*b*, and a lifter mechanism 870*b* (see, FIG. 22). Accordingly, the second processing portion 854*b* may operate in substantially the same manner as the first processing portion 854*a*, and hence the description thereof will not be repeated. However, as may be understood, the carriage 604 may be lifted by the lifter mechanism 870*b* such that the second control component terminal 206*b* may be engaged with the second base 204*b*, as illustrated in FIG. 25.

After the second robotic arm 846*b* completes the control component terminal engagement operation, a second storage transceiver 876*b* may write code to the storage module 624 indicating whether or not the second control component terminal 206*b* was properly engaged with the second base 204*b*. In this regard, a component presence sensor 878*b* (e.g., comprising a light emitter and receiver) may detect whether the second control component terminal 206*b* is properly engaged with the second base 204*b* following movement of the second robotic arm 846*b* as described above. For example, the component presence sensor 878*b* may detect whether or not the second control component terminal is present while the carriage 604 is lifted by the lifter mechanism 870*b*. In instances in which the second control component terminal 206*b* is not properly engaged with the second base 204*b* additional operations that would be otherwise conducted on the second base downstream of the second robotic arm 846*b* may not be conducted so as to avoid damage to the remaining substations and waste of components. In this same regard, the storage transceiver 876*b* may read the code on the storage module 624 to determine that the partially-assembled cartridge is fit for further assembly prior to coupling the control component terminal 206*b* to the base 204*b*.

The lifter mechanism 870*b* may then lower such that the track 602 transports the carriage 604 including the control component terminals 206*a*, 206*b* respectively coupled to bases 204*a*, 204*b* downstream. However, as illustrated in FIG. 25, the control component terminals 206*a*, 206*b* may not be fully engaged with the bases 204*a*, 204*b* by the robotic arms 846*a*, 846*b*. In this regard, as illustrated in FIG. 26, the control component terminal coupling substation 504 may further comprise a third processing portion 854*c*. The third processing portion 854*c* may include a lift stop 864*c*, a stop locator sensor 868*c* (see, FIG. 22), and a lifter mechanism 870*c*. The lift stop 864*c* may be configured to stop the carriage 604, the stop locator sensor 868*c* may be configured to detect presence of the carriage, and the lifter mechanism 870*c* may be configured to lift the carriage when detected.

The control component terminal coupling substation 504 may further comprise a press 880. The press 880 may be configured to press the control component terminals 206*a*, 206*b* into full engagement with the bases 204*a*, 204*b* while the carriage 604 is lifted by the lifter mechanism 870*c*. In this regard, as a result of the control component terminals 206*a*, 206*b* being relatively short, the first and second assembly units 806*a*, 806*b* may not be able to fully insert the control component terminals using the robotic arms 846*a*, 846*b* and end effectors 848*a*, 848*b*, and hence the press 880 may be employed to fully engage the control component terminals. However, in other embodiments the press may not be employed. Following operation of the press 880, a storage transceiver 876*c* may write code to the storage module 624 indicating whether or not the control component terminals 206*a*, 206*b* were properly pressed into the bases 204*a*, 204*a* (e.g., based on completion of a full downward stroke of the press 880).

Note that the above-described operations may be conducted simultaneously. In this regard, while the first robotic arm 846*a* couples the first control component terminal 206*a* to the first base 204*a*, the second robotic arm 846*b* may receive the second control component terminal 206*b* from the singulator 832. Conversely, while the second robotic arm 846*b* couples the second control component terminal 206*b* to the second base 204*b*, the first robotic arm 846*a* may receive the first control component terminal 206*a* from the singulator 832. Further, the press 880 may press the control component terminals 206*a*, 206*b* into full engagement with the bases 204*a*, 204*b* while other operations are ongoing, such as while the first robotic arm 846*a* couples the first control component terminal 206*a* to the first base 204*a* and the second robotic arm 846*b* receives the second control component terminal 206*b* from the singulator 832. Accordingly, rapid and efficient engagement of the control component terminals 206*a*, 206*b* with the bases 204*a*, 204*b* may be achieved.

The negative heating terminal coupling substation 506 and the positive heating terminal coupling substation 508 may be positioned downstream from the control component terminal coupling substation 504. For example, in one embodiment the negative heating terminal coupling substation 506 may be positioned downstream from the control component coupling substation 506 and the positive heating terminal coupling substation 508 may be positioned downstream of the negative heating terminal coupling substation. The negative heating terminal coupling substation 506 and the positive heating terminal coupling substation 508 may be substantially similar. In this regard, although the description provided below is directed to the negative heating terminal coupling substation 506, such description is applicable to both the negative heating terminal coupling substation and the positive heating terminal coupling substation 508, except as otherwise noted.

FIG. 27 illustrates a perspective view of the negative heating terminal coupling substation 506. As illustrated, the negative heating terminal coupling substation 506 may include a supply unit 902, a feeder unit 904, a first assembly unit 906*a*, and a second assembly unit 906*b*. Briefly, the supply unit 902 may be configured to provide a plurality of components (e.g., the negative heating terminals 234). The feeder unit 904 may be configured to receive the negative heating terminals 234 from the supply unit and alternatingly feed the negative heating terminals to the first assembly unit 906*a* and the second assembly unit 906*b*. The first assembly unit 906*a* and the second assembly unit 906*b* may each be configured to assemble the negative heating terminals 234 into cartridges 200 for an aerosol delivery device 100, for example, by engaging the negative heating terminals with the bases 204.

In this regard, FIG. 28 illustrates an enlarged view of the supply unit 902. As illustrated, the supply unit 902 may be configured to supply a plurality of the negative heating terminals 234. In some embodiments the supply unit 902 may include a vibratory arrangement. For example, the vibratory arrangement may include a vibratory hopper 908, a vibratory bowl 910, and a supply track 912. In some embodiments the vibratory hopper 908, the vibratory bowl 910, and/or the supply track 912 may be manufactured by Performance Feeders, Inc. of Oldsmar, Fla.

The negative heating terminals 234 may be loaded into the vibratory hopper 908. As the vibratory hopper 908 vibrates, the negative heating terminals 234 gradually travel under a gate 914 and fall into the vibratory bowl 910 so as to provide the vibratory bowl with a substantially constant supply of the negative heating terminals. In this regard, a component level sensor 916 may detect a level of the negative heating terminals 234 within the vibratory bowl 910. Thereby, the vibratory hopper 908 may start and stop based on the level of the negative heating terminals 234 within the vibratory bowl 910 as detected by the component level sensor 916. Accordingly, the vibratory hopper 908 may maintain a substantially constant level of the negative heating terminals 234 within the vibratory bowl 910 as the negative heating terminals are transported therefrom.

The vibratory bowl 910 may define a pathway 918 configured to arrange the negative heating terminals 234 in a serially-aligned stream 920 (see, FIG. 29). In this regard, the vibratory motion of the vibratory bowl 910 may direct the negative heating terminals 234 upwardly along the pathway 918, which may narrow such that some negative heating terminals fall therefrom and the negative heating terminals that remain on the pathway become serially-aligned.

As illustrated in FIG. 29, the vibratory bowl 910 may be configured to arrange the negative heating terminals 234 vertically, with an upper end 258 of the negative heating terminal extending downwardly and a lower end 260 of the negative heating terminal extending upwardly. However, some negative heating terminals 234 in the serially-aligned stream 920 may be oriented in a manner that differs from the desired orientation. In this regard, as illustrated in FIG. 28, the supply unit 902 may further comprise an actuator 924 configured to individually remove or realign the negative heating terminals 234 in the serially-aligned stream 920 when the negative heating terminals are misaligned in a direction. In one embodiment the actuator 924 may comprise a nozzle 926 configured to direct a flow of air at each negative heating terminals 234 that is misaligned to remove the misaligned negative heating terminal from the pathway 918 or push the misaligned negative heating terminal into proper alignment. In some embodiments the nozzle 926 may be oriented so as to only impact those negative heating terminals 234 that are misaligned. In another embodiment the supply unit 902 may further comprise an orientation sensor 922 (e.g., a camera) configured to determine an alignment of the negative heating terminals 234 on the pathway 918, and the actuator 924 may be actuated in response thereto when a misaligned negative heating terminal is detected.

Accordingly, each of the negative heating terminals 234 in the serially-aligned stream 920 may be properly oriented downstream of the actuator 924. The negative heating terminals 234 removed by the actuator 924 may be directed back into the vibratory bowl 910 such that the negative heating terminals may be returned to the pathway 918. In some embodiments the pathway may define a gap or other feature configured to remove the components from the serially-aligned stream when the components are misaligned in a second direction.

Accordingly, the serially-aligned stream 920 of the negative heating terminals 234 may be directed to the supply track 912, which may maintain the negative heating terminals in the vertical orientation and in the single-file arrangement. In some embodiments the supply track 912 may comprise a vibratory supply track to facilitate movement of the negative heating terminals 234 therealong. As illustrated in FIG. 28, the supply track 912 may include a full sensor 926 configured to detect whether the supply track is full of the negative heating terminals 234. In this regard, when the full sensor 926 sense that the supply track 912 is full, the vibratory bowl 910 may be shut off. Further, the supply track 912 may include a low level sensor 928 configured to detect when the supply track is running low on the negative heating terminals 234. In this regard, when the low level sensor 928 detects a low level of the negative heating terminals 234 in the supply track 912, an indicator 930 (see, FIG. 27) may be illuminated to inform an operator that the negative heating terminal coupling substation 506 is running low on the negative heating terminals, such that the operator may be informed that it is time to refill the vibratory hopper 908. In some embodiments the full sensor 926 and the low level sensor 928 may comprise optical sensors that include an emitter and a receiver configured to detect each negative heating terminal 234 passing thereby.

Further, as illustrated in FIG. 29, the supply unit 902 may include a singulator 932 configured to singulate the negative heating terminals 234 from the serially-aligned stream 920. In this regard, the singulator 932 may include a stop 934 (e.g., comprising a pin) that stops the serially-aligned stream 920 of negative heating terminals 234 from further advancement. As illustrated, in one embodiment a horizontal actuator 936 (see, FIG. 30) may be configured to move the stop 934 horizontally between a retracted position and an extended position. The horizontal actuator 936 may default to the extended position such that the stop 934 blocks the serially-aligned stream 920 of negative heater terminals 234 from moving. However, the horizontal actuator 936 may momentarily retract the stop 934 to the retracted position to allow one of the negative heating terminals 234 to pass the stop. Thereby, a second stop 938 (e.g., comprising a plate) may stop the outermost negative heating terminal 234 from further advancement, such that the outermost negative heating terminal is positioned between the stop 934 (i.e., the first stop) and the second stop 938 and singulated from the serially-aligned stream 920.

As illustrated, when the outermost negative heating terminal 234 is singulated between the first stop 934 and the second stop 938, a biasing member 940 may engage the outermost negative heating terminal 234 such that the outermost negative heating terminal 234 is further separated from the remaining negative heating terminals. In particular, the biasing member 940 may be configured to extend upwardly to engage the downwardly-extending upper end 258 of the outermost negative heating terminal 234. In this regard, the biasing member 940 may define an angled surface 942 that engages and presses outwardly on the upper end 258 of the outermost negative heating terminal 234 as the biasing member 940 extends upward.

After the outermost negative heating terminal 234 is singulated, this negative heating terminal may be transferred to the feeder unit 904. FIG. 30 illustrates a perspective view of the feeder unit 904. In some embodiments the feeder unit 904 may comprise a rotary member 944. The rotary member 944 may include a first engagement head 946a and a second engagement head 946b respectively configured to receive one of the negative heating terminals 234 from the supply unit 902. In this regard, the first engagement head 946a may define a first gripper 948a and the second engagement head 946b may define a second gripper 948b. As illustrated, in some embodiments the rotary member 944 may comprise a first arm 950a and a second arm 950b. The first engagement head 946a may be coupled to the first arm 950a and the second engagement head 946b may be coupled to the second arm 950b.

The rotary member 944 may be configured to swivel between a first receiving position at which the first engagement head 946a is positioned proximate the feeder 902 and a second receiving position (see, FIGS. 29 and 30) in which the second engagement head 946b is positioned proximate the feeder. Thereby, a first negative heating terminal 234a singulated from the serially-aligned stream 920 may be grasped by the first gripper 948a of the first engagement head 946a in the first receiving position. In this regard, a terminal singulation sensor 952 (e.g., an optical sensor; see FIG. 29) may detect that a negative heating terminal 234 has been singulated.

A first gripper extender 954a may then extend the first gripper 948a, which is open, around the first negative heating terminal 234a. The first gripper 948a may then shut so as to clamp onto the first heating terminal 234a. A second horizontal actuator 956 (see, FIG. 29) may then retract the second stop 938 such that the first gripper extender 954a may retract the first gripper 948a with the first negative heating terminal 234a engaged therewith.

A terminal load sensor 958 (e.g., an optical sensor) may detect whether the first gripper 948a properly gripped the first heating terminal 234a. The rotary member 944 may then swivel to a first delivery position (e.g., by rotating clockwise when viewed from above) to a first delivery position, which corresponds to the second receiving position, and which is illustrated in FIG. 30.

FIG. 31 illustrates the first assembly unit 906a and the second assembly unit 906b. As illustrated, the first assembly unit 906a may include a first robotic arm 960a and a first end effector 962a coupled thereto. Similarly, the second assembly unit 906b may include a second robotic arm 960b and a second end effector 962b coupled thereto.

The first end effector 962a may be configured to engage the first negative heating terminal 234a and deliver the first negative heating terminal to the first base 204a on a carriage 604 on the track 602 via movement of the first robotic arm 960a. Thus, the first assembly unit 906a may be positioned such that the first robotic arm 960a is configured to move the first end effector 962a between the feeder unit 904 and the track 602. In this regard, when the rotary member 944 is in the first delivery position (see, FIGS. 29-31), the first robotic arm 960a may direct the first end effector 962a into proximity with the first negative heating terminal 234a held by the first gripper 948a of the feeder unit 904.

Accordingly, the first end effector 962 may be configured to engage the first negative heating terminal 234a. As illustrated in FIG. 32, in some embodiments the first end effector 962a may comprise first and second opposing portions 964, 966 configured to clamp the first negative heating terminal 234a therebetween. Accordingly, the first end effector 962a may be configured to securely grasp each first negative heating terminal 234a.

As described above, the singulator 932 may supply the first negative heating terminals 234a upside down, with the upper end 258 thereof pointing downwardly, and this orientation may be maintained by the supply unit 904, such that the first end effector 962a receives the first negative heating terminals in this inverted orientation. In particular, the first end effector 962a may grasp each first negative heating terminal 234a between the upper end 258 and the lower end 260, substantially at a middle thereof. The first end effector 962a may thereby rotate one hundred eighty degrees such that the lower end 260 of the first negative heating terminal 234a is pointed downwardly, as illustrated in FIG. 33.

Accordingly, the track 602 may move the carriage 604 such that the first base 204a is positioned for receipt of the first negative heating terminal 234a. In this regard, a carriage 604 with the first and second bases 204a, 204b engaged therewith, and the control component terminals 206a, 206b engaged with the bases may be directed through the negative heating terminal coupling substation 506. As illustrated in FIG. 34, the track 602 may direct each carriage 604 through a first processing portion 968a of the first assembly unit 906a and a second processing portion 968b of the second assembly unit 906b at the negative heating terminal coupling substation 506. In particular, each carriage 604 may first be directed through the first processing portion 968a followed by the second processing portion 968b. Operations relating to the first base 204a and the first negative heating terminals 234a are conducted at the first processing portion 968a, whereas operations relating to the second base 204b and the second negative heating terminals 234b (see, e.g., FIG. 30) are conducted at the second processing portion 968b.

Accordingly, a carriage 604 may be transported along the track 602 to the first processing portion 968a. The carriage 604 may be directed past a carriage sensor 970a, which may comprise a light emitter and detector, and which detects presence of the carriage 604. After passing the carriage sensor 970a, the carriage 604 may be directed past an initial locator sensor 972a configured to detect the locator module 626 and verify the presence and location of the carriage. An initial stop 974a may then stop the carriage 604 in the manner described above with respect to the initial stop 760a of the base load substation 502 (see, FIG. 15). Thereafter, when any downstream carriage is clear, the carriage 604 may be released from the initial stop 974a. Accordingly, the track 602 may move the carriage 604 until the carriage engages a lift stop 976a in the manner described above with respect to the lift stop 764a of the base load substation 502 (see, FIG. 15). While the carriage 604 is stopped, a stop locator sensor 978a may detect the locator module 626 and verify the presence and location of the carriage.

The track 602 may include a lifter mechanism 980a configured to lift the carriage 604 after the presence and location thereof is verified by the stop locator sensor 978a in the manner described above with respect to the lifter mechanism 770a of the base load substation 502 (see, FIG. 15). While the carriage 604 is lifted and engaged by the lifter mechanism 980a, the first robotic arm 960a may lower the first end effector 962a such that the lower end 260 of the first negative heating terminal 234a extends into the negative heating terminal aperture 248a (see, FIG. 14).

In some embodiments the first assembly unit 906a may include a first pusher 982a positioned proximate the first end effector 962a. As illustrated in FIG. 32, the first pusher 982a may be configured to extend downwardly to press against the first negative heating terminal 234a to fully insert the first negative heating terminal into the first base 204a. Prior to the first pusher 982a extending, the first end effector 962a may release the first negative heating terminal 234a, such that the first negative heating terminal may remain in engagement with the first base 204. The first robotic arm 960a may then return to the singulator 932 to engage an additional negative heating terminal for attachment with the first base on a subsequent carriage.

After the robotic arm 960a engages the first negative heating terminal 234a with the first base 204a, a storage transceiver (not shown; see, e.g., storage transceiver 984b) may write code to the storage module 624 indicating whether or not the first negative heating terminal 234a was properly coupled to the first base 204a. In this regard, a component presence sensor 986a (e.g., comprising a light emitter and receiver) may detect whether the first negative heating terminal 234a is engaged with the first base 204a following movement of the first robotic arm 960a as described above. For example, the component presence sensor 986a may detect whether or not the first negative heating terminal 234a is present while the carriage 604 is lifted by the lifter mechanism 980a. In instances in which the first negative heating terminal 234a is not properly engaged with the first base 204a, the substations downstream of the base load substation 502 may not perform additional operations that would be otherwise conducted on the first base 204a. In other words, in light of the first negative heating terminal 234a being improperly attached to the base 204a or missing, the substations downstream of the negative heating terminal coupling substation 506 may not attempt to couple additional components thereto, so as to avoid damage to the remaining substations and waste of components. In this same regard, the storage transceiver may read the code on the storage module 624 to determine that the partially-assembled cartridge is fit for further assembly prior to coupling the negative heating terminal 234a to the base 204a.

Thereafter, the lifter mechanism 980a may release the carriage 604 by lowering the carriage back onto the conveyor belts 628. At such time the carriage 604 may be directed along the track 602 to the second processing portion 968b. The second processing portion 968b may comprise the same components included in the first processing portion 968a. For example, as illustrated in FIG. 34, the second processing portion 968b may include a carriage sensor 970b, an initial locator sensor 972b, an initial stop 974b, a lift stop 976b, a stop locator sensor 978b, and a lifter mechanism 980b. Accordingly, the second processing portion 968b may operate in substantially the same manner as the first processing portion 968a, and hence the description thereof will not be repeated. However, as may be understood, the carriage 604 may be lifted by the lifter mechanism 980b such that the second negative heating terminal 234b may be engaged with the second base 204b.

In this regard, while the first negative heating terminal 234a is delivered to the first assembly unit 906a for insertion in the first base 204a, the second negative heating terminal 234b may be singulated from the serially-aligned stream 920 of negative heating terminals. In particular, with reference to FIGS. 29 and 30, the second horizontal actuator 956 may extend the second stop 938 to the default extended configuration, the biasing member 940 may retract, and the horizontal actuator 936 (i.e., the first horizontal actuator) may retract the first stop 934 such that a negative heating terminal 234 (i.e., the second negative heating terminal 234b) advances to the second stop 938. The first horizontal actuator 936 may then extend the first stop 934 such that the second negative heating terminal 234b is received between the first stop 934 and the second stop 938. The biasing member 940 may then extend to separate the second heating terminal 234b from the serially-aligned stream 920 of negative heating terminals.

Accordingly, the second gripper 948b of the feeder unit 904 may engage the second negative heating terminal 234b. Thereby, the feeder unit 904 may swivel (e.g., by rotating counterclockwise when viewed from above), and position the second negative heating terminal 234b proximate the track 602. The second robotic arm 960b, the second end effector 962b, and a second pusher (not shown; see, e.g., pusher 982a) may then engage the second negative heating terminal 234b in the negative heating terminal aperture 248b of the second base 204b in the manner described above.

After the second robotic arm 960b completes the second negative heating terminal engagement operation, the second storage transceiver 984b may write code to the storage module 624 indicating whether or not the second negative heating terminal 234b was properly engaged with the second base 204b. In this regard, a component presence sensor 986b (e.g., comprising a light emitter and receiver) may detect whether the second negative heating terminal 234b is properly engaged with the second base 204*b* following movement of the second robotic arm 960*b* as described above. For example, the component presence sensor 986*b* may detect whether or not the second negative heating terminal 234*b* is present while the carriage 604 is lifted by the lifter mechanism 980*b*. In instances in which the second negative heating terminals 234*b* is not properly engaged with the second base 204*b* additional operations that would be otherwise conducted on the second base downstream of the second robotic arm 960*b* may not be conducted so as to avoid damage to the remaining substations and waste of components. Following attachment of the second negative heating terminal 234*b* and detection of presence or absence thereof, the lifter mechanism 980*b* may lower the carriage 604 such that the track 602 transports the carriage including the negative heating terminals 234*a*, 234*b* respectively coupled to bases 204*a*, 204*b* downstream. In this same regard, the storage transceiver 984*b* may read the code on the storage module 624 to determine that the partially-assembled cartridge is fit for further assembly prior to coupling the negative heating terminal 234*b* to the base 204*b*.

Note that the above-described operations may be conducted simultaneously. In this regard, while the first engagement head 946*a* delivers the first negative heating terminal 234*a* to the first robotic arm 960*a*, the second engagement head 946*b* may receive the second negative heating terminal 234*b* from the singulator 932. Conversely, while the second engagement head 946*b* delivers the second negative heating terminal 234*b* to the second robotic arm 960*b*, the first engagement head 946*a* may receive the first negative heating terminal 234*a* from the singulator 932. Further, while the first robotic arm 960*a* couples the first negative heating terminal 234*a* to the first base 204*a*, the second robotic arm 960*b* may receive the second negative heating terminal 234*b* from the rotary member 944. Conversely, while the second robotic arm 960*b* couples the second negative heating terminals 235 to the second base 204*b*, the first robotic arm 960*a* may receive the first negative heating terminal 234*a* from the rotary member 944. Accordingly, rapid and efficient engagement of the negative heating terminals 234*a*, 234*b* with the bases 204*a*, 204*b* may be achieved.

As noted above, the positive heating terminal coupling substation 508 may be substantially similar to the negative heating terminal coupling substation 506. Accordingly, a description of the various components of the positive heating terminal coupling substation 508 will not be repeated. However, in some embodiments the positive heating terminal coupling substation 508 may additionally include an inspection unit 988, which may be positioned downstream of the first and second assembly units thereof, which may be substantially similar to the first and second assembly units 906*a*, 906*b* of the negative heating terminal coupling substation 506, as noted above.

As illustrated in FIG. 35, the inspection unit 988 may include an inspection locator sensor 990, which may detect the presence of the carriage 604. A first inspection stop 992 may momentarily stop the carriage at a location at which the first base 204*a* is positioned proximate an imaging device 994 (e.g., a digital camera). Accordingly, the imaging device 994 may capture an image of the first control component terminal 206*a*, the first negative heating terminal 234*a*, and a first positive heating terminal (see, e.g., positive heating terminal 235 in FIG. 1). Following release from the first inspection stop 992, the carriage 604 may travel downstream on the track 602 and engage a second inspection stop 996, at which the second base 204*b* is positioned proximate the imaging device 994. Accordingly, the imaging device 994 may capture an image of the second control component terminal 206*b*, the second negative heating terminal 234*b*, and a second positive heating terminal (see, e.g., positive heating terminal 235 in FIG. 1).

In some embodiments a backlight 998 may be positioned across from the imaging device 994, such that the terminals 206, 234, 235 are positioned between the imaging device and the backlight, to improve imaging of the terminals. Accordingly, the images captured by the imaging device 994 may be analyzed to determine whether the terminals 206, 234, 235 are missing or improperly engaged with the bases 204. For example, the height to which the terminals 206, 234, 235 extend from the base 204 may be determined and compared to a desired height of the terminals. A third storage transceiver 984*c* may write code to the storage module 624 indicating whether or not the terminals 206, 234, 235 are properly engaged with the bases 204. In instances in which the terminals 206, 234, 235 are not properly engaged with the bases 204, additional operations that would be otherwise conducted thereon downstream of the positive heating terminal coupling substation 508 may not be conducted so as to avoid damage to the remaining substations and waste of components.

The control component coupling substation 510 may be positioned downstream of the positive heating terminal coupling substation 508. FIG. 36 illustrates a perspective view of the control component coupling substation 510. As illustrated, the control component coupling substation 510 may include a supply unit 1002, a feeder unit 1004, a first assembly unit 1006*a*, and a second assembly unit 1006*b*. Briefly, the supply unit 1002 may be configured to provide a plurality of components (in particular, electronic control components 208). The feeder unit 1004 may be configured to receive the electronic control components 208 from the supply unit and alternatingly feed the electronic control components 208 to the first assembly unit 1006*a* and the second assembly unit 1006*b*. The first assembly unit 1006*a* and the second assembly unit 1006*b* may each be configured to assemble the electronic control components 208 into cartridges 200 for an aerosol delivery device 100 (e.g., by engaging the electronic control components with the control component terminals 206).

In this regard, FIG. 37 illustrates an enlarged view of the supply unit 1002. As illustrated, the supply unit 1002 may be configured to supply a plurality of the electronic control components 208. In some embodiments the supply unit 1002 may include a vibratory arrangement. For example, the vibratory arrangement may include a vibratory bowl 1010 and a supply track 1012. In some embodiments the vibratory bowl 1010 and/or the supply track 1012 may be manufactured by Performance Feeders, Inc. of Oldsmar, Fla. Further, in some embodiments the vibratory bowl 1010 and/or various other components of the control component coupling substation 510 may be coated with an antistatic coating configured to avoid damaging the electronic control components 208, which may include a circuit board.

The electronic control components 208 may be loaded directly into the vibratory bowl 1010, or a vibratory hopper may supply the electronic control components 208 to the vibratory bowl in the manner described above. The vibratory bowl 1010 may define a pathway 1018 configured to arrange the electronic control components 208 in a serially-aligned stream 1020. In this regard, the vibratory motion of the vibratory bowl 1010 may direct the electronic control components 208 upwardly along the pathway 1018, which may narrow such that some electronic control components fall therefrom and the electronic control components that remain on the pathway become serially-aligned.

The vibratory bowl 1010 may be configured to arrange the electronic control components 208 generally horizontally with longitudinal ends thereof contacting one-another. However, some electronic control components 208 in the serially-aligned stream 1020 may be oriented in a manner that differs from the desired orientation. In this regard, as illustrated in FIG. 38, the supply unit 1002 may further comprise an actuator 1024 configured to individually remove or realign the electronic control components 208 in the serially-aligned stream 1020 when the electronic control components are misaligned in a direction. In one embodiment the actuator 1024 may comprise a nozzle 1026 configured to direct a flow of air at each electronic control components 208 that is misaligned to remove the electronic control component from the pathway 1020 or push the electronic control component into proper alignment. In some embodiments the nozzle 1026 may be oriented so as to only impact those electronic control components 208 that are misaligned with a flow of air directed therefrom.

In another embodiment the supply unit 1002 may further comprise an orientation sensor 1028 (e.g., a camera) configured to determine an alignment of the electronic control components 208 on the pathway 1018, and the actuator 1024 may be actuated in response thereto when a misaligned electronic control component is detected. For example as illustrated in FIG. 39, each of the electronic control components 208 may define a first longitudinal end 262 and a second longitudinal end 264. The first longitudinal end 262 may be oriented downstream of the second longitudinal end 264 in a proper orientation for performance of additional operations on the electronic control component 208 as described hereinafter. Accordingly, electronic control components defining a different orientation, as detected by the orientation sensor 1028, may be removed from the pathway 1018 by the nozzle 1026.

In some embodiments the electronic control components 208 may also be asymmetrical with respect to a first major surface 266 and a second major surface 268. For example, as illustrated in FIG. 39, the first major surface 266 of the electronic control components 208 may include a chip (e.g., a memory chip) extending therefrom. Further, the opposing second major surface 268 of the electronic control components 208 may be substantially flat. Accordingly, the orientation sensor 1028 may additionally determine which major side of the electronic control components 208 is oriented away from the vibratory bowl 1010, and any electronic control components oriented differently from a desired orientation (e.g., an orientation in which the first major surface 266 faces away from the vibratory bowl) may be removed from the pathway 1018 by the nozzle 1026.

Alternatively or additionally, as illustrated in FIG. 39, in some embodiments the pathway 1018 may define a gap 1030 or other feature configured to remove the electronic control components 208 from the serially-aligned stream 1020 when the electronic control components are misaligned in a second direction. For example, as noted above, the first and second major surfaces 266, 268 of the electronic control components 208 may be asymmetrical. In this regard, the first major surface 266 of the electronic control component 208 may include a memory chip or other feature defining a protrusion extending along a portion of the longitudinal length of the electronic control component. Thereby, when the electronic control component 208 is oriented with the first major surfaces 268 of the electronic control component toward the vibratory bowl 1010, the protrusion may enter the gap 1030. Thereby, the gap 1030 may be configured to cause the electronic control component terminals 208 to fall from the pathway 1018 when the major surfaces thereof are oppositely oriented relative to a desired orientation. In some embodiments the gap 1030 may be positioned upstream from the actuator 1024 so as to allow the actuator to only remove those electronic control components that are longitudinally improperly oriented.

Accordingly, each of the electronic control components 208 in the serially-aligned stream 1020 may be properly oriented downstream of the gap 1030 and the actuator 1024. The electronic control components 208 removed by the gap 1030 and the actuator 1024 may be directed back into the vibratory bowl 1010 such that the electronic control components may be returned to the pathway 1018. Thus, the removed electronic control components 208 may be directed back into the serially-aligned stream 1020.

Thereby the serially-aligned stream 1020 of the electronic control components 208 may be directed to the supply track 1012, which may maintain the electronic control components in the horizontal orientation and in the longitudinal single-file arrangement. In some embodiments the supply track 1012 may comprise a vibratory supply track to facilitate movement of the electronic control components 208 therealong. As illustrated in FIG. 37, the supply track 1012 may include a full sensor 1032 configured to detect whether the supply track is full of the electronic control components 208. In this regard, when the full sensor 1032 senses that the supply track 1012 is full, the vibratory bowl 1010 may be shut off. Further, the supply track 1012 may include a low level sensor 1034 configured to detect when the supply track is running low on the electronic control components 208. In this regard, when the low level sensor 1034 detects a low level of the electronic control components 208 in the supply track 1012, an indicator 1030 (see, FIG. 36) may be illuminated to inform an operator that the electronic control component coupling substation 510 is running low on the electronic control components, such that the operator may be informed that it is time to refill the vibratory bowl 1010. In some embodiments the full sensor 1032 and the low level sensor 1034 may comprise optical sensors that include an emitter and a receiver configured to detect the presence or absence of electronic control components 208 positioned therebetween.

Further, as illustrated in FIG. 40, the supply unit 1002 may include a singulator 1036 configured to singulate the electronic control components 208 from the serially-aligned stream 1020. In this regard, the singulator 1036 may include a stop 1038 (e.g., comprising a pin) that stops the serially-aligned stream 1020 of electronic control components 208 from further advancement. As illustrated, in one embodiment a vertical actuator 1040 may be configured to move the stop 1038 vertically between a retracted position and an extended position. The vertical actuator 1040 may default to the extended position such that the stop 1038 blocks the serially-aligned stream 1020 of electronic control components 208 from moving. However, the vertical actuator 1040 may momentarily retract the stop 1038 to the retracted position to allow one of the electronic control components 208 to pass the stop. Thereby, an outermost electronic control component 208 may be directed to the feeder unit 1004. Further, the vertical actuator 1040 may move the stop 1038 to the extended position after the outermost electronic control component 208 passes thereunder such that an electronic control component is singulated from the serially-aligned stream 1020, and received by the feeder unit 1004.

FIG. 40 further illustrates a perspective view of the feeder unit 1004. In some embodiments the feeder unit 1004 may comprise a rotary member 1042. The rotary member 1042 may include a first engagement head 1044a and a second engagement head 1044b respectively configured to receive one of the electronic control components 208 from the supply unit 1002. In this regard, the first engagement head 1044a may define a first pocket 1046a and the second engagement head 1044b may define a second pocket 1046b. As illustrated, in some embodiments the rotary member 1042 may comprise a first arm 1048a and a second arm 1048b. The first engagement head 1044a may be coupled to the first arm 1048a and the second engagement head 1044b may be coupled to the second arm 1048b.

FIG. 40 illustrates the rotary member 1042 in a first receiving position and FIG. 41 illustrates the rotary member in a second receiving position, between which the rotary member may be configured to swivel. In the first receiving position, the first engagement head 1044a is positioned proximate the singulator 1036. Thereby, a first electronic control component 208a may be singulated from the serially-aligned stream 1020 and delivered into the first pocket 1046a in the first engagement head 1044a. A singulation sensor 1050 (e.g., an optical sensor) may detect that the first electronic control component 208a has been singulated and delivered to the first engagement head 1044a.

After the first electronic control component 208a is received in the first engagement head 1044a, the rotary member 1042 may swivel (e.g., by rotating clockwise when viewed from above) to a first delivery position, which corresponds to the second receiving position, and which is illustrated in FIG. 41. As the rotary member 1042 swivels, negative pressure may be applied to the first pocket 1046a. Thereby, the negative pressure may assist in retaining the first electronic control component 208a on the rotary member 1042 during swiveling movement thereof. Accordingly, the first electronic control component 208a may be moved to the first delivery position.

FIG. 42 illustrates the first assembly unit 1006a and the second assembly unit 1006b. As illustrated, the first assembly unit 1006a may include a first robotic arm 1052a and a first end effector 1054a coupled thereto. Similarly, the second assembly unit 1006a may include a second robotic arm 1052b and a second end effector 1054b coupled thereto.

The first end effector 1054b may be configured to engage the first electronic control component 208a and deliver the first electronic control component to the first base 204a, which is engaged with a carriage 604 on the track 602, via movement of the first robotic arm 1052a. Thus, the first assembly unit 1006a may be positioned such that the first robotic arm 1052a is configured to move the first end effector 1054a between the feeder unit 1004 and the track 602. In this regard, when the rotary member 1042 is in the first delivery position (see, FIG. 41), the first robotic arm 1052a may direct the first end effector 1054a into proximity with the first electronic control component 208a held by the first engagement head 1044a of the feeder unit 1004.

Accordingly, the first end effector 1054a may be configured to engage the first electronic control component 208a. As illustrated in FIGS. 43 and 44, in some embodiments the first end effector 1054a may comprise first and second opposing portions 1056, 1058 configured to clamp the first electronic control component 208a therebetween. Accordingly, the first and second opposing portions 1056, 1058 of the first end effector 1048a may securely grasp the first electronic control component 208a and the first robotic arm 1052a may lift the first electronic control component from the rotary member 1042. In some embodiments the first pocket 1046a may stop applying negative pressure while the first assembly unit 1006a lifts the first electronic control component 208a therefrom.

Accordingly, the track 602 may move the carriage 604 such that the first base 204a is positioned for receipt of the first electronic control component 208a. In this regard, a carriage 604 with the bases 204 engaged therewith, and the negative heating terminal 234, the positive heating terminal 235, and the control component terminal 206 engaged with the bases, may be directed through the control component coupling substation 510. As illustrated in FIG. 45, the track 602 may direct each carriage 604 through a first processing portion 1060a of the first assembly unit 1006a and a second processing portion 1060b of the second assembly unit 106b at the control component coupling substation 510. In particular, each carriage 604 may first be directed through the first processing portion 1060a followed by the second processing portion 1060b. Operations relating to the first base 204a and the first electronic control component 208a are conducted at the first processing portion 1060a, whereas operations relating to the second base 204b and the second electronic control component 208b (see, FIG. 40) are conducted at the second processing portion 1060b.

Accordingly, a carriage 604 may be transported along the track 502 to the first processing portion 1060a. The carriage 604 may be directed past a carriage sensor 1062a, which may comprise a light emitter and detector, and which detects the presence of the carriage 604. After passing the carriage sensor 1062a, the carriage 604 may be directed past an initial locator sensor 1064a configured to detect the locator module 626 and verify the presence and location of the carriage. An initial stop 1066a may then stop the carriage 604 in the manner described above with respect to the initial stop 760a of the base load substation 502 (see, FIG. 15). Thereafter, when any downstream carriage is clear, the carriage 604 may be released from the initial stop 1066a. Accordingly, the track 602 may move the carriage 604 until the carriage engages a lift stop 1068a in the manner described above with respect to the lift stop 764a of the base load substation 502 (see, FIG. 15). While the carriage 604 is stopped, a stop locator sensor 1070a may detect the locator module 626 and verify the presence and location of the carriage.

The track 602 may include a lifter mechanism 1072a configured to lift the carriage 604 after the presence and location thereof is verified by the stop locator sensor in the manner described above with respect to the lifter mechanism 770a of the base load substation 502 (see, FIG. 15). While the carriage 604 is lifted and engaged by the lifter mechanism 1072a, the first robotic arm 1052a may lower the first end effector 1054a such that the first end 262 of the first electronic control component 208a engages the first control component terminal 206a.

In this regard, as illustrated in FIGS. 43 and 44, the first end effector 1054a may further comprise a pivoting gripper 1074a. The pivoting gripper 1074a may be configured to apply a negative pressure to the first electronic control component 208a. Accordingly, when the first and second opposing portions 1056, 1058 release, the pivoting gripper 1074a may remain in engagement with the first electronic control component 208a.

As illustrated in FIGS. 43 and 44, the pivoting gripper 1074a may be configured to pivot downwardly, such that the first electronic control component 208a transitions from a substantially horizontal configuration to a substantially vertical configuration. Thereby, the first electronic control component 208a may be positioned between the negative heating terminal 234 and the positive heating terminal 235 in contact with the control component terminal 206. In some embodiments the assembly units 1006a, 1006b may respectively include a terminal spreader 1076a, 1076b (see, FIG. 45), which may be configured to spread the negative heating terminal 234 and the positive heating terminal 235 apart from one another in order to facilitate insertion of the electronic control component 208 therebetween.

After the electronic control component 208 is engaged with the control component terminal 206, the pivoting gripper 1074a may stop applying the negative pressure to the first electronic control component 208a, such that the first electronic control component remains in engagement with the control component terminal 206a between the negative and positive heating terminals 234a, 235a. The first robotic arm 1052a may then return to the feeder unit 1004 to engage an additional first electronic control component for attachment with the first base 204a on a subsequent carriage 604.

After the robotic arm 1060a engages the first electronic control component 208a with the first base 204a (e.g., via the control component terminal 206), a storage transceiver 1078a may write code to the storage module 624 indicating whether or not the first electronic control component 208a was properly coupled to the first base 204a. In this regard, for example, the storage transceiver 1078a may store information to the storage module 624 indicating that the electronic control component 208a is improperly attached unless each of the movements of the components of the first assembly unit 1006a are successfully completed, as detected by various motion sensors associated therewith. In instances in which the first electronic control component 208a is deemed to not be properly engaged with the first base 204a, the substations downstream of the control component coupling substation 510 may not perform additional operations that would be otherwise conducted on the first base 204a. In other words, in light of the first electronic control component 208a being improperly attached to the base 204a or missing, the substations downstream of the electronic control component coupling substation 510 may not attempt to couple additional components thereto, so as to avoid damage to the remaining substations and waste of components. In this same regard, the storage transceiver 1078a may read the code on the storage module 624 to determine that the partially-assembled cartridge is fit for further assembly prior to coupling the electronic control component 208a to the control component terminal 206 coupled to the first base 204a.

Thereafter, the lifter mechanism 1072a may release the carriage 604 by lowering the carriage back onto the conveyor belts 628. At such time the carriage 604 may be directed along the track 602 to the second processing portion 1060b. As illustrated in FIG. 46, the second processing portion 1060b may comprise the same components included in the first processing portion 1060a. For example, the second processing portion 1060b may include a carriage sensor 1062b (see, FIG. 42), an initial locator sensor 1064b, an initial stop 1066b, a lift stop 1068b, a stop locator sensor 1070b, a lifter mechanism 1072b, and a storage transceiver 1078b. Accordingly, the second processing portion 1060b may operate in substantially the same manner as the first processing portion 1068a, and hence the description thereof will not be repeated.

In this regard, while the first electronic control component 208a is delivered to the first assembly unit 1006a for engagement with the first base 204a, the second electronic control component 208b may be singulated from the serially-aligned stream 1020 of electronic control components in the manner described above and received in the second pocket 1046b in the second engagement head 1044b, as illustrated in FIG. 41. Thereby, when the rotary member 1042 swivels back to the first receiving position, as illustrated in FIG. 40, the second electronic control component 208b may be received by the second assembly unit 1006b, which may then engage the second electronic control component 208b with the second base 204b in the manner described above.

After the second electronic control component 208b is coupled to the second base 208b, the lifter mechanism 1072b may lower the carriage 604 such that the track 602 transports the carriage downstream. As illustrated, in FIG. 46, an inspection unit 1080 may be positioned downstream of the second assembly unit 1006b. The inspection unit 1080 may include an inspection locator sensor 1082, which may detect the presence of the carriage 604. A lift stop 1084 may momentarily stop the carriage 604 at a location at which a lifter mechanism 1086 may lift the carriage 604 after the carriage is detected by the inspection locator sensor 1082. Accordingly, first and second component presence sensors 1088a, 1088b (e.g., comprising a light emitter and a receiver) may detect the presence of the electronic control components 208a, 208b. Accordingly, a storage transceiver 1090 may write code to the storage module 624 indicating whether or not the electronic control components 208a, 208b are properly attached to a respective base 204a, 204b. In instances in which the electronic control components 208a, 208b are not properly engaged with a respective base 204a, 204b, the substations downstream of the control component coupling substation 510 may not perform additional operations that would be otherwise conducted on the base. The lifter mechanism 1086 may lower the carriage 604 such that the track 602 transports the carriage including the positive and negative heating terminals 234, 235, the control component terminal 206, and the electronic control component 208 respectively coupled to bases 204a, 204b downstream.

Note that the above-described operations may be conducted simultaneously. In this regard, while the first engagement head 1044a delivers the first electronic control component 208a to the first robotic arm 1052a, the second engagement head 1044b may receive the second electronic control component 208b from the singulator 1036. Conversely, while the second engagement head 1044b delivers the second electronic control component 208b to the second robotic arm 1052b, the first engagement head 1044a may receive the first electronic control component 208a from the singulator 1036. Further, while the first robotic arm 1052a couples the first electronic control component 208a to the first base 204a, the second robotic arm 1052b may receive the second electronic control component 208b from the second engagement head 1044a. Conversely, while the second robotic arm 1052b couples the second electronic control components 208b to the second base 204b, the first robotic arm 1052a may receive the first electronic control components 208a from the first engagement head 1044a. Accordingly, rapid and efficient engagement of the electronic control components 208a, 208b with the bases 204a, 204b may be achieved.

The flow director coupling substation 512 may be positioned downstream of the control component coupling substation 510. FIG. 47 illustrates a perspective view of the flow director coupling substation 512. As illustrated, the flow director coupling substation 512 may include a supply unit 1102, a feeder unit 1104, a first assembly unit 1106a, and a second assembly unit 1106b. Briefly, the supply unit 1102 may be configured to provide a plurality of components (in particular, flow directors 210). The feeder unit 1104 may be configured to receive the flow directors 210 from the supply unit 1102 and alternatingly feed the flow directors to the first assembly unit 1106a and the second assembly unit 1106b. The first assembly unit 1106a and the second assembly unit 1106b may each be configured to assemble the flow directors 210 into cartridges 200 for an aerosol delivery device 100, for example by positioning the flow directors between the negative and positive terminals 234, 235 and in engagement with the control component terminal 208.

In this regard, FIG. 48 illustrates an enlarged view of the supply unit 1102. As illustrated, the supply unit 1102 may be configured to supply a plurality of the flow directors 210. In some embodiments the supply unit 1102 may include a vibratory arrangement. For example, the vibratory arrangement may include a vibratory bowl 1110 and a supply track 1112. In some embodiments the vibratory bowl 1110 and/or the supply track 1112 may be manufactured by Performance Feeders, Inc. of Oldsmar, Fla.

The flow directors 210 may be loaded directly into the vibratory bowl 1110, or a vibratory hopper 1114 may supply the flow directors 210 to the vibratory bowl in the manner described above. In this regard, a component level sensor 1116 may activate vibration of the vibratory hopper 1114 based on the level of the flow directors 210 within the vibratory bowl 1110. The vibratory bowl 1110 may define a pathway 1118 configured to arrange the flow directors 210 in a serially-aligned stream 1120 (see, FIG. 49). In this regard, the vibratory motion of the vibratory bowl 1110 may direct the flow directors 210 upwardly along the pathway 1118, which may narrow such that some flow directors fall therefrom and the flow directors that remain on the pathway become serially-aligned.

The vibratory bowl 1110 may be configured to arrange the flow directors 210 generally vertically by the time the flow directors reach the supply track 1112. An actuator or gap (not shown) may be configured to individually remove or realign the flow directors 210 in the serially-aligned stream 1120 when the flow directors are misaligned in a direction, as discussed above. The supply track 1112 may include a full sensor 1132 configured to detect whether the supply track is full of the flow directors 210 and to thereby turn off the vibration of the vibratory bowl 1110, and a low level sensor 1134 configured to detect when the supply track is running low on the flow directors 210, to active an indicator 1130 (see, FIG. 47) to inform an operator that the flow director coupling substation 510 is running low on the flow directors. In some embodiments the full sensor 1132 and the low level sensor 1134 may comprise optical sensors that include an emitter and a receiver configured to detect whether a flow director 210 is positioned therebetween.

Further, as illustrated in FIG. 49, the supply unit 1102 may include a singulator 1136 configured to singulate the flow directors 210 from the serially-aligned stream 1120. In this regard, the singulator 1136 may include a stop 1138 (e.g., comprising a pin) that stops the serially-aligned stream 1120 of flow directors 210 from further advancement. As illustrated, in one embodiment a vertical actuator 1140 may be configured to move the stop 1138 vertically between a retracted position and an extended position. The vertical actuator 1140 may default to the extended position such that the stop 1138 blocks the serially-aligned stream 1120 of flow directors 210 from moving. In this regard, the stop 1138 may extend into a longitudinal hole 210' (see, FIG. 1) defined through the flow directors 210. However, the vertical actuator 1140 may momentarily retract the stop 1138 to the retracted position to allow one of the flow directors 210 to pass the stop. The vertical actuator 1140 may return the stop 1138 to the extended position inside of the subsequent flow director 210 after the outermost flow director passes thereunder.

After the outermost flow director 210 is released from the stop 1138, the flow director may contact a second stop 1144. At this time a second vertical actuator 1146 may extend a guide pin 1148 into the longitudinal hole 210' extending through the flow director 210. Thus, when a horizontal actuator 1150 retracts the second stop 1144, the flow director 210 may fall down the guide pin 1148. In this regard, the guide pin 1148 may guide the flow director 210 to the feeder unit 1104, such that the flow director is singulated from the serially-aligned stream 1120, and received by the feeder unit 1104.

As illustrated in FIG. 50, the feeder unit 1104 may comprise a rotary member 1152 having a first engagement head 1154a including a first pocket 1156a and a second engagement head 1154b including a second pocket 1156b each configured to receive one of the flow directors 210 from the supply unit 1102. The rotary member 1152 may comprise a first arm 1158a to which the first engagement head 1154a is mounted and a second arm 1158b to which the second engagement head 1154b is mounted.

FIGS. 49 and 50 illustrate the rotary member 1152 in a first receiving position at which the first engagement head 1154a is positioned proximate the singulator 1136. The rotary member 1152 may be configured to swivel to a second receiving position at which the second engagement head 1154b is positioned proximate the singulator 1136. A singulation sensor 1160 (e.g., an optical sensor) may detect that the flow director 210 has been singulated and delivered to one of the engagement heads 1154a, 1154b. Accordingly, the rotary member 1152 may swivel between the first receiving position (corresponding to a second delivery position) and a second receiving position (corresponding to a first delivery position) in the manner described above with respect to the other rotary members described herein.

Thus, the singulated flow directors 210 may be delivered to the first assembly unit 1106a and the second assembly unit 1106b. FIG. 51 illustrates the second assembly unit 1106b. As illustrated, the second assembly unit 1106b may include a second robotic arm 1162b and a second end effector 1164b. Similarly, the first assembly unit 1106a may include a first robotic arm 1162a (see, FIG. 47) and a first end effector 1164a (see, FIG. 52). Accordingly, the first end effector 1154b may be configured to engage a first flow director 210a (see, FIG. 49) held in the first pocket 1156a of the feeder unit 1104 and deliver the first flow director to the first base 204a on a carriage 604 on the track 602 via movement of the first robotic arm 1162a. As illustrated in FIG. 52, in some embodiments the first end effector 1154a may comprise first and second opposing portions 1166, 1168 configured to clamp the first flow director 210a therebetween.

Accordingly, the track 602 may move the carriage 604 such that the first base 204a is positioned for receipt of the first flow director 210a and similarly, the second base 204b is positioned for receipt of the second flow director 210b. In this regard, as illustrated in FIG. 53, the track 602 may direct each carriage 604 through a first processing portion 1170a and a second processing portion 1170b at the flow director coupling substation 512. The first processing portion 1170a may include a carriage sensor (not shown; see, e.g., carriage sensor 1172b), an initial locator sensor 1174a, an initial stop

1176a, a lift stop 1178a, a stop locator sensor 1180a, and a lifter mechanism 1182a, which may function in the manner described above with respect to the same components at the other substations.

Further, the first processing portion 1170a may include a terminal spreader 1184. As illustrated, the terminal spreader 1184 may include first and second spreading pins 1186a, 1186b. In this regard, while the carriage 604 is stopped by the initial stop 1176a, a vertical actuator 1188 of the terminal spreader 1184 may lower the first spreading pin 1186a between the first negative and positive heating terminals 234a, 235a and lower the second spreading pin 1186b between the second negative and positive heating terminals 234b, 235b. Thereby, the negative and positive heating terminals 234, 235 may be spread apart from one another, such that insertion of the flow director 210 therebetween and into engagement with the electronic control component 208 by the first robotic arm 1162a is facilitated.

In this regard, the first and second opposing portions 1166, 1168 of the first end effector 1164a (see, FIG. 52) may be configured to position the first flow director 210a between the first negative and positive heating terminals 234a, 235a. Further, each engagement head 1164 may include opposing first and second terminal pinchers 1190, 1192, which may be configured to move inwardly and outwardly in directions that are perpendicular to the directions in which the first and second opposing portions 1166, 1168 move inwardly and outwardly. After the first flow director 210a is positioned between the spread first negative and positive heating terminals 234a, 235a by the first and second opposing portions 1166, 1168, the terminal pinchers 1190, 1192 may pinch the negative and positive heating terminals against the side of the first flow director 208a, such that the flow director is securely positioned therebetween.

While the carriage 604 is lifted by the lifter mechanism 1182a, a component presence sensor 1194a (e.g., comprising a light emitter and a receiver) may detect the presence of the flow director 210a. Further, a storage transceiver 1196a may write code to the storage module 624 indicating whether or not the first flow director 210a was properly coupled to the first base 204a based on the signal from the component presence sensor 1194a, such that improperly assembled cartridges may not be subjected to further assembly operations downstream. In this same regard, the storage transceiver 1196a may read the code on the storage module 624 to determine that the partially-assembled cartridge is fit for further assembly prior to coupling the flow director 210a to the base 204a.

Thereafter, the lifter mechanism 1182a may lower the carriage 604 back onto the track 602. The carriage 604 may be directed downstream to the second processing portion 1170b, at which the second assembly unit 1106b may perform substantially the same operations discussed above with respect to the first assembly unit 1106a on the second base 204b, with the exception of terminal spreading which is conducted upstream at the terminal spreader 1184. In this regard, as illustrated in FIG. 53, the second processing portion 1170b may include a carriage sensor 1172b, an initial locator sensor 1174b an initial stop 1176b, a lift stop 1178b, a stop locator sensor 1180b, a lifter mechanism 1182b, a component presence sensor 1194b configured to detect whether the flow director 210b is properly attached, and a storage transceiver 1196b.

Note that the above-described operations may be conducted simultaneously. In this regard, while the first engagement head 1154a delivers the first flow director 210a to the first robotic arm 1162a, the second engagement head 1154b may receive the second flow director 210b from the singulator 1136. Conversely, while the second engagement head 1154b delivers the second flow director 210b to the second robotic arm 1162b, the first engagement head 1154a may receive the first flow director 210a from the singulator 1136. Further, while the first robotic arm 1162a couples the first flow director 210a to the first base 204a, the second robotic arm 1162b may receive the second flow director 210b from the second engagement head 1154b. Conversely, while the second robotic arm 1162b couples the second flow director 210b to the second base 204b, the first robotic arm 1162a may receive the first flow director 210a from the first engagement head 1154a. Accordingly, rapid and efficient engagement of the flow directors 210a, 210b with the bases 204a, 204b may be achieved.

The heating element coupling substation 514 may be positioned downstream of the flow director coupling substation 512. FIG. 54 illustrates a perspective view of the heating element coupling substation 514. The heating element coupling substation 514 may include a supply unit 1202. As illustrated, the supply unit 1202 may include a spool 1204 configured to supply a substantially continuous heating element input 1206. In this regard, the substantially continuous heating element input 1206 may comprise a plurality of the heating elements 240 wound about an elongated liquid transport element 238, which may thereby be cut as described below to define a plurality of liquid transport elements 238 with a heating element 240 coupled thereto. Examples of heating elements wound about liquid transport elements are provided in U.S. Pat. App. Pub. Nos. 2014/0270730 to DePiano et al. and 2014/0157583 to Ward et al., which are incorporated herein by reference in their entireties.

The heating element coupling substation 514 may further include a casing 1208. The casing 1208 may be substantially enclosed and opaque so as to prevent laser beams/and or other potentially harmful light from exiting therefrom. In this regard, as discussed below, welding, and in particular laser welding, in addition to the various other operations discussed below, may be performed inside the casing 1208.

FIG. 55 illustrates a view of a portion of the supply unit 1202 inside of the casing 1208. As illustrated in FIG. 55, the supply unit 1202 may further comprise a moveable clamp 1210 configured to pull the substantially continuous heating element input 1206 from the spool 1204 into the casing 1206. The supply unit 1202 may additionally include a guide 1212 and a singulator 1214, which may comprise a cutter. In this regard, the substantially continuous heating element input 1206 may be directed through the guide 1212 (e.g., through an aperture defined therethrough) and through the singulator 1214 to a feeder unit 1216.

As illustrated in FIG. 56, the feeder unit 1216 may include a first engagement head 1218a and a first gripper 1220a coupled to a first arm 1222a of a rotary member 1224. The rotary member 1224 is illustrated in a first receiving position in FIG. 56, at which the first arm 1222a is positioned proximate the supply unit 1202. As illustrated in FIG. 57, the rotary member 1224 may further comprise a second arm 1222b including a second engagement head 1218b and a second gripper 1220b coupled thereto. The rotary member 1224 is illustrated in a second delivery position in FIG. 57, which corresponds to the first receiving position illustrated in FIG. 56.

The supply unit 1202 may be configured to pull the substantially continuous heating element input 1206 until a desired length thereof is received by the feeder unit 1216. In this regard, at least one imaging device may be configured to determine a length of the substantially continuous heating element input 1206 pulled from the spool 1202. As illustrated in FIG. 56, in one embodiment the supply unit 1202 may include a first imaging device 1226a and the feeder unit may include a second imaging device 1226b. The first imaging device 1226a may determine a position of a heater area defined by the heating element 240 (e.g., a portion of the heating element at which a plurality of tightly-wound coils are positioned), and the moveable clamp 1210 may align a center of the heater area with the second imaging device 1226b. At this position, the substantially continuous heating element input 1206 may extend through the first engagement head 1218a to the first gripper 1220a, which may clamp onto the end of the substantially continuous heating element input. The singulator 1214 may then cut the substantially continuous heating element input 1206 to singulate a first heating element 240 and first liquid transport element 238 useable in a single cartridge therefrom.

Accordingly, the rotary member 1224 may swivel from the first receiving position at which a singulated heating element 240 and liquid transport element 238 is received to a first delivery position, which corresponds to a second receiving position at which the second arm 1222b of the rotary member 1224 is positioned proximate the supply unit 1202. As illustrated in FIG. 55, a stationary clamp 1228 may engage the substantially continuous heating element input 1206, such that the moveable clamp 1210 may release therefrom and move to an initial position at which the moveable clamp may reengage the substantially continuous heating element input. Thereby, the moveable clamp 1210 may pull the substantially continuous heating element input 1206 from the spool 1204 and direct the substantially continuous heating element input through the second engagement head 1218b such that the second gripper 1220b may engage an end thereof. Thereby, a second heating element 240 and second liquid transport element 238 may be singulated from the substantially continuous heating element input 1206 by the singulator 1214 in the manner described above.

As illustrated in FIG. 57, the heating element coupling substation 514 may further comprise a first assembly unit 1230a and a second assembly unit 1230b. The first assembly unit 1230a may be configured to assemble the first heating element 240 and the first liquid transport element 238 to the negative and positive heating terminals 234a, 235a coupled to the first base 204a. Similarly, the second assembly unit 1230b may be configured to assemble the second heating element 240 and the second liquid transport element 238 to the negative and positive heating terminals 234b, 235b coupled to the second base 204b. In this regard, the first assembly unit 230a may include a first robotic arm 1232a and the second assembly unit 230b may include a second robotic arm 1232b. The first robotic arm 1232a may include a first end effector 1234a and the second robotic arm 1234a may include a second end effector 1234b (see, FIG. 58).

As illustrated, in FIG. 58, each end effector 1234a, 1234b may include first and second opposing portions 1236, 1238. Each opposing portion 1236, 1238 may include a first prong 1240 and a second prong 1242. The first and second opposing portions 1236, 1238 of the end effectors 1234a, 1234b may be configured to receive a singulated heating element 240 and liquid transport element 238 therebetween.

In this regard, FIG. 59 illustrates an enlarged view of the first engagement head 1218a, which may be substantially similar to the second engagement head 1218b. As illustrated, the first engagement head 1218a may include a plurality of depressible buttons 1244. The buttons 1244 may be configured to recess into the first engagement head 1218a when engaged by the prongs 1240, 1242 of each of the opposing portions 1236, 1238 of the end effector 1234a. Note that although gaps could be provided in the engagement heads 1218a, 1218b instead of the depressible buttons 1244, the end of the substantially continuous heating element input 1206 may undesirably enter such gaps and bind when directed into the engagement heads, rather than travel to the respective gripper 1220a, 1220b as intended during singulation thereof.

Accordingly, the opposing portions 1236, 1238 of the first engagement head 1218a may depress the depressible buttons 1244 while extending around the singulated heating element 240 and liquid transport element 238 received in the first engagement head. The first engagement head 1218a may then clamp onto the singulated heating element 240 and liquid transport element 238. Thus, the first robotic arm 1234a may lift the singulated heating element 240 and liquid transport element 238 received in the first engagement head 1218a and transport the singulated heating element and liquid transport element for assembly with the positive heating terminal 235 and the negative heating terminal 234a coupled to a first base 204a.

In this regard, as illustrated in FIG. 60, the first assembly unit 1230a may further comprise a first processing portion 1244a, and the second assembly unit 1230b may further comprise a second processing portion 1244b positioned along the track 602. Accordingly, the carriage 604 may be directed along the track 602 to the first processing portion 1244a. As illustrated, the first processing portion 1244a may include a carriage sensor 1246a, an initial locator sensor 1248a, an initial stop 1250a, a lift stop 1252a (see, FIG. 61), a stop locator sensor (not shown; see, e.g., stop locator sensor 1254b, and a lifter mechanism 1256a (see, FIG. 61), which may function in the manner described above with respect to the same components at the other substations.

Further, the first processing portion 1244a may include a terminal fixation mechanism 1258a and a laser 1260a. FIG. 61 illustrates an enlarged view of the terminal fixation mechanism 1258a. As illustrated, the terminal fixation mechanism 1258a may include a clamp 1262a. The clamp 1262a may include opposing terminal effectors 1264a and opposing base effectors 1266a coupled thereto. Accordingly, when the carriage 604 is lifted by the lifter mechanism 1256a, the clamp 1262a may act on the first base 204a and the negative and positive heating terminals 234a, 235a coupled thereto. In this regard, the base effectors 1266a may clamp on opposing sides of the first base 204a such that the first base is centered therebetween. Further, the terminal effectors 1264a may clamp against opposing sides of the negative heating terminal 234a and the positive heating terminal 235a.

In this regard, FIG. 62 illustrates an enlarged partial view of the terminal effectors 1264a. As illustrated, the terminal effectors 1264a may include a protruding member 1268 and a recessed member 1270. The protruding member 1268 and the recessed member 1270 may be configured to clamp the negative and positive heating terminals 234a, 235a therebetween. In particular, the protruding member 1268 may define a first shoulder 1272a configured to engage the negative heating terminal 234a and a second should 1272b configured to engage the positive heating terminal 235a. Similarly, the recessed member 1270 may define a first shoulder 1274a configured to engage the negative heating terminal 234a and a second shoulder 1274b configured to engage the positive heating terminal 235a. Accordingly, the negative heating terminal 234a may be clamped between the first shoulder 1272*a* of the protruding member 1268 and the first shoulder 1274*a* of the recessed member 1270. Similarly, the positive heating terminal 235*a* may be clamped between the second shoulder 1272*b* of the protruding member 1268 and the second shoulder 1274*b* of the recessed member 1270.

During this clamping operation, a center portion 1272*c* of the protruding member 1268 may extend between the negative and positive heating terminals 234*a*, 235*a*. Further, outer prongs 1274*c* defined by the recessed member 1270 may extend around the outside of the negative and positive heating terminals 234*a*, 235*a*. Accordingly, the center portion 1272*c* of the protruding member 1268 and the outer prongs 1274*c* of the recessed member 1270 may position the negative and positive heating terminals 234*a*, 235*a* at a fixed spacing corresponding to a desired spacing of the negative and positive heating terminals for attachment of the heating element 240 thereto.

In this regard, the robotic arm 1232*a* may position the end effector 1234*a* such that the heating element 240 and the liquid transport element 238 are in proximity to the negative and positive heating terminals 234*a*, 235*a*. In particular, a center of a heating portion of the heating element 240 may be aligned with a center of the negative and positive heating terminals 234*a*, 235*a* via movement of the robotic arm 1232*a*. In this regard, as illustrated in FIG. 60, the first processing portion 1244*a* may further comprise an imaging device 1270*a* configured to capture images of the negative and positive heating terminals 234*a*, 235*a*, and the heating element 240, such that the robotic arm 1232*a* may align the center of the heating element 240 with the center of the negative and positive heating terminals 234*a*, 235*a* based on the images thereof. Additional details with respect to the alignment of the negative and positive heating terminals with the heating element are described in U.S. patent application Ser. No. 14/227,159, filed Mar. 27, 2014, to Ampolini et al., which is incorporated herein by reference in its entirety.

Once aligned, the laser 1260*a* may weld the heating element 240 to one of the negative heating element 234*a* and the positive heating element 235*a*. Then the laser 1260*a* may weld the heating element 240 to the other of the negative heating element 234*a* and the positive heating element 235*a*. For example, the laser 1260*a* may weld the heating element 240 to the negative heating element 234*a* and then move to a second position to weld the positive heating element 235*a*. In this regard, the laser 1260*a* and the imaging device 1270*a* may be mounted to a slide 1272*a* configured to move the laser and the camera between first and second welding positions. Accordingly, the heating element 240 may be welded to the negative and positive heating terminals 234*a*, 235*a*, which may thereby indirectly couple the liquid transport element 238 to the negative and positive heating terminals as a result of the heating element being coiled around, or otherwise attached to the liquid transport element.

As illustrated in FIG. 57, a vent 1275 may be provided inside the casing 1208. The vent 1275 may be employed to remove smoke and gases associated with laser welding from the casing 1208. Additional details with respect to the welding operation are provided in U.S. patent application Ser. No. 14/227,159, filed Mar. 27, 2014, to Ampolini et al., which is incorporated herein by reference in its entirety, as noted above. Further, although use of laser welding is described herein, it should be understood that the heating element may be attached to the negative and positive heating terminals in a variety of manners. For example, arc welding, metal inert gas welding (MIG), tungsten inert gas welding (TIG), plasma welding, etc. may be employed in other embodiments. More broadly, the heating element may be attached to the heating terminals via other methods outside of welding, such as via soldering and via mechanical connectors. Accordingly, it should be understood that various other embodiments of coupling methods and related equipment outside of laser welding may be employed without departing from the scope of the present disclosure.

A component presence sensor 1278*a* (e.g., comprising a light emitter and receiver) may detect whether or not the heating element 240 was properly coupled to the negative and positive heating terminals 234*a*, 235*a*. For example, the component presence sensor 1278*a* may detect whether or not the heating element 240 and/or the liquid transport element are present while the carriage 604 is lifted by the lifter mechanism 1256*a* (see, FIG. 61). Thereby, this information may be written to the storage module 624 by a storage transceiver 1276*a*, such that in the event the heating element 240 is not detected, further operations may not be performed on the partially-assembled cartridge. In this same regard, the storage transceiver 1276*a* may read the code on the storage module 624 to determine that the partially-assembled cartridge is fit for further assembly prior to coupling the heating element 240 to the negative and positive heating terminals 234, 235.

After welding at the first processing portion 1244*a*, the lifter mechanism 1256*a* (see, FIG. 61) may lower the carriage 604 back into engagement with the track 602. The carriage 604 may be directed to the second processing portion 1244*b*, which may include substantially the same equipment as the first processing portion. In this regard, as illustrated in FIG. 60, the second processing portion 1244*b* may include a carriage sensor 1246*b*, an initial locator sensor 1248*b*, an initial stop 1250*b*, a lift stop 1252*b*, a stop locator sensor 1254*b*, and a lifter mechanism 1256*b*, a terminal fixation mechanism 1258*b*, a laser 1260*b*, a storage transceiver (not shown; see storage transceiver 1276*a*), and a component presence sensor 1278*b*. Accordingly, the second processing portion 1244*b* may couple a second heating element 240 and a second liquid transport element 238 to the second negative and positive heating terminals 234*b*, 235*b*.

Note that the above-described operations may be conducted simultaneously. In this regard, while the first engagement head 1218*a* delivers the first heating element 240 and the first liquid transport element 238 to the first robotic arm 1232*a*, the second engagement head 1218*b* may receive the second heating element and the second liquid transport element from the supply unit 1202. Conversely, while the second engagement head 1218*b* delivers the second heating element 240 and the second liquid transport element 238 to the second robotic arm 1232*b*, the first engagement head 1220*a* may receive the first heating element and the first liquid transport element from the supply unit 1202. Further, while the first robotic arm 1232*a* couples the first heating element 240 and the first liquid transport element 238 to the negative and positive heating terminals 234*a*, 234*b*, the second robotic arm 1232*b* may receive the second heating element and the second liquid transport element from the second engagement head 1218*b*. Conversely, while the second robotic arm 1232*b* couples the second heating element 240 and liquid transport element 238 to the negative and positive heating terminals 234*b*, 235*b*, the first robotic arm 1232*a* may receive the first heating element and the first liquid transport element from the first engagement head 1220*a*. Accordingly, rapid and efficient engagement of the heating elements and liquid transport elements with the negative and positive heating terminals may be achieved.

The reservoir and outer body coupling substation 516 may be positioned downstream of the heating element coupling substation 514. FIG. 63 illustrates a perspective view of the reservoir and outer body coupling substation 516. As illustrated, the reservoir and outer body coupling substation 516 may include a supply unit 1302. The supply unit 1302 may include a reservoir supply unit 1304 and an outer body supply unit 1306.

As illustrated, the reservoir supply unit 1304 may include a first spool 1308*a* and a second spool 1308*b* each configured to respectively supply a substantially continuous reservoir substrate input 1310. Each spool 1308*a*, 1308*b* may supply the substantially continuous reservoir substrate input 1310 to a respective moveable clamp 1312, one of which is illustrated in FIG. 64. Each moveable clamp 1312 may be configured to pull the substantially continuous reservoir substrate input 1310 from a respective spool 1308*a*, 1308*b*. Thereby, the substantially continuous reservoir substrate input 1310 may be directed to a singulator 1314. As illustrated in FIG. 65, the singulator 1314 may include a reservoir gripper 1316 which may include four prongs 1318. When the end of the substantially continuous reservoir substrate input 1310 is directed down into the reservoir gripper 1316, the prongs 1318 may clamp against opposing sides thereof.

At this time a stationary clamp 1320, as illustrated in FIG. 64, may clamp against the substantially continuous reservoir substrate input 1310 and the moveable clamp 1312 may return to a starting position (e.g., by moving upwardly), at which the moveable clamp grips the substantially continuous reservoir substrate input again. A cutter 1322 of the singulator 1314 may then cut the substantially continuous reservoir substrate input 1310 such that the reservoir gripper 1316 holds a singulated reservoir substrate 214 (see, e.g., FIG. 1).

A vacuum gripper 1324 (see, FIG. 65) may then extend into contact with the reservoir substrate 214 held by the reservoir gripper 1316. In this regard, the vacuum gripper 1324 may apply negative pressure to the reservoir substrate 214 such that the reservoir substrate wraps around a curved outer nose 1326 defined by the vacuum gripper. The reservoir gripper 1316 may then release the reservoir substrate 214 and retract downwardly. Thereby, the reservoir substrate 214 is positioned for receipt by a feeder unit 1328, as discussed below.

While the singulated reservoir substrates 214 are supplied by the reservoir supply unit 1304 in the manner described above, the outer body supply unit 1306 may supply the outer bodies 216 (see, e.g., FIG. 1). In this regard, as illustrated in FIG. 66, the outer body supply unit 1306 may include a vibratory arrangement. For example, the vibratory arrangement may include a vibratory bowl 1330 and a supply track 1332. In some embodiments the vibratory bowl 1330 and/or the supply track 1332 may be manufactured by Performance Feeders, Inc. of Oldsmar, Fla. The outer bodies 216 may be loaded directly into the vibratory bowl 1330, or a vibratory hopper 1334 may supply the outer bodies 216 to the vibratory bowl in the manner described above with respect to other vibratory bowls and vibratory hoppers described herein. In this regard, a component level sensor 1336 may activate vibration of the vibratory hopper 1334 based on the level of the outer bodies 216 within the vibratory bowl 1330.

The vibratory bowl 1330 may define a pathway 1338 configured to arrange the outer bodies 216 in a serially-aligned stream 1340. In this regard, the vibratory motion of the vibratory bowl 1330 may direct the outer bodies 216 upwardly along the pathway 1338, which may narrow such that some outer bodies fall therefrom and the outer bodies that remain on the pathway become serially-aligned. The vibratory bowl 1330 may be configured to arrange the outer bodies 216 generally vertically by the time the outer bodies reach the supply track 1332. An actuator or gap (not shown) may be configured to individually remove or realign the outer bodies in the serially-aligned stream 1340 when the outer bodies are misaligned in a direction, as discussed above with respect to other components. The supply track 1332 may include a full sensor 1342 configured to detect whether the supply track is full of the outer bodies 216 and to thereby turn off the vibration of the vibratory bowl 1330, and a low level sensor (not shown; see, e.g., the full sensor 1342) configured to detect when the supply track 1332 is running low on the outer bodies 216, to active an indicator 1346 (see, FIG. 63) to inform an operator that the reservoir and outer body coupling substation 516 is running low on the outer bodies 216. In some embodiments the full sensor 1342 and the low level sensor may comprise optical sensors that include an emitter and a receiver configured to detect each outer body 216 passing thereby. Note that the indicator 1346 may alternatively or additionally be activated when one or both of the spools 1308*a*, 1308*b* runs low on the substantially continuous reservoir substrate input 1310.

Further, as illustrated in FIG. 67, the outer body supply unit 1306 may include a singulator 1348 configured to singulate the outer bodies 216 from the serially-aligned stream 1340. In this regard, the singulator 1348 may include a stop 1350. As illustrated, in one embodiment the stop 1350 may comprise an end wall 1352 configured to stop the serially-aligned stream 1340 of outer bodies 216 from further advancement. As illustrated, a horizontal slot 1354 may be defined through the end wall 1352. A singulation sensor 1356 may detect that an outermost one of the outer bodies 216 is positioned for singulation. In this regard, the stop 1350 may include an upper cutout 1358 that may allow for access to the outer body 216 at the end of the serially-aligned stream 1340.

Accordingly, the feeder unit 1328 may receive one of the outer bodies 216. In this regard, as illustrated in FIG. 68, the feeder unit 1328 may include an initial outer body feeder 1360. The initial outer body feeder 1360 may include a first engagement head 1362*a* and a second engagement head 1362*b* coupled to opposing ends of a beam 1364. As illustrated in FIGS. 67 and 68, each of the engagement heads 1362*a*, 1362*b* may include first and second opposing portions 1366, 1368 configured to clamp an outer body 216 therebetween.

The beam 1364 may be configured to raise, lower, and shift laterally between a first receiving position, which corresponds to a second delivery position, and a second receiving position, which corresponds to a first delivery position. In this regard, the beam 1364 may lower such that the opposing portions 1366, 1368 of the first engagement head 1362*a* extend into the upper cutout 1358 in the stop 1350 and clamp onto an outermost outer body 216 in the serially-aligned stream 1340. While the first engagement head 1362*a* engages a first outer body 216, a second outer body may be delivered to a second outer body and reservoir substrate feeder 1370*b*, which is illustrated in FIG. 71. After the first engagement head 1362*a* engages the first outer body 216, the beam may lift upwardly, shift position laterally, and lower to deliver the first outer body to a first outer body and reservoir substrate feeder 1370*a*, which is also illustrated in FIG. 69. At this time, the second engagement head 1362*b* is positioned proximate the singulator 1348 and engages a second outer body 216.

Accordingly, the initial outer body feeder 1360 may alternatingly feed outer bodies 216 to the first outer body and reservoir substrate feeder 1370a and the second outer body and reservoir substrate feeder 1370b. While the first outer body and reservoir substrate feeder 1370a receives a first outer body 216 from the initial outer body feeder 1360, the first outer body and reservoir substrate feeder also receives a reservoir substrate 214 singulated from the substantially continuous reservoir input 1310 supplied by the first spool 1308a in the manner described above. Conversely, while the second outer body and reservoir substrate feeder 1370b receives a second outer body 216 from the initial outer body feeder 1360, the second outer body and reservoir substrate feeder also receives a reservoir substrate 214 singulated from the substantially continuous reservoir input 1310 supplied by the second spool 1308b in the manner described above.

In this regard, as illustrated in FIG. 71, the first and second outer body and reservoir substrate feeders 1370a, 1370b may each include a rotary member 1372, first and second substrate grippers 1374', 1374" positioned at opposing ends of the rotary member, and first and second outer body supporters 1376', 1376" positioned at opposing ends of the rotary member. As illustrated, the outer body supporters 1376', 1376" may comprise upwardly extending pins. Thus, the engagement heads 1362a, 1362b of the initial body feeder 1360 (see, e.g., FIG. 68) may position and release the outer bodies 216 such that the outer body extenders 1376', 1376" extend at least partially through the outer bodies such that the outer bodies may be held in place.

Further, as illustrated in FIG. 70, the substrate grippers 1374', 1374" may each include first and second opposing portions 1378', 1378" configured to receive the reservoir substrate 214 therebetween. In this regard, a distal end of each opposing portion 1378', 1378" may define a lip configured to engage a respective longitudinal end of the reservoir substrate 214. Accordingly, the reservoir substrate 214 may retain a substantially U-shaped configuration when removed from a curved outer nose 1326 of the vacuum gripper 1324 (see, e.g., FIG. 65). Note that in order to facilitate transfer of the reservoir substrate 214 from the vacuum gripper 1324 to one of the substrate grippers 1374', 1374", in some embodiments the vacuum gripper may momentarily apply a positive pressure to the reservoir substrate when one of the substrate grippers is positioned to receive the reservoir substrate therefrom. Further, in some embodiments the substrate grippers 1374', 1374" may apply a negative pressure to the reservoir substrate 214 in order to further improve grasping thereof.

Once the first outer body and reservoir substrate feeder 1370a or the second outer body and reservoir substrate feeder 1370b receives the outer body 216 and the reservoir substrate 214, the rotary member 1372 may rotate such that the reservoir substrate and the outer body are positioned for receipt by a respective one of a first assembly unit 1380a and a second assembly unit 1380b, as illustrated in FIG. 69. In this regard, the first outer body and reservoir substrate feeder 1370a supplies the outer bodies 216 and reservoir substrates 214 to the first assembly unit 1380a and the second outer body and reservoir substrate feeder 1370b (see, FIG. 71) supplies the outer bodies and the reservoir substrates to the second assembly unit 1380b.

In the illustrated embodiment the second assembly unit 1380b is positioned upstream of the first assembly unit 1380a. Accordingly, a reservoir substrate 214 and an outer body 216 may be assembled to the second partially-assembled cartridge including the second base 204b in advance of assembling a reservoir substrate and an outer body to the first partially-assembled cartridge including the first base 204a. However, as may be understood, this order may be reversed in other embodiments.

Accordingly, the carriage 604 may be directed along the track 602 for receipt of the reservoir substrate 214 and the outer body 216. In this regard, as illustrated in FIG. 71, the track 602 may direct each carriage 604 through a first processing portion 1382a of the first assembly unit 1380a and a second processing portion 1382b of the second assembly unit 1380b at the reservoir and outer body coupling substation 516. The first processing portion 1382a may include a carriage sensor 1384a, an initial locator sensor 1386a, an initial stop 1388a, a lift stop 1390a (see, FIG. 70), a stop locator sensor 1392a, and a lifter mechanism 1394a, which may function in the manner described above with respect to the same components at the other substations. Similarly, the second processing portion 1382b may include a carriage sensor (not shown; see, e.g., carriage sensor 1384a), an initial locator sensor 1386b, an initial stop 1388b, a lift stop 1390b (not shown; see, e.g. lift stop 1390a in FIG. 70), a stop locator sensor 1392b, and a lifter mechanism 1394b. Accordingly, the carriage 604 may be directed along the track 602 to the second processing portion 1382b at which the second assembly unit 1380b assembles the reservoir substrate 214 and the outer body 216 to the second base 204b followed by the first processing portion 1382a at which the first assembly unit 1380a assembles the reservoir substrate and the outer body to the first base 204a.

In this regard, as illustrated in FIG. 69, the first assembly unit 1380a may include a robotic arm 1396. The second assembly unit 1380b may also include a robotic arm 1396, which may be substantially similar to the robotic arm of the first assembly unit 1380a. The robotic arm 1396 may be configured to insert a partially-assembled cartridge into the outer body 216 (e.g., by directing the outer body over the partially-assembly cartridge in the manner discussed below). In this regard, the carriage 604 may transport one or more (e.g., two as described above) partially-assembled cartridges along the track 602 to the reservoir and outer body coupling substation 516, and as described above, such partially-assembled cartridges may include a base 204, a negative heating terminal 234, a positive heating terminal 235, a heating element 240, a liquid transport element 238, a control component terminal 206, and an electronic control component 208. As further described above, the negative heating terminal 234 and the positive heating terminal 235 may be directly coupled to the base 204, and the heating element 240 may be directly coupled to the negative heating terminal and the positive heating terminal. The heating element 240 may be coiled about the liquid transport element 238 such that the liquid transport element is indirectly coupled to the negative heating terminal 234, the positive heating terminal 235, and the base 204. Further, the control component terminal 206 may be directly coupled to the base 204 and may engage the electronic control component 208.

As illustrated in FIG. 70, each robotic arm 1396 may include a bending mechanism 1398. The bending mechanism 1398 may be configured to receive the partially-assembled cartridge therein so as to bend the liquid transport element 238 against the negative heating terminal 234 and the positive heating terminal 235. In this regard, as illustrated in FIG. 72, the bending mechanism 1398 may comprise a hollow tube that extends over the partially-assembled cartridge so as to press the ends of the liquid transport element 238, and the heating element 240 in the illustrated embodiment, down into contact with the negative heating terminal 234 and the positive heating terminal 235.

While the liquid transport element 238 and the heating element 240 are bent against the negative heating terminal 234 and the positive heating terminal 235, the substrate gripper 1374' may wrap the reservoir substrate 214 at least partially around the bending mechanism 1398. In this regard, as illustrated in FIG. 70, the opposing portions 1378', 1378" may clamp towards one another and around the bending mechanism 1398. The bending mechanism 1398 may then retract relative to the partially-assembled cartridge (e.g., by moving upward in terms of the illustrated orientation) following wrapping of the reservoir substrate 214 such that the reservoir substrate is wrapped at least partially about the negative heating terminal 234 and the positive heating terminal 235 and in contact with the liquid transport element 238.

As illustrated in FIG. 70, each robotic arm 1396 may further comprise an outer body gripper 1400. The outer body gripper 1400 may include first and second opposing portions 1402', 1402". The opposing portions 1402', 1402" of the outer body gripper may be configured to move between a separated configuration, which is illustrated and in which the opposing portions are separated from one another, and a contracted configuration, in which the opposing portions contact one another.

While the robotic arm 1396 lowers the bending mechanism 1398 over the partially-assembled cartridge, the outer body gripper 1400 may also be lowered such that the first and second opposing portions 1402', 1402" extend around an outer body 216 supported by the one of the outer body supporters 1376', 1376" positioned proximate the track 602. Accordingly, the outer body gripper 1440 may be configured to receive the outer body 216 therein while the bending mechanism 1398 receives the partially-assembled cartridge therein. Once lowered, the first and second opposing portions 1402', 1402" may move toward one another such that the outer body gripper 1400 retains the outer body 216 therein. Thus, when the robotic arm 1396 lifts the bending mechanism 1398 after the reservoir substrate 214 is wrapped thereabout, the outer body gripper 1400 may lift the outer body 216 from the one of the outer body supporters 1376', 1376" to which the outer body was engaged.

Further, the robotic arm 1396 may direct the outer body gripper 1400 with the outer body 216 positioned therein over the partially-assembled cartridge. In this regard, the robotic arm 1396 may rotate (e.g., about 90 degrees) such that the bending mechanism 1398 is positioned away from the carriage 604, and thereby does not come into contact with the carriage, while the outer body gripper 1400 extends downwardly toward the partially-assembled cartridge. As the outer body 216 is directed over the partially-assembled cartridge, at least a portion of the negative heating terminal 234, the positive heating terminal 235, the heating element 240, and the liquid transport element 238, and the electronic control component 208 and the control component terminal 206 in embodiments including these components) are received in the outer body.

In order to facilitate insertion of the partially-assembled cartridge into the outer body 216, the outer body gripper 1400 may apply a negative pressure longitudinally through the outer body via the outer body gripper 1400. In this regard, as illustrated in FIG. 70, the outer body gripper 1400 may further comprise a piston 1404. The piston 1404 may be configured to engage an end of the outer body 216 when the first and second opposing portions 1402', 1402" of the outer body gripper 1400 are in the contracted configuration with the outer body therein and apply the negative pressure through the outer body. In this regard, for example, the piston 1404 may be hollow and coupled to a suction system 1405 configured to supply the negative pressure. Application of the negative pressure to the partially-assembled cartridge through the outer body 216 may assist in inserting the partially-assembled cartridge into the outer body by pulling the reservoir substrate 214 into the outer body during insertion. Thereby, issues with respect to the reservoir substrate 214 shifting from the desired position or not becoming fully inserted into the outer body 216 may be avoided.

As the outer body 216 is pressed downwardly over the partially-assembled cartridge, the opposing portions 1378', 1378" of the substrate gripper 1374' may release the reservoir substrate 214, and cease applying negative pressure thereto in embodiments in which the substrate gripper applies negative pressure to the reservoir substrate. The rotary member 1372 of the outer body and reservoir substrate feeder 1370b may then swivel (e.g., by rotating about one hundred and eighty degrees) to transport an additional outer body 216 into proximity to the robotic arm 1396 for attachment to a partially-assembled cartridge on the next carriage 604.

The piston 1404 may be further configured to press the outer body 216 into engagement with the base 204b. In this regard, the piston 1404 may press against an upper end of the outer body 216 (e.g., by sitting flush against the upper end of the outer body). In this regard, the piston 1404 may define one or dimensions (e.g., a diameter) that are substantially equal to that of the outer body 216. Thereby, the outer body 216 may be pressed over the partially-assembled cartridge into full engagement with the base 204b.

A component presence sensor 1406b (e.g., comprising a light emitter and receiver) may detect whether or not the outer body 216 was properly coupled to the base 204b. For example, the component presence sensor 1406b may detect whether or not the outer body 216 is present while the carriage 604 is lifted by the lifter mechanism 1394b. Thereby, this information may be written to the storage module 624 by a storage transceiver (not shown; see, e.g., storage transceiver 1408a) at the second processing portion 1382b. Thus additional operations may not be performed on the partially-assembled cartridge if the outer body 216 is not properly assembled therewith, so as to avoid damage to the assembly equipment and waste of additional components. In this same regard, the storage transceiver may read the code on the storage module 624 to determine that the partially-assembled cartridge is fit for further assembly prior to coupling the outer body 216 to the base 204.

Once the outer body 216 is pressed onto the partially-assembled cartridge, the lifter mechanism 1394b may lower the carriage back onto the track 602. The carriage 604 may then be directed to the first processing portion 1382a, at which substantially the same operations may occur to couple a first outer body 216 to the first base 204a. Thereafter, as described above with respect to the second processing portion 1382b, a component presence sensor 1406a (e.g., comprising a light emitter and receiver) may detect whether or not the outer body 216 was properly coupled to the base 204a. Thereby, this information may be written to the storage module 624 by a storage transceiver 1408a at the first processing portion 1382a. Thus additional operations may not be performed on the partially-assembled cartridge if the outer body 216 is not properly assembled therewith, so as to avoid damage to the assembly equipment and waste of additional components. In this same regard, the storage transceiver 1408a may read the code on the storage module 624 to determine that the partially-assembled cartridge is fit for further assembly prior to coupling the outer body 216 to the base 204.

Note that the above-described operations may be conducted simultaneously. In this regard, for each of the outer body and reservoir substrate feeders 1370a, 1370b, while one of the substrate grippers 1374', 1374" receives a reservoir substrate 1314, the other of the substrate grippers may wrap the reservoir substrate around the bending mechanism 1398. Further, while one of the substrate grippers 1374', 1374" receives a reservoir substrate 1314, an associated one of the outer body supporters 1376', 1376" may receive an outer body. Various other operations conducted by the reservoir and outer body coupling substation 516 may be conducted simultaneously so as to reduce cycle times. Accordingly, rapid and efficient engagement of the reservoir substrate and outer body with the partially-assembled cartridges may be achieved.

The outer body crimping and inspection substation 518 may be positioned downstream of the reservoir and outer body coupling substation 516. FIG. 73 illustrates a partial side view of the outer body crimping and inspection substation 518. As illustrated, the outer body crimping and inspection substation 518 may include a first crimper unit 1502a, a second crimper unit 1502b, a first transfer unit 1504, an inspection and processing unit 1506, and a second transfer unit 1508.

FIG. 74 illustrates a perspective view of the first crimper unit 1502a and the second crimper unit 1502b. As illustrated, the first and second crimper units 1502a, 1502b may each include a crimper 1510. The crimper 1510 may comprise multiple sections configured to extend around the outer body 216 and crimp the outer body to the base 204. Thereby, the first crimper unit 1502a may crimp an outer body 216 to the first base 204a, whereas the second crimper unit 1502b may crimp a second outer body 216 to the second base 204b. Various details with respect to the configuration of example embodiments of crimpers that may be employed in the first and second crimper units 1502a, 1502b are provided in U.S. patent application Ser. No. 14/227,159 to Ampolini et al., filed Mar. 27, 2014, which is incorporated herein by reference in its entirety.

As further illustrated in FIG. 74, the first crimper unit 1502a and the second crimper unit 1502b may each include a processing portion 1512 configured to prepare each partially-assembled cartridge on the carriage 604 for crimping as the carriage is directed along the track 602. In this regard, the processing portions 1512 may respectively position the carriage 604 for crimping a first outer body 216 at the first crimper unit 1502a and position the carriage for crimping a second outer body at the second crimper unit 1502b.

In this regard, FIG. 75 illustrates a perspective view of the processing portion 1512 respectively included at each of the first crimper unit 1502a and the second crimper unit 1502b. As illustrated, the processing portion 1512 may include a carriage sensor 1514, an initial locator sensor 1516, an initial stop 1518, a stop locator sensor 1520, a lift stop 1522, and a lifter mechanism 1524, which may function in the manner described above with respect to the same components at the other substations.

Thus, the carriage 604 may be lifted at each of the first crimper unit 1502a and the second crimper unit 1502b by the respective lifter mechanism 1524. While lifted at the first crimper unit 1502a the first outer body 216 may be crimped onto the first base 204a. Similarly, while lifted at the second crimper unit 1502b the second outer body 216 may be crimped onto the second base 204b.

After each crimping operation a component presence sensor 1526 (e.g., comprising a light emitter and receiver) may detect whether the partially-assembled cartridge that was crimped is still present. Thereby, a storage transceiver 1528 may write code to the storage module 624 indicating whether or not the partially-assembled cartridge subjected to the crimping operation is present, so that additional operations may not be performed thereon when the cartridge is not detected. In this same regard, the storage transceiver 1528 may read the code on the storage module 624 to determine that the partially-assembled cartridge is fit for further assembly prior to crimping the outer body 216 to the base 204. Thereafter, the lifter mechanism 1524 may lower the carriage 604 into engagement with the track 602 such that the carriage is directed downstream. In this regard, each carriage 604 may be directed from the first crimper unit 1502a to the second crimper unit 1502b to the first transfer unit 1504.

FIG. 76 illustrates an enlarged partial view of the first transfer unit 1504. As illustrated, the first transfer unit 1504 may include a processing portion 1530. The processing portion 1530 may position the carriage 604 for transfer of the partially-assembled cartridges to the inspection and processing unit 1506. In this regard, the processing portion 1530 may include a carriage sensor (not shown; see, e.g., carriage sensor 1514 in FIG. 75), an initial locator sensor (not shown; see, e.g., initial locator sensor 1516 in FIG. 75), an initial stop 1532, a stop locator sensor 1534, a lift stop 1536, and a lifter mechanism 1538, which may function in the manner described above with respect to the same components at the other substations. Accordingly, the carriage 604 may be lifted by the lifter mechanism 1538. Thereby, the first transfer unit 1504 may transfer the first and second partially-assembled cartridges to the inspection and processing unit 1506.

In this regard, as further illustrated in FIG. 76, the first transfer unit 1504 may include an end effector 1540. The end effector 1540 may include first and second opposing portions 1542, 1544 configured to grasp a partially-assembled cartridge. For example, the first and second opposing portions 1542, 1544 of the end effector 1540 may be configured to clamp against opposing sides of the base 204 and/or the outer body 204. Thereby, a robotic arm 1546 of the first transfer unit 1504 may individually lift and remove first and second partially-assembled cartridges from the carriage 604 and transfer the partially-assembled cartridges to the inspection and processing unit 1506.

The processing portion 1530 of the first transfer unit 1504 may further comprise a first component presence sensor 1548a and a second component presence sensor 1548b (e.g., respectively comprising a light emitter and receiver). The first component presence sensor 1548a may be configured to detect whether the first partially-assembled cartridge is successfully removed from the carriage by the robotic arm 1546 and the end effector 1540. Similarly the second component presence sensor may be configured to determine whether the second partially-assembled cartridge is removed by the robotic arm 1546 and the end effector 1540. Thereby, a storage transceiver 1542 may write code to the storage module 624 indicating whether or not the partially-assembled cartridges are successfully removed from the carriage 604. In this regard, when the partially-assembled cartridges are successfully removed from the carriage 604, the track 602 may direct the carriage back to the staging area 602a, such that the carriage may be reused with each of the substations 502-518 (see, FIG. 4) in the manner described above. However, in instances in which one or both of the partially-assembled cartridges is unsuccessfully removed from the carriage 604, the carriage may be directed off of the track 602, or an operator may be alerted, such that the carriage is not reused with the partially-assembled cartridge still attached.

The first transfer unit 1504 may transfer the partially-assembled cartridges to the inspection and processing unit 1506. As illustrated in FIG. 77, in one embodiment the inspection and processing unit 1506 may include an audit chute 1547. In this regard, partially-assembled cartridges may be selected at various stages of assembly for review for quality control or other purposes. When a partially-assembled cartridge is selected for review, after reaching a desired state of completion, the storage module 624 may be programmed to indicate that such partially-assembled cartridge should not be subjected to any further assembly, in the same manner discussed above with respect to cartridges that are determined to be defective. In this regard, the various storage transceivers described above may read the storage module 624 and the code thereon may instruct the respective substations to not perform further assembly operations on the partially-assembled cartridge. Thereby, the partially-assembled cartridges may reach the first transfer unit 1504 under any of a variety of states of completion, such that the partially-assembled cartridges may be directed to the audit chute 1547 and inspected to ensure that each of the substations 502-518 of the cartridge assembly system 402 are operating properly.

The first transfer unit 1504 may transfer the remainder of the partially-assembled cartridges, which are not directed to the audit chute 1547 to an indexing table 1550 of the inspection and processing unit 1506. As illustrated, the indexing table 1550 may include a plurality of first grippers 1552a and second grippers 1552b extending radially therefrom. The first grippers 1552a may be configured to receive the first partially-assembled cartridges and the second grippers 1552b may be configured to receive the second partially-assembled cartridges. Thereby, as the indexing table 1550 indexes (e.g., by moving counterclockwise in terms of the illustrated orientation), the partially-assembled cartridges may be transported between a plurality of angular stops.

In this regard, the first transfer unit 1504 may transport the partially-assembled cartridges to a first angular stop 1554. As illustrated in FIG. 78, the first angular stop 1554 may comprise a first reject chute 1556. Thus, when the first transfer unit 1504 positions each partially-assembled cartridge at the first angular stop 1554, the associated gripper 1552a, 1552b to which the partially-assembled cartridge is delivered may function in one of two manners. If the partially-assembled cartridge is defective in one or more respects, as recorded on the storage module 624, and as read by the storage transceiver 1542 (see, FIG. 76), the gripper 1552a, 1552b to which the partially-assembled cartridge is delivered may not clamp thereon. Accordingly, when the end effector 1540 releases a defective partially-assembled cartridge, such cartridge may fall into the first reject chute 1556 for disposal, further analysis, or recycling of the components thereof.

Conversely, when a partially-assembled cartridge is not determined to be defective, the associated gripper 1552a, 1552b to which the partially-assembled cartridge is delivered may clamp onto the cartridge such that the cartridge may be transported with movement of the indexing table 1550. In this regard, each gripper 1552a, 1552b may include first and second opposing portions 1558, 1560 configured to clamp around the base 204 and/or the outer body 216 of each partially-assembled cartridge. Each gripper 1552a, 1552b may be actuated in response to a respective component presence sensor 1562a, 1562b detecting the presence of a partially-assembled cartridge at the gripper, and which has not been previously determined to be defective as described above. Note that in FIG. 78 the indexing table 1550 is illustrated as rotated slightly counterclockwise from first angular stop 1554 at which the grippers 1552a, 1552b receive the partially-assembled cartridges from the first transfer unit 1504, so as to show the first reject chute 1556. In this regard, the grippers 1552a, 1552b are positioned over the reject chute 1556, instead of displaced therefrom, in the first angular stop 1554.

Once received in the grippers 1552a, 1552b, the indexing table 1550 may index such that the partially-assembled cartridges are transported to a second angular stop 1564. FIG. 79 illustrates an enlarged view of the second angular stop 1564. As illustrated, the second angular stop 1564 may include first and second air flow assemblies 1566a, 1566b. Each air flow assembly 1566a, 1566b includes first and second couplers 1568, 1570, one of which engages the base 204 and the other of which engages an end of the outer body 216 distal to the base. Thereby, each air flow assembly 1566a, 1566b may apply a flow of air through the partially-assembled cartridge so as to remove any contaminants and/or ensure that a pressure drop associated with the partially-assembled cartridge meets specifications.

After the air flow assemblies 1566 release from the partially-assembled cartridges, the indexing table 1550 may index to a third angular stop 1572. As illustrated in FIG. 80, the third angular stop 1572 may include a first imaging device 1574 (e.g., a camera) configured to inspect an exterior of the partially-assembled cartridge. In this regard, the first imaging device 1574 may capture an image of an end of the partially-assembled cartridge opposite from the base, such that the image includes the heating element 240, the liquid transport element 238, and the reservoir substrate 214 inside the outer body 216. Thereby, a position of one or more of these components may be compared to a desired position thereof. Further, the third angular stop 1572 may include a second imaging device 1576 (e.g., a camera) configured to inspect an exterior of the partially-assembled cartridge. In this regard, the second imaging device 1576 may capture an image of the side of the outer body 216 and the base 204 to ensure that the outer body 216 is properly crimped to the base and to ensure that the reservoir substrate 214 is not exposed at the joint therebetween.

The indexing table 1550 may next index to a fourth angular stop 1578. As illustrated in FIG. 81, the fourth angular stop 1578 may include first and second electrical testers 1580a, 1580b. The electrical testers 1580a, 1580b may be configured to ensure that the heating element 240 was properly welded to the negative and positive heating terminals 234, 235. Further, the electrical testers 1580a, 1580b may test the partially-assembled cartridges to make sure that the control component terminal 206, the negative heating terminal 234, and the positive heating terminal 235 are not grounded to the outer body 216. Further, in some embodiments the electrical testers 1580a, 1580b may upload code to the electronic control component 208 which may, for example, control a heating profile dictating how current is directed to the heating element 240 when a draw is detected on an associated control body.

The indexing table 1550 may then index to a fifth angular stop 1582. As illustrated in FIG. 77, the fifth angular stop 1582 may include a second reject chute 1584. In this regard, when a partially-assembled cartridge fails one of the tests at the second, third, or fourth angular stops 1564, 1572, 1578, of the inspection and processing unit 1506, the gripper 1552*a*, 1552*b* may release the partially-assembled cartridge over the second reject chute 1584 for disposal, further analysis, or recycling of the components thereof.

The indexing table 1550 may further index to a sixth angular stop 1586, which corresponds to a position at which the partially-assembled cartridges are proximate the second transfer unit 1508. In this regard, as illustrated in FIG. 73, the second transfer unit 1508 may include a robotic arm 1588 and an end effector 1590. The robotic arm 1588 may position the end effector 1590, such that the end effector may grasp a partially-assembled cartridge and transfer the partially-assembled cartridge to an offload conveyor 1592. Thereby, the offload conveyor 1592 may transfer the partially-assembled cartridges to the cartridge filling subsystem 408 for filing, followed by the cartridge capping subsystem 412 for capping, and the cartridge labeling subsystem 416 for labeling (see, FIG. 3).

Note that the inspection subsystem 418 may be distributed across the various portions of the system 400 for producing cartridges. In this regard, by way of example, the inspection subsystem 418 may include the various component presence sensors and other sensors configured to detect the position, presence, and other attributes of the components of the cartridge as described above.

An assembly method is additionally provided. As illustrated in FIG. 82, the method may include providing a plurality of components via a supply unit at operation 1602. Further, the method may include alternatingly feeding a first portion of the components from the supply unit to a first assembly unit and a second portion of the components to a second assembly unit at operation 1604. The method may additionally include assembling the first portion of the components with the first assembly unit and the second portion of the components with the second assembly unit into a plurality of cartridges for an aerosol delivery device at operation 1606.

In some embodiments, alternatingly feeding the first portion of the components from the supply unit to the first assembly unit and the second portion of the components to the second assembly unit at operation 1604 may include swiveling a rotary member between a first delivery position in which the rotary member is configured to deliver the first portion of the components to the first assembly unit and a second delivery position in which the rotary member is configured to deliver the second portion of the components to the second assembly unit. Swiveling the rotary member may include receiving one of the components from the supply unit in a first engagement head while a second engagement head feeds one of the components to the second assembly unit and receiving one of the components from the supply unit in the second engagement head while the first engagement head feeds one of the components to the first assembly unit.

Providing the components via the supply unit at operation 1602 may include directing the components along a pathway in a serially-aligned stream and singulating the components from the serially-aligned stream. The method may additionally include individually removing the components from the serially-aligned stream or realigning the components when misaligned in a first direction. The method may additionally include removing the components from the serially-aligned stream through a gap in the pathway when the components are misaligned in a second direction.

An additional embodiment of an assembly method is illustrated in FIG. 83. As illustrated, the method may include providing a base and a plurality of additional components collectively configured to form a plurality of cartridges for an aerosol delivery device, the base extending between an inner end configured to receive the additional components during assembly of the cartridges and an attachment end defining an internal surface configured to engage a control body during usage of the aerosol delivery device at operation 1702. Further, the method may include providing a plurality of assembly substations, a track, and a carriage comprising an engagement head defining a plurality of sections, the track extending between the assembly substations, and the carriage being configured to engage the track and to cooperate therewith to move between the assembly substations at operation 1704. The method may further include engaging the internal surface of the attachment end of the base with the sections of the engagement head via an interference fit to provide the assembly substations with access to the inner end of the base at operation 1706. The method may also include transporting the carriage by way of the track between the assembly substations at operation 1708. Additionally, the method may include assembling the additional components with the inner end of the base at the assembly substations at operation 1710.

Engaging the base with the engagement head at operation 1706 may include rotationally aligning the base with the engagement head. Rotationally aligning the base with the engagement head comprises detecting a rotational orientation of the base based on image of the attachment end of the base. The method may further include storing cartridge identification and status information in a storage module coupled to the carriage. Additionally, the method may include locking the carriage at one or more of the substations by directing one or more locking pins from the track into one or more alignment apertures defined in the carriage. Transporting the carriage by way of the track at operation 1708 may include transporting the carriage by way of a conveyor, and wherein locking the carriage comprises lifting the carriage from the conveyor.

FIG. 84 illustrates an additional assembly method. As illustrated, the method may include providing a partially-assembled cartridge comprising: a base, a negative heating terminal, a positive heating terminal, a heating element, and a liquid transport element, the negative heating terminal and the positive heating terminal being coupled to the base, and the heating element being coupled to the negative heating terminal and the positive heating terminal at operation 1802. The method may additionally include inserting the partially-assembled cartridge within an outer body by engaging the outer body with an outer body gripper of a robotic arm and directing the outer body over the partially-assembled cartridge at operation 1804. Further, the method may include applying a negative pressure to the outer body supplied by a suction system operably engaged with the outer body gripper of the robotic arm to facilitate insertion of the partially-assembled cartridge into the outer body at operation 1806.

In some embodiments the method may further include inserting the partially-assembled cartridge in a bending mechanism to bend the liquid transport element against the negative heating terminal and the positive heating terminal, wrapping a reservoir substrate at least partially around the bending mechanism, and retracting the bending mechanism relative to the partially-assembled cartridge following wrapping of the reservoir substrate such that the reservoir substrate is wrapped at least partially about the negative heating terminal and the positive heating terminal and in contact with the liquid transport element. Applying the negative pressure to the outer body at operation 1806 may include engaging an end of the outer body with a piston of the outer body gripper, the piston being in fluid communication with the suction system and configured to apply the negative pressure through the outer body. Further, the method may include pressing the outer body into engagement with the base with the piston.

As noted above, the system 400 may include a controller 417. The controller 417 may be configured to execute computer code for performing the operations described herein. As illustrated in FIG. 85, the controller 417 may comprise a processor 1902 that may be a microprocessor or a controller for controlling the overall operation thereof. In one embodiment the processor 1902 may be particularly configured to perform the functions described herein. The controller 417 may also include a memory device 204. The memory device 1904 may include non-transitory and tangible memory that may be, for example, volatile and/or non-volatile memory. The memory device 1904 may be configured to store information, data, files, applications, instructions or the like. For example, the memory device 1904 could be configured to buffer input data for processing by the processor 1902. Additionally or alternatively, the memory device 1904 may be configured to store instructions for execution by the processor 1902.

The controller 417 may also include a user interface 1906 that allows a user to interact therewith. For example, the user interface 1906 can take a variety of forms, such as a button, keypad, dial, touch screen, audio input interface, visual/image capture input interface, input in the form of sensor data, etc. Still further, the user interface 1906 may be configured to output information to the user through a display, speaker, or other output device. A communication 1908 interface may provide for transmitting and receiving data through, for example, a wired or wireless network 1910 such as a local area network (LAN), a metropolitan area network (MAN), and/or a wide area network (WAN), for example, the Internet.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling the above-described operations. In particular, computer readable code may be configured to perform each of the operations of the methods described herein and embodied as computer readable code on a computer readable medium for controlling the above-described operations. In this regard, a computer readable storage medium, as used herein, refers to a non-transitory, physical storage medium (e.g., a volatile or non-volatile memory device, which can be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

As noted above, the controller 417 may be configured to execute computer code for performing the above-described operations. In this regard, an embodiment of a non-transitory computer readable medium for storing computer instructions executed by a processor in a controller (e.g. controller 417) configured to assemble a cartridge for an aerosol delivery device is provided. The non-transitory computer readable medium may comprise program code instructions for providing a plurality of components via a supply unit; program code instructions for alternatingly feeding a first portion of the components from the supply unit to a first assembly unit and a second portion of the components to a second assembly unit via a processor; and program code instructions for assembling the first portion of the components with the first assembly unit and the second portion of the components with the second assembly unit into a plurality of cartridges for an aerosol delivery device.

The program code instructions for alternatingly feeding the first portion of the components from the supply unit to the first assembly unit and the second portion of the components to the second assembly unit may include program code instructions for swiveling a rotary member between a first delivery position in which the rotary member is configured to deliver the first portion of the components to the first assembly unit and a second delivery position in which the rotary member is configured to deliver the second portion of the components to the second assembly unit. The program code instructions for swiveling the rotary member may include program code instructions for receiving one of the components from the supply unit in a first engagement head while a second engagement head feeds one of the components to the second assembly unit and receiving one of the components from the supply unit in the second engagement head while the first engagement head feeds one of the components to the first assembly unit. The program code instructions for providing the components via the supply unit may include program code instructions for directing the components along a pathway in a serially-aligned stream and singulating the components from the serially-aligned stream. The non-transitory computer readable medium may further comprise program code instructions for individually removing the components from the serially-aligned stream or realigning the components when misaligned in a first direction. The non-transitory computer readable medium may further comprise program code instructions for removing the components from the serially-aligned stream through a gap in the pathway when the components are misaligned in a second direction.

In an additional embodiment, a non-transitory computer readable medium for storing computer instructions executed by a processor in a controller (e.g. controller 417) configured to assemble a cartridge for an aerosol delivery device may comprise program code instructions for providing a base and a plurality of additional components collectively configured to form a plurality of cartridges for an aerosol delivery device, the base extending between an inner end configured to receive the additional components during assembly of the cartridges and an attachment end defining an internal surface configured to engage a control body during usage of the aerosol delivery device; program code instructions for providing a plurality of assembly substations, a track, and a carriage comprising an engagement head defining a plurality of sections, the track extending between the assembly substations, and the carriage being configured to engage the track and to cooperate therewith to move between the assembly substations; program code instructions for engaging the internal surface of the attachment end of the base with the sections of the engagement head via an interference fit to provide the assembly substations with access to the inner end of the base; program code instructions for transporting the carriage by way of the track between the assembly substations; and program code instructions for assembling the additional components with the inner end of the base at the assembly substations via a processor.

The program code instructions for engaging the base with the engagement head may comprise program code instructions for rotationally aligning the base with the engagement head. The program code instructions for rotationally aligning the base with the engagement head may include program code instructions for detecting a rotational orientation of the base based on image of the attachment end of the base. The non-transitory computer readable medium may further comprise program code instructions for storing cartridge identification and status information in a storage module coupled to the carriage. The non-transitory computer readable medium may further comprise program code instructions for locking the carriage at one or more of the substations by directing one or more locking pins from the track into one or more alignment apertures defined in the carriage. In some embodiments the program code instructions for transporting the carriage by way of the track may include program code instructions for transporting the carriage by way of a conveyor, and wherein the program code instructions for locking the carriage may include program code instructions for lifting the carriage from the conveyor.

In a further embodiment, a non-transitory computer readable medium for storing computer instructions executed by a processor in a controller (e.g. controller 417) configured to assemble a cartridge for an aerosol delivery device may comprise program code instructions for providing a partially-assembled cartridge comprising: a base, a negative heating terminal, a positive heating terminal, a heating element, and a liquid transport element, the negative heating terminal and the positive heating terminal being coupled to the base, and the heating element being coupled to the negative heating terminal and the positive heating terminal; program code instructions for inserting the partially-assembled cartridge within an outer body by engaging the outer body with an outer body gripper of a robotic arm and directing the outer body over the partially-assembled cartridge; and program code instructions for applying a negative pressure to the outer body supplied by a suction system operably engaged with the outer body gripper of the robotic arm to facilitate insertion of the partially-assembled cartridge into the outer body via a processor.

In some embodiments the non-transitory computer readable medium may further comprise program code instructions for inserting the partially-assembled cartridge in a bending mechanism to bend the liquid transport element against the negative heating terminal and the positive heating terminal; program code instructions for wrapping a reservoir substrate at least partially around the bending mechanism; and program code instructions for retracting the bending mechanism relative to the partially-assembled cartridge following wrapping of the reservoir substrate such that the reservoir substrate is wrapped at least partially about the negative heating terminal and the positive heating terminal and in contact with the liquid transport element.

In some embodiments the program code instructions for applying the negative pressure to the outer body may comprise program code instructions for engaging an end of the outer body with a piston of the outer body gripper, the piston being in fluid communication with the suction system and configured to apply the negative pressure through the outer body. The non-transitory computer readable medium may further comprise program code instructions for pressing the outer body into engagement with the base with the piston.

Many modifications and other embodiments of the disclosure will come to mind to one skilled in the art to which this disclosure pertains having the benefit of the teachings presented in the foregoing descriptions and the associated drawings. Therefore, it is to be understood that the disclosure is not to be limited to the specific embodiments disclosed herein and that modifications and other embodiments are intended to be included within the scope of the appended claims. Although specific terms are employed herein, they are used in a generic and descriptive sense only and not for purposes of limitation.

The invention claimed is:

1. An assembly substation, comprising:
   a supply unit configured to provide a plurality of components;
   a feeder unit configured to receive the plurality of components from the supply unit; and
   a first assembly unit configured to receive a first portion of the components and a second assembly unit configured to receive a second portion of the components, the first assembly unit and the second assembly unit being respectively configured to assemble the first portion of the components and the second portion of components into a plurality of cartridges for an aerosol delivery device;
   wherein the feeder unit is arranged to alternate between feeding the first portion of the components to the first assembly unit and the second portion of the components to the second assembly unit.

2. The assembly substation of claim 1, wherein the feeder unit comprises a rotary member configured to swivel between a first delivery position in which the rotary member is configured to deliver the first portion of the components to the first assembly unit and a second delivery position in which the rotary member is configured to deliver the second portion of the components to the second assembly unit.

3. The assembly substation of claim 2, wherein the rotary member comprises a first engagement head and a second engagement head respectively configured to receive one of the components from the supply unit,
   the first engagement head being configured to receive one of the components from the supply unit while the second engagement head feeds one of the components to the second assembly unit,
   the second engagement head being configured to receive one of the components from the supply unit while the first engagement head feeds one of the components to the first assembly unit.

4. The assembly substation of claim 1, wherein the supply unit comprises a vibratory arrangement defining a pathway configured to arrange the components in a serially-aligned stream and a singulator configured to singulate the components from the serially-aligned stream.

5. The assembly substation of claim 4, wherein the supply unit further comprises an actuator configured to individually remove the components from the serially-aligned stream or realign the components when misaligned in a first direction.

6. The assembly substation of claim 5, wherein the pathway defines a gap configured to remove the components from the serially-aligned stream when the components are misaligned in a second direction.

\* \* \* \* \*